United States Patent [19]

Boyle et al.

[11] Patent Number: 5,363,320
[45] Date of Patent: Nov. 8, 1994

[54] AUTOMATIC COMPILATION OF MODEL EQUATIONS INTO A GRADIENT BASED ANALOG SIMULATOR

[75] Inventors: Graeme R. Boyle, Yamhill; Susan C. Bergquist, Woodburn; Ernest G. McReynolds, Portland; Matson M. Haug, Newberg, all of Oreg.

[73] Assignee: Tektronix, Inc., Wilsonville, Oreg.

[21] Appl. No.: 79,226

[22] Filed: Jun. 21, 1993

Related U.S. Application Data

[63] Continuation of Ser. No. 634,262, Dec. 14, 1990, abandoned.

[51] Int. Cl.$^5$ ............................................. G06F 15/60
[52] U.S. Cl. ................................................... 364/578
[58] Field of Search ............... 364/578, 488, 489, 490, 364/232.3; 395/500

[56] References Cited

U.S. PATENT DOCUMENTS

| 4,613,940 | 9/1986 | Shenton et al. | 364/488 |
| 4,742,473 | 5/1988 | Shugar et al. | 395/157 |
| 4,868,770 | 9/1989 | Smith et al. | 364/578 |
| 4,970,664 | 11/1990 | Kaiser et al. | 364/488 |
| 5,092,780 | 3/1992 | Vlach | 364/578 |
| 5,111,413 | 5/1992 | Lazansky et al. | 364/578 |

OTHER PUBLICATIONS

Analogy Inc.'s Saber sales brochure, Dec. 14, 1990.
Doug Johnson, "A Simulator for Designing Mixed Technology Systems", 1987 Automated Design and Engineering for Electronics-West conference.
Konno et al., "Advanced implicit solution function of Depsol and its evaluation", IEEE Tokyo 1986.

Primary Examiner—Ellis B. Ramirez
Attorney, Agent, or Firm—Boulden G. Griffith

[57] ABSTRACT

A method allows analog device model descriptions to be described in a suitable language and then automatically converted into the language of the simulator in a form that facilitates gradient-based calculations. The method can include the steps of: entering a high-level description of the component model by naming the model, declaring parameters, specifying argument-independent equations, describing a topology of the model, declaring arguments, and specifying argument-dependent equations. Then, compiling the high-level description to produce model behavior code parse trees and model structure data, analyzing the data-flow of the model behavior code parse trees to produce verified parse trees and error messages for those variables referenced but not defined, debugging the model behavior code parse trees and model structure data, translating the verified parse trees to produce scalar-code parse trees according to a selected translation mode, the scalar code parse trees including objects that manipulate expressions containing derivatives with respect to an argument, checking the argument dependence of the scalar-code parse trees to produce repartitioned scalar code parse trees, and filling in the data required by simulator model templates to convert the repartitioned scalar code parse trees into code in the computer programming language used by the simulator.

24 Claims, 4 Drawing Sheets

AUTOMATIC COMPILATION OF MODEL EQUATIONS INTO A GRADIENT BASED ANALOG SIMULATOR

This is a continuation of application Ser. No. 07/634,262 filed Dec. 14, 1990 which is now abandoned.

BACKGROUND OF THE INVENTION

This invention relates to the field of electrical circuit simulators, and more particularly to the field of entering analog electrical component model descriptions into a gradient based analog circuit simulator.

Years ago, when electrical circuits involved primarily discrete components, a traditional "breadboard" allowed an engineer with an oscilloscope to probe and measure the activity at every node of interest until he was satisfied that he knew how his circuit would behave under a variety of expected conditions. The similarity between the breadboard circuit and the final circuit was great enough to allow fairly accurate characterization of the final circuit by laboratory measurements of the breadboard circuit.

However, with the vast majority of today's circuitry being implemented in integrated circuits, breadboarding is no longer a viable approach to circuit design. The parasitic components present in the final integrated circuit (IC) cannot be physically duplicated with a breadboard approach. The fabrication and testing of an IC is an acceptable way to verify a design when there is already a high level of confidence in how it is going to work, but for trying out different design possibilities fabrication of an IC and testing it is far too slow and expensive to be competitive in today's rapid development environment.

Hence, the advent of circuit simulators. Circuit simulators represent the circuit under design in mathematical terms, allowing numerical analysis procedures to be performed which correspond to the measurements that formerly were made with physical hardware in the laboratory. The output of the simulator program is in effect the result of a measurement made on the circuit under design as it presently has been specified within the simulator.

The effective use of simulators has been hindered, however, by the difficulty of adding new device models to libraries of such models. The simulators are built and maintained by software engineers, who are comfortable with computer programming, but who frequently have a somewhat limited knowledge of device physics. The physicists who develop models for new devices, on the other hand, tend to have a limited knowledge of software and would prefer not to have to become extremely conversant with it in order to add their model to a library of such models.

One approach that has been used to permit device physicists to enter models into an analog simulator is part of the Saber TM simulator sold by Analogy (R), Inc. of Beaverton, Oreg. Saber TM includes a modeling language called "MAST" that attempts to solve the problem of making simulators accessible to their users.

Rather than calculating derivatives directly as part of the simulation itself, which requires having the necessary equations compiled into the main simulation code, the Saber TM system precalculates tables of model branch values and gradient data and then uses those tables and piecewise linear approximation to produce solution vectors. For a more thorough understanding of this method, reference may be made to "Piecewise Linear Methods for Analyzing Large Hierarchical Networks" by Martin Vlach published by the Institute for Computer Research (1984).

For some types of simulation activities, e.g. sensitivity tests, the use of piecewise linear approximation has disadvantages. To perform a sensitivity test, the values of the parameter that the sensitivity is being measured with respect to must be repeatedly varied. In an approach that relies on the pre-building of tables, varying a parameter requires repeatedly re-building the tables and doing so is a time-consuming step. To increase the accuracy of a simulation using a table-based approach, the tables must be re-calculated using a finer grid, whereas in a system based on the symbolic relationships being compiled into the main simulation code, a more accurate calculation can be obtained more directly by varying the control parameter, such as the convergence tolerances or transient operator approximation tolerances, and then re-running the simulation immediately.

What is desired is a method that allows analog device models to be effectively described in a language that is easy to learn and use, and then to have that description converted into the language of the simulator and automatically compiled and linked into the main program used by the simulator in a way that allows high speed calculation of solutions of gradient-based equations without the use of piecewise linear approximation and the need to build and use tables.

SUMMARY OF THE INVENTION

Accordingly, the present invention is a method that allows analog device model descriptions to be effectively described in a language that is easy to learn and use, and to have that description converted into the language of the simulator and automatically compiled and linked into the main program used by the simulator in a way that allows actual high speed calculation of gradient-based equations without the use of piecewise linear approximation and the need to build and use tables.

In a preferred embodiment, the method of the present invention encompasses the following steps: entering a high-level description of the component model by naming the model, declaring parameters, specifying argument-independent equations, describing a topology of the model, declaring arguments, and specifying argument-dependent equations. Then, compiling the high-level description to produce model behavior code parse trees and model structure data, analyzing the data-flow of the model behavior code parse trees to produce verified parse trees and error messages for those variables referenced but not defined, debugging the model description as represented by the model behavior code parse trees and model structure data, translating the verified parse trees to produce scalar-code parse trees according to a selected translation mode, the scalar code parse trees including objects representing arithmetic operators that permit said operators to manipulate expressions containing derivatives with respect to an argument, checking the argument dependence of the scalar-code parse trees to produce repartitioned scalar code parse trees, and filling in the data required by simulator model templates to convert the repartitioned scalar code parse trees into code in the computer programming language used by the simulator.

DETAILED DESCRIPTION

Figure 1A:
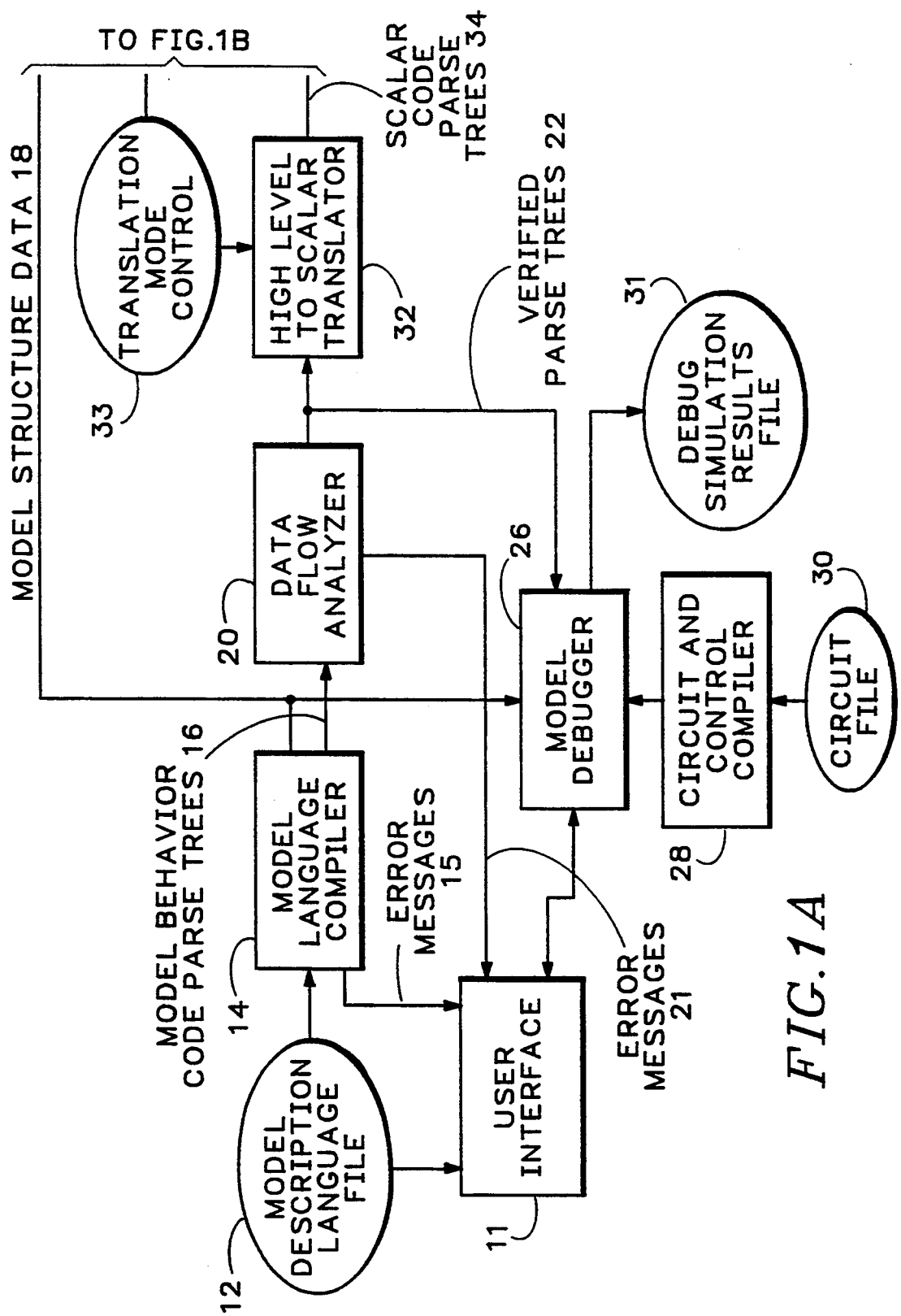
FIG. 1 is a data flow and block diagram of an analog circuit simulator provided with means for accomplishing the of the present invention.
Figure 1B:
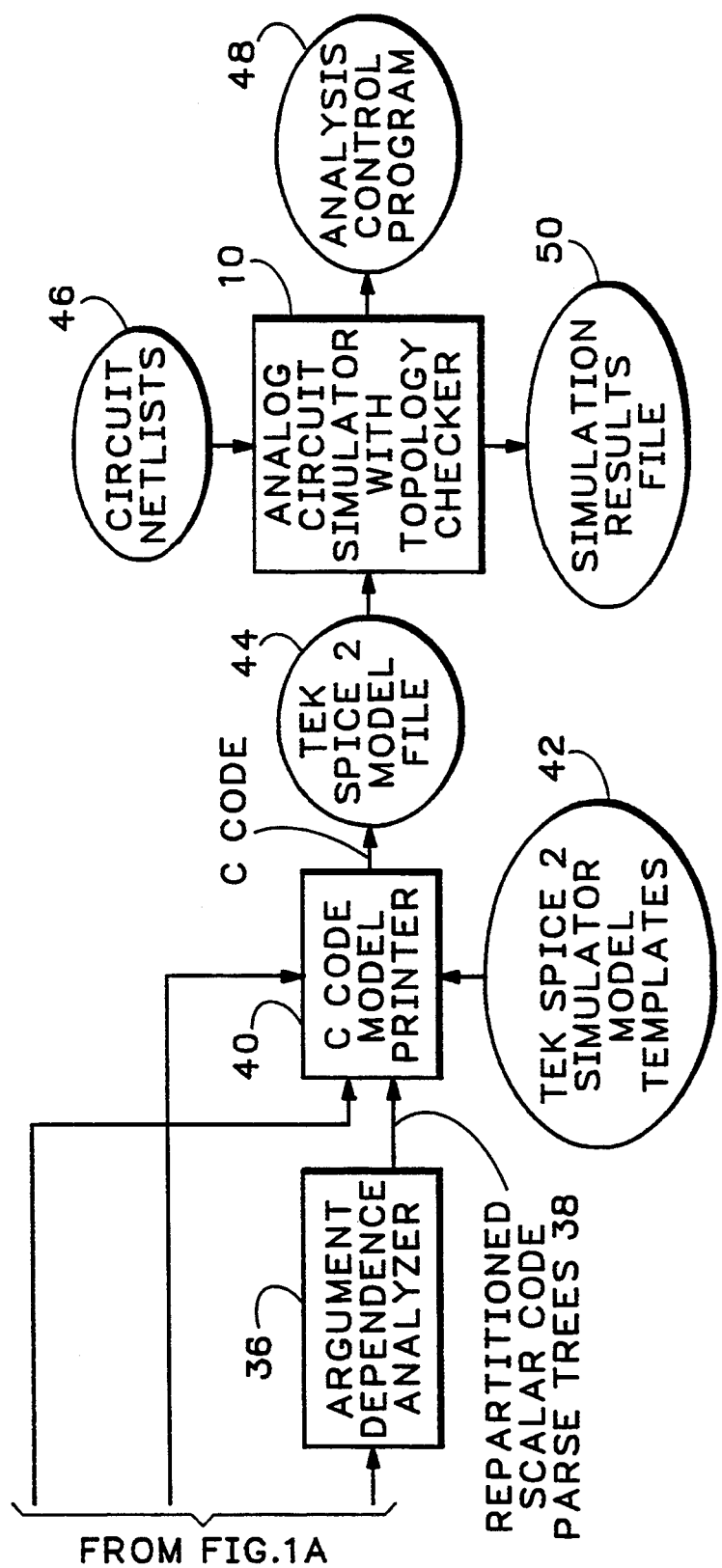

Referring to FIG. 1, a gradient-based analog simulator 10 has been provided with means for accomplishing the methods of the present invention. At a user interface 11, the user enters data describing the user's model for an analog circuit device into a model description language file 12. The language used, the Analog Device Model Description Language, has been designed to foster good communication between a device physicist and the software intensive environment of the analog circuit simulator 10. It permits a rigorous definition of the analog device model while insulating the user from the details of simulation software. As will be seen below when the language is more fully described, the block-oriented structure of this language guides the model developer through the requirements for a complete model description.

A model language compiler 14 performs lexical and syntax analysis of the model description from the model description language file 12 and produces model behavior code parse trees 16 and model structure data 18. The model behavior code parse trees are forwarded to a data flow analyzer 20 which verifies that all referenced variables are defined. The output of the data flow analyzer 20 is verified parse trees 22. If a variable is referenced but not defined, an error message 21 is generated.

The verified parse trees 22 and model data structures 18 are both available to a model debugger 26 that also receives input from a circuit and control compiler 28 operating on the data in circuit file 30. The circuit file 30 is a smaller, local version of the same kind of information that is found in the circuit netlists 46 and the analysis control program 48 associated with the analog circuit simulator 10. The user controls the model debugger 26 through the user interface 11 to produce a debug simulation results file 31. The model debugger 26 has interactive capabilities that allow the user to examine the values of all of the variables in the context of the execution of any statement. These capabilities and the error messages generated help the user find any errors in the model description language file 12.

The model behavior code parse trees and the verified parse trees derived from them can be linked to a unique class of objects that are capable of performing arithmetic and algebraic operations on operands that contain not only variables but their partial derivatives. "FAndGradF" (function and gradient of the function; Appendix E) is the name of a calculating version of this class of objects that is used in the model debugger 26 to numerically evaluate the verified parse trees 22.

Once the debugging has been completed, the verified parse trees 22 also go to a high level to scalar translator 32 which produces scalar code parse trees 34. The high level to scalar translator 32 adds parse nodes representing the derivatives of all quantities with respect to their arguments. For dc, transient and ac analyses the arguments are those variables declared in the argument-definition section of the Analog Model Description Language procedure. For sensitivity analysis the arguments are the model parameters with respect to which the sensitivities are to be found. For noise analysis the arguments are the noise sources in the code, defined using the noise function.

Another version of the new class of objects (described briefly above) to represent variables and their partial derivatives is called "CodeGenFAndGradF" (Appendix F). In the high level to scalar translator 32, "FAndGradF" objects in the high level verified parse trees 22 spawn specialized variants of themselves, "CodeGenFAndGradF". Rather than performing numerical calculations of variables and their derivatives, as "FAndGradF" does, "CodeGenFAndGradF" is designed to generate C code to perform the calculations within the analog circuit simulator 10.

The scalar code parse trees 34 from the high level to scalar translator 32 go to an argument dependence analyzer 36. The argument dependence analyzer 36 optimizes the code by first running a more complete data flow analysis, which includes the derivatives with respect to arguments as well as the original equations. If this analysis finds variables that are defined but never used, the definitions are discarded. The argument-dependent equations are then checked to verify that they truly are argument-dependent and those that are not are moved to the argument-independent portion of the code to produce repartitioned scalar code parse trees 38. This repartitioning is necessary because the process of differentiation may turn a variable into a constant. It is important to optimize the argument-dependent portion of the resulting C code as much as possible, because the argument-dependent portion of the code must be executed repeatedly for the nonlinear part of the analysis while the argument-independent portion of the code is only run once per simulation. Therefore, keeping as many calculations as possible out of the part of the code that must be run so many times is highly rewarding in terms of efficiency.

A C code model printer 40 receives the translation mode data 33, the repartitioned scalar code parse trees 38 and the model structure data 18 and uses TekSpice2 simulator model templates 42 to organize and convert those inputs into a C code output, the TekSpice2 model file 44 that is suitable for linking into the main simulation program of the analog circuit simulator 10. The TekSpice2 simulator model templates 42 help define the C code functions expected by the simulator.

The analog circuit simulator 10 also receives circuit netlists 46 and an analysis control program 48, and, based on the interaction of one or more instances of a number of such models according to the contents of the circuit netlists, produces a simulation results file 50.

The first step in the method of the present invention is to create a high-level description of the new device model in an easy to use language. This language, which is called the Analog Model Description Language (AMDL), provides a uniform and straightforward way to describe all of the characteristics of the new device model in a structure which lends itself to the rest of the process that is to follow.

The Analog Model Description Language description of a new model begins with an outer block that defines the name of the new model, in this example "resistor". Each block begins with a required keyword, in this example "modelDefinition". "<sub-blocks>" are the model details that are filled in the steps which follow. Comments are identified by a slash and an asterisk, /*comments*/, as in the language C. Taking these together, we have an outer block that looks like:

```
modelDefinition resister {
    /*comments*/
    <sub-blocks>
}
```

The sub-blocks define the parameters, argument-independent equations, topology, arguments, and argument-dependent equations for the new model, in that order. Each sub-block contains one or more statements as explained below. Every model must have a topology sub-block and an argument-dependent equations sub-block, but the inclusion of other 'sub-blocks is optional, depending on the features of the particular model. Variables defined in one block are available for use in equations in the blocks that follow. The general form of all sub-blocks is:

```
blockName {
    <statements>
}
```

PARAMETER DECLARATION

Parameters are variables which assume constant values at simulation time, such as the resistance of a resistor. They are declared using assignment statements. The assignment statements contain the parameter name and a default value, and optionally a legal set of values. The default value may be specified to be anything from negative infinity to positive infinity. Default values may be overridden for particular instances of the use of the model. The form of the specification is:

parameter=value or parameter=value,<legal set>

The comma indicates that a legal set of values follows the assignment of the default value. Such a comma and legal set may only appear after an assignment statement. When a legal set is specified, the assigned value is tested to see if it is within the legal set. If it is not, an error message is generated.

A legal set of discrete values may be specified by enumeration, e.g.:

{value1,value2, ... }

Intervals of real values, either including or excluding end points, e.g.:

[lowValue,highValue)

A bracket indicates inclusion of the end point, "lowValue" in this example, while a parenthesis indicates exclusion of the endpoint, "highValue" in this example.

A legal set may also include the union of two or more sets, where a back-slash forward-slash combination is interpreted as the union operator for sets, e.g.:

$(-\infty, -0.1]/\{0\}/[0.1, \infty)$

Legal sets may also be defined by exclusion using an exclamation point. Thus, the set of all real numbers except zero is denoted by:

!{0}

Parameters are declared using the keyword "defaultParameterValues", as in the following declaration for the resistor example started above:

```
defaultParameterValues {
    R = 1, ! {0}   /* The resistance may not be zero.  */
    TC = 0         /* Temperature coefficient.         */
}
```

ARGUMENT-INDEPENDENT EQUATIONS

Arguments are independent variables whose values are determined repeatedly during every iteration of the simulation. Argument-independent equations only involve parameters and constants, and so only need to be evaluated when parameter values change. These equations often are used for scaling by dimensions, temperature effects, or could be used to map physical parameters into internal electrical parameters. As will be further explained below in connection with Note 2 of Appendix C, the diode model input file, an iterative construct ("while" statement) is provided for local solution of simple nonlinear equations. Legal sets may also be appended to assignment statements in this sub-block. The keyword is "argumentIndependentEquations" and an example using the resistor again is:

```
argumentIndependentEquations {
    r = R*(1+TC*(temp-t_nom)), ! {0}
    gResistor = 1/r
}
```

Statements are sequentially evaluated, so any variable that has been declared in a previous sub-block may be referenced in subsequent sub-blocks, as "R" and "TC" have been here. Each variable may be assigned any number of times, but only within one sub-block. Variables must be declared in the model description by assignment before being referenced, except for global variables. Global variables, such as temp and $t_{nom}$, are defined as part of the simulator.

TOPOLOGICAL DESCRIPTION

Electrical circuit simulation is naturally facilitated through the construction of nodal networks. For this purpose, network constructs for a node, branch and pad are provided to describe the flow of network quantities and provide interconnections for the confluence of those flows. This sub-block closely emulates the form of a circuit netlist. The statements for defining nodes and pads use the keywords "node" and "pad", and "units", and look like this:

node name units=unit pad name units=unit

Nodes and branches are private to a model definition, i.e., no branch may join the node of one model definition to the node of a different model definition. Pads are special nodes that are the only legal way to connect a particular instance of a model definition to the other network elements in the system. The specification of units determines the type of quantities that are associated with particular nodes and pads, so that inconsistent types of quantities, such as voltage and pressure, are not inadvertently connected to the same node or pad.

Branches are the conduits used to interconnect nodes and pads with other nodes and pads. The statement for declaring a branch uses the keywords "branch" and "units" and looks like:

```
branch name node1 node2 units=unit
```

The branch name provides the association between the mathematical equations of the model definition, defined in the argumentDependentEquations sub-block described below, and the branch contribution to the system of which it is a component. A "through" quantity is defined by those equations as the flow through the branch. For electrical branches the value of "through" is electrical current. "Units" again are used to enforce consistency in network construction.

In an electrical network the value of branch current may be that required to keep the difference in node voltages across that branch constant. An example of this would be the branch joining the terminals of a voltage-source. In this case, it is convenient to introduce an unknown quantity to represent the current through the voltage source. Corresponding to the introduction of the unknown voltage-source current, it is customary to introduce an equation of constraint. The model unknown, which may represent a network or non-network quantity, provides for this requirement.

A model unknown provides a mechanism for expressing equations of constraint between the model arguments. A model unknown must have an associated constraint equation which may mathematically couple to branches in the network. Additionally, the unknown must be used in at least one of the equations in the model definition. The constraint is defined in the argumentDependentEquations section of the model description and the action of the simulator is to adjust the system solution, and hence the model arguments, to drive the expression appearing in the constraint equation to zero. The statement for a model unknown uses the keywords "unknown" and "units" and looks like:

```
unknown name units=unit
```

Here units serve to identify the type of unknown quantity for simulation output purposes.

The topological description for the resistor example is given by:

```
topologicalDescription {
    pad plus units=volts
    pad minus units=volts
    branch resistor plus minus units=amps
}
```

Note that algorithm-specific information such as matrix stamps are not included in the model description as in other model-definition languages. Such information is extractable by the software of the present invention from branch, unknown, equations, and argument declarations and need not concern the model developer.

ARGUMENT DECLARATION

The arguments are independent variables in the model equations that receive their values from the solution of the system equations. An example would be vbe and vbc for a bipolar transistor. There are two argument types. The first is an "across" argument:

```
argument=across(name1,name2)
``` or

```
argument=across(name1,name2,polarity)
``` where name1 and name2 are network nodes or pads in the topological description of the model. "Across" arguments in electrical networks are thus voltage differences. The polarity variable allows one equation set to be used for models with two polarities, such as npn and pnp transistors.

The second argument type comes from a model unknown. A "value" argument is declared by:

```
argument=value (name-of-unknown)
```

The argument declaration for the resistor is:

```
argumentDefinition {
    vResistor = across(plus, minus)
}
```

Arguments will be used for the definition of the mathematical functions and relations of the argumentDependentEquations sub-block. Arguments have the same units as the nodes, pads and unknowns which they reference. The mixing of units is thereby prevented.

ARGUMENT-DEPENDENT EQUATIONS

The argument-dependent equations involve the model arguments as well as parameters and must be evaluated at each iteration during the solution process if a nonlinear system is being solved. All branches must have through values defined and all model unknowns must have constraints expressed in this block.

The branch "through" quantity is set in the argumentDependentEquations sub-block of the model description by the statement:

```
throughValueFor(branch name)=expression
``` or

```
throughValueFor(branch name,
    polarity)=expression
```

The expression appearing above is formed as an equation right-hand side from a set of conventional mathematical functions and operators. The action of the simulator is to subtract the through value from the nodal system equation of the first node of the branch and to add to the equation for the second node.

The constraint is defined in the argumentDependentEquations sub-block of the model definition by the statement:

```
constraintFor(unknown name)=expression
``` and the action of the simulator is to adjust the system solution, and hence the model arguments, to drive the expression appearing in the constraint equation above to zero. An example of a model definition using a model unknown and constraint equation is reproduced below in a model of a constant-inductor.

The argument-dependent equations for the resistor are:

```
argumentDependentEquations {
    throughValueFor(resistor) = vResistor*gResistor
}
```

No derivatives of the branch or constraint quantities are required to be specified in this sub-block of the model definition since this is a simulator-dependent matter that can be performed by the software of the present invention.

Assembly of the above sub-blocks within the encompassing modelDefinition block for the resistor completes a mathematical definition suitable for incorporation into a simulator:

```
modelDefinition resistor {
    defaultParameterValues {
        R = 1, ! {0}    /* The resistance may not be zero. */
        TC = 0          /* Temperature coefficient. */
    }
    argumentIndependentEquations {
        r = R*(1+TC*(temp-t_nom)), ! {0}
        gResistor = 1 / r
    }
    topologicalDescription {
        pad plus units=volts
        pad minus units=volts
        branch resistor plus minus units=amps
    }
    argumentDeclaration {
        vResistor = across(plus, minus)
    }
    argumentDependentEquations {
        throughValueFor(resistor) = vResistor*gResistor
    }
}
```

The Analog Model Description Language assumes the existence in the simulator of standard mathematical support and the approximation operators "ddt( )", "delay( )", "bessel1( )", and "integral( )". The operator "ddt( )" is a derivative approximation of the argument with respect to time. The other approximation operators "delay( )", "bessel2( )", and "integral( )" are needed to implement the standard Spice transmission line and bipolar transistor models, and the not-so-standard Josephson junction mode 1, respectively.

Appendices A and B are, respectively, "lex" and "yacc" files that together rigorously define the Analog Model Description Language. The "lex" file defines the tokens of the Analog Model Description Language, while the "yacc" file defines all of the permitted sequences of those tokens.

AN EXAMPLE OF A MODEL DEFINITION USING A MODEL UNKNOWN

In this example, the employment of an unknown in the topologicalDescription sub-block permits definition of an inductor in the modified-nodal analysis form of TekSpice2. Note also the use of derivative operator "ddt( )". The following is a complete description of a positive constant-inductor model:

```
modelDefinition inductor {
    defaultParameterValues {
        L=1      ,[0, infinity)
    }
    topologicalDescription {
```

-continued
```
        pad in units=volts
        pad out units=volts
        branch inductor in out units=amps
        unknown i units=amps
    }
    argumentDefinition {
        v1=across(in,out)
        i1=value(i)
    }
    argumentDependentEquations {
        phi=L*i1
        throughValueFor(inductor)=i1
        constraintFor(i)=ddt(phi)=v1
              /* Constraint v1=ddt(phi) */
    }
}
```

The Analog Model Description Language is highly flexible, in that it allows the user to include as many unknowns as desired in the solution vector. While the desire to reduce simulation time usually leads one to include as few unknowns as possible in the solution vector, different topological forms may exhibit superior behavior numerically due to the approximation methods used to solve the system unknowns. The Analog Model Description Language permits such varied descriptions. For example, Appendix N shows an Analog Model Description Language file describing a diode model in a topological form suitable for modified nodal analysis, with three node voltages in the solution vector as system unknowns. Appendix O is a similar file, but in a topological form suitable for the tableau method, with three node voltages, two branch currents, and a junction capacitance all appearing in the solution vector as system unknowns. Appendix P is yet another such file, but in the modified tableau method, with three node voltages and two branch currents as system unknowns. Finally, Appendix Q is another file in the modified tableau method, but with only two node voltages and one branch current appearing in the solution vector.

Appendix U (Prior Art) to this document is a paper, that was given at the 1987 Automated Design and Engineering for Electronics—West conference, entitled "A Simulator for Designing Mixed Technology Systems" by Doug Johnson of Analogy Inc. This paper describes the Saber system and, at page 230, shows an example of the MAST language. Appendix R is an example of how the same devices may be defined using the Analog Model Description Language of the present invention. Appendix R contains two pages. The first is the model description for the error amplifier, while the second is the model description for the motor and tachometer.

The model language compiler 14, provides lexical and syntactical analysis. "Principles of Compiler Design" by Aho and Ullman, Addison-Wesley Publishing Company, (1977), hereby incorporated by reference, explains lexical and syntax analyzers and parser generators. The model language compiler 14 is written in SmallTalk-80, although it could be written in other languages, especially other object oriented languages. When the model language compiler 14 is presented with an allowed sequence of tokens, it builds a corresponding object to represent that allowed sequence. When the compiler is presented with a sequence of tokens that is not allowed, it produces an error message 15 for the operator. To optimize its output, the model language compiler also looks for repeated common sub-expressions, and as they are found, sets all references for such a common sub-expression to a single definition.

Figure 2:
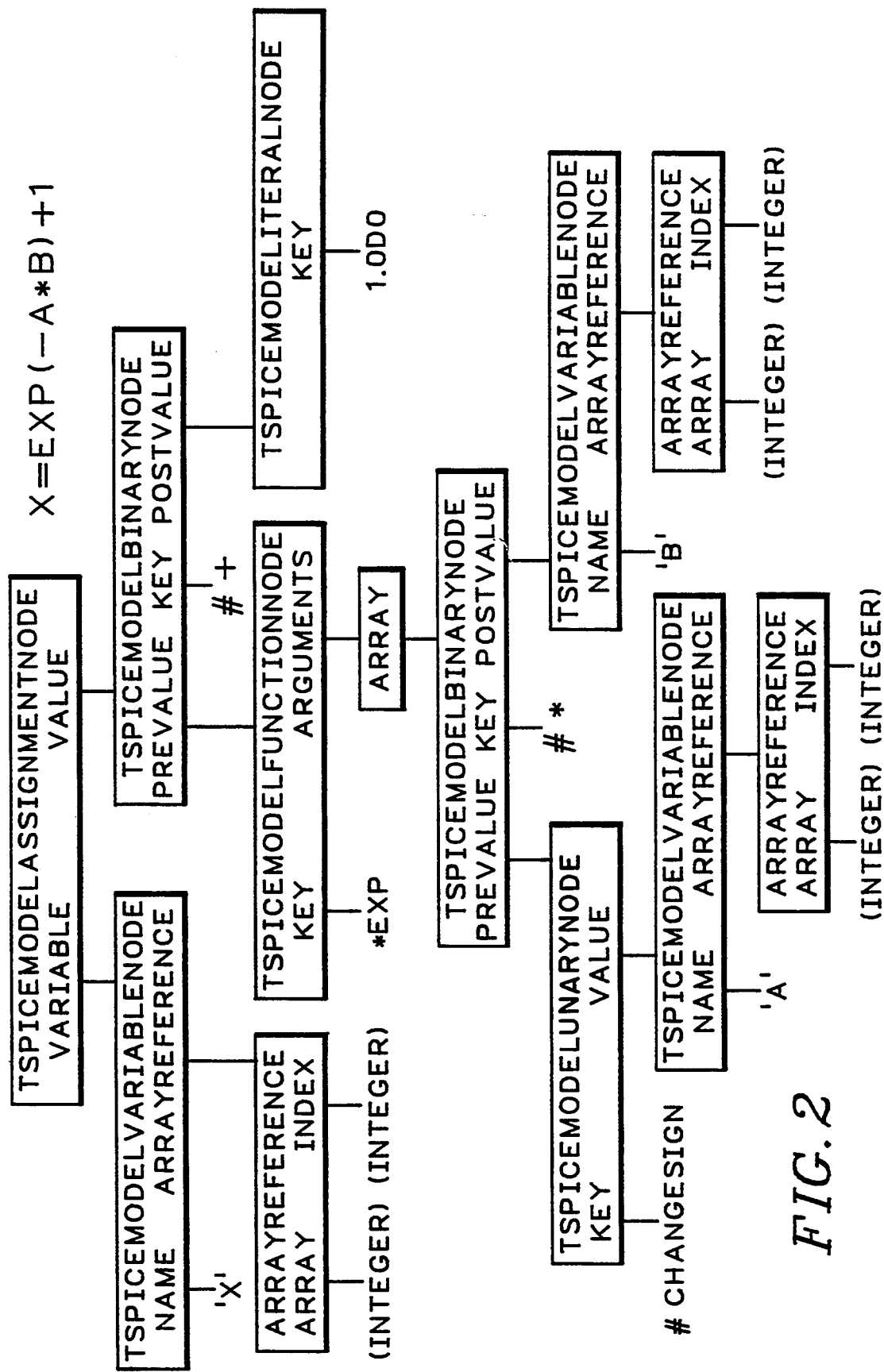
FIG. 2 is an example of a model behavior code parse tree.

The model language compiler 14 produces two outputs, model structure data 18 and model behavior code parse trees 16, in addition to the error messages 15. FIG. 2 is an example of a model behavior code parse tree and the equation that it is based on. The present system follows the post-order convention for parse tree traversal. As will be explained in detail below, the model behavior code parse trees 16 produced by the model language compiler 14 can be linked to "FAndGradF" objects, that permit arithmetic operators to accommodate differentials in the operands that they operate on.

Model structure data 18 includes an input parameters list and "map-in" and "map-out" data. During the iterative system solution process, initial arguments and parameters are used by the argument-dependent model code to produce a numerical results file. "Map-out" is the code that is used to transfer the data from the model's numerical results into the linear system equation of a gradient based simulation. Solution of the linear system equations produces a solution vector. "Map-in" is the code that converts the data in the solution vector back into the values of the arguments for the next iteration. Thus, each iteration consists of: first, mapping-in values from the solution vector to the arguments; next, evaluating argument-dependent equations using those values; and then, mapping-out the "through" and "constraint" quantities into the linear system equations which are solved again to complete the iteration.

The model debugger 26 accepts the verified parse trees from the data flow analyzer and model structure data from the model language compiler and executes it in a pseudo-machine environment. Because it is not running compiled machine level code but rather using a program to interpret the incoming stream of high level instructions and emulate the behavior of the actual simulator, the execution is much slower than execution of the compiled code produced by the C code model printer. However, this slow execution is a reasonable tradeoff, in that it permits debugging of Analog Model Description Language programs directly in an environment that returns much more meaningful information when errors are encountered, and permits the stepping through of instructions and the viewing of intermediate results and the values of all variables, so that debugging is made feasible in a way that it would not be along the main path through the C code model printer.

The model debugger 26 is a modified version of the standard SmallTalk-80 debugger. The modifications make it more suitable for executing the verified parse trees 22. Each node in these parse trees (FIG. 2) knows how to execute itself in a suitable context containing the values of the variables that it needs. The top node in the tree, the assignment (=) node, is sent a message to "execute in this context" and the context is supplied. The top node then passes the same message to the subtree representing its right-hand-side. The node at the top of the right-hand-side subtree, the "+" sign, then passes this message to each of its subtrees. The subtree nodes to its left keep passing the message down, until the bottom nodes eventually are reached. They extract any values that they need from the supplied context, perform their computations, and pass the results back up to the nodes above them. The top node of the right-hand-side subtree eventually receives the information that it needs from the nodes on its left-hand-side, adds the postValue "1" to that, and passes the result back to the top node, the equals sign. The top node then tells the node to its left, "X", to store its new value in the supplied context. This figure, FIG. 2, is discussed in more detail below, in connection with the C code model printer 40.

The model debugger 26 calculates partial derivatives using "FAndGradF", which is explained in detail below. "FAndGradF" uses a numerical approach and produces actual values of the variables that it operates on. "CodeGenFAndGradF", which is used to replace "FAndGradF" in the high level to scalar translator 32, is analogous, but it uses a symbolic approach and produces C code when it reaches the C code model printer 40. This C code then does the actual numerical calculations after it is linked into the C code of the main program of the Analog Circuit Simulator 10.

Because the model debugger 26 is executing parse trees instead of regular SmallTalk-80 code, there are some differences in its user interface and the information that is available to the user. In the regular SmallTalk debugger, the debugger constructs a map between the source code and the compiled method before it calls the SmallTalk interpreter to perform executions. It is therefore able to print out the source code for the user as he steps through or halts on an instruction.

In the model debugger 26 of the present invention, there is no interpreter for the compiled model code; it executes itself as described above. The model debugger 26 does not create a map between the test representation of the model code and the parse nodes, but rather it asks each code statement to construct a text representation of itself. Each node/object of the model behavior code parse trees 16 includes methods for responding to messages making such requests. For example, the top node equal sign of FIG. 2, when presented with such a request, would ask its left-hand-side node to print out its name, then itself print an equal sign, then ask its right-hand-side node to print out its name. The right-hand-side node would have to make similar requests of the nodes below it in order to complete its printout.

Figure 3:
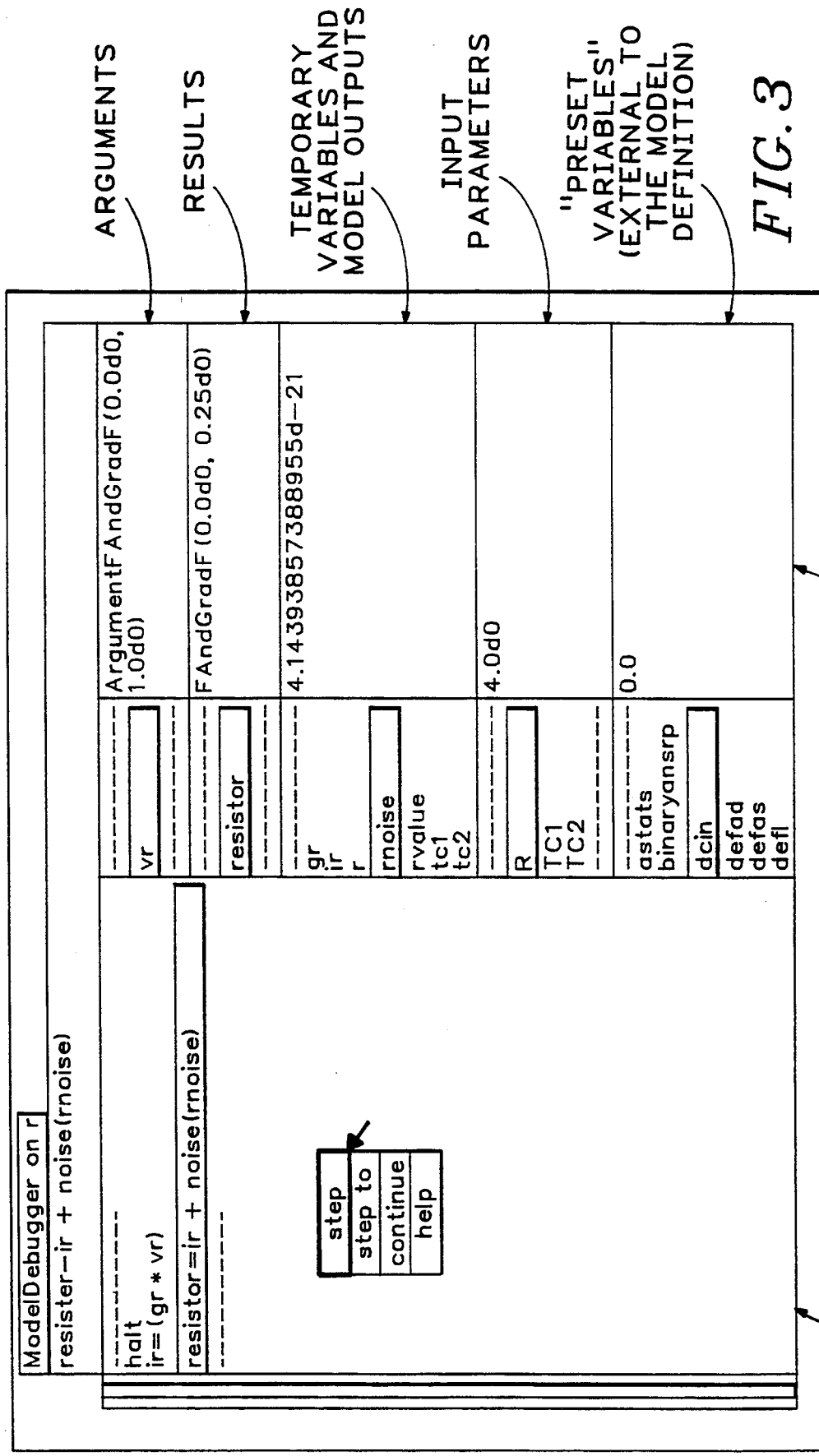
FIG. 3 is a screen view of the user interface of the model debugger.

FIG. 3 is a sample screen from the model debugger 26 engaged in the process of debugging a resistor model, r. As the annotations indicate, the pane on the left is used to step through code statements or view a statement that has been halted on. The panes on the right are used to inspect values stored in variables. The pane at the top on the right displays argument values. The second pane down on the right displays the values of the "through" and "constraint" variables that will be mapped out into the linear system equations. The third pane down on the right displays temporary variables and model outputs. The fourth pane down on the right displays input parameters. The fifth and final pane on the right displays preset global variables, those that are external to the model definition.

After the model description language file 12 has been successfully debugged, the resulting verified parse trees 22 are forwarded from the data flow analyzer 20 to the high level to scalar translator 32. The high level to scalar translator 32 produces scalar code parse trees 34 that are specialized to perform tests in each of the following modes: dc/bias, transient, ac, noise, and sensitivity. The translation mode control 33 informs the high level to scalar translator 32 and the C code model printer 40 about the requirements of each mode. The high level to scalar translator 32 produces appropriately different code for efficiently performing the requirements of each mode, so that C code modules for each test are available for selection by the analysis control program 48.

The high level to scalar translator 32 has the ability to produce SmallTalk-80 objects capable of writing C code representing arithmetic operators that permits those operators to manipulate expressions containing derivatives with respect to a plurality of arguments. This capability is fundamental to automatically constructing a C code TekSpice2 model file 44 that includes all of the operations necessary for gradient based non-linear analysis. The same technique could be used with other templates to produce code for other simulators, e.g., Berkeley's Spice3. The Saber TM software of the prior art, in contrast, numerically evaluates the equations in their compiled language description over a range of space and passes on tables of the results obtained to the generic code of the simulator which interpolates from these tables as needed to perform the simulation.

The FAndGradF and CodeGenFAndGradF objects have the general form:

$$\begin{bmatrix} y \\ \overline{dy/dx1} \\ \cdot \\ \cdot \\ \cdot \\ dy/dxN \end{bmatrix}$$ where $y$ is the variable and $x1$ through $xN$ are the arguments that $y$ may be differentiated with respect to.

Since the derivatives of arguments are either 1, for derivatives with respect to itself, or 0 for a derivative with respect to another argument, the arguments may then be defined as:

$$\begin{bmatrix} \frac{x1}{1} \\ 0 \\ \cdot \\ \cdot \\ 0 \end{bmatrix} \begin{bmatrix} \frac{x2}{0} \\ 1 \\ 0 \\ \cdot \\ \cdot \end{bmatrix} \cdots \begin{bmatrix} \frac{xN}{0} \\ \cdot \\ \cdot \\ 0 \\ 1 \end{bmatrix}$$

The class of objects FAndGradF contains methods for every arithmetic or algebraic relationship that may occur in an analog model. These include addition, subtraction, multiplication, division, exponentiation, absolute value, trigonometric functions and their inverses and hyperbolics, ceiling, floor, coerce, degrees-to-radians, and radians-to-degrees, fractional-part, integer-part, natural logarithm, logarithm-in-base-y, negation, power-of-ten, real-part, imaginary-part, reciprocal, rounded-off, square-root, minimum, maximum,, modulus, raised-to-power-of, and sign. In most cases these methods can operate on either scalar (argument-independent) or gradient (argument-dependent) quantities.

A few examples of these methods used by the class FAndGradF are explained below. These methods generally have the following form: they begin with the method name in boldface, followed by a comment in quotes summarizing the function of the method, followed by the SmallTalk-80 code that implements the method. The up-arrow symbol means "return the following object". The implementing code in these methods is at two levels. The lower level exists in two forms: a standard SmallTalk implementation, and a version that utilizes extended primitives written in C code for faster execution. The method "FAndGradF operand: opcode:" has been added as a primitive to the SmallTalk interpreter. In the examples that follow, the FAndGradF methods which access the added SmallTalk primitives are shown first and then the SmallTalk back-up code that further implements them.

EXAMPLES OF HIGH LEVEL CODE:

abs
    "Answer abs(self)"

↑ (self class new: self size)
    operand: self
    opcode: Abs exp
    "Answer exp(self)"

↑ (self class new: self size)
    operand:self
    opcode: Exp sin
    "Answer sin(self)"

↑ (self class new: self size)
    operand: self
    opcode: Sin

CORRESPONDING BACK-UP CODE:

stAbs
    "Answer the absolute value of the receiver"
    self value < 0.0d0
      ifTrue:

[↑self negated]
      ifFalse:

[↑self]
stExp
    "Answer exp(self)."
    | newVec expf |
    newVec <— self species new: self size.
    expf <— self value exp.
    newVec value: expf.
    1 to: self size do: [:index | newVec derivativeAt: index put: (self derivativeAt: index) * expf].

↑newVec
stSin
    "Answer sin(self)."
    | newVac fPrime u |
    newVec <— self species new: self size.
    u <— self value.
    newVec value: u sin.
    fPrime <— u cos.
    1 to: self size do: [:index | newVec derivativeAt: index put: (self derivativeAt: index) * fPrime.

↑newVac

Let us examine how the last examples in these two lists produce a sine function that operates on derivatives of functions as well as the functions themselves. In general, dy/dx=dy/du*du/dx, so for the function "y=sin(u)", the derivative of y with respect to x is "dy/dx=cos (u) *du/dx".

Noting that when the object form described above is applied to a function of a function:

$$f\left(\begin{bmatrix} u \\ \overline{du/dx1} \\ \cdot \\ \cdot \\ \cdot \\ du/dxN \end{bmatrix}\right) = \begin{bmatrix} f(u) \\ \overline{(df/du)(du/dx1)} \\ \cdot \\ \cdot \\ \cdot \\ (df/du)(du/dxN) \end{bmatrix}$$

Thus, the code for the sine function should produce an object having this form that is equivalent to the relationship "dy/dx=cos(u)*du/dx". Examining this code we see that the last line returns newVec, a vector containing the result dy/dx=cos(u)*du/dx, for x1 to xN, in the form shown in the object shape above.

This result vector has a length the size of the original vector (self) that holds two sets of functions. The first part of newVec is y, the function value. This header is generated by the "newVec value: u sin". The (df/du) part of the object, which is cos(u) for this function, is generated by the "fPrime" portion of this line of code. "fPrime" contains the cosine of u as the result of the preceding line of code, "fPrime←u cos". The (du/dxN) part of the object, du/dx, is generated by the "(self derivativeAt: index)" part of the same line of code.

The second to the last line of this code,

"1 to: self size do: [:index|newVec derivativeAt:
    index put: (self derivativeAt: index) * fPrime."

stores the derivative value in the result vector.

Once this object has been created, the value of the derivative of y with respect to x3 can be obtained by sending a message to the new object identifying the argument index among the set of arguments dX1to dxN. The argument can be identified using the construct shown above:

$$\begin{bmatrix} x3 \\ \hline 0 \\ 0 \\ 1 \\ 0 \\ \cdot \\ \cdot \\ \cdot \\ 0 \end{bmatrix}$$

In response to this message the object returns "cos (u) *du/dx3". Thus, these arithmetic and algebraic objects have been "taught" to be aware of how (calculus) differentiation applies to them, i.e., they know the rules of calculus. For example, the multiplication method knows that the derivative of a product of two variables, u and v, with respect to x is u*dv/dx+v*du/dx:

$$\begin{bmatrix} u \\ \hline du/dx1 \\ \cdot \\ \cdot \\ \cdot \\ du/dxN \end{bmatrix} * \begin{bmatrix} v \\ \hline dv/dx1 \\ \cdot \\ \cdot \\ \cdot \\ dv/dxN \end{bmatrix} = \begin{bmatrix} u*v \\ \hline u*dv/dx1 + v*du/dx1 \\ \cdot \\ \cdot \\ \cdot \\ u*dv/dxN + v*du/dxN \end{bmatrix}$$

Similarly, the methods for all of the other FAndGradF objects carry with them an understanding of how differentiation pertains to them.

CodeGenFAndGradF objects create scalar code objects that carry with them the capacity to write themselves out in C code with the help of the C code model printer. In addition to the understanding of calculus that they share with FAndGradF objects, the methods associated with CodeGenFAndGradF also contain a penchant for code simplification. That is, they pay attention to when variables become zero as a result of differentiation, for example, and they act accordingly to simplify the code that they write to eliminate operations that become meaningless as a result of these occurrences.

---

CodeGenFAndGradF (CGFGF) EXAMPLE (addition):
+ aCGFGF

---

"Answer the sum of self with aCGFGF. The result
will contain a symbolic representation of the
operation on the function values and all active
partial derivatives."
    "Arguments:
        aCGFGF - <CodeGenFAndGradF>"

|self species new preOperand: self plusPostOperand: aCGFGF
preOperand: preOperand plusPostOperand: postOperand
    "Answer the sum of preOperand with postOperand.
The result will contain a symbolic representation of
the operation on the function values and all active
derivatives."
    "Arguments:
        preOperand - <CodeGenFAndGradF>
        postOperand - <CodeGenFAndGradF>"
| preDeriv postDeriv deriv |
context <— preOperand context.
activeDerivatives <— preOperand activeDerivatives bitOr:
    postOperand activeDerivatives.
functionValue <— preOperand functionValue + postOperand
    functionValue.
gradientValues <— Array new: (preOperand size max:
    postOperand size).
1 to gradientValues size do:
    [:i|
    preDeriv <— preOperand derivativeActiveFor: i.
    postDeriv <— postOperand derivativeActiveFor: i.
    preDeriv
        ifTrue: [postDeriv
            ifTrue: [deriv <— (preOperand derivativeAt:i)
                + (postOperand derivativeAt:i)]
            ifFalse:[deriv <— preOperand derivativeAt:i]]
        ifFalse: [postDeriv
            ifTrue: [deriv <— postOperand derivativeAt:i]
            ifFalse: [deriv <— nil]].
    gradientValues at: i put: deriv]

---

Note in this example how within the loop, 1 to the size of gradientValues, the flags preDeriv and postDeriv are set only if the corresponding operand contains an active derivative. Then if both flags are set, code is generated to calculate both derivatives and sum them. But if only one derivative is active, no summation is performed and the active derivative is returned as the sum, "deriv". If neither operand is flagged as active, a nil is returned. Each unnecessary operation that is avoided translates into better execution time within the analog circuit simulator 10 when the resulting code is compiled, linked and executed.

The scalar code parse trees 34 from the high level to scalar translator 32 go to an argument dependence analyzer 36. The argument dependence analyzer 36 optimizes the code by checking ostensibly argument-dependent equations to verify that they truly are argument-dependent and moving those that are not to the argument-independent portion of the code to produce repartitioned scalar code parse trees 38. Sometimes the process of differentiation turns a variable into a constant, for instance. This repartitioning also increases the speed of execution at run time.

Appendix C is an Analog Model Description Language file 12 for a diode model. Appendix D is a corresponding C code TekSpice2 model file 44 output produced from Appendix C by the method of the present invention. In the output file, any variable name with under scores has been generated by the method of the present invention.

Notes 1 and 2 in Appendix C show the use of "if" and "while" statements in the Analog Model Description Language. The "if" statement of Note 1 is being used to conditionally introduce the concept of breakdown voltages. The "while" statement of Note 2 is the iterative construct that performs the calculation of the crossover from the normal diode behavior curve to the breakdown voltage behavior curve.

The Analog Model Description Language has been structured to facilitate the complete mathematical description of a model. This description is free of algorithmic details that are features of approximate solution methods which may be employed to solve systems formed using a given model definition. However, the model description may be augmented by an individual knowledgeable in practical simulation to incorporate such algorithmic information. Further, special simulation outputs may be flagged or the generation of code for simulation methods of a particular type may be signaled through the use of "line modifiers" in a model definition. Line modifiers permit the tailoring of a model definition for a particular simulator. Appendix T is an example of another diode model description, first without and then with the use of such line modifiers.

The C code model printer 40 receives the repartitioned scalar code parse trees 38 in SmallTalk-80 and, using TekSpice2 simulator model templates 42 that are themselves SmallTalk-80 subroutines, converts the partitioned scalar code parse trees 38 into a C code file, TekSpice2 TM model file 44, that is suitable for linking into the generic code of the analog circuit simulator 10. The output of this method is compatible with TekSpice2. TekSpice2 is like Spice3 from Berkeley (UCB) and the Saber TM simulator in that it is modular with respect to new models.

ArgumentFAndGradF is a class of objects used by the model debugger 26 to represent a model argument and initialize the argument values during the numerical evaluation process. CodeGenArgumentFAndGradF is a class of objects used by the high level to scalar translator 32 to represent a model argument and initialize the argument values during the code generation process. Appendix G is a definition of an ArgumentFAndGradF object, while Appendix H is a definition of a CodeGenArgumentFAndGradF object.

Each ArgumentFAndGradF and CodeGenArgumentFAndGradF object carries its argument number with it. Note 3 in Appendix H shows the argumentNumber being returned. Note 4 shows the point where "convergencePossible" is returned (left arrows "←" within single quotes are SmallTalk-80's representation of an underscore, while outside of such quotes the backarrow represents an assignment operator). The argument objects have limiting functions applied to them to ensure that the step size limit from iteration to iteration does not become too large. Multiple Note 5's in Appendix H show limit functions.

Referring now to Appendices D and G, some examples are shown of how the high level to scalar translator 32 actually generates the scalar code that the C code model printer 40 prints out as C code TekSpice2 model files 44 using the TekSpice2 simulator model templates 42.

Appendix I, MDSModelDefinition, is the highest level code of the system of the present invention. It includes the code that is represented by or controls the translation mode data 33, the high level to scalar translator 32, the argument dependence analyzer 36, the C code model printer 40, and the TekSpice2 simulator model templates 42.

One of the functions performed by MDSModelDefinition is C code generation. It also contains C code generation utilities. The C code generation portion of the MDSModelDefinition contains the TekSpice2 model templates 42 and the high level structure of the translation mode data 33.

The TekSpice2 model templates portion of the MDSModelDefinition code puts C function definition headers with variable declarations at the top of a function and then calls on these other Node blocks of code to fill in the details according to the contents of the repartitioned scalar code parse trees.

For example, Note 6 in Appendix D indicates the location of some header information in the resulting C code, beginning with a comment that is followed by the declaration of some variables. Note 7 in Appendix I is the SmallTalk C code generation code that produces the C code identified by Note 6. The "name" in "nextPutAll: name" is "d", since this is the diode model example.

The code identified by Note 8 in Appendix I is checking to see what local variables must be declared and whether they need to be "ints" or "doubles". Note 9 in Appendix I identifies the line of code that acts to print out the double declaration identified by Note 10 in Appendix D.

As well as producing this header information and orchestrating the activities of the other Node blocks of code, MDSModelDefinition also uses the "map-in" and "map-out" information discussed above to build the C code that controls the map-in and map-out functions (Note 11, Appendix D).

In order to actually write all of the C code, though, the MDSModelDefinition calls on TspiceModelBlockNode (Appendix J, page 4, bottom), which calls TspiceModelAssignmentNode (Appendix J, page 3, bottom) for each assignment statement in the block. If "if-then-else" or "while" statements are present, TspiceModelBlockNode will also make calls to TspiceIfNode or TspiceWhileNode as necessary.

Referring again now to FIG. 2, the expression "x=exp(−a*b)+1", which has been entered in the argument-dependent block, has been converted by the model language compiler 14 into the parse tree shown. The high level to scalar translator 32 now translates the verified parse tree 22 shown in FIG. 2 as follows.

The process begins by setting all external variable values (parameters and global variables) to scalar CodeGenFAndGradF (Appendix F) instances and all arguments to CodeGenArgumentFAndGradF (Appendix H) instances with appropriate derivatives activated. The method "generateCodeInContext:" is then sent to each code block. The receipt of this message first creates a new instance of TspiceCodeGenBlockNode (Appendix S). Each block sends the same method, generateCodeInContext: , to each of its assignment, if-else-then, and while, statements.

The TspiceModelAssignmentNode (Appendix J, page 3, bottom) is the top node representing the assignment expression used in the example of FIG. 2, and it receives the generateCodeInContext: message. It has two parts, a variable on the left-hand-side and a value for that expression on the right, and it forwards the generateCodeInContext: message to its right-hand-side, the value. The variable is represented by an instance of TspiceModelVariableNode (Appendix J, page 6), having the name "x" (string 'x' in SmallTalk notation) and an arrayReference indicating the address at which the variable value is to be stored in the variable context. An arrayReference consists of an ordered pair of integers representing which array within an array of arrays is referred to and the offset into that array.

The right-hand-side of the TspiceModelAssignmentNode, the value, is represented by a TspiceModelBinaryNode (Appendix J, page 4) whose key is the symbol constant "#+", and which has a preValue and a postValue. The preValue is a TspiceModelFunctionNode (Appendix J, page 5, top) having a key whose symbol constant is "#exp" and arguments, which are generally stored in an array, although in this instance the Array has only one entry, a TspiceModelBinaryNode representing the multiplication (key "#*") sign. The same message, generateCodeInContext:, is sent to each of these nodes also.

The preValue of the TspiceModelBinaryNode "#*" is a TspiceModelUnaryNode (Appendix J, page 5) whose key is "#changeSign" and whose value is a TspiceModelVariableNode (Appendix J, page 6) with name 'a'. The TspiceModelVariableNode for "a" also contains an array reference indicating its array and location within that array. The TspiceModelVariableNode (Appendix J, page 5) returns its value, an external variable or an argument, in the form of CodeGenFAndGradF which includes the derivatives of the variable with respect to the arguments.

The TspiceModelUnaryNode above the "a" variable node negates the value that it receives and returns it upward, again in the form of a CodeGenFAndGradF.

The right-hand-side or postValue of the TspiceModelBinaryNode with key "#*" is the TspiceModelVariableNode with name 'b', which also has an arrayReference. Again the value returned is in the form of a CodeGenFAndGradF.

The TspiceModelBinaryNode with key "#*" also returns a value in the form of a CodeGenFAndGradF to the TspiceModelFunctionNode to which it is the preValue.

The TspiceModelFunctionNode with key "#exp" performs its function, in this case exponentiation, on the CodeGenFAndGradF's, and returns a value in the same form to the binary node above it.

The postValue of the TspiceModelBinaryNode with key "#+" is a TspiceModelLiteralNode (Appendix J, page 5) with a key whose value is the literal "1.0d0" which is returned in the form of a CodeGenFAndGradF.

The "+" binary node above now has both a preValue and a postValue and can perform its operation and return CodeGenFAndGradF to the node above it, which is the TspiceModelAssignmentNode at the top of this parse tree.

The TspiceModelAssignmentNode (Appendix J, pages 3–4) now takes the value returned and puts it in "cGValue", registers the name of its variable and the names of the derivatives of that variable in the context, and enters the cGValue in "variable" which has the form shown for the method TspiceModelVariableNode (Appendix K). The TspiceModelVariableNode stores the result for the value back into the context, so that it can be accessed by later expressions, creates a TspiceCodeGenAssignmentNode (Appendix L) and gives it the name of the variable and the value that it holds. The TspiceCodeGenAssignmentNode is then passed back to the TspiceModelBlockNode. TspiceModelBlockNode manages temporary assignment statements to avoid re-execution of common sub-expressions. TspiceModelBlockNode uses the TspiceCodeGenAssignmentNode just created to put the value in fAndGradFValue, reassign the value to be just the function part, adds self to the block node, and then cycles through the active derivatives naming and calculating gradient values (Note 12, Appendix L).

To summarize in a simplified manner, generateCodeInContext messages are passed all the way down the tree and CodeGenFAndGradF's are passed back up to the assignment level, and the latter return TspiceCodeGenAssignmentNodes to the TspiceCodeGenBlockNode.

Appendix M, TspiceCodeGenValueNode, is a superclass object of the classes TspiceCodeGenBinaryNode, TspiceCodeGenUnaryNode, TspiceCodeGenFunctionNode, TspiceCodeGenVariableNode and TspiceCodeGenLiteralNode. It contains most of the methods used by all of these code generating nodes and implements these methods for all of the subclasses.

Some of the methods used perform minor optimizations of several types. Whenever the raise-to-a-power function might be used, a check is made to see if a small integer power is involved, in which case multiplication is used instead to enhance efficiency. And, if the number to be raised to a power can be determined to always be positive, the log and exponential functions are used instead, as being faster than the raise-to-a-power function.

LIST OF APPENDICES

Appendix A: Alex description of the tokens of the Analog Model Description Language.

Appendix B: A yacc description of the syntax of the Analog Model Description Language.

Appendix C: A sample of a model description language file for a diode model.

Appendix D: A sample of a TekSpice2 model file in C code for the diode model corresponding to the model description language file of Appendix C.

Appendix E: An example of the FAndGradF SmallTalk code.

Appendix F: An example of the CodeGenFAndGradF SmallTalk code.

Appendix G: An example of the ArgumentFAndGradF SmallTalk code.

Appendix H: An example of the CodeGenArgumentFAndGradF SmallTalk code.

Appendix I: An example of the MDSModelDefinition SmallTalk code.

Appendix J: An example of some miscellaneous SmallTalk code.

Appendix K: An example of the TspiceModelVariableNode SmallTalk code.

Appendix L: An example of the TspiceCodeGenAssignmentNode SmallTalk code.

Appendix M: An example of the TspiceCodeGenValueNode SmallTalk code.

Appendix N: An example of an Analog Model Description Language file describing a diode model in a topological form suitable for modified nodal analysis, with three node voltages in the solution vector.

Appendix O: An example of an Analog Model Description Language file describing a diode model in a topological form suitable for the tableau method, with three node voltages, two branch currents, and a junction capacitance all appearing in the solution vector.

Appendix P: An example of an Analog Model Description Language file describing a diode model in a topological form suitable for in the modified tableau method, with three node voltages and two branch currents appearing in the solution vector.

Appendix Q: Another example of an Analog Model Description Language file describing a diode model in a topological form suitable for the modified tableau method, but with only two node voltages and one branch current appearing in the solution vector.

Appendix R: An example of how the devices described in Appendix U would be defined using the Analog Model Description Language of the present invention.

Appendix S: An example of the TspiceCodeGenBlockNode SmallTalk code.

Appendix T: An example of a diode model description, first without and then with the use of line modifiers.

Appendix U: A paper that was given at the 1987 Automated Design and Engineering for Electronics—West conference, entitled "A Simulator for Designing Mixed Technology Systems" by Doug Johnson of Analogy Inc.

REFERENCES

Aho and Ullman, *Principles of Compiler Design*, Addison-Wesley Publishing Company, 1977.

L. W. Nagel, *SPICE2: A Computer Program to Simulate Semiconductor Circuits*, ERL Memo No. ERL-M520, Electronics Research Laboratory, University of California, Berkeley, May, 1975.

J. L. Shearer, A. T. Murray and H. H. Richardson, *Introduction to Systems Dynamics*, Addison-Wesley Publishing Co., Reading, Massachusetts, 1967.

J. Vlach and K. Singhal, *Computer Methods for Circuit Analysis and Design*, Van Nostrand Reinhold, 1983.

M. Vlach, *WATAND User's Manual, Version V1.09, 2nd edition*, Technical Report UW-EE-82-01, University of Waterloo, January, 1983.

C. W. Ho, A. E. Reuhli and P. A. Brennan, *The Modified Nodal Approach to Network Analysis*, Proc. 1974 International symposium on circuits and Systems, San Francisco, April, 1974, pp. 505–509.

The foregoing six references are hereby incorporated by reference.

While a preferred embodiment of the present invention has been shown and described, it will be apparent to those skilled in the art that many changes and modifications may be made without departing from the invention in its broader aspects. For example, different object-oriented languages could be used instead of SmallTalk-80, and different structured languages could be used instead of C. Some steps could be performed in a different order with some attendant rearrangement of assumptions. The claims that follow are therefore intended to cover all such changes and modifications as fall within the true spirit and scope of the invention.

APPENDIX A

```
%{
/*
 * Lex input for lexical analyser for MDS model-description language.
 *     $Author: graemeb $
 *     $Revision: 1.2 $ $Date: 90/01/15 15:34:34 $
 *     $Source: /tekcae/usr6/cae/projlib/mds/modelLanguage/RCS/mds.lex,v $
 */ include "y.tab.h"
%} letter              [a-zA-Z]

digit               [0-9]

alphanumeric        ({letter}|{digit})

identifier          {letter}{alphanumeric}* whiteSpace          [ \t\n]

punctuation         [()\[\]{},:]

assignmentOperator  = arithmeticOperator  [+\-*/^]

relationalOperator  ([<>]|==|!=|<=|>=)

booleanAnd          && booleanOr           "||"

not                 !

union               \\\/ engineeringFactor   ([afpnumkgt]|meg)

unsignedInt         {digit}+ exponent            (\-{unsignedInt}|\+{unsignedInt}|{unsignedInt})

exponentFactor      e{exponent} scaleFactor         ({exponentFactor}|{engineeringFactor})

fraction            \.{digit}* mantissa            (\.{unsignedInt}|{unsignedInt}{fraction}|{unsignedInt})
```

```
unsignedConstant    ({mantissa}{scaleFactor}|{mantissa})

comment         "/*""/"*"([^*/]|[^*]"/"|"*"[^/])*"*""*/"

other           .

%%
modelDefinition     {printf("\t\t%s\n",yytext);
            return MODEL_DEFINITION;} defaultParameterValues  {printf("\t%s\n",yytext);
            return DEFAULT_PARAMETER_VALUES;} argumentIndependentEquations    {printf("\t%s\n",yytext);
            return ARGUMENT_INDEPENDENT_EQUATIONS;} topologicalDescription  {printf("\t%s\n",yytext);
            return TOPOLOGICAL_DESCRIPTION;} argumentDefinition  {printf("\t%s\n",yytext);
            return ARGUMENT_DEFINITION;} argumentDependentEquations  {printf("\t%s\n",yytext);
            return ARGUMENT_DEPENDENT_EQUATIONS;} output      {printf("\t\t%s\n",yytext);
            return OUTPUT;} if          {printf("\t\t%s\n",yytext);
            return IF;} else        {printf("\t\t%s\n",yytext);
            return ELSE;} while       {printf("\t\t%s\n",yytext);
            return WHILE;} halt        {printf("\t\t%s\n",yytext);
            return HALT;} print       {printf("\t\t%s\n",yytext);
            return PRINT;} pad         {printf("\t\t%s\n",yytext);
            return PAD;} node        {printf("\t\t%s\n",yytext);
            return NODE;} branch      {printf("\t\t%s\n",yytext);
            return BRANCH;} unknown     {printf("\t\t%s\n",yytext);
            return UNKNOWN;} collapseTo  {printf("\t\t%s\n",yytext);
            return COLLAPSE_TO;} units       {printf("\t\t%s\n",yytext);
            return UNITS;} across      {printf("\t\t%s\n",yytext);
            return ACROSS;} value       {printf("\t\t%s\n",yytext);
            return VALUE;} throughValueFor     {printf("\t\t%s\n",yytext);
            return THROUGH_VALUE_FOR;} constraintFor       {printf("\t\t%s\n",yytext);
            return CONSTRAINT_FOR;}

{unsignedConstant}  {printf("Constant \t %s\n",yytext);
            return UNSIGNED_CONSTANT;}

{identifier}    {printf("Identifier\t %s\n",yytext);
            return IDENTIFIER;}

{assignmentOperator}    {printf("Assignment \t %s\n",yytext);
            /* return the operator character */
            return '=';}

{arithmeticOperator}    {printf("\t\t %s\n",yytext);
            /* return the operator character */
            return (int) yytext[0];}

{relationalOperator}    {printf("Relop\t\t %s\n",yytext);
            return RELATIONAL_OPERATOR;}

{booleanAnd}    {printf("BooleanAnd \t%s\n",yytext);
            return BOOLEAN_AND;}

{booleanOr}     {printf("BooleanOr \t%s\n",yytext);
            return BOOLEAN_OR;}
```

```
{union}         {printf("Union    \t%s\n",yytext);
         return UNION;}

{whiteSpace}        ;

{punctuation}   {printf("\t\t %s\n",yytext);
         return (int) yytext[0];}

{not}           {printf("\t\t %s\n",yytext);
         return (int) yytext[0];}

{comment}       printf("Comment \t %s\n",yytext);

{other}         {printf("Illegal char**** \t %s\n",yytext);
         return -1; /* error condition */}
```

APPENDIX B

```
%{

/*
 * Yacc input for parser for MDS model-description language
 *
 * Notes:
 * A "sequence" is zero or more items.
 * A "list" is zero or more items separated by commas.
 *
 * $Author: graemeb $
 * $Revision: 1.2 $ $Date: 90/01/15 15:35:47 $
 * $Source: /tekcae/usr6/cae/projlib/mds/modelLanguage/RCS/mds.yacc,v $
 */ include <stdio.h>
extern char yytext[];     /* current token */
extern int yylineno;      /* current input line number */ main ()
{
    yyparse();
} yyerror(s)
    char * s;
{
    fputs(s, stderr);
    fprintf(stderr, " on line %d, token '%s'.", yylineno, yytext);
    putc('\n', stderr);
}
%}

/*
 * Keyword token declarations
 *
 */

%token  MODEL_DEFINITION              /* modelDefinition         */
%token  DEFAULT_PARAMETER_VALUES      /* defaultParameterValues  */
%token  ARGUMENT_INDEPENDENT_EQUATIONS /* argumentIndependentEquations */
%token  TOPOLOGICAL_DESCRIPTION       /* topologicalDescription  */
%token  ARGUMENT_DEFINITION           /* argumentDefinition      */
%token  ARGUMENT_DEPENDENT_EQUATIONS  /* argumentDependentEquations */
%token  OUTPUT              /* output        */
%token  IF                  /* if            */
%token  ELSE                /* else          */
%token  WHILE               /* while         */
%token  HALT                /* halt          */
%token  PRINT               /* print         */
%token  PAD                 /* pad           */
%token  NODE                /* node          */
%token  BRANCH              /* branch        */
%token  UNKNOWN             /* unknown       */
%token  COLLAPSE_TO         /* collapseTo    */
%token  UNITS               /* units         */
%token  ACROSS              /* across        */
%token  VALUE               /* value         */
%token  THROUGH_VALUE_FOR   /* throughValueFor */
%token  CONSTRAINT_FOR      /* constraintFor */

/*
 *
 *       /\                    /\
 *      /  \                  /  \
 *       |                     |
 *
 * symbol            actual language string
 */

/* Generic token declarations
 * (Single-character tokens represent themselves
 */

%token  UNSIGNED_CONSTANT
%token  IDENTIFIER
%token  RELATIONAL_OPERATOR
%token  BOOLEAN_AND
%token  BOOLEAN_OR
%token  UNION
```

```
%start primitiveDefinitionSequence

%%

/*
 * The term 'sequence' is used to refer to zero or more items.
 * The term 'list' is used to refer to zero or more comma-separated items.
 */ primitiveDefinitionSequence

: primitiveDefinitionSequence primitiveDefinition
    | /* nil */
    ;

primitiveDefinition
    : MODEL_DEFINITION IDENTIFIER '{' blocks '}' outputModifier blocks
    : defaultParameterBlock argumentIndependentEquationsBlock
      topologicalDescriptionBlock argumentDefinitionBlock
      argumentDependentEquationsBlock outputBlock
    ;

defaultParameterBlock
    : DEFAULT_PARAMETER_VALUES assignmentsBlock
    | /* nil */
    ;

argumentIndependentEquationsBlock
    : ARGUMENT_INDEPENDENT_EQUATIONS statementBlock
    | /* nil */
    ;

topologicalDescriptionBlock
    : TOPOLOGICAL_DESCRIPTION '{' topologicalElementSequence '}'
    ;

argumentDefinitionBlock
    : ARGUMENT_DEFINITION '{' argumentAssignmentSequence '}'
    | /* nil */
    ;

argumentDependentEquationsBlock
    : ARGUMENT_DEPENDENT_EQUATIONS '{' argumentDependentStatementSequence '}'
    ;

outputBlock
    : OUTPUT statementBlock
    | /* nil */
    ;

assignmentsBlock
    : '{' assignmentStatementSequence '}'
    ;

assignmentStatementSequence
    : assignmentStatementSequence assignmentStatement
    | /* nil */
    ;

statementBlock
    : '{' statementSequence '}'
    ;

topologicalElementSequence
    : topologicalElementSequence topologicalElement
    | /* nil */
    ;

topologicalElement
    : padDefinition
    | nodeDefinition
    | branchDefinition
    | unknownDefinition
    ;

padDefinition
    : PAD IDENTIFIER unitsSpecifier
    ;

nodeDefinition
    : NODE IDENTIFIER unitsSpecifier collapseModifier
    ;

branchDefinition
    : BRANCH IDENTIFIER IDENTIFIER IDENTIFIER unitsSpecifier
    ;

unknownDefinition
    : UNKNOWN IDENTIFIER unitsSpecifier
    ;

unitsSpecifier
    : UNITS '=' IDENTIFIER
    ;
```

```
collapseModifier
    : ':' COLLAPSE_TO '(' IDENTIFIER ',' IDENTIFIER ')' ':'
    | /* nil */
    ;

argumentAssignmentSequence
    : argumentAssignmentSequence argumentAssignment
    | /* nil */
    ;

argumentAssignment
    : IDENTIFIER '=' mapIn argumentLineModifier
    ;

mapIn
    : acrossMapIn
    | valueMapIn
    ;

acrossMapIn
    : ACROSS '(' IDENTIFIER ',' IDENTIFIER ')'
    | ACROSS '(' IDENTIFIER ',' IDENTIFIER ',' IDENTIFIER ')'
    ;

valueMapIn
    : VALUE '(' IDENTIFIER ')'
    ;

argumentLineModifier
    : ':' argumentModifierList ':'
    | /* nil */
    ;

argumentModifierList
    : argumentModifierItems
    | /* nil */
    ;

argumentModifierItems
    : argumentModifierItems ',' argumentModifier
    | argumentModifier
    ;

argumentModifier
    : IDENTIFIER
    | limitFunction
    ;

limitFunction
    : limitFunctionIdentifier '(' expressionList ')'
    ;

limitFunctionIdentifier
    : IDENTIFIER
    ;

argumentDependentStatementSequence
    : argumentDependentStatementSequence argumentDependentStatement
    | /* nil */
    ;

argumentDependentStatement
    : statement
    | mapOutAssignment
    ;

mapOutAssignment
    : mapOut '=' assignedValue
    ;

mapOut
    : throughValueMapOut
    | constraintMapOut
    ;

throughValueMapOut
    : THROUGH_VALUE_FOR '(' IDENTIFIER ')'
    | THROUGH_VALUE_FOR '(' IDENTIFIER ',' IDENTIFIER ')'
    ;

constraintMapOut
    : CONSTRAINT_FOR '(' IDENTIFIER ')'
    ;

statementSequence
    : statementSequence statement
    | /* nil */
    ;

statement
    : assignmentStatement
    | ifStatement
    | whileStatement
    | haltStatement
    | printStatement
    ;

assignmentStatement
    : IDENTIFIER '=' assignedValue
    ;
```

```
assignedValue
    : expression assignmentModifier
    ;

expression
    : term
    | expression '+' term
    | expression '-' term
    ;

term
    : factor
    | term '*' factor
    | term '/' factor
    ;

factor
    :'-' factor
    | primary
    | primary '^' factor
    ;

primary
    : '(' expression ')'
    | functionIdentifier '(' expressionList ')'
    | IDENTIFIER
    | UNSIGNED_CONSTANT
    ;

functionIdentifier
    : IDENTIFIER
    ;

expressionList
    : expressionItems
    | /* nil */
    ;

expressionItems
    : expression
    | expressionItems ',' expression
    ;

assignmentModifier
    : legalDomainModifier outputModifier
    ;

legalDomainModifier
    : ',' legalDomain
    | /* nil */
    ;

legalDomain
    : legalDomainComponent
    | legalDomain UNION legalDomainComponent
    ;

legalDomainComponent
    : legalDomainPrimitive
    | '!' legalDomainPrimitive
    ;

legalDomainPrimitive
    : range
    | set
    ;

range
    : lowerBoundarySymbol expression ',' expression upperBoundarySymbol
    ;

lowerBoundarySymbol
    : '('
    | '['
    ;

upperBoundarySymbol
    : ')'
    | ']'
    ;

set
    : '{' expressionList '}'
    ;

outputModifier
    : ':' outputList ':'
    | /* nil */
    ;

outputList
    : outputItems
    | /* nil */
    ;

outputItems
    : outputList ',' IDENTIFIER
    | IDENTIFIER
    ;
```

```
ifStatement
    : IF condition statementBlock elseStatement
    ;

condition
    : '(' booleanExpression ')'
    ;

elseStatement
    : ELSE statementBlock
    | /* nil */
    ;

booleanExpression
    : booleanTerm
    | booleanExpression BOOLEAN_OR booleanTerm
    ;

booleanTerm
    : booleanFactor
    | booleanTerm BOOLEAN_AND booleanFactor
    ;

booleanFactor
    : booleanPrimary
    ;

booleanPrimary
    : expression RELATIONAL_OPERATOR expression
    | '(' booleanExpression ')'
    | '!' '(' booleanExpression ')'
    ;

whileStatement
    : WHILE condition statementBlock
    ;

haltStatement
    : HALT
    ;

printStatement
    : PRINT expression
    ;
```

APPENDIX C

```
modelDefinition d {

/*   Tekspice diode model.
 *
 *   $Author: graemeb $
 *   $Revision: 1.1 $ $Date: 90/01/15 11:25:40 $
 *   $Source: /tekcae/usr6/cae/projlib/mds/modelDefinitions/RCS/d,v $
 */ defaultParameterValues {

AF=1.0 ,[0.1, infinity)
  /*Flicker noise exponent.*/

AREA=1.0 ,(0.0, infinity) : biasSensitivity :
  /*Scaling factor.*/

BV=infinity ,[0.0, infinity] : biasSensitivity :
  /*Reverse breakdown voltage. */

CJO=0.0 ,[0.0, 0.001]
  /*Zero-bias junction capacitance.*/

EG=1.11 ,[0.1, 2.0] : biasSensitivity :
  /*Energy gap potential.*/

FC=0.5 ,(0.0, 1.0)
  /*Forward-bias junction capacitance.*/

IBV=1e-3 ,(0.0, infinity) : biasSensitivity :
  /*Current at the reverse breakdown voltage.*/

IS=1e-14 ,(0.0, 0.001] : biasSensitivity :
  /*Saturation current.*/

KF=0.0 ,[0.0, infinity)
  /*Flicker noise coefficient.*/

M=0.5 ,(0.0, 0.9]
  /*Depletion capacitance grading coefficient.*/

N=1.0 ,(0.0, 5.0] : biasSensitivity :
  /*Emission coefficient.*/

PB=1.0 ,(0.0, infinity)
  /*Built-in junction potential.*/

PT=3.0 ,(0.0, 5.0] : biasSensitivity :
  /*Saturation current temperature exponent.*/

RS=0.0 ,[0.0, infinity) : biasSensitivity :
  /*Series ohmic resistance.*/
```

```
STATE=on  ,{off,on}
/*The initial conductive state of the device.*/

TT=0.0 ,[0.0, 0.001]
/*Transit time.*/

VDO=0.0
/*Initial junction voltage.*/
} argumentIndependentEquations { gs=AREA*spiceInvert(RS,0)

t=temp+273.15
  to=tnom+273.15
  ratio=t/to
  vt=k*t/q
  nvt=N*vt

/*calculate the coefficients for the modeling of the breakdown region*/
  if ( BV < infinity )
  { nvto=N*k*to/q                         <-- NOTE 1
    bvj=-5*nvto
    bid=AREA*IS*(exp(-5)-1)
    bgd=AREA*IS*exp(-5)/nvto
    xbvMustBeDetermined=true
    iterationCount=0
    xbv=-BV                               <-- NOTE 2
    while (xbvMustBeDetermined==true)
    { xbv=-BV+nvto*log(1+(IBV+bid+bgd*(xbv-bvj)-gmin*BV)/(nvto*bgd))
      ibv=bid+bgd*(xbv-bvj)-gmin*BV-nvto*bgd*(exp((xbv+BV)/nvto)-1)
      iterationCount=iterationCount+1      ,[1,25]
      if ( abs(ibv+IBV) <= reltol*IBV )
      { xbvMustBeDetermined=false }
      else
      { xbvMustBeDetermined=true }
    }
  }
  else
  { xbv=-infinity }

/*transform model parameter values to temperature adjusted values*/ is=IS*AREA*exp(EG*(ratio-1)/nvt)*ratio^(PT/N)   : tempAdjust :
  eg=1.16-0.000702*(t*t/(t+1108))
  vref=3*vt*log(ratio)-eg+1.1150877*ratio
  pb=PB*ratio-vref   : tempAdjust :
  cjo=CJO*AREA*(1+M*(0.0004*(t-to)+(1-pb/PB)))   : tempAdjust :

/*construct the linear coefficients used to define junction currents
    in their linear approximation regions*/ lvj=-5*nvt
  lid=is*(exp(-5)-1)
  lgd=is*exp(-5)/nvt

} topologicalDescription {
  pad  anode    units=volts
  pad  cathode  units=volts
  node iAnode   units=volts   : collapseTo(anode, RS) :
  branch junction iAnode cathode units=amps
  branch resistor anode iAnode units=amps
} argumentDefinition { vj=across(iAnode,cathode)   : spiceJunctionLimit(nvt,is,STATE) :
  vs=across(anode,iAnode)
} argumentDependentEquations { if (vj > xbv)
  { if (vj > lvj)
    { id=is*(exp(vj/nvt)-1)+gmin*vj }
    else
    { id=lid+lgd*(vj-lvj)+gmin*vj }
  }
  else
  { id=lid+lgd*(xbv-lvj)-nvt*lgd*(exp((xbv-vj)/nvt)-1)+gmin*vj }

/*determine the charge shared between the internal anode and cathode*/ qd=spiceDepletionCharge(vj,cjo,pb,M,FC)+TT*id

/*construct the squared noise amplitudes*/
  nrs=4*k*t*gs
  nid=2*q*abs(id)
  nfn=KF*abs(id)^AF/freq throughValueFor(junction)=id+ddt(qd)+noise(nid)+noise(nfn)
  throughValueFor(resistor)=gs*vs+noise(nrs)
}
```

```
output {

ID=id   : bias,initialAc :
  VD=vj+vs : bias,initialAc :
  REQ=1/gradient(id,vj)  : bias,initialAc :
  CAP=gradient(qd,vj)  : bias,initialAC :
        }
}
```

APPENDIX D

```
/******************************************************************
 *   SSource: /vice/u/caedev/projlib/mds/RCS/d.c,v S
 *   SRevision: 1.6 S
 *   SDate: 90/06/26 11:18:28 S
 *
 *   This program is the property of the cax center, TEKTRONIX, INC.
 *   and is protected under U.S. copyright law as unpublished work
 *   and, may not be distributed to, or copied by, persons outside of
 *   TEKTRONIX, INC. without express written permission. Use of this
 *   program is subject to the terms and conditions of the license
 *   granted by the cax center, TEKTRONIX, INC. Disclosure of this
 *   program or use not authorized by the license granted by the cax
 *   center, TEKTRONIX, INC., is strictly forbidden.
 ******************************************************************/ include "cPrimitives.h"
include "d.h"

/* Run the argument independent code for one element */
int
AI_d(_element, _circuit)             /* NOTE 6 */
circuitPrimitive *_element;
circuitData *_circuit;
{
        double _D1;                  /* NOTE 10 */
        if (RS == 0.0) {
                _D1 = 0.0;
        }
        else {
                _D1 = 1.0 / RS;
        }
        gs = AREA * _D1;
        t = 273.15 + temp;
        to = 273.15 + tnom;
        ratio = t / to;
        vt = k * t / q;
        nvt = N * vt;
        if (BV < infinity) {
                nvto = k * N * to / q;
                bvj = -5.0 * nvto;
                bid = AREA * IS * -0.993262053000914;
                bgd = AREA * IS * 0.00673794699908547 / nvto;
                xbvMustBeDetermined = true;
                iterationCount = 0.0;
                xbv = -BV;
                while (xbvMustBeDetermined == true) {
                        xbv = -BV + nvto * log(1.0 + (bid + IBV + bgd * (xbv - bvj) - BV * gmin) / (bgd * nvto));
                        ibv = bid + bgd * (xbv - bvj) - BV * gmin - bgd * nvto * (exp((BV - xbv) / nvto) - 1.0);
                        iterationCount = 1.0 + iterationCount;
                        if (!(1.0 <= iterationCount && 25.0 >= iterationCount)) {
                                _VALUE_OUT_OF_RANGE(iterationCount);
                        }
                        if (_ABS(ibv + IBV) <= IBV * reltol) {
                                xbvMustBeDetermined = false;
                        }
                        else {
                                xbvMustBeDetermined = true;
                        }
                }
        }
        else {
                xbv = -infinity;
        }
        is = AREA * IS * exp(EG * (ratio - 1.0) / nvt) * pow(ratio, PT / N);
        eg = 1.16 - 7.02e-4 * t * t / (1108.0 + t);
        vref = 3.0 * vt * log(ratio) - eg + 1.1150877 * ratio;
        pb = PB * ratio - vref;
        cjo = AREA * CJO * (1.0 + M * (4.0e-4 * (t - to) + 1.0 - pb / PB));
        lvj = -5.0 * nvt;
        lid = -0.993262053000914 * is;
        lgd = 0.00673794699908547 * is / nvt;
        nrs = 4.0 * k * t * gs;
        resistor_vs = gs;

return(OKAY);
}

/* Reset arguments using the designated solution vector */
int
RA_d(_loader, _solutionVector)
elementLoader *_loader;
double *_solutionVector;
{ register int _i;
        circuitPrimitive *_element;

for (_i = 0; _i < _loader->num_Elements; _i++) {

_element = _loader->elements[_i];

vj = _solutionVector[vj__plus] - _solutionVector[vj__minus];
                vs = _solutionVector[vs__plus] - _solutionVector[vs__minus];
        }       /* end for loop over elements */ return(OKAY);
```

```
/* Run the transient code for one element */
int
TR_d(_element, _circuit)
circuitPrimitive *_element;
circuitData *_circuit;
{
        double _D1;
        double _D2;
        if (vj > xbv) {
                if (vj > lvj) {
                        id = is * (exp(vj / nvt) - 1.0) + gmin * vj;
                        id_vj = is * exp(vj / nvt) * 1.0 / nvt + gmin;
                }
                else {
                        id = lid + lgd * (vj - lvj) + gmin * vj;
                        id_vj = gmin + lgd;
                }
        }
        else {
                id = lid + lgd * (xbv - lvj) - lgd * nvt * (exp((xbv - vj) / nvt) - 1.0) + gmin * vj;
                id_vj = -(lgd * nvt * exp((xbv - vj) / nvt) * -1.0 / nvt) + gmin;
        }
        if (vj > FC * pb) {
                _D1 = ((vj - FC * pb) * cjo * M / ((1.0 - FC) * pow(1.0 - FC , M) * pb) / 2.0 + cjo / pow(1.0 - FC , M) * (
                _D2 = (vj - FC * pb) * cjo * M / ((1.0 - FC) * pow(1.0 - FC , M) * pb) / 2.0 + cjo / pow(1.0 - FC , M) * cjc
        }
        else {
                _D1 = (1.0 - pow(1.0 - vj / pb , 1.0 - M)) * cjo * pb / (1.0 -*M);
                _D2 = -((1.0 - M) * pow(1.0 - vj / pb , 1.0 - M - 1.0) * -(1.0 / pb)) * cjo * pb / (1.0 - M);
        }
        qd = _D1 + id * TT;
        qd_vj = _D2 + id_vj * TT;
        junction = id + _DDT(qd , 0);
        junction_vj = id_vj + _DDT_DERIVATIVE(qd_vj);
        resistor = gs * vs;
}

/* Transient initializing loader -- "TransientLoaderToInitializeOperators" */
int
TI_d(_loader, _circuit, _convergencePossible)
int *_convergencePossible;
elementLoader *_loader;
circuitData *_circuit;

{ register int _i;
        circuitPrimitive *_element;
        double *_rhs;
        double *_solutionVector;

_solutionVector = _circuit->solutionVector;
        _rhs = _circuit->solution.rhs;

for (_i = 0; _i < _loader->num_Elements; _i++) {

_element = _loader->elements[_i];

vj__imposed = _solutionVector[vj__plus] - _solutionVector[vj__minus];
                vs__imposed = _solutionVector[vs__plus] - _solutionVector[vs__minus];

/* Update arguments */
                vj = _SPICE_BREAKDOWN_JUNCTION_LIMIT(vj__arg , nvt , is , xbv , _convergencePossible);
                vs = _UPDATE_REFERENCE_ARG_WITH_UNLIMITED_VALUE(vs__arg);

/* Run the transient code */
                TR_d(_element, _circuit);

}       /* end for loop over elements */
}

/* Transient non-bypassing loader -- "TransientLoadUsingPredictedSolutionVector" */
int
TP_d(_loader, _circuit, _convergencePossible)
int *_convergencePossible;
elementLoader *_loader;
circuitData *_circuit;

{
        register int _i;
        circuitPrimitive *_element;
        double *_rhs;
        double *_solutionVector;

_solutionVector = _circuit->solutionVector;
        _rhs = _circuit->solution.rhs;
```

```c
        for (_i = 0; _i < _loader->num_Elements; _i++) {

_element = _loader->elements[_i];

vj__imposed = _solutionVector[vj__plus] - _solutionVector[vj__minus];
                vs__imposed = _solutionVector[vs__plus] - _solutionVector[vs__minus];

/* Update arguments */
                vj = _SPICE_BREAKDOWN_JUNCTION_LIMIT(vj__arg , nvt , is , xbv , _convergencePossible);
                vs = _UPDATE_REFERENCE_ARG_WITH_UNLIMITED_VALUE(vs__arg);

/* Run the transient code */
                TR_d(_element, _circuit);

/* Run the mapout code */
                _ADDNN(junction__mapout_vj , junction_vj);
                _ADDN(_rhs , junction__res , junction - junction_vj * vj);
                _ADDNN(resistor__mapout_vs , resistor_vs);
        }       /* end for loop over elements */
}

/* Transient non-bypassing loader -- "LoadUsingSolutionVector" */
int
TN_d(_loader, _circuit, _convergencePossible)
int *_convergencePossible;
elementLoader *_loader;
circuitData *_circuit;

{ register int _i;
        circuitPrimitive *_element;
        double *_solutionVector;
        double *_rhs;
        double _sum;
        double _absoluteTolerance;
        double _relativeTolerance;
        _solutionVector = _circuit->solutionVector;
        _rhs = _circuit->solution.rhs;
        _absoluteTolerance = *_circuit->absoluteTolerance;
        _relativeTolerance = *_circuit->relativeTolerance;

for (_i = 0; _i < _loader->num_Elements; _i++) {

_element = _loader->elements[_i];
                _element->bypass = FALSE;

vj__imposed = _solutionVector[vj__plus] - _solutionVector[vj__minus];    } NOTE 11
                vs__imposed = _solutionVector[vs__plus] - _solutionVector[vs__minus];

if (*_convergencePossible) {

/* calculate delta argument values */
                        vj__delta = vj__imposed - vj;
                        vs__delta = vs__imposed - vs;

/* update linear results */
                        _sum = junction_vj * vj__delta;
                        junction__linear = junction + _sum;

}

/* Update arguments */
                vj = _SPICE_BREAKDOWN_JUNCTION_LIMIT(vj__arg , nvt , is , xbv , _convergencePossible);
                vs = _UPDATE_REFERENCE_ARG_WITH_UNLIMITED_VALUE(vs__arg);

/* Run the transient code */
                TR_d(_element, _circuit);

/* perform linearization check */
                if (*_convergencePossible) {
                        *_convergencePossible = (fabs(junction - junction__linear) <=
                                        fabs(junction) * _relativeTolerance - _absoluteTolerance);
                }

/* Run the mapout code */
                _ADDNN(junction__mapout_vj , junction_vj);
                _ADDN(_rhs , junction__res , junction - junction_vj * vj);
                _ADDNN(resistor__mapout_vs , resistor_vs);
        }       /* end for loop over elements */
}

/* Transient output loader -- "Run code to set values before printing outputs" */
int
TO_d(_loader, _circuit, _fdAnsr)
FILE *_fdAnsr;  /* input -- file descriptor of ansr file */
elementLoader *_loader;
circuitData *_circuit;

{ return(OKAY);

}

/* Run the dc code for one element */
```

```
int
DC_d(_element, _circuit)
circuitPrimitive *_element;
circuitData *_circuit;
{
        if (vj > xbv) {
                if (vj > lvj) {
                        id = is * (exp(vj / nvt) - 1.0) + gmin * vj;
                        id_vj = is * exp(vj / nvt) * 1.0 / nvt + gmin;
                }
                else {
                        id = lid + lgd * (vj - lvj) + gmin * vj;
                        id_vj = gmin + lgd;
                }
        }
        else {
                id = lid + lgd * (xbv - lvj) - lgd * nvt * (exp((xbv - vj) / nvt) - 1.0) + gmin * vj;
                id_vj = -(lgd * nvt * exp((xbv - vj) / nvt) * -1.0 / nvt) + gmin;
        }
        junction = id;
        junction_vj = id_vj;
        resistor = gs * vs;

}

/* Bias topology check loader -- "LoadUsingSigns" */
int
LS_d(_loader, _circuit, _convergencePossible)
int *_convergencePossible;
elementLoader *_loader;
circuitData *_circuit;

{
        register int _i;
        circuitPrimitive *_element;
        for (_i = 0; _i < _loader->num_Elements; _i++) {

_element = _loader->elements[_i];

/* Run the argument independent code */
                AI_d(_element, _circuit);

/*
                 * Set initial argument values to 0.0
                 */ vj__imposed = 0.0;
                vs__imposed = 0.0;

/*
                 * Initialize reference arguments with initial (flag) values
                 * The limiting function will test for this value
                 */ vj = POS_INFINITY;
                vs = POS_INFINITY;

/* Update arguments */
                vj = _SPICE_BREAKDOWN_JUNCTION_LIMIT(vj__arg , nvt , is , xbv , _convergencePossible);
                vs = _UPDATE_REFERENCE_ARG_WITH_UNLIMITED_VALUE(vs__arg);

/* Run the DC code */
                DC_d(_element, _circuit);

/* Run the mapout code */
                /* mapOut the sign of the results to the matrix */

_ADDNN(junction__mapout_vj, _SIGNUM(junction_vj ));
                _ADDNN(resistor__mapout_vs, _SIGNUM(resistor_vs ));
        }       /* end for loop over elements */
}

/* Bias initializing loader -- "LoadUsingInitialArguments" */
int
BI_d(_loader, _circuit)
elementLoader *_loader;
circuitData *_circuit;

{
        register int _i;
        circuitPrimitive *_element;
        double *_rhs;
        double _scaleValue;

_scaleValue = max(1.0e-6, _stepperVariable);
        _rhs = _circuit->solution.rhs;

for (_i = 0; _i < _loader->num_Elements; _i++) {

_element = _loader->elements[_i];

/* Run the mapout code */
                /* Scale results if element is off */
```

```
                if (STATE == OFF) {
                        _ADDNN(junction_mapout_vj , junction_vj * _scaleValue);
                        _ADDN(_rhs , junction_res , _scaleValue * (junction - junction_vj * vj));
                        _ADDNN(resistor_mapout_vs , resistor_vs * _scaleValue);
                }
                else {
                        _ADDNN(junction_mapout_vj , junction_vj);
                        _ADDN(_rhs , junction_res , junction - junction_vj * vj);
                        _ADDNN(resistor_mapout_vs , resistor_vs);
                }

}       /* end for loop over elements */
}

/* Bias non-bypassing loader -- "LoadUsingPredictedSolutionVector" */
int
BP_d(_loader, _circuit, _convergencePossible)
int *_convergencePossible;
elementLoader *_loader;
circuitData *_circuit;

{
        register int _i;
        circuitPrimitive *_element;
        double *_rhs;
        double *_solutionVector;
        double _scaleValue;

_scaleValue = max(1.0e-6, _stepperVariable);
        _solutionVector = _circuit->solutionVector;
        _rhs = _circuit->solution.rhs;

for (_i = 0; _i < _loader->num_Elements; _i++) {

_element = _loader->elements[_i];

vj_imposed = _solutionVector[vj_plus] - _solutionVector[vj_minus];
                vs_imposed = _solutionVector[vs_plus] - _solutionVector[vs_minus];

/* Update arguments */
                vj = _SPICE_BREAKDOWN_JUNCTION_LIMIT(vj_arg , nvt , is , xbv , _convergencePossible);
                vs = _UPDATE_REFERENCE_ARG_WITH_UNLIMITED_VALUE(vs_arg);

/* Run the DC code */
                DC_d(_element, _circuit);

/* Run the mapout code */
                /* Scale results if element is off */
                if (STATE == OFF) {
                        _ADDNN(junction_mapout_vj , junction_vj * _scaleValue);
                        _ADDN(_rhs , junction_res , _scaleValue * (junction - junction_vj * vj));
                        _ADDNN(resistor_mapout_vs , resistor_vs * _scaleValue);
                }
                else {
                        _ADDNN(junction_mapout_vj , junction_vj);
                        _ADDN(_rhs , junction_res , junction - junction_vj * vj);
                        _ADDNN(resistor_mapout_vs , resistor_vs);
                }

}       /* end for loop over elements */
}

/* Bias non-bypassing loader -- "LoadUsingSolutionVector" */
int
BN_d(_loader, _circuit, _convergencePossible)
int *_convergencePossible;
elementLoader *_loader;
circuitData *_circuit;

{
        register int _i;
        circuitPrimitive *_element;
        double *_solutionVector;
        double *_rhs;
        double _sum;
        double _absoluteTolerance;
        double _relativeTolerance;
        double _scaleValue;

_scaleValue = max(1.0e-6, _stepperVariable);
        _solutionVector = _circuit->solutionVector;
        _rhs = _circuit->solution.rhs;
        _absoluteTolerance = *_circuit->absoluteTolerance;
        _relativeTolerance = *_circuit->relativeTolerance;

for (_i = 0; _i < _loader->num_Elements; _i++) {

_element = _loader->elements[_i];
                _element->bypass = FALSE;

vj_imposed = _solutionVector[vj_plus] - _solutionVector[vj_minus];
                vs_imposed = _solutionVector[vs_plus] - _solutionVector[vs_minus];

if (*_convergencePossible) {
```

```
                        /* calculate delta argument values */
                        vj__delta = vj__imposed - vj;
                        vs__delta = vs__imposed - vs;

/* update linear results */
                        _sum = junction_vj * vj__delta;
                        junction__linear = junction + _sum;

}

/* Update arguments */
                vj = _SPICE_BREAKDOWN_JUNCTION_LIMIT(vj__arg , nvt , is , xbv , _convergencePossible);
                vs = _UPDATE_REFERENCE_ARG_WITH_UNLIMITED_VALUE(vs__arg);

/* Run the DC code */
                DC_d(_element, _circuit);

/* perform linearization check */
                if (*_convergencePossible) {
                        *_convergencePossible = (fabs(junction - junction__linear) <=
                                        fabs(junction) * _relativeTolerance - _absoluteTolerance);
                }

/* Run the mapout code */
                /* Scale results if element is off */
                if (STATE == OFF) {
                        _ADDNN(junction__mapout_vj , junction_vj * _scaleValue);
                        _ADDN(_rhs , junction__res , _scaleValue * (junction - junction_vj * vj));
                        _ADDNN(resistor__mapout_vs , resistor_vs * _scaleValue);
                }
                else {
                        _ADDNN(junction__mapout_vj , junction_vj);
                        _ADDN(_rhs , junction__res , junction - junction_vj * vj);
                        _ADDNN(resistor__mapout_vs , resistor_vs);
                }

}       /* end for loop over elements */
}

/* Bias bypassing loader -- "LoadUsingSolutionVector with bypassing" */
int
BB_d(_loader, _circuit, _convergencePossible)
int *_convergencePossible;
elementLoader *_loader;
circuitData *_circuit;

{
        register int _i;
        circuitPrimitive *_element;
        double *_solutionVector;
        double *_rhs;
        double _sum;
        double _absoluteTolerance;
        double _relativeTolerance;
        double _vnTolerance;
        double _scaleValue;

_scaleValue = max(1.0e-6, _stepperVariable);
        _solutionVector = _circuit->solutionVector;
        _rhs = _circuit->solution.rhs;
        _absoluteTolerance = *_circuit->absoluteTolerance;
        _relativeTolerance = *_circuit->relativeTolerance;
        _vnTolerance = *_circuit->vnTolerance;

for (_i = 0; _i < _loader->num_Elements; _i++) {

_element = _loader->elements[_i];

_element->bypass = TRUE;

vj__imposed = _solutionVector[vj__plus] - _solutionVector[vj__minus];
                vs__imposed = _solutionVector[vs__plus] - _solutionVector[vs__minus];

/* calculate delta argument values */
                vj__delta = vj__imposed - vj;
                vs__delta = vs__imposed - vs;

/* update linear results */
                _sum = junction_vj * vj__delta;
                junction__linear = junction + _sum;

/* determine if the dc code can be bypassed */
                if (_element->bypass) {
                        _element->bypass = fabs(vj__delta) <= _relativeTolerance *
                                        MAX(fabs(vj__delta), fabs(vj__imposed)) + _vnTolerance;
                        if (_element->bypass) {
                                _element->bypass = fabs(vs__delta) <= _relativeTolerance *
                                                MAX(fabs(vs__delta), fabs(vs__imposed)) + _vnTolerance;
                        }
                } if (_element->bypass) {
                        _element->bypass = fabs(junction__linear - junction) <=
                                        (_relativeTolerance * MAX(fabs(junction__linear), fabs(junction)) + _absoluteTolerance);
                }
```

```
                if (!_element->bypass) {
                        /* Update arguments */
                        vj = _SPICE_BREAKDOWN_JUNCTION_LIMIT(vj_arg , nvt , is , xbv , _convergencePossible);
                        vs = _UPDATE_REFERENCE_ARG_WITH_UNLIMITED_VALUE(vs_arg);

/* Run the DC code */
                        DC_d(_element, _circuit);

/* perform linearization check */
                        if (*_convergencePossible) {
                                *_convergencePossible = (fabs(junction - junction_linear) <=
                                                 fabs(junction) * _relativeTolerance + _absoluteTolerance);
                        }

}       /* end if (!_element->bypass) */

/* Run the mapout code */
                /* Scale results if element is off */
                if (STATE == OFF) {
                        _ADDNN(junction_mapout_vj , junction_vj * _scaleValue);
                        _ADDN(_rhs , junction_res , _scaleValue * (junction - junction_vj * vj));
                        _ADDNN(resistor_mapout_vs , resistor_vs * _scaleValue);
                }
                else {
                        _ADDNN(junction_mapout_vj , junction_vj);
                        _ADDN(_rhs , junction_res , junction - junction_vj * vj);
                        _ADDNN(resistor_mapout_vs , resistor_vs);
                }

}       /* end for loop over elements */
}

/* Bias output loader -- "Run code to set values before printing outputs" */
int
BO_d(_loader, _circuit, _fdAnsr)
FILE *_fdAnsr; /* input -- file descriptor of ansr file */
elementLoader *_loader;
circuitData *_circuit;

register int _i;
        double _D2;

circuitPrimitive *_element;
        double *_solutionVector;

_solutionVector = _circuit->solutionVector;

for (_i = 0; _i < _loader->num_Elements; _i++) {
                _element = _loader->elements[_i];

vj = _solutionVector[vj_plus] - _solutionVector[vj_minus];
                vs = _solutionVector[vs_plus] - _solutionVector[vs_minus];
                /* If element was bypassed, update arguments and run DC code */
                if (_element->bypass == TRUE)
                        /* Run the DC code */
                        DC_d(_element, _circuit);

/* Run the output code */
                /* no limiting or assignments to arguments are done here */ if (vj > FC * pb) {
                        _D2 = (vj - FC * pb) * cjo * M / ((1.0 - FC) * pow(1.0 - FC , M) * pb) / 2.0 + cjo / pow(1.0 - FC ,
                }
                else {
                        _D2 = -((1.0 - M) * pow(1.0 - vj / pb , 1.0 - M - 1.0) * -(1.0 / pb)) * cjo * pb / (1.0 - M);
                }
                qd_vj = _D2 + id_vj * TT;
                BI = id;
                REQ = 1.0 / id_vj;
                CAP = qd_vj;

WRITE_ELEMENT_OUTPUTS (_loader->outputMap[_circuit->outputSection],
                                                _element->elementNumber);
        }       /* end for loop over elements */ return (OKAY);
}

/* Dc output loader -- "Run code to set values before printing outputs" */
int
DO_d(_loader, _circuit, _fdAnsr)
FILE *_fdAnsr; /* input -- file descriptor of ansr file */
elementLoader *_loader;
circuitData *_circuit;

{
                return(OKAY);
}
static arrayReference locations [] = {
        5, 15,
        5, 17,
```

```
        5, 16,
        6, 5,
        6, 7,
        6, 6
};

static char *outputNames [] = {
        "BI",
        "CAP",
        "REQ",
        "cjo",
        "is",
        "pb"
};

static outputMapType analysisOutputs [] = {
        3, &locations[0], &outputNames[0],      /* Bias */
        3, &locations[0], &outputNames[0],      /* InitialAc */
        3, &locations[0], &outputNames[0],      /* InitialDc */
        3, &locations[0], &outputNames[0],      /* InitialTransient */
        3, &locations[3], &outputNames[3],      /* TemperatureAdjusted */
        0, NULL, NULL,  /* Ac */
        0, NULL, NULL,  /* Dc */
        0, NULL, NULL   /* Transient */
};

static
double parameterDefaults [] = {

1.0e0,     /* AF */
        1.0e0,     /* AREA */
        infinity,  /* BV */
        0.0e0,     /* CJO */
        1.11e0,    /* EG */
        0.5e0,     /* FC */
        0.001e0,         /* IBV */
        1.0e-14,         /* IS */
        0.0e0,     /* KF */
        0.5e0,     /* M */
        1.0e0,     /* N */
        1.0e0,     /* PB */
        3.0e0,     /* PT */
        0.0e0,     /* RS */
        1.0,       /* STATE */
        0.0e0      /* TT */
};

static char *parameterNames [] = {
        "AF",
        "AREA",
        "BV",
        "CJO",
        "EG",
        "FC",
        "IBV",
        "IS",
        "KF",
        "M",
        "N",
        "PB",
        "PT",
        "RS",
        "STATE",
        "TT"
};

static
double allValues [] = {
        0.1,
        infinity,
        0.0,
        infinity,
        0.0,
        0.001,
        0.1,
        2.0,
        0.0,
        1.0,
        0.0,
        0.9,
        0.0,
        5.0,
        2.0,
        off,
        on
};

static
struct rangeObject actualRanges[] = {

&allValues[0], InRangeIN,
        &allValues[2], InRangeNN,
        &allValues[2], InRangeII,
        &allValues[4], InRangeII,
        &allValues[6], InRangeII,
        &allValues[8], InRangeNN,
```

```
        &allValues[4],  InRangeNI,
        &allValues[2],  InRangeIN,
        &allValues[10], InRangeNI,
        &allValues[12], InRangeNI,
        &allValues[14], InSet
};

static
struct rangeUnion sharedUnions[] = {
        &actualRanges[0],  1,
        &actualRanges[1],  1,
        &actualRanges[2],  1,
        &actualRanges[3],  1,
        &actualRanges[4],  1,
        &actualRanges[5],  1,
        &actualRanges[6],  1,
        &actualRanges[7],  1,
        &actualRanges[8],  1,
        &actualRanges[9],  1,
        &actualRanges[10], 1
};

static
struct rangeUnion *parameterRanges [] = {
        &sharedUnions[0],
        &sharedUnions[1],
        &sharedUnions[2],
        &sharedUnions[3],
        &sharedUnions[4],
        &sharedUnions[5],
        &sharedUnions[1],
        &sharedUnions[6],
        &sharedUnions[7],
        &sharedUnions[8],
        &sharedUnions[9],
        &sharedUnions[1],
        &sharedUnions[9],
        &sharedUnions[7],
        &sharedUnions[10],
        &sharedUnions[3]
};

Init_d (_mod)
modelDefinition *_mod;
{
        register int _i;

double *_doubleBuffer;

(void) strcpy (_mod->name, "d");
        _mod->num_Arguments = 2;
        _mod->num_Results = 2;
        _mod->num_Intermediates = 12;
        _mod->num_Temporaries = 18;
        _mod->num_Pads = 2;
        _mod->num_Parameters = 16;

_mod->parameterDefaults = parameterDefaults;
        _mod->parameterNames = parameterNames;
        _mod->parameterRanges = parameterRanges;
        _mod->outputMap = analysisOutputs;

_doubleBuffer = CALLOC (47, double);
        _mod->tempWorkspace = CALLOC (18, fandfprime);
        for (_i=0; _i<18; _i++) {
                _mod->tempWorkspace[_i].fval = 0.0;
                _mod->tempWorkspace[_i].partialIndex = 0;
                _mod->tempWorkspace[_i].vectorSize = _mod->num_Arguments;
                _mod->tempWorkspace[_i].fprime = _doubleBuffer;
                _doubleBuffer += 2;
        }

_mod->deltaArgumentsWorkspace = _doubleBuffer;
        _doubleBuffer += 2;
        _mod->imposedArgumentsWorkspace = _doubleBuffer;
        _doubleBuffer += 2;
        _mod->linearResultsWorkspace = _doubleBuffer;
        _doubleBuffer += 2;
        _mod->scaledResultsWorkspace = _doubleBuffer;
        _doubleBuffer += 2;
        _mod->outputsWorkspace = _doubleBuffer;
        _mod->functionInstances [BESSEL2_INDEX] = 0;
        _mod->functionInstances [DDT_INDEX] = 1;
        _mod->functionInstances [DELAY_INDEX] = 0;
        _mod->functionInstances [INTEGRAL_INDEX] = 0;

_mod->arg_Indep = AI_d;
        _mod->reset_Arguments = RA_d;
        _mod->tran_Initialize = TI_d;
        _mod->tran_PredictedSoln = TP_d;
        _mod->tran_NonBypass = TN_d;
        _mod->tran_Output = TO_d;
        _mod->bias_Initialize = BI_d;
        _mod->bias_PredictedSoln = BP_d;
        _mod->signumLoad = LS_d;
        _mod->bias_NonBypass = BN_d;
```

```
      _mod->bias_Bypass = BB_d;
      _mod->bias_Output = BO_d;
      _mod->dc_Output = DO_d;

_mod->sourceStepped = FALSE;
      _mod->stateIndex = 14;
/*****************************************************************
 *   $Source: /vice/u/caedev/projlib/mds/RCS/d.h,v $
 *   $Revision: 1.3 $
 *   $Date: 90/06/26 11:18:25 $
 *
 *   This program is the property of the cax center, TEKTRONIX, INC.
 *   and is protected under U.S. copyright law as unpublished work
 *   and, may not be distributed to, or copied by, persons outside of
 *   TEKTRONIX, INC. without express written permission. Use of this
 *   program is subject to the terms and conditions of the license
 *   granted by the cax center, TEKTRONIX, INC. Disclosure of this
 *   program or use not authorized by the license granted by the cax
 *   center, TEKTRONIX, INC., is strictly forbidden.
 *****************************************************************/ define AF       (*(_element->parameters[0]))
define AREA     (*(_element->parameters[1]))
#define bgd      _element->model->tempWorkspace[6].fval
#define BI       _element->model->tempWorkspace[15].fval
#define bid      _element->model->tempWorkspace[5].fval
#define BI_vj    _element->model->tempWorkspace[15].fprime[0]
#define BV       (*(_element->parameters[2]))
#define bvj      _element->model->tempWorkspace[4].fval
#define CAP      _element->model->tempWorkspace[17].fval
#define CJO      (*(_element->parameters[3]))
#define cjo      _element->intermediates[5].fval
#define eg       _element->model->tempWorkspace[10].fval
#define EG       (*(_element->parameters[4]))
#define FC       (*(_element->parameters[5]))
#define freq     _circuit->temp_Variables[1].fval
#define gmin     _circuit->temp_Variables[10].fval
#define gs       _element->intermediates[11].fval
#define ibv      _element->model->tempWorkspace[9].fval
#define IBV      (*(_element->parameters[6]))
#define id       _element->intermediates[1].fval
#define id_vj    _element->intermediates[1].fprime[0]
#define IS       (*(_element->parameters[7]))
#define is       _element->intermediates[7].fval
#define iterationCount _element->model->tempWorkspace[8].fval
#define junction _element->results[0].fval
#define junction_vj _element->results[0].fprime[0]
#define junction__linear   _element->model->linearResultsWorkspace[0]
#define junction__mapout_vj _element->map[0][0]
#define junction__res 0
#define junction__zeroArgs _element->zeroArgumentResults[0]
#define KF       (*(_element->parameters[8]))
#define lqd      _element->intermediates[2].fval
#define lid      _element->intermediates[3].fval
#define lvj      _element->intermediates[4].fval
#define M        (*(_element->parameters[9]))
#define N        (*(_element->parameters[10]))
#define nfn      _element->model->tempWorkspace[14].fval
#define nfn_vj   _element->model->tempWorkspace[14].fprime[0]
#define nid      _element->model->tempWorkspace[13].fval
#define nid_vj   _element->model->tempWorkspace[13].fprime[0]
#define nrs      _element->model->tempWorkspace[12].fval
#define nvt      _element->intermediates[9].fval
#define nvto     _element->model->tempWorkspace[3].fval
#define pb       _element->intermediates[6].fval
#define PB       (*(_element->parameters[11]))
#define PT       (*(_element->parameters[12]))
#define qd       _element->intermediates[0].fval
#define qd_vj    _element->intermediates[0].fprime[0]
#define ratio    _element->model->tempWorkspace[1].fval
#define reltol   _circuit->temp_Variables[11].fval
#define REQ      _element->model->tempWorkspace[16].fval
#define resistor _element->results[1].fval
#define resistor_vs _element->results[1].fprime[1]
#define resistor__linear   _element->model->linearResultsWorkspace[1]
#define resistor__mapout_vs _element->map[1][1]
#define resistor__res 1
#define resistor__zeroArgs _element->zeroArgumentResults[1]
#define RS       (*(_element->parameters[13]))
#define STATE    (*(_element->parameters[14]))
#define t        _element->intermediates[10].fval
#define temp     _circuit->temp_Variables[2].fval
#define tnom     _circuit->temp_Variables[5].fval
#define to       _element->model->tempWorkspace[0].fval
#define TT       (*(_element->parameters[15]))
#define vj       _element->arguments[0].fval
#define vj__arg  0
#define vj__constraint _element->mapIns[0].plus
#define vj__delta _element->model->deltaArgumentsWorkspace[0]
#define vj__imposed _element->model->imposedArgumentsWorkspace[0]
#define vj__minus _element->mapIns[0].minus
#define vj__plus  _element->mapIns[0].plus
#define vref     _element->model->tempWorkspace[11].fval
#define vs       _element->arguments[1].fval
#define vs__arg  1
#define vs__constraint _element->mapIns[1].plus
```

```
#define vs__delta    _element->model->deltaArgumentsWorkspace[1]
#define vs__imposed  _element->model->imposedArgumentsWorkspace[1]
#define vs__minus    _element->mapIns[1].minus
#define vs__plus     _element->mapIns[1].plus
#define vt           _element->model->tempWorkspace[2].fval
#define xbv          _element->intermediates[8].fval
#define xbvMustBeDetermined _element->model->tempWorkspace[7].fval
#define _stepperVariable _circuit->stepperVariable
```

APPENDIX E

*From Tektronix Smalltalk-80 version TB2.2.2a of May 05, 1988, 18:14:03. on 19 September 1990 at 4:45:52 pm ADS version: ADS.2c3aTEK.007.LBa6.020*

——————————————————— FAndGradF ———————————————————

NumericByteArray variableByteSubclass: #FAndGradF                              FAndGradF
    instanceVariableNames: ''
    classVariableNames: 'Abs Add ArcCos ArcSin ArcTan ArcTan2 BinarySelectors Ceiling Coerce Cos DegreesToRadians Divide DoubleType Eq ErrorDictionary Exp Floor FloorLog10 FractionPart Ge Gt Imag IntegerPart Le Ln Log Logy Lt Max Min Mod Multiply Ne Negated PowerOfTen RadiansToDegrees RaisedTo Real RealImag RelationalSelectors Rounded Sin Sqrt STBinarySelectors STRelationalSelectors STUnarySelectors Subtract Tan UnarySelectors'
    poolDictionaries: ''
    category: 'Vector-Algebra'

FAndGradF comment:
'This class is an arithmetic system that behaves like DoubleFloat for arithmetic operations. In addition, when arithmetic operations are performed, the partial derivatives with respect to a set of arguments are evaluated. See the class method "initialize" for the operations supported as primitives by the class. Primitive execution requires use of the special ADS interpreter. Smalltalk execution is provided for all operations if the special interpreter is not used.

Author: 9 January 1989 graemeb; Modified: 30 Jan 1989 graemeb

Class variables:

| | |
|---|---|
| BinarySelectors | <Array> of selectors for the primitively-implemented binary methods |
| UnarySelectors | <Array> of selectors for the primitively-implemented unary methods |
| RelationalSelectors | <Array> of selectors for the primitively-implemented relational methods |
| DoubleType | <SmallInteger> code for DoubleFloat |
| ErrorDictionary | <Dictionary> of Strings containing the error messages |
| STRelationalSelectors | <Array> of selectors for the Smalltalk relational backup methods |
| STUnarySelectors | <Array> of selectors for the Smalltalk unary backup methods |
| STBinarySelectors | <Array> of selectors for the Smalltalk binary backup methods |

All of the below are of type <SmallInteger> and are the primitive codes for the primitively-implemented operators.

Abs Add ArcCos ArcSin ArcTan ArcTan2 Ceiling Coerce Cos DegreesToRadians Divide Eq Exp Floor FloorLog10 FractionPart Ge Gt Imag IntegerPart Le Ln Log Logy Lt Max Min Mod Multiply Ne Negated PowerOfTen RadiansToDegrees RaisedTo Real RealImag Rounded Sin Sqrt Subtract Tan ' accessing asDoubleFloat                                                              asDoubleFloat
        "Return the function value as a DoubleFloat."
        "Author: 1 Jan 1989 graemeb"

↑super at: 1 get:(DoubleFloat new) as: DoubleType at: index                                                                                                              at:
  *"FAndGradF is not to be accessed as an array."*
  *"Author: 1 Jan 1989 graemeb"*

↑self shouldNotImplement at: index put: aNum                                                                                                    at:put:
  *"FAndGradF is not to be accessed as an array."*
  *"Author: 1 Jan 1989 graemeb"*

↑self shouldNotImplement basicValue                                                                                                             basicValue
  *"Answer the contained value."*
  *"Author: 29 Jan 1989 graemeb"*

↑self derivativeAt: argumentNumber                                                                                           derivativeAt:
  *"Answer the derivative with respect to argument number 'argumentNumber'."*
  *"Arguments: argumentNumber - <SmallInteger>"*
  *"Author: 1 Jan 1989 graemeb"*

↑super at: (8*argumentNumber + 1) get: (DoubleFloat new) as: DoubleType derivativeAt: argumentNumber put: derivativeValue                                                                      derivativeAt:put:
  *"Store the derivative with respect to argument number 'argumentNumber' and answer the derivative value."*
  *"Arguments:*
       *argumentNumber - <SmallInteger>*
       *derivativeValue - <DoubleFloat>*
  "
  *"Author: 1 Jan 1989 graemeb"*

↑super at: (8*argumentNumber + 1) put: derivativeValue as: DoubleType derivativesAsVector                                                                                                    derivativesAsVector
  *"Answer a vector (of DoubleFloats) of the derivatives from this FAndGradF."*
  *"Author: 12 Jan 1989 graemeb; Modified 5 Apr 1989 graemeb"*

↑self class preferredArrayClass new array: self      *"Use FAndGradF as the byte array."*
                                   type: DoubleType    *"Type DoubleFloat."*
                                   length: self size   *"Number of derivatives."*
                                   inc: 8              *"Items are adjacent DoubleFloats."*
                                   first: 8            *"First derivative is byte 9 so send this stupid thing 9-1."* isVectorZero                                                                                                           isVectorZero
  *"Answer true if the function value and all derivatives are zero, else answer false."*
  *"Author: 9 Aug 90 graemeb"*

| double |
  double ← DoubleFloat new.
  0 to: self size do: [:i | (super at: (8*i + 1) get: double as: DoubleType) ~= 0.0d0 ifTrue: [↑false]].
  ↑true

*"* 13 Aug 90 4:10 pm graemeb *"* size                                                                                                                 size
     *"Return the number of partial derivatives."*
     *"Author: 1 Jan 1989 graemeb"*

↑super size / 8 - 1 value                                                                                                                value
     *"Return the function value as a DoubleFloat."*

"Author: 1 Jan 1989 graemeb"

↑super at: 1 get: (DoubleFloat new) as: DoubleType value: functionValue                                                                                                    value:
   "Store and answer the function value."
   "Arguments: functionValue - <DoubleFloat>"
   "Author: 1 Jan 1989 graemeb"

↑super at: 1 put: functionValue as: DoubleType mathematical functions
   performDdtWithFunctionInstance: instance                                              performDdtWithFunctionInstance:
      "Answer an FAndFPrime object ddt(self)."
      "Arguments: instance - <a special function instance>"
      "Author: 1 January 1989 graemeb"

↑instance performDdtWithArgument: self performDelayWithFunctionInstance: instance                                            performDelayWithFunctionInstance:
      "Answer an FAndFPrime object delay(self)."
      "Arguments: instance - <a special function instance>"
      "Author: 1 January 1989 graemeb"

↑instance performDelayWithArgument: self performIntegralWithFunctionInstance: instance                                         performIntegralWithFunctionInstance:
      "Answer an FAndGradF object integral(self)."
      "Arguments: instance - <a special function instance>"
      "Author: 14 May 90 graemeb"

↑instance performIntegralWithArgument: self

"* 15 May 90 12:26 pm graemeb *"

performSpiceBesselWithFunctionInstance:
   performSpiceBesselWithFunctionInstance: instance
      "Answer an FAndFPrime object bessel2(self)."
      "Arguments: instance - <a special function instance>"
      "Author: 1 January 1989 graemeb"

↑instance performSpiceBesselWithArgument: self spiceDepletionCharge: array                                                              spiceDepletionCharge:
   | cj pb mj fc vqj oneMinusFc oneMinusMj oneMinusFcRaisedToMj qj0 qj1 qj2 deltaVj one |
   "Answer the value of junction depletion charge for the given arguments using the spice formula."
   "Author: 16 Dec 88 graemeb; Modified: 29 Jan 1989 graemeb"

cj ← array at: 1.
   pb ← array at: 2.
   mj ← array at: 3.
   fc ← array at: 4.

vqj ← fc * pb.
   oneMinusMj ← 1.0d0 - mj.

self > vqj
      ifTrue:
         [oneMinusFc ← 1.0d0 - fc.
          oneMinusFcRaisedToMj ← oneMinusFc raisedTo: mj.
          qj0 ← cj * pb * (1.0d0 - (oneMinusFc / oneMinusFcRaisedToMj)) / oneMinusMj.
          qj1 ← cj / oneMinusFcRaisedToMj.
          qj2 ← cj * mj / (oneMinusFc * oneMinusFcRaisedToMj * pb).
          deltaVj ← self - vqj.

↑(((deltaVj * (qj2 / 2.0d0)) + qj1) * deltaVj) + qj0]
ifFalse:
 [one ← (self species new: self size) value: 1.0d0. *"This crap is to eliminate coercion for speed."*
 ↑(one - ((one - (self / pb)) raisedTo: oneMinusMj)) * (cj * pb / oneMinusMj)]

spiceInvert: specialValue                                                                   spiceInvert:
*"Answer the reciprocal of self if self not the special value. Answer zero if self is the special value."*
*"Author: 14 Dec 88 graemeb"* self = specialValue
 ifTrue: [↑0.0d0]
 ifFalse: [↑self reciprocal]

spiceJunctionCurrent: array                                                           spiceJunctionCurrent:
| nfvt is reverseBreakpointVtMultiplier lvj gmin factor lij lgj |
*"Answer the value of junction current for the given arguments using the spice formula."*
*"Author: 16 Dec 88 graemeb"* nfvt ← array at: 1.
is ← array at: 2.
reverseBreakpointVtMultiplier ← array at: 3.
lvj ← reverseBreakpointVtMultiplier * nfvt.
gmin ← array at: 4.

self > lvj
 ifTrue:
  [↑((self / nfvt) exp - 1.0d0) * is + (self * gmin)]
 ifFalse:
  [factor ← reverseBreakpointVtMultiplier exp.
  lij ← is * (factor - 1) + (gmin * lvj).
  lgj ← is * factor / nfvt + gmin.
  ↑(self - lvj) * lgj + lij]

arithmetic unary abs                                                                                          abs
*"Answer abs(self)"*
*"Author: 1 Jan 1989 graemeb"*

↑(self class new: self size)
 operand: self
 opcode: Abs arcCos                                                                                       arcCos
*"Answer arcCos(self)"*
*"Author: 1 Jan 1989 graemeb"*

↑(self class new: self size)
 operand: self
 opcode: ArcCos arcSin                                                                                       arcSin
*"Answer arcSin(self)"*
*"Author: 1 Jan 1989 graemeb"*

↑(self class new: self size)
 operand: self
 opcode: ArcSin arcTan                                                                                       arcTan
*"Answer arcTan(self)"*
*"Author: 1 Jan 1989 graemeb"*

↑(self class new: self size)
 operand: self
 opcode: ArcTan ceiling　　　　　　　　　　　　　　　　　　　　　　　　　　　　　　　　　　　　　　　　　　　　　　　　　ceiling
  "*Answer an FAndGradF with value of the integer nearest the receiver toward positive infinity.*"
  "*Author: 1 Jan 1989 graemeb*"

↑(self class new: self size)
      operand: self
      opcode: Ceiling coerce　　　　　　　　　　　　　　　　　　　　　　　　　　　　　　　　　　　　　　　　　　　　　　　　　coerce
  "*Answer a copy of self.*"
  "*Author: 1 Jan 1989 graemeb*"

↑(self class new: self size)
      operand: self
      opcode: Coerce cos　　　　　　　　　　　　　　　　　　　　　　　　　　　　　　　　　　　　　　　　　　　　　　　　　　　cos
  "*Answer cos(self)*"
  "*Author: 1 Jan 1989 graemeb*"

↑(self class new: self size)
      operand: self
      opcode: Cos cosh　　　　　　　　　　　　　　　　　　　　　　　　　　　　　　　　　　　　　　　　　　　　　　　　　　cosh
  "*Answer the hyperbolic cosine of self.*"
  "*Author: 9 Oct 89 graemeb*"

| newVec arg fPrime |
  newVec ← self species new: self size.
  arg ← self value.
  newVec value: arg cosh.
  fPrime ← arg sinh.
  1 to: self size do:
      [: index | newVec derivativeAt: index put: (self derivativeAt: index) * fPrime].
  ↑newVec degreesToRadians　　　　　　　　　　　　　　　　　　　　　　　　　　　　　　　　　　　　　degreesToRadians
  "*Answer self * pi / 180.*"
  "*Author: 1 Jan 1989 graemeb*"

↑(self class new: self size)
      operand: self
      opcode: DegreesToRadians exp　　　　　　　　　　　　　　　　　　　　　　　　　　　　　　　　　　　　　　　　　　　　　　　　　　　exp
  "*Answer exp(self)*"
  "*Author: 1 Jan 1989 graemeb*"

↑(self class new: self size)
      operand: self
      opcode: Exp floor　　　　　　　　　　　　　　　　　　　　　　　　　　　　　　　　　　　　　　　　　　　　　　　　　floor
  "*Answer an FAndGradF with value of the integer nearest the receiver toward negative infinity.*"
  "*Author: 1 Jan 1989 graemeb*"

↑(self class new: self size)
      operand: self
      opcode: Floor floorLog10　　　　　　　　　　　　　　　　　　　　　　　　　　　　　　　　　　　　　　　　　　　floorLog10
  "*Answer floor(log10(self)). Note that floor is the integer nearest the receiver toward negative infinity.*"
  "*Author: 1 Jan 1989 graemeb*"

```
        ↑(self class new: self size)
            operand: self
            opcode: FloorLog10
``` fractionPart                                                                                          fractionPart
"*Answer an FAndGradF with a value self - self integerPart. The derivatives are all those of self.*"
"*Author: 1 Jan 1989 graemeb*"

```
        ↑(self class new: self size)
            operand: self
            opcode: FractionPart
``` imag                                                                                                          imag
"*Answer imag(self) = 0.*"
"*Author: 1 Jan 1989 graemeb*"

```
        ↑(self class new: self size)
``` integerPart                                                                                              integerPart
"*Answer an FAndGradF with an integer value nearest the receiver toward zero. The derivatives are all zero.*"
"*Author: 1 Jan 1989 graemeb*"

```
        ↑(self class new: self size)
            operand: self
            opcode: IntegerPart
``` ln                                                                                                              ln
"*Answer ln(self)*"
"*Author: 1 Jan 1989 graemeb*"

```
        ↑(self class new: self size)
            operand: self
            opcode: Ln
``` log                                                                                                            log
"*Answer log10(self).*"
"*Author: 2 Jan 1989 graemeb*"

```
        ↑(self class new: self size)
            operand: self
            opcode: Log
``` negated                                                                                                   negated
"*Answer -self.*"
"*Author: 2 January 1989 graemeb*"

```
        ↑(self class new: self size)
            operand: self
            opcode: Negated
``` powerOfTen                                                                                           powerOfTen
"*Answer 10.d0 ↑self.*"
"*Author: 1 Jan 1989 graemeb*"

```
        ↑(self class new: self size)
            operand: self
            opcode: PowerOfTen
``` radiansToDegrees                                                                                 radiansToDegrees
"*Answer self * 180 / pi.*"
"*Author: 1 Jan 1989 graemeb*"

```
        ↑(self class new: self size)
            operand: self
            opcode: RadiansToDegrees
``` real
"*Answer real(self)*"
"*Author: 1 Jan 1989 graemeb*"

↑self reciprocal
"*Answer the multiplicitive inverse self.*"
"*Author: 12 Jan 1989 graemeb*"

| temp |
temp ← 1.0d0 asFAndGradFWithDimensions: self size.
↑temp operand: temp
    opcode: Divide
    operand: self rounded
"*Answer an FAndGradF with value of the integer nearest the receiver.*"
"*Author: 1 Jan 1989 graemeb*"

↑(self class new: self size)
    operand: self
    opcode: Rounded sin
"*Answer sin(self)*"
"*Author: 1 Jan 1989 graemeb*"

↑(self class new: self size)
    operand: self
    opcode: Sin sinh
"*Answer the hyperbolic sine of self.*"
"*Author: 9 Oct 89 graemeb*"

| newVec arg fPrime |
newVec ← self species new: self size.
arg ← self value.
newVec value: arg sinh.
fPrime ← arg cosh.
1 to: self size do:
    [: index | newVec derivativeAt: index put: (self derivativeAt: index) * fPrime].
↑newVec sqrt
"*Answer sqrt(self)*"
"*Author: 1 Jan 1989 graemeb*"

↑(self class new: self size)
    operand: self
    opcode: Sqrt tan
"*Answer tan(self)*"
"*Author: 1 Jan 1989 graemeb*"

↑(self class new: self size)
    operand: self
    opcode: Tan tanh
"*Answer tanh(self).*"
"*Author: 3 January 1989 graemeb*"

| newVec arg sech fPrime | newVec ← self species new: self size.
arg ← self value.
newVec value: arg tanh.
sech ← arg sech.
fPrime ← sech * sech.
1 to: self size do:
    [: index | newVec derivativeAt: index put: (self derivativeAt: index) * fPrime].
↑newVec arithmetic binary

* aScalarOrGrad
    "Answer self * aScalarOrGrad"
    "Arguments: aScalarOrGrad - <DoubleFloat or FAndGradF>"
    "Author: 1 Jan 1989 graemeb"

↑(self class new: self size)
        operand: self
        opcode: Multiply
        operand: aScalarOrGrad + aScalarOrGrad
    "Answer self + aScalarOrGrad"
    "Arguments: aScalarOrGrad - <DoubleFloat or FAndGradF>"
    "Author: 1 Jan 1989 graemeb"

↑(self class new: self size)
        operand: self
        opcode: Add
        operand: aScalarOrGrad

- aScalarOrGrad
    "Answer self - aScalarOrGrad"
    "Arguments: aScalarOrGrad - <DoubleFloat or FAndGradF>"
    "Author: 1 Jan 1989 graemeb"

↑(self class new: self size)
        operand: self
        opcode: Subtract
        operand: aScalarOrGrad / aScalarOrGrad
    "Answer self / aScalarOrGrad"
    "Arguments: aScalarOrGrad - <DoubleFloat or FAndGradF>"
    "Author: 1 Jan 1989 graemeb"

↑(self class new: self size)
        operand: self
        opcode: Divide
        operand: aScalarOrGrad logy: aScalarOrGrad
    "Answer log base aScalarOrGrad(self)."
    "Arguments: aScalarOrGrad - <DoubleFloat or FAndGradF>"
    "Author: 1 Jan 1989 graemeb"

↑(self class new: self size)
        operand: self
        opcode: Logy
        operand: aScalarOrGrad max: aScalarOrGrad
    "Answer the operand with the maximum value."
    "Arguments: aScalarOrGrad - <DoubleFloat or FAndGradF>"
    "Author: 2 Jan 1989 graemeb"

↑(self class new: self size)
    operand: self
    opcode: Max
    operand: aScalarOrGrad min: aScalarOrGrad   min:
    "*Answer the operand with the minimum value.*"
    "*Arguments: aScalarOrGrad - <DoubleFloat or FAndGradF>*"
    "*Author: 2 Jan 1989 graemeb*"

↑(self class new: self size)
    operand: self
    opcode: Min
    operand: aScalarOrGrad mod: aScalarOrGrad   mod:
    "*Answer mod(self,aScalarOrGrad)*"
    "*Arguments: aScalarOrGrad - <DoubleFloat or FAndGradF>*"
    "*Author: 1 Jan 1989 graemeb*"

↑(self class new: self size)
    operand: self
    opcode: Mod
    operand: aScalarOrGrad pcomplex: aScalarOrGrad   pcomplex:
    "*Answer self since FAndGradF uses real arithmetic only.*"
    "*Arguments: aScalarOrGrad - <DoubleFloat or FAndGradF>*"
    "*Author: 1 Jan 1989 graemeb*"
    ↑self raisedTo: aScalarOrGrad   raisedTo:
    "*Answer self ↑ aScalarOrGrad*"
    "*Arguments: aScalarOrGrad - <DoubleFloat or FAndGradF>*"
    "*Author: 1 Jan 1989 graemeb*"

↑(self class new: self size)
    operand: self
    opcode: RaisedTo
    operand: aScalarOrGrad sign: aScalarOrGrad   sign:
    "*Answer sign(self,aScalarOrGrad)*"
    "*Arguments: aScalarOrGrad - <DoubleFloat or FAndGradF>*"
    "*Author: 29 Sep 89 graemeb; Modified: 9 Oct 89 graemeb*"

aScalarOrGrad > 0 ifTrue: [↑self abs].
    aScalarOrGrad < 0 ifTrue: [↑self abs negated].
    ↑0.0d0 smallSignal: anArgumentFAndGradF   smallSignal:
    "*Answer the small-signal component of self with respect to the argument. The argument is assumed to be an ArgumentFAndGradF. This method will answer zero if this is not true.*"
    "*Author: 24 Feb 1989 graemeb; Revised: 28 Aug 90 graemeb*"

↑anArgumentFAndGradF isArgument
        ifTrue: [self derivativeAt: anArgumentFAndGradF argumentNumber]
        ifFalse: [0.0d0]

"*  28 Aug 90 10:38 am graemeb *"

triangleWithPeriod: period   triangleWithPeriod:
    "*Answer the triangle function of self. One period is given by: f(x) = x, 0 <= x < period/2; f(x) = period-x, period/2 <= x < period.*"
    "*Author: 3 January 1989 graemeb*"

```
| newVec absArg f fPrime arg |
arg ← self value mod: period value.
absArg ← arg abs.
absArg > (period value / 2.0d0)
        ifTrue: [f ← period-absArg.
                fPrime ← arg sign negated]
        ifFalse: [f ← absArg.
                fPrime ← arg sign].

newVec ← self species new: self size.
newVec value: f.
1 to: self size do:
        [: index | newVec derivativeAt: index put: (self derivativeAt: index)  * fPrime].
↑newVec
``` getError                                                                                                        getError
  *"Answer the latest error code for FAndGradF as a SmallInteger. (Kurt has text for error codes.) Answer -1 if the primitive fails. This indicates that the special ADS interpreter is not being used."*
  *"Author: 1 Jan 1989 graemeb; Modified: 16 Jan 1989 graemeb"*

```
< primitive: 255>
↑-1
``` userPrimitiveFailed                                                                                userPrimitiveFailed
  *"Announce that a user primitive has failed and there is no appropriate Smalltalk code to run."*
  *"Author: 9 Jan 1989 kurtk; Modified: 16 Jan 1989 graemeb"*

```
| errorcode errormessage |
errorcode ← self getError.
errorcode < 0
        ifTrue: [self error: 'Unable to retreive error code from Primitive'].
errormessage ← ErrorDictionary at: errorcode.
self error: 'FAndGradF primitive failed, Code =' , errorcode printString , ' ' , errormessage
``` smalltalk unary stAbs                                                                                                                stAbs
  *"Answer the absolute value of the receiver"*
  *"Author: 2 January 1989 graemeb"*

```
self value < 0.0d0
        ifTrue:
            [↑self negated]
        ifFalse:
            [↑self]
``` stArcCos                                                                                                        stArcCos
  *"Answer arccos(self)."*
  *"Author: 2 January 1989 graemeb"*

```
| newVec fPrime u |
newVec ← self species new: self size.
u ← self value.
newVec value: u arcCos.
fPrime ← -1.0d0 / (1.0d0 - (u * u)) sqrt.
1 to: self size do: [: index | newVec derivativeAt: index put: (self derivativeAt: index)
            * fPrime].
↑newVec
``` stArcSin                                                                                                        stArcSin
  *"Answer arcsin(self)."*
  *"Author: 2 January 1989 graemeb"*

```
| newVec fPrime u |
newVec ← self species new: self size.
```

```
u ← self value.
newVec value: u arcSin.
fPrime ← 1.0d0 / (1.0d0 - (u * u)) sqrt.
1 to: self size do: [: index | newVec derivativeAt: index put: (self derivativeAt: index)
            * fPrime].
↑newVec
``` stArcTan

*"Answer arctan(self)."*
*"Author: 2 January 1989 graemeb"*

```
| newVec fPrime u |
newVec ← self species new: self size.
u ← self value.
newVec value: u arcTan.
fPrime ← 1.0d0 / (u * u + 1.0d0).
1 to: self size do: [: index | newVec derivativeAt: index put: (self derivativeAt: index)
            * fPrime].
↑newVec
``` stCeiling

*"Answer an FAndGradF with value of the integer nearest the receiver toward positive infinity."*
*"Author: 1 Jan 1989 graemeb"*

```
| newVec fVal |
newVec ← self species new: self size.
fVal ← self value.
newVec value: fVal ceiling.
↑newVec
``` stCoerce

*"Answer a copy of self."*
*"Author: 2 Jan 1989 graemeb"*

```
| newVec fVal |
newVec ← self species new: self size.
fVal ← self value.
newVec value: fVal.
1 to: self size do: [: index | newVec derivativeAt: index put: (self derivativeAt: index)].
↑newVec
``` stCos

*"Answer cos(self)."*
*"Author: 2 January 1989 graemeb"*

```
| newVec fPrime u |
newVec ← self species new: self size.
u ← self value.
newVec value: u cos.
fPrime ← u sin negated.
1 to: self size do: [: index | newVec derivativeAt: index put: (self derivativeAt: index)
            * fPrime].
↑newVec
``` stDegreesToRadians

*"Answer self * pi / 180."*
*"Author: 2 Jan 1989 graemeb"*

```
↑self * (DoubleFloat pi / 180.0d0)
``` stExp

*"Answer exp(self)."*
*"Author: 2 January 1989 graemeb"*

```
| newVec expf |
```

```
newVec ← self species new: self size.
expf ← self value exp.
newVec value: expf.
1 to: self size do: [:index | newVec derivativeAt: index put: (self derivativeAt: index)
            * expf].
↑newVec
``` stFloor
*"Answer an FAndGradF with value of the integer nearest the receiver toward negative infinity."*
*"Author: 2 Jan 1989 graemeb"*

```
| newVec fVal |
newVec ← self species new: self size.
fVal ← self value.
newVec value: fVal floor.
↑newVec
``` stFloorLog10
*"Answer floor(log10(self)). Note that floor is the integer nearest the receiver toward negative infinity."*
*"Author: 1 Jan 1989 graemeb"*

```
↑self log floor
``` stFractionPart
*"Answer an FAndGradF with a value self - self integerPart. The derivatives are all those of self."*
*"Author: 2 Jan 1989 graemeb"*

```
| newVec fVal |
newVec ← self species new: self size.
fVal ← self value.
newVec value: fVal fractionPart.
1 to: self size do: [:index | newVec derivativeAt: index put: (self derivativeAt: index)].
↑newVec
``` stImag
*"Answer zero."*
*"Author: 2 Jan 1989 graemeb"*

```
↑0.0d0
``` stIntegerPart
*"Answer an FAndGradF with an integer value nearest the receiver toward zero. The derivatives are all zero."*
*"Author: 2 Jan 1989 graemeb"*

```
| newVec fVal |
newVec ← self species new: self size.
fVal ← self value.
newVec value: fVal integerPart.
↑newVec
``` stLn
*"Answer an FAndFPrime object self ln."*

```
| newVec fPrime f |
newVec ← self species new: self size.
f ← self value ln.
newVec value: f.
fPrime ← f reciprocal.
1 to: self size do: [:index | newVec derivativeAt: index put: (self derivativeAt: index)
            * fPrime].
↑newVec
``` stLog
*"Answer log10(self)."*
*"Author: 2 January 1989 graemeb"*

```
| newVec fVal logE10OnY |
newVec ← self species new: self size.
fVal ← self value.
newVec value: fVal log.
logE10OnY ← 10.0d0 ln / fVal.
1 to: self size do: [: index | newVec derivativeAt: index put: (self derivativeAt: index)
         * logE10OnY].
↑newVec
``` stNegated                                                                                            stNegated

*"Answer an FAndFPrime object self * -1."*

```
| newVec f |
newVec ← self species new: self size.
f ← self value negated.
newVec value: f.
1 to: self size do: [: index | newVec derivativeAt: index put: 0.0d0 - (self derivativeAt: index)].
↑newVec
``` stPowerOfTen                                                                                         stPowerOfTen

*"Answer 10.d0 ↑self."*
*"Author: 2 Jan 1989 graemeb"*

```
| newVec fVal newVal yLn10 |
newVec ← self species new: self size.
fVal ← self value.
newVal ← fVal powerOfTen.
newVec value: newVal.
yLn10 ← newVal * 10.0d0 log.
1 to: self size do: [: index | newVec derivativeAt: index put: (self derivativeAt: index)
         * yLn10].
↑newVec
``` stRadiansToDegrees                                                                                   stRadiansToDegrees

*"Answer self * 180 / pi."*
*"Author: 2 Jan 1989 graemeb"*

↑self * (180.0d0 / DoubleFloat pi)

stReal                                                                                               stReal

*"Answer self."*
*"Author: 2 Jan 1989 graemeb"*

↑self stRounded                                                                                            stRounded

*"Answer an FAndGradF with value of the integer nearest the receiver."*
*"Author: 2 Jan 1989 graemeb"*

```
| newVec fVal |
newVec ← self species new: self size.
fVal ← self value.
newVec value: fVal rounded.
↑newVec
``` stSin                                                                                                stSin

*"Answer sin(self)."*
*"Author: 2 January 1989 graemeb"*

```
| newVec fPrime u |
newVec ← self species new: self size.
u ← self value.
newVec value: u sin.
fPrime ← u cos.
1 to: self size do: [: index | newVec derivativeAt: index put: (self derivativeAt: index)
         * fPrime].
```

↑newVec stSqrt
"Answer sqrt(self)."
"Author: 2 January 1989 graemeb"

| newVec f fPrime |
newVec ← self species new: self size.
f ← self value sqrt.
newVec value: f.
fPrime ← 1.0d0 / (2.0d0 * f).
1 to: self size do: [: index | newVec derivativeAt: index put: (self derivativeAt: index)
        * fPrime].
↑newVec stTan
"Answer tan(self)."
"Author: 2 January 1989 graemeb"

| newVec fPrime u sec |
newVec ← self species new: self size.
u ← self value.
newVec value: u tan.
sec ← 1.0d0 / u cos.
fPrime ← sec * sec.
1 to: self size do: [: index | newVec derivativeAt: index put: (self derivativeAt: index)
        * fPrime].
↑newVec smalltalk binary
    arcTan2: aScalarOrGrad
        "Answer arcTan2(self,aScalarOrGrad)."
        "Arguments: aScalarOrGrad - <DoubleFloat or FAndGradF>"
        "Author: 12 Jan 1989 graemeb"

| newVec fPrime fVal gVec gVal newVal gPrime f2PlusG2 |
        newVec ← self species new: self size.
        fVal ← self value.
        gVec ← aScalarOrGrad asFAndGradFWithDimensions: self size.
        gVal ← gVec asDoubleFloat.
        newVal ← fVal arcTan2: gVal.
        newVec value: newVal.
        f2PlusG2 ← (fVal * fVal) + (gVal * gVal).
        1 to: self size do: [: index |
            fPrime ← self derivativeAt: index.
            gPrime ← gVec derivativeAt: index.
            newVec derivativeAt: index put: ((fPrime * gVal) - (fVal * gPrime)) / f2PlusG2].
        ↑newVec raisedToScalarPower: num
        "Answer self ↑ num where 'num' is a scalar."
        "Author: 2 January 1989 graemeb"

| newVec numDec fVal fPrime |
        newVec ← self species new: self size.
        fVal ← self value.
        numDec ← num - 1.
        newVec value: (fVal raisedTo: num).
        fPrime ← (fVal raisedTo: numDec)
                * num.
        1 to: self size do: [: index | newVec derivativeAt: index put: (self derivativeAt: index)
                * fPrime].
        ↑newVec raisedToVectorPower: gVec
"*Answer self ↑ num where 'gVec' is an FAndGradF.*"
"*Author: 2 January 1989 graemeb*"

| newVec fVal gVal lnf fRaisedToG gDividedByF factor1 factor2 |
newVec ← self species new: self size.
fVal ← self value.
gVal ← gVec value.
lnf ← fVal ln.
fRaisedToG ← fVal raisedTo: gVal.
newVec value: fRaisedToG.
gDividedByF ← gVal / fVal.
factor1 ← gDividedByF * fRaisedToG.
factor2 ← lnf * fRaisedToG.
1 to: self size do: [: index | newVec derivativeAt: index put: (self derivativeAt: index)
            * factor1 + ((gVec derivativeAt: index)
                * factor2)].
↑newVec stAdd: gArg
"*Answer an FAndGrad object self + gArg.*"
"*Author: 12 Jan 1989 graemeb*"

| newVec fVal gVal gVec |
newVec ← self species new: self size.
fVal ← self value.
gVec ← gArg asFAndGradFWithDimensions: self size.
gVal ← gVec value.
newVec value: fVal + gVal.
1 to: self size do: [: index | newVec derivativeAt: index put: (self derivativeAt: index)
            + (gVec derivativeAt: index)].
↑newVec stDivide: gArg
"*Answer an FAndGradF object the receiver / gArg.*"
"*Author: 12 Jan 1989 graemeb*"

| newVec fVal gVal gSquared gVec |
newVec ← self species new: self size.
fVal ← self value.
gVec ← gArg asFAndGradFWithDimensions: self size.
gVal ← gVec value.
newVec value: fVal / gVal.
gSquared ← gVal * gVal.
1 to: self size do: [: index | newVec derivativeAt: index put: (((self derivativeAt: index)
            * gVal) - ((gVec derivativeAt: index)
                * fVal)) / gSquared].
↑newVec stLogy: aScalarOrGrad
"*Answer log base aScalarOrGrad(self).*"
"*Arguments: aScalarOrGrad - <DoubleFloat or FAndGradF>*"
"*Author: 12 Jan 1989 graemeb*"

| newVec fPrime fVal gVec gVal newVal fOverG lnG gPrime |
newVec ← self species new: self size.
fVal ← self value.
gVec ← aScalarOrGrad asFAndGradFWithDimensions: self size.
gVal ← gVec asDoubleFloat.
newVal ← fVal logy: gVal.

newVec value: newVal.
fOverG ← fVal / gVal.
lnG ← gVal ln.
1 to: self size do: [: index |

```
        fPrime ← self derivativeAt: index.
        gPrime ← gVec derivativeAt: index.
        newVec derivativeAt: index put: ((fPrime / fVal) - (gPrime * fOverG)) / lnG].
    ↑newVec
``` stMax: aScalarOrGrad    stMax:
*"Answer the operand with the maximum value."*
*"Arguments: aScalarOrGrad - <DoubleFloat or FAndGradF>"*
*"Author: 2 Jan 1989 graemeb"*

```
    self value > aScalarOrGrad value
        ifTrue: [↑self]
        ifFalse: [↑aScalarOrGrad]
``` stMin: aScalarOrGrad    stMin:
*"Answer the operand with the minimum value."*
*"Arguments: aScalarOrGrad - <DoubleFloat or FAndGradF>"*
*"Author: 2 Jan 1989 graemeb"*

```
    self value < aScalarOrGrad value
        ifTrue: [↑self]
        ifFalse: [↑aScalarOrGrad]
``` stMinus: gArg    stMinus:
*"Answer an FAndFPrime object self - gArg."*
*"Author: 12 Jan 1989 graemeb"*

```
    | newVec fVal gVal gVec |
    newVec ← self species new: self size.
    fVal ← self value.
    gVec ← gArg asFAndGradFWithDimensions: self size.
    gVal ← gVec value.
    newVec value: fVal - gVal.
    1 to: self size do: [:index | newVec derivativeAt: index put: (self derivativeAt: index)
                - (gVec derivativeAt: index)].
    ↑newVec
``` stMod: aScalarOrGrad    stMod:
*"Answer mod(self,aScalarOrGrad)"*
*"Arguments: aScalarOrGrad - <DoubleFloat or FAndGradF>"*
*"Author: 1 Jan 1989 graemeb"*

```
    | newVec fVal gVal gVec |
    newVec ← self species new: self size.
    fVal ← self value.
    gVal ← aScalarOrGrad asDoubleFloat.
    newVec value: (fVal mod: gVal).
    1 to: self size do: [:index | newVec derivativeAt: index put: (self derivativeAt: index)].
    ↑newVec
``` stMult: gArg    stMult:
*"Answer an FAndGradF object self * gVec."*
*"Author: 12 Jan 1989 graemeb"*

```
    | newVec fVal gVal gVec |
    newVec ← self species new: self size.
    fVal ← self value.
    gVec ← gArg asFAndGradFWithDimensions: self size.
    gVal ← gVec value.
    newVec value: fVal * gVal.
    1 to: self size do: [:index | newVec derivativeAt: index put: fVal * (gVec derivativeAt: index) + ((self derivativeAt: index)
                * gVal)].
    ↑newVec
``` stRaisedTo: power
"*Answer self ↑ power*"
"*Arguments: power - <FAndFPrime>*"
"*Author: 2 January 1989 graemeb*"

power isScalar
　　ifTrue: [↑self raisedToScalarPower: power]
　　ifFalse: [↑self raisedToVectorPower: power]

primitive functions primAdd: anFAndGradF
"*Answer self + anFAndGradF. This is for compatibility with the coercion from DoubleFloat.*"
"*Arguments: anFAndGradF - <FAndGradF>*"
"*Author: 1 Jan 1989 graemeb*"

↑(self class new: self size)
　　operand: self
　　opcode: Add
　　operand: anFAndGradF primArcTan2: anFAndGradF
"*Answer arcTan2(self,anFAndGradF). This is for compatibility with the coercion from DoubleFloat.*"
"*Arguments: anFAndGradF - <FAndGradF>*"
"*Author: 1 Jan 1989 graemeb*"

↑(self class new: self size)
　　operand: self
　　opcode: ArcTan2
　　operand: anFAndGradF primDivide: anFAndGradF
"*Answer self / anFAndGradF. This is for compatibility with the coercion from DoubleFloat.*"
"*Arguments: anFAndGradF - <FAndGradF>*"
"*Author: 1 Jan 1989 graemeb*"

↑(self class new: self size)
　　operand: self
　　opcode: Divide
　　operand: anFAndGradF primEQ: anFAndGradF
"*Answer true or false representing self = anFAndGradF*"
"*Arguments: anFAndGradF - <FAndGradF>*"
"*Author: 1 Jan 1989 graemeb; Modified: 16 Jan 1989 graemeb*"

↑self
　　reloperand: anFAndGradF
　　opcode: Eq primGE: anFAndGradF
"*Answer true or false representing self >= anFAndGradF*"
"*Arguments: anFAndGradF - <FAndGradF>*"
"*Author: 1 Jan 1989 graemeb; Modified: 16 Jan 1989 graemeb*"

↑self
　　reloperand: anFAndGradF
　　opcode: Ge primGT: anFAndGradF
"*Answer true or false representing self > anFAndGradF*"
"*Arguments: anFAndGradF - <FAndGradF>*"
"*Author: 1 Jan 1989 graemeb; Modified: 16 Jan 1989 graemeb*"

↑self reloperand: anFAndGradF
        opcode: Gt primLE: anFAndGradF  primLE:
    *"Answer true or false representing self <= anFAndGradF"*
    *"Arguments: anFAndGradF - <FAndGradF>"*
    *"Author: 1 Jan 1989 graemeb; Modified: 16 Jan 1989 graemeb"*

↑self
        reloperand: anFAndGradF
        opcode: Le primLogy: anFAndGradF  primLogy:
    *"Answer log base anFAndGradF(self). This is for compatibility with the coercion from DoubleFloat."*
    *"Arguments: anFAndGradF - <FAndGradF>"*
    *"Author: 1 Jan 1989 graemeb"*

↑(self class new: self size)
        operand: self
        opcode: Logy
        operand: anFAndGradF primLT: anFAndGradF  primLT:
    *"Answer true or false representing self < anFAndGradF"*
    *"Arguments: anFAndGradF - <FAndGradF>"*
    *"Author: 1 Jan 1989 graemeb; Modified: 16 Jan 1989 graemeb"*

↑self
        reloperand: anFAndGradF
        opcode: Lt primMax: anFAndGradF  primMax:
    *"Answer max(self,anFAndGradF). This is for compatibility with the coercion from DoubleFloat."*
    *"Arguments: anFAndGradF - <FAndGradF>"*
    *"Author: 1 Jan 1989 graemeb"*

↑(self class new: self size)
        operand: self
        opcode: Max
        operand: anFAndGradF primMin: anFAndGradF  primMin:
    *"Answer min(self,anFAndGradF). This is for compatibility with the coercion from DoubleFloat."*
    *"Arguments: anFAndGradF - <FAndGradF>"*
    *"Author: 1 Jan 1989 graemeb"*

↑(self class new: self size)
        operand: self
        opcode: Min
        operand: anFAndGradF primMinus: anFAndGradF  primMinus:
    *"Answer self - anFAndGradF. This is for compatibility with the coercion from DoubleFloat."*
    *"Arguments: anFAndGradF - <FAndGradF>"*
    *"Author: 1 Jan 1989 graemeb"*

↑(self class new: self size)
        operand: self
        opcode: Subtract
        operand: anFAndGradF primMod: anFAndGradF  primMod:
    *"Answer mod(self,anFAndGradF). This is for compatibility with the coercion from DoubleFloat."*
    *"Arguments: anFAndGradF - <FAndGradF>"*
    *"Author: 1 Jan 1989 graemeb"*

↑(self class new: self size)
    operand: self
    opcode: Mod
    operand: anFAndGradF primMult: anFAndGradF                                                                                              primMult:
    "Answer self * anFAndGradF. This is for compatibility with the coercion from DoubleFloat."
    "Arguments: anFAndGradF - <FAndGradF>"
    "Author: 1 Jan 1989 graemeb"

↑(self class new: self size)
    operand: self
    opcode: Multiply
    operand: anFAndGradF primNE: anFAndGradF                                                                                                primNE:
    "Answer true or false representing self¯ = anFAndGradF"
    "Arguments: anFAndGradF - <FAndGradF>"
    "Author: 1 Jan 1989 graemeb; Modified: 16 Jan 1989 graemeb"

↑self
    reloperand: anFAndGradF
    opcode: Ne primRaisedTo: anFAndGradF                                                                                          primRaisedTo:
    "Answer self ↑ anFAndGradF. This is for compatibility with the coercion from DoubleFloat."
    "Arguments: anFAndGradF - <FAndGradF>"
    "Author: 1 Jan 1989 graemeb"

↑(self class new: self size)
    operand: self
    opcode: RaisedTo
    operand: anFAndGradF primitives operand: f opcode: operator                                                                                        operand:opcode:
    "Perform the requested arithmetic unary operation primitively if possible. If the primitive fails then try the
    Smalltalk backup code. Answer the result. Note that the special ADS interpreter must be used for the
    operations to be performed primitively."
    "Arguments:
        f - <DoubleFloat or FAndGradF>
        operator - <SmallInteger> See class method 'initialize' for meaning of codes."
    "Author: 1 Jan 1989 graemeb; Modified: 16 Jan 1989 graemeb"

< primitive: 251> self getError > 0 ifTrue: [↑self retryOperand: f basicValue opcode: operator].
    ↑f perform: (STUnarySelectors at: operator + 1)

operand: f opcode: op operand: g                                                                                   operand:opcode:operand:
    "Perform the requested arithmetic binary operation primitively if possible. If the primitive fails then try the
    Smalltalk backup code. Answer the result. Note that the special ADS interpreter must be used for the
    operations to be performed primitively."
    "Arguments:
        f - <FAndGradF>
        g - <DoubleFloat or FAndGradF>
        operator - <SmallInteger> See class method 'initialize' for meaning of codes."
    "Author: 1 Jan 1989 graemeb; Modified: 30 Jan 1989 graemeb"

<primitive: 250> self getError > 0 ifTrue: [↑self retryOperand: f basicValue opcode: op operand: g basicValue].
    ↑f perform: (STBinarySelectors at: op + 1) with: g reloperand: f opcode: operator                                                            reloperand:opcode:

"Perform the requested relational binary operation primitively if possible. If the primitive fails then try the Smalltalk backup code. Answer the result (true of false). Note that the special ADS interpreter must be used for the operations to be performed primitively."
"Arguments:
 f - <DoubleFloat or FAndGradF>
 operator - <SmallInteger> See class method 'initialize' for meaning of codes."
"Author: 16 Jan 1989 graemeb"
<primitive: 252> self getError > 0 ifTrue: [↑self retryReloperand: f basicValue opcode: operator].
↑self perform: (STRelationalSelectors at: operator + 1) with: f retryOperand: f opcode: operator                                                          retryOperand:opcode:

"Perform the requested relational binary operation primitively if possible. If the primitive fails then try the Smalltalk backup code. Answer the result (true of false). Note that the special ADS interpreter must be used for the operations to be performed primitively."
"Arguments:
 f - <DoubleFloat or FAndGradF>
 operator - <SmallInteger> See class method 'initialize' for meaning of codes."
"Author: 16 Jan 1989 graemeb"

<primitive: 251> self getError > 0 ifTrue: [self userPrimitiveFailed].
↑self perform: (STRelationalSelectors at: operator + 1) with: f retryOperand: f opcode: op operand: g                                                     retryOperand:opcode:operand:

"Perform the requested arithmetic binary operation primitively if possible. If the primitive fails then try the Smalltalk backup code. Answer the result. Note that the special ADS interpreter must be used for the operations to be performed primitively."
"Arguments:
 f - <FAndGradF>
 g - <DoubleFloat or FAndGradF>
 operator - <SmallInteger> See class method 'initialize' for meaning of codes."
"Author: 1 Jan 1989 graemeb; Modified: 30 Jan 1989 graemeb"

<primitive: 250> self getError > 0 ifTrue: [self userPrimitiveFailed].
↑f perform: (STBinarySelectors at: op + 1) with: g retryReloperand: f opcode: operator                                                       retryReloperand:opcode:

"Perform the requested relational binary operation primitively if possible. If the primitive fails then try the Smalltalk backup code. Answer the result (true of false). Note that the special ADS interpreter must be used for the operations to be performed primitively."
"Arguments:
 f - <DoubleFloat or FAndGradF>
 operator - <SmallInteger> See class method 'initialize' for meaning of codes."
"Author: 16 Jan 1989 graemeb"

<primitive: 252> self getError > 0 ifTrue: [self userPrimitiveFailed].
↑self perform: (STRelationalSelectors at: operator + 1) with: f comparing

< aScalarOrGrad                                                                                        <

"Answer true or false representing self < aScalarOrGrad"
"Arguments: aScalarOrGrad - <DoubleFloat or FAndGradF>"
"Author: 1 Jan 1989 graemeb; Modified: 16 Jan 1989 graemeb"

↑self

```
        reloperand: aScalarOrGrad
        opcode: Lt

<= aScalarOrGrad                                                                                    <=
    "Answer true or false representing self <= aScalarOrGrad"
    "Arguments: aScalarOrGrad - <DoubleFloat or FAndGradF>"
    "Author: 1 Jan 1989 graemeb; Modified: 16 Jan 1989 graemeb"

↑self
        reloperand: aScalarOrGrad
        opcode: Le

= aScalarOrGrad                                                                                     =
    "Answer true or false representing self = aScalarOrGrad"
    "Arguments: aScalarOrGrad - <DoubleFloat or FAndGradF>"
    "Author: 1 Jan 1989 graemeb; Modified: 16 Jan 1989 graemeb"

↑self
        reloperand: aScalarOrGrad
        opcode: Eq

> aScalarOrGrad                                                                                     >
    "Answer true or false representing self > aScalarOrGrad"
    "Arguments: aScalarOrGrad - <DoubleFloat or FAndGradF>"
    "Author: 1 Jan 1989 graemeb; Modified: 16 Jan 1989 graemeb"

↑self
        reloperand: aScalarOrGrad
        opcode: Gt

>= aScalarOrGrad                                                                                    >=
    "Answer true or false representing self >= aScalarOrGrad"
    "Arguments: aScalarOrGrad - <DoubleFloat or FAndGradF>"
    "Author: 1 Jan 1989 graemeb; Modified: 16 Jan 1989 graemeb"

↑self
        reloperand: aScalarOrGrad
        opcode: Ge

~= aScalarOrGrad                                                                                    ~=
    "Answer true or false representing self ~= aScalarOrGrad"
    "Arguments: aScalarOrGrad - <DoubleFloat or FAndGradF>"
    "Author: 1 Jan 1989 graemeb; Modified: 16 Jan 1989 graemeb"

↑self
        reloperand: aScalarOrGrad
        opcode: Ne printing debugPrint                                                                                      debugPrint
        "Temporary method for model print statement."
        "Author: 16 Dec 88 graemeb"

Transcript show: self printString; cr printOn: aStream                                                                                printOn:
        "Print a description of self in the given stream."
        "Author: 1 Jan 1989 graemeb"

aStream nextPutAll: self class name.
        aStream nextPut: $(; print: self value;  nextPut: $,; space.
        1 to: self size do: [:i | aStream nextPutAll: (self derivativeAt: i) printString; space].
        aStream nextPutAll: ')'
``` coercing asAcFAndFPrime
*"Answer the AcFAndFPrime corresponding to this FAndGradF."*
*"Author: 1 Dec 88 graemeb"*

| newFiValues numArgs |
numArgs ← self size.
newFiValues ← SimVector newDoubleFloat: numArgs + 1. *"Add 1 for the source value."*
1 to: numArgs do:
    [:i | newFiValues at: i put: (self derivativeAt: i )].
↑AcFAndFPrime new withDcValue: self asDoubleFloat freqIndependentValues: newFiValues asFAndGradFWithDimensions: anInteger
*"Answer an FAndGradF equivalent to self."*
*"Author: 1 Jan 1989 graemeb"*

↑self asFloat
*"Answer the function value as a Float."*
*"Author: 1 January 1989 graemeb"*

↑self value asFloat perform: operator onDoubleFloat: aDoubleFloat
*"Perform the given operation between self and aDoubleFloat."*
*"Arguments:*
*operator - <Symbol>*
*aDoubleFloat - <DoubleFloat>*
*"*
*"Author: 1 January 1989 graemeb"*

↑(self species newWithNumVars: self size withConstValue: aDoubleFloat)
    perform: operator with: self perform: operator onFloat: aFloat
*"Perform the given operation between self and aFloat."*
*"Arguments:*
*operator - <Symbol>*
*aFloat - <Float>*
*"*
*"Author: 1 January 1989 graemeb"*

↑(self species newWithNumVars: self size withConstValue: aFloat)
    perform: operator with: self perform: operator onInteger: anInteger
*"Perform the given operation between self and anInteger."*
*"Arguments:*
*operator - <Symbol>*
*anInteger - <Integer>*
*"*
*"Author: 1 January 1989 graemeb"*

↑(self species newWithNumVars: self size withConstValue: anInteger asDoubleFloat)
    perform: operator with: self smalltalk relational stEQ: aScalarOrGrad
*"Answer true or false representing self = aScalarOrGrad"*
*"Arguments: aScalarOrGrad - <DoubleFloat or FAndGradF>"*
*"Author: 2 Jan 1989 graemeb"*

↑self value = aScalarOrGrad asDoubleFloat stGE: aScalarOrGrad
    "*Answer true or false representing self >= aScalarOrGrad*"
    "*Arguments: aScalarOrGrad - <DoubleFloat or FAndGradF>*"
    "*Author: 2 Jan 1989 graemeb*"

↑self value >= aScalarOrGrad asDoubleFloat stGT: aScalarOrGrad
    "*Answer true or false representing self > aScalarOrGrad*"
    "*Arguments: aScalarOrGrad - <DoubleFloat or FAndGradF>*"
    "*Author: 2 Jan 1989 graemeb*"

↑self value > aScalarOrGrad asDoubleFloat stLE: aScalarOrGrad
    "*Answer true or false representing self <= aScalarOrGrad*"
    "*Arguments: aScalarOrGrad - <DoubleFloat or FAndGradF>*"
    "*Author: 2 Jan 1989 graemeb*"

↑self value <= aScalarOrGrad asDoubleFloat stLT: aScalarOrGrad
    "*Answer true or false representing self < aScalarOrGrad*"
    "*Arguments: aScalarOrGrad - <DoubleFloat or FAndGradF>*"
    "*Author: 2 Jan 1989 graemeb*"

↑self value < aScalarOrGrad asDoubleFloat stNE: aScalarOrGrad
    "*Answer true or false representing self ~= aScalarOrGrad*"
    "*Arguments: aScalarOrGrad - <DoubleFloat or FAndGradF>*"
    "*Author: 2 Jan 1989 graemeb*"

↑self value ~= aScalarOrGrad asDoubleFloat testing
    isArgument
        "*Answer that this object is not an argument.*"
        "*Author: 28 Aug 90 graemeb*"

↑false

"* 28 Aug 90 10:37 am graemeb *"

isScalar
        "*Answer that this object is not a scalar.*"
        "*Author: 3 January 1989 graemeb*"

↑false isVector
        "*Answer that this object is a vector.*"
        "*Author: 3 January 1989 graemeb*"

↑true converting
    asAcFAndGradF
        "*Answer the AcFAndGradF corresponding to this FAndGradF.*"
        "*Author: 15 Sep 1988 graemeb; Modified 5 Apr 1989 graemeb*"

| newFiValues | newFiValues ← SimVectorIP newDoubleFloat: self size + 1. *"Add 1 for the source value."*
1 to: self size do:
    [: i | newFiValues at: i put: (self derivativeAt: i)].
↑AcFAndFPrime new withDcValue: self asDoubleFloat freqIndependentValues: newFiValues asCodeGenFAndGradFWithContext: aContext              asCodeGenFAndGradFWithContext:
    *"Answer an equivalent CodeGenFAndGradF."*
    *"Arguments:*
        *aContext - <ModelCodeGenContext>"*
    *"Author: 4 May 1989 graemeb"*

↑CodeGenFAndGradF new setValue: self value andContext: aContext copying copyFrom: aScalarOrGrad              copyFrom:
    *"Copy the contents of aScalarOrGrad to self."*
    *"Arguments: aScalarOrGrad - <DoubleFloat or FAndGradF>"*
    *"Author: 9 Jan 1989 graemeb; Modified: 29 Jan 1989 graemeb"*

*"self operand: aScalarOrGrad opcode: Coerce*     *Coerce is currently broken."*
    *"self operand: aScalarOrGrad opcode: Real*       *Unary ops with scalar are currently broken."*
    self operand: aScalarOrGrad opcode: Add operand: 0.0d0

——————————————— FAndGradF class ———————————————

FAndGradF class             *FAndGradF class*
    instanceVariableNames: "

class initialization initialize             initialize
    *"Initialize the class variables and class-instance variables."*
    *"Author: 1 January 1989 graemeb; Modified: 18 Jan 1989 graemeb"* self initializeNumericOops.
    self initializeOpCodes.
    UnarySelectors ← #(coerce real imag int fract negated abs sqrt exp ln powerOfTen log10 floorLog10 ceiling floor rounded degreesToRadian radiansToDegrees sin cos tan arcSin arcCos arcTan).

STUnarySelectors ← #(stCoerce stReal stImag stInt stFract stNegated stAbs stSqrt stExp stLn stPowerOfTen stLog10 stFloorLog10 stCeiling stFloor stRounded stDegreesToRadians stRadiansToDegrees stSin stCos stTan stArcSin stArcCos stArcTan).

BinarySelectors ← #(+ - * / mod: max: min: raisedTo: logy: realImag: arcTan2:).

STBinarySelectors ← #(stAdd: stMinus: stMult: stDivide: stMod: stMax: stMin: stRaisedTo: stLogy: stRealImag: stArcTan2:).

RelationalSelectors ← #(= ~= < > <= >=).

STRelationalSelectors ← #(stEQ: stNE: stLT: stGT: stLE: stGE:).

self setErrorDictionary.

*"FAndGradF initialize"* initializeNumericOops             initializeNumericOops
    *"Initialize class instance variable holding classes which user primitives can manipulate."*
    *"Author: 1 January 1989 graemeb; Modified: 30 Mar 89 messick"* numericOops ~= nil ifTrue: [numericOops atAllPut: nil].
numericOops ← Array new:5.
numericOops at: 1 put: Float.
numericOops at: 2 put: DoubleFloat.
numericOops at: 3 put: ComplexFloat.
numericOops at: 4 put: DoubleComplex.
numericOops at: 5 put: self.

*"FAndGradF initialize"* initializeOpCodes

"*Initialize the class variables representing the primitive codes for the primitive operations. Note that this list was copied from AbstractFloat.*"
"*Author: 1 January 1989 graemeb*"

"*Arithmetic-type code.*"
DoubleType ← 4.   "*DoubleFloat*"

"*Binary opCodes*"
Add ← 0.
Subtract ← 1.
Multiply ← 2.
Divide ← 3.
Mod ← 4.
Max ← 5.
Min ← 6.
RaisedTo ← 7.
Logy ← 8.
RealImag ← 9.   "*Not used in FAndGradF.*"
ArcTan2 ← 10.

"*Unary opCodes*"
self initializeUnaryOpCodes.

"*Relational opCodes*"
Eq ← 0.
Ne ← 1.
Lt ← 2.
Gt ← 3.
Le ← 4.
Ge ← 5.

"*FAndGradF initialize*"

initializeUnaryOpCodes
"*FAndGradF initialize.*"
"*Author: 1 January 1989 graemeb*"

"*Unary opCodes*"
Coerce ← 0.
Real ← 1.
Imag ← 2.
IntegerPart ← 3.
FractionPart ← 4.
Negated ← 5.
Abs ← 6.
Sqrt ← 7.
Exp ← 8.
Ln ← 9.
PowerOfTen ← 10.
Log ← 11.
FloorLog10 ← 12.
Ceiling ← 13.
Floor ← 14.
Rounded ← 15.

DegreesToRadians ← 16.
RadiansToDegrees ← 17.
Sin ← 18.
Cos ← 19.
Tan ← 20.
ArcSin ← 21.
ArcCos ← 22.
ArcTan ← 23.

setErrorDictionary                                                                                          setErrorDictionary
  "*Initialize the error strings.*"
  "*Author: 9 Jan 1989 kurtk*"

ErrorDictionary ← Dictionary new.
  ErrorDictionary at: 0 put: 'NOERROR '.
  ErrorDictionary at: 256 put: 'FATAL minimum fatal error number'.
  ErrorDictionary at: 16 put: 'EW-MINSHORT number is < MINSHORT'.
  ErrorDictionary at: 17 put: 'EW-MAXSHORT number is > MAXSHORT'.
  ErrorDictionary at: 18 put: 'EW-MINLONG number is < MINLONG'.
  ErrorDictionary at: 19 put: 'EW-MAXLONG number is > MAXLONG'.
  ErrorDictionary at: 20 put: 'EW-MINFLOAT number is < MINFLOAT'.
  ErrorDictionary at: 21 put: 'EW-MAXFLOAT number is > MAXFLOAT'.
  ErrorDictionary at: 512 put: 'E-NOREF     no object or invalid object ref array'.
  ErrorDictionary at: 513 put: 'E-INSREF insufficient number of reference objects'.
  ErrorDictionary at: 514 put: 'E-INVREF invalid reference object in ref list'.
  ErrorDictionary at: 515 put: 'E-UNKARG unknown or invalid argument type'.
  ErrorDictionary at: 516 put: 'E-NOINT     small integer not found where expected'.
  self setErrorDictionary1
  " *FandGradF setErrorDictionary*"

setErrorDictionary1                                                                                         setErrorDictionary1
  "*Continue to initialize the error strings.*"
  "*Author: 9 Jan 1989 kurtk*"

ErrorDictionary at: 518 put: 'E-ZEROLENARR zero length array'.
  ErrorDictionary at: 519 put: 'E-INVBYTARR invalid byte array'.
  ErrorDictionary at: 520 put: 'E-INVNUMARR invalid num array-no ByteArray component'.
  ErrorDictionary at: 521 put: 'E-INVARRTYPE invalid numeric array data type'.
  ErrorDictionary at: 522 put: 'E-INDXBNDS array indexing out of bounds'.
  ErrorDictionary at: 523 put: 'E-ELMSPC increment to next element < element size'.
  ErrorDictionary at: 525 put: 'E-NOTNUM a numeric argument was not passed as par'.
  ErrorDictionary at: 526 put: 'E-NOTNUMARR argument is not a numeric array'.
  ErrorDictionary at: 530 put: 'E-NOTCPXDBL array elements are not Complex Double'.
  ErrorDictionary at: 531 put: 'E-ELMNOTADJ array elements are not adjacent'.
  ErrorDictionary at: 532 put: 'E-NOTPWR2 array length is not a power of 2'.
  ErrorDictionary at: 540 put: 'E-INVGRAD Invalid FAndGradF object'.
  ErrorDictionary at: 541 put: 'E-NOGRAD Receiver is not an FAndGradF object'.
  ErrorDictionary at: 542 put: 'E-OPRANGE Operator is out of range'.
  ErrorDictionary at: 543 put: 'E-FUNRANGE Function arg is out of range'.
  ErrorDictionary at: 550 put: 'E-SINGULAR Singular matrix'.
  ErrorDictionary at: 551 put: 'E-NOTSQMATRIX SquareMatrixCFP not found'.
  ErrorDictionary at: 552 put: 'E-NOTDBLARR Double NumericArray not found'.
  ErrorDictionary at: 553 put: 'E-VECTORLEN Vector Length does not match Matrix size'.
  ErrorDictionary at: 554 put: 'E-INVMATTYPE Invalid matrix type'.
  ErrorDictionary at: 555 put: 'E-INVROWMAP Invalid row mapping array'.
  ErrorDictionary at: 556 put: 'E-INVCOLMAP Invalid column mapping array'.
  ErrorDictionary at: 600 put: 'E-NOIMPLEMENT Operation not implemented'
  " *FandGradF setErrorDictionary1*"

instance creation new: length                                                                                               new:
  ↑super new:(8*(length+1))

newWithNumVars: dimension
    *"Answer an instance of an FAndFPrime vector with f and fprime initialized to 0.0."*

↑self new: dimension newWithNumVars:

newWithNumVars: numVars thisVarNum: num withValue: val
    *"Answer an instance of an FAndGradF vector with f initialized to 'val'*
    *and fprime initialized to 0.0."*

| tmp |
    tmp ← self new: numVars.
    tmp value: val.
    tmp derivativeAt: num put:1.
    ↑tmp newWithNumVars:thisVarNum:withValue:

newWithNumVars: numVars withConstValue: val
    *"Answer an instance of an FAndGradF vector with f initialized to 'val'*
    *and fprime initialized to 0.0."*

| tmp |
    tmp ← self new: numVars.
    tmp value: val.
    ↑tmp newWithNumVars:withConstValue:

preferred preferredArrayClass
        *"Answer the class for use when accessing derivatives as a vector."*
        *"Author: 12 Jan 1989 graemeb"*

↑SimVectorIP preferredArrayClass testing primitivelyImplementsBinarySelector: operator
        *"Answer true if the given binary operator is implemented primitively by FAndGradF, else answer false."*
        *"Arguments: operator - <Symbol>"*
        *"Author: 29 Jan 1989 graemeb"* self opcodeForBinarySelector: operator ifAbsent: [↑false].
        ↑true primitivelyImplementsBinarySelector:

primitivelyImplementsRelationalSelector: operator
        *"Answer true if the given unary operator is implemented primitively by FAndGradF, else answer false."*
        *"Arguments: operator - <Symbol>"*
        *"Author: 29 Jan 1989 graemeb"* self opcodeForRelationalSelector: operator ifAbsent: [↑false].
        ↑true primitivelyImplementsRelationalSelector:

primitivesAvailable
        *"Answer true if the ADS interpreter is being used, else answer false."*
        *"Author: 29 Jan 1989 graemeb"*

↑self getError ~= -1 primitivesAvailable accessing opcodeForBinarySelector: operator
        *"Answer the FAndGradF primitive code, as a SmallInteger, for the given binary operator."* opcodeForBinarySelector:

"Arguments: operator - <Symbol> The binary operator"
"Author: 29 Jan 1989 graemeb"

↑self opcodeForBinarySelector: operator ifAbsent: [self internalError: 'Selector ''' , operator , ''' not in BinarySelectors for ' , self name]

opcodeForBinarySelector: operator ifAbsent: aBlock   opcodeForBinarySelector:ifAbsent:
"Answer the FAndGradF primitive code, as a SmallInteger, for the given binary operator. Execute aBlock if the operator is not found."
"Arguments:
    operator- <Symbol>
    aBlock    - <BlockContext>"
"Author: 29 Jan 1989 graemeb"

↑(BinarySelectors indexOf: operator ifAbsent: [↑aBlock value])
    - 1 opcodeForRelationalSelector: operator   opcodeForRelationalSelector:
"Answer the FAndGradF primitive code, as a SmallInteger, for the given relational operator. Execute aBlock if the operator is not found."
"Arguments:
    operator- <Symbol>"
"Author: 29 Jan 1989 graemeb"

↑self opcodeForRelationalSelector: operator ifAbsent: [self internalError: 'Selector ''' , operator , ''' not in RelationalSelectors for ' , self name]

opcodeForRelationalSelector:ifAbsent:
opcodeForRelationalSelector: operator ifAbsent: aBlock
"Answer the FAndGradF primitive code, as a SmallInteger, for the given relational operator. Execute aBlock if the operator is not found."
"Arguments:
    operator- <Symbol>
    aBlock    - <BlockContext>"
"Author: 29 Jan 1989 graemeb"

↑(RelationalSelectors indexOf: operator ifAbsent: [↑aBlock value])
    - 1 opcodeForUnarySelector: operator   opcodeForUnarySelector:
"Answer the FAndGradF primitive code, as a SmallInteger, for the given unary operator."
"Arguments: operator - <Symbol> The unary operator"
"Author: 29 Jan 1989 graemeb"

↑self opcodeForUnarySelector: operator ifAbsent: [self internalError: 'Selector ''' , operator , ''' not in UnarySelectors for ' , self name]

opcodeForUnarySelector: operator ifAbsent: aBlock   opcodeForUnarySelector:ifAbsent:
"Answer the FAndGradF primitive code, as a SmallInteger, for the given unary operator. Execute aBlock if the operator is not found."
"Arguments:
    operator- <Symbol>
    aBlock    - <BlockContext>"
"Author: 29 Jan 1989 graemeb"

↑(UnarySelectors indexOf: operator ifAbsent: [↑aBlock value])
    - 1 error handling getError   getError
"Answer the latest error code for FAndGradF as a SmallInteger. (Kurt has text for error codes.) Answer -1 if the primitive fails. This indicates that the special ADS interpreter is not being used."
"Author: 29 Jan 1989 graemeb"

```
< primitive: 255>
↑-1
```

FAndGradF initialize

APPENDIX F

*From Tektronix Smalltalk-80 version TB2.2.2a of May 05, 1988, 18:14:03. on 19 September 1990 at 5:03:44 pm
ADS version: ADS.2c3aTEK.007.LBa6.020*

─────────────── CodeGenFAndGradF ───────────────

Object subclass: #CodeGenFAndGradF                                              *CodeGenFAndGradF*
   instanceVariableNames: 'context activeDerivatives functionValue gradientValues'
   classVariableNames: ''
   poolDictionaries: ''
   category: 'Tspice-MDS-To-C'
CodeGenFAndGradF comment:
'This class is used to represent an arithmetic value during the code-generation process.
Author: 4 May 1989 graemeb; Revised: 17 Nov 89 sueb Instance variables:

activeDerivatives       <Integer>          active-derivative mask with one bit allocated for each derivative
wrt a model argument
context        <ModelCodeGenContext>
functionValue           <code-generation node>
gradientValues          <Array>            of code-generation value nodes representing the values of the
derivatives' controlling boolean:then:else:context:
boolean: booleanValue then: thenBlock else: elseBlock context: aContext
   "Answer a CodeGenFAndGradF whose value represents an inline 'if then else' statement. The result will
contain a symbolic representation of the operation on the function values and all active partial derivatives. A
regular 'if then else' statement is generated which assigns values to temporaries and these values are referenced
by the returned CGF."
   "Arguments:
      booleanValue     - <CodeGenBoolean>
      thenValue        - <CodeGenFAndGradF>
      elseValue        - <CodeGenFAndGradF>"
   "Author: 8 May 1989 graemeb; Modified: 15 Aug 89 graemeb; Revised: 17 Nov 89 sueb (move
temporaryAssignments to context) ; Revised: 24 Jan 90 sueb (removed unused temp) ; Revised: 2 Mar 90 sueb
(pass in context)"

| preDeriv postDeriv deriv zeroNode then else thenValue elseValue previousTempAssignments | context ← aContext.
   previousTempAssignments ← context temporaryAssignments.
   context resetTemporaryAssignments.

then ← TspiceCodeGenBlockNode new initialize.
   else ← TspiceCodeGenBlockNode new initialize.
   thenValue ← thenBlock value.
   context addTemporaryAssignmentStatementsTo: then.
   context resetTemporaryAssignments.

elseValue ← elseBlock value.
   context addTemporaryAssignmentStatementsTo: else.

context resetTemporaryAssignments.
then addTemporaryAssignmentForValue: thenValue functionValue inContext: context.
functionValue ← else reuseTemporaryAssignmentForValue: elseValue functionValue inContext: context.
context addTemporaryBoolean: (TspiceCodeGenConditionalNode new boolean: booleanValue functionValue then: then else: else).

activeDerivatives ← thenValue activeDerivatives bitOr: elseValue activeDerivatives.
gradientValues ← Array new: (thenValue size max: elseValue size).
zeroNode ← TspiceCodeGenLiteralNode zero.
1 to: gradientValues size do:
   [: i |
   preDeriv ← thenValue derivativeActiveFor: i.
   postDeriv ← elseValue derivativeActiveFor: i.
   preDeriv
      ifTrue: [postDeriv
          ifTrue: [then addTemporaryAssignmentForValue: (thenValue derivativeAt: i) inContext: context.
          deriv ← else reuseTemporaryAssignmentForValue: (elseValue derivativeAt: i) inContext: context]
          ifFalse: [then addTemporaryAssignmentForValue: (thenValue derivativeAt: i) inContext: context.
          deriv ← else reuseTemporaryAssignmentForValue: zeroNode inContext: context]]
      ifFalse: [postDeriv
          ifTrue: [then addTemporaryAssignmentForValue: zeroNode inContext: context.
          deriv ← else reuseTemporaryAssignmentForValue: (elseValue derivativeAt: i) inContext: context]
          ifFalse: [deriv ← nil]].
   gradientValues at: i put: deriv].

previousTempAssignments addAll: context temporaryAssignments.
context temporaryAssignments: previousTempAssignments "* 5 Mar 90 10:23 am sueb *"

arithmetic binary

* aCGFGF

"Answer the product of self with aCGFGF. The result will contain a symbolic representation of the operation on the function values and all active partial derivatives."
"Arguments:
   aCGFGF - <CodeGenFAndGradF>"
"Author: 5 May 1989 graemeb"

↑self species new preOperand: self timesPostOperand: aCGFGF

+ aCGFGF

"Answer the sum of self with aCGFGF. The result will contain a symbolic representation of the operation on the function values and all active partial derivatives."
"Arguments:
   aCGFGF - <CodeGenFAndGradF>"
"Author: 5 May 1989 graemeb"

↑self species new preOperand: self plusPostOperand: aCGFGF

- aCGFGF

"Answer the difference of self with aCGFGF. The result will contain a symbolic representation of the operation on the function values and all active partial derivatives."
"Arguments:
   aCGFGF - <CodeGenFAndGradF>"
"Author: 5 May 1989 graemeb"

↑self species new preOperand: self minusPostOperand: aCGFGF

/ aCGFGF

"Answer the quotient of self with aCGFGF. The result will contain a symbolic representation of the operation on the function values and all active partial derivatives."

```
"Arguments:
    aCGFGF - <CodeGenFAndGradF>"
"Author: 5 May 1989 graemeb"
```

↑self species new preOperand: self overPostOperand: aCGFGF protectedRaisedTo: aCGFGF                                                                                                  protectedRaisedTo:
"Answer the exponentiation of self with aCGFGF where it is known that self > 0. The result will contain a symbolic representation of the operation on the function values and all active partial derivatives."
```
"Arguments:
    aCGFGF - <CodeGenFAndGradF>"
"Author: 7 Sep 90 graemeb"
```

↑self species new preOperand: self protectedRaisedToPostOperand: aCGFGF

"* 7 Sep 90 7:58 pm graemeb *"

raisedTo: aCGFGF                                                                                                                         raisedTo:
"Answer the exponentiation of self with aCGFGF. The result will contain a symbolic representation of the operation on the function values and all active partial derivatives."
```
"Arguments:
    aCGFGF - <CodeGenFAndGradF>"
"Author: 5 May 1989 graemeb"
```

↑self species new preOperand: self raisedToPostOperand: aCGFGF accessing activeDerivatives                                                                                                                     activeDerivatives
"Answer the active-derivatives mask as an Integer."
"Author: 5 May 1989 graemeb"

↑activeDerivatives context                                                                                                                                               context
"Answer the code-generation context."
"Author: 5 May 1989 graemeb"

↑context derivativeAt: argumentNumber                                                                                           derivativeAt:
"Answer the value of the derivative of this variable with respect to the given model argument number. The derivative value is a code-generation node."
"Author: 5 May 1989 graemeb"

↑gradientValues at: argumentNumber functionArgValue                                                                                                                   functionArgValue
"Answer the name of this variable as a code-generation value node. (Arguments print specially)"
"Author: 5 May 1989 graemeb"

↑functionValue functionValue                                                                                                                             functionValue
"Answer the function value of this variable as a code-generation value node."
"Author: 5 May 1989 graemeb"

↑functionValue gradientValues                                                                                                                         gradientValues
"Answer the derivatives of this variable as an Array of code-generation value nodes."
"Author: 5 May 1989 graemeb"

↑gradientValues numberOfActiveDerivatives
"Answer the number of active (non-zero) derivatives for the receiver."
"Author: 27 Oct 89 sueb"

↑activeDerivatives numBits size
"Answer the number of derivatives (active and inactive) carried in this variable."
"Author: 5 May 1989 graemeb"

↑gradientValues size value
"This is here for compatibility with TspiceCodeGenBlockNodes -- both may be sent as 'then' and 'else' values used to create ConditionalNodes. Instances of this class simply return self when sent this message."
"Author: 6 Nov 89 sueb"

↑self arithmetic unary abs
"Answer abs(self)"
"Author: 8 May 1989 graemeb"

↑self species new absOperand: self arctan
"Answer atan(self)"
"Author: 8 May 1989 graemeb"

↑self species new atanOperand: self

"* 17 Aug 90 11:13 am erniem *"

arcTan
"Answer atan(self)"
"Author: 8 May 1989 graemeb"

↑self species new atanOperand: self

"* 17 Aug 90 11:13 am erniem *"

atan
"Answer atan(self)"
"Author: 8 May 1989 graemeb"

↑self species new atanOperand: self

"* 17 Aug 90 11:02 am erniem *"

cos
"Answer cos(self)"
"Author: 5 Mar 90 graemeb"

↑self species new cosOperand: self

"* 5 Mar 90 12:16 pm erniem *"

exp
"Answer exp(self)"
"Author: 8 May 1989 graemeb"

↑self species new expOperand: self ln
"Answer ln(self)"
"Author: 8 May 1989 graemeb"

↑self species new lnOperand: self negated
"Answer -(self)"
"Author: 8 May 1989 graemeb"

↑self species new negatedOperand: self reciprocal
"Answer 1/(self)"
"Author: 8 May 1989 graemeb"

↑self species new reciprocalOperand: self
arithmetic unary signum
"Answer signum(self)"
"Author: 8 Dec 89 graemeb"

↑self species new signumOperand: self sin
"Answer sin(self)"
"Author: 5 Mar 90 graemeb"

↑self species new sinOperand: self

"* 5 Mar 90 12:15 pm erniem *"

sqrt
"Answer sqrt(self)"
"Author: 8 May 1989 graemeb"

↑self species new sqrtOperand: self special functions bessel2Operand: operand delay: newDelayArgument
"Generate the code to return the ddt of the receiver for the backend simulator."
"Author: 4 Apr 90 sueb ; Revised: 30 Apr 90 sueb ; Revised: 4 May 90 graemeb "

| instanceIndex deriv operandTemp offset |
context ← operand context.
activeDerivatives ← operand activeDerivatives.
gradientValues ← Array new: operand size.
instanceIndex ← TspiceCodeGenLiteralNode new value: context nextBesselInstance.
"Force a separate statement for storing the delay value. This is arg independent so will be moved to AI code."
newDelayArgument activeDerivatives > 0
    ifTrue:
        [self userError: 'Bessel2 arg. < ', newDelayArgument functionValue printString, ' > is argument dependent.'].
context addTemporaryAssignment: (newDelayArgument functionValue storeBessel2ParameterForInstance: instanceIndex).
offset ← context nextTemporaryInteger.
context addExternalVariable: offset name.
functionValue ← operand functionValue bessel2ForInstance: instanceIndex delay: offset.

activeDerivatives > 0
    ifTrue:
        [1 to: gradientValues size do: [: i |
            (operand derivativeActiveFor: i)

ln negated reciprocal

- CodeGenFAndGradF signum sin sqrt bessel2Operand:delay:

```
                    ifTrue: [deriv ← (operand derivativeAt: i) bessel2Derivative: offset]
                    ifFalse: [deriv ← nil].
                gradientValues at: i put: deriv]]
```

"* 21 Aug 90 2:36 pm graemeb *"

ddtOperand: operand                                                                ddtOperand:
"Generate the code to return the ddt of the receiver for the backend simulator."
"Author: 4 Apr 90 sueb"

```
| instanceIndex deriv offset |
context ← operand context.
activeDerivatives ← operand activeDerivatives.
gradientValues ← Array new: operand size.
instanceIndex ← TspiceCodeGenLiteralNode new value: context nextDdtInstance.
offset ← context nextTemporaryInteger.
context addExternalVariable: offset name.
functionValue ← operand functionValue ddtForInstance: instanceIndex offset: offset.
activeDerivatives > 0
    ifTrue:
        [1 to: gradientValues size do: [:i |
            (operand derivativeActiveFor: i)
                ifTrue: [deriv ← (operand derivativeAt: i) ddtDerivative]
                ifFalse: [deriv ← nil].
            gradientValues at: i put: deriv]]
```

"* 23 Aug 90 9:45 am graemeb *"

delayOperand: operand delay: newDelayArgument                                      delayOperand:delay:
"Generate the code to return the ddt of the receiver for the backend simulator."
"Author: 4 Apr 90 sueb ; Revised: 30 Apr 90 sueb; Revised: 4 May 90 graemeb"

```
| instanceIndex deriv offset |
context ← operand context.
activeDerivatives ← operand activeDerivatives.
gradientValues ← Array new: operand size.
instanceIndex ← TspiceCodeGenLiteralNode new value: context nextDelayInstance.
```

"Force a separate statement for storing the delay value. This is arg independent so will be moved to AI code."
```
newDelayArgument activeDerivatives > 0
    ifTrue:
        [self userError: 'Delay arg. < ', newDelayArgument functionValue printString, ' > is argument dependent.'].
context addTemporaryAssignment: (newDelayArgument functionValue storeDelayParameterForInstance: instanceIndex).
offset ← context nextTemporaryInteger.
context addExternalVariable: offset name.
functionValue ← operand functionValue delayForInstance: instanceIndex delay: offset.

activeDerivatives > 0
    ifTrue:
        [1 to: gradientValues size do: [:i |
            (operand derivativeActiveFor: i)
                ifTrue: [deriv ← (operand derivativeAt: i) delayDerivative: offset]
                ifFalse: [deriv ← nil].
            gradientValues at: i put: deriv]]
```
integralOperand: operand                                                           integralOperand:
"Generate the code to return the integral of the receiver for the backend simulator."
"Author: 4 Apr 90 sueb; Revised: 4 May 90 graemeb"

```
| instanceIndex deriv offset |
context ← operand context.
activeDerivatives ← operand activeDerivatives.
gradientValues ← Array new: operand size.
instanceIndex ← TspiceCodeGenLiteralNode new value: context nextIntegralInstance.
offset ← context nextTemporaryInteger.
context addExternalVariable: offset name.
functionValue ← operand functionValue integralForInstance: instanceIndex offset: offset.
```

```
        activeDerivatives > 0
            ifTrue:
                [1 to: gradientValues size do: [:i |
                    (operand derivativeActiveFor: i)
                        ifTrue: [deriv ← (operand derivativeAt: i) integralDerivative]
                        ifFalse: [deriv ← nil].
                    gradientValues at: i put: deriv]]

"* 23 Aug 90 4:22 pm graemeb *"
``` private absOperand: operand                                                                                                    absOperand:
    *"Load the receiver with CodeGen nodes to represent abs(operand)."*
    *"Arguments: operand - <CodeGenFAndGradF>"*
    *"Author: 28 Feb 1989 graemeb; Revised: 6 Dec 89 sueb (suppress creation of temporaryAssignments) ;*
    *Revised: 1 Aug 90 kurtk (un-suppress creation of temporaryAssignments)"*

```
    | deriv operandTemp fPrime |
    context ← operand context.
    activeDerivatives ← operand activeDerivatives.
    gradientValues ← Array new: operand size.
    activeDerivatives > 0
        ifTrue:
            [operand functionValue isExpression
                ifTrue: [operandTemp ← context addTemporaryAssignment: operand functionValue]
                ifFalse: [operandTemp ← operand functionValue].
            functionValue ← operandTemp abs.
            fPrime ← operandTemp sign.
            activeDerivatives numBits > 1 ifTrue: [fPrime ← context addTemporaryAssignment: operandTemp
sign].
            1 to: gradientValues size do:
                [:i |
                (operand derivativeActiveFor: i)
                    ifTrue: [deriv ← fPrime * (operand derivativeAt: i)]
                    ifFalse: [deriv ← nil].
                gradientValues at: i put: deriv]]
        ifFalse: [functionValue ← operand functionValue abs]
``` atanOperand: operand                                                                                                    atanOperand:
    *"Load the receiver with CodeGen nodes to represent atan(operand)."*
    *"Arguments: operand - <CodeGenFAndGradF>"*
    *"Author: 28 Feb 1989 graemeb; Revised: 6 Dec 89 sueb (suppress creation of temporaryAssignments)"*

```
    | deriv fPrime one operandTemp |
    context ← operand context.
    activeDerivatives ← operand activeDerivatives.
    gradientValues ← Array new: operand size.
    activeDerivatives > 0
        ifTrue: [ functionValue ← operand functionValue atan.

one ← TspiceCodeGenLiteralNode one.
            operandTemp ← context addTemporaryAssignment: operand functionValue.
            fPrime ← (one + (operandTemp * operandTemp)) reciprocal.

1 to: gradientValues size do: [:i |
                (operand derivativeActiveFor: i)
                    ifTrue: [deriv ← fPrime * (operand derivativeAt: i)]
                    ifFalse: [deriv ← nil].
                gradientValues at: i put: deriv]]

ifFalse:
            [functionValue ← operand functionValue atan].

"* 17 Aug 90 11:16 am erniem *"
``` cosOperand: operand
    "*Load the receiver with CodeGen nodes to represent cos(operand).*"
    "*Arguments: operand - <CodeGenFAndGradF>*"
    "*Author: 5 Mar 90 graemeb (suppress creation of temporaryAssignments); Revised: 4 May 90 graemeb ;*
    *Revised: 1 Aug 90 kurtk (un-suppress creation of temporaryAssignments)*"

| deriv operandTemp fPrime |
    context ← operand context.
    activeDerivatives ← operand activeDerivatives.
    gradientValues ← Array new: operand size.
    activeDerivatives > 0
        ifTrue:
            [operand functionValue isExpression
                ifTrue: [operandTemp ← context addTemporaryAssignment: operand functionValue]
                ifFalse: [operandTemp ← operand functionValue].
            functionValue ← operandTemp cos.
            activeDerivatives numBits > 1
                ifTrue: [fPrime ← context addTemporaryAssignment: operandTemp sin negated]
                ifFalse: [fPrime ← operandTemp sin negated].
            1 to: gradientValues size do:
                [: i |
                (operand derivativeActiveFor: i)
                    ifTrue: [deriv ← fPrime * (operand derivativeAt: i)]
                    ifFalse: [deriv ← nil].
                gradientValues at: i put: deriv]]
        ifFalse: [functionValue ← operand functionValue cos]

expOperand: operand
    "*Load the receiver with CodeGen nodes to represent exp(operand).*"
    "*Arguments: operand - <CodeGenFAndGradF>*"
    "*Author: 28 Feb 1989 graemeb; Revised: 6 Dec 89 sueb (suppress creation of temporaryAssignments) ;*
    *Revised: 1 Aug 90 kurtk (un-suppress creation of temporaryAssignments)*"

| deriv |
    context ← operand context.
    activeDerivatives ← operand activeDerivatives.
    gradientValues ← Array new: operand size.
    activeDerivatives > 0
        ifTrue:
            [functionValue ← context addTemporaryAssignment: operand functionValue exp.
            1 to: gradientValues size do:
                [: i |
                (operand derivativeActiveFor: i)
                    ifTrue: [deriv ← functionValue * (operand derivativeAt: i)]
                    ifFalse: [deriv ← nil].
                gradientValues at: i put: deriv]]
        ifFalse: [functionValue ← operand functionValue exp]

"* 8 Aug 90 11:23 am kurtk *"

lnOperand: operand
    "*Load the receiver with CodeGen nodes to represent ln(operand).*"
    "*Arguments: operand - <CodeGenFAndGradF>*"
    "*Author: 28 Feb 1989 graemeb; Revised: 6 Dec 89 sueb (suppress creation of temporaryAssignments)*
    *Revised: 3 Aug 90 kurtk (un-suppress creation of temporaryAssignments)*"

| deriv operandTemp fPrime |
    context ← operand context.
    activeDerivatives ← operand activeDerivatives.
    gradientValues ← Array new: operand size.
    activeDerivatives > 0
        ifTrue:
            [operand functionValue isExpression
                ifTrue:
                    [operandTemp ← context addTemporaryAssignment: operand functionValue]
                ifFalse:
                    [operandTemp ← operand functionValue].
            functionValue ← context addTemporaryAssignment: operandTemp ln.
            fPrime ← functionValue reciprocal.
            1 to: gradientValues size do: [: i |

```
            (operand derivativeActiveFor: i)
                ifTrue: [deriv ← fPrime * (operand derivativeAt: i)]
                ifFalse: [deriv ← nil].
            gradientValues at: i put: deriv]]

ifFalse:
        [functionValue ← operand functionValue ln].
``` negatedOperand: operand                                                                    negatedOperand:
  *"Load the receiver with CodeGen nodes to represent -(operand)."*
  *"Arguments: operand - <CodeGenFAndGradF>"*
  *"Author:  8 May 1989 graemeb;  Revised:  6 Nov 89 sueb  (move temporaryAssignments to context)"*

```
| deriv |
context ← operand context.
activeDerivatives ← operand activeDerivatives.
functionValue ← operand functionValue negated.
gradientValues ← Array new: operand size.
1 to: gradientValues size do:
    [:i |
    (operand derivativeActiveFor: i)
        ifTrue: [deriv ← (operand derivativeAt: i) negated]
        ifFalse: [deriv ← nil].
    gradientValues at: i put: deriv]
``` pcomplexWithArgs: args                                                                      pcomplexWithArgs:
  *"Answer the Complex number which has the magnitude of arg1 and phase (in degrees) of arg2."*
  *"Arguments: args - <Array> of code-generation values"*
  *"Author: 8 May 1989 graemeb"*

```
| magnitude |
magnitude ← args at: 1.
context ← magnitude context.
context analysisMode = #dc
    ifTrue: [↑magnitude].
```

*"the next line is probably just a temporary kludge to get at more of the transient code."*
```
context analysisMode = #transient
    ifTrue: [↑magnitude].
``` self halt: 'pcomplex only implemented for dc.'.

*"activeDerivatives ← magnitude activeDerivatives.*
  *temporaryAssignments ← magnitude temporaryAssignments.*

*functionArgs ← Array new: args size.*
  *1 to: args size do: [:i | functionArgs at: i put: ((args at: i) functionValue)].*
  *functionValue ← imposedValue functionValue pcomplexWithArgs: functionArgs.*

*gradientValues ← imposedValue gradientValues."*

*"* 4 Apr 90 11:18 am sueb *"* preOperand:minusPostOperand:
preOperand: preOperand minusPostOperand: postOperand
  *"Answer the difference of preOperand with postOperand. The result will contain a symbolic representation
  of the operation on the function values and all active partial derivatives."*
  *"Arguments:*
       *preOperand - <CodeGenFAndGradF>*
       *postOperand - <CodeGenFAndGradF>"*
  *"Author:  8 May 1989 graemeb;  Revised:  6 Nov 89 sueb  (move temporaryAssignments to context)"*

```
| preDeriv postDeriv deriv |
context ← preOperand context.
activeDerivatives ← preOperand activeDerivatives bitOr: postOperand activeDerivatives.
functionValue ← preOperand functionValue - postOperand functionValue.
gradientValues ← Array new: (preOperand size max: postOperand size).
1 to: gradientValues size do:
    [:i |
```

```
        preDeriv ← preOperand derivativeActiveFor: i.
        postDeriv ← postOperand derivativeActiveFor: i.
        preDeriv
            ifTrue: [postDeriv
                        ifTrue: [deriv ← (preOperand derivativeAt: i)  - (postOperand derivativeAt: i)]
                        ifFalse: [deriv ← preOperand derivativeAt: i]]
            ifFalse: [postDeriv
                        ifTrue: [deriv ← (postOperand derivativeAt: i) negated]
                        ifFalse: [deriv ← nil]].
        gradientValues at: i put: deriv]
``` preOperand: preOperand overPostOperand: postOperand                           preOperand:overPostOperand:
"Answer the quotient of preOperand with postOperand. The result will contain a symbolic representation of the operation on the function values and all active partial derivatives."
"Arguments:
    preOperand - <CodeGenFAndGradF>
    postOperand - <CodeGenFAndGradF>"
"Author: 8 May 1989 graemeb; Revised: 6 Dec 89 sueb (suppress creation of temporaryAssignments) ; Revised: 16 Aug 90 kurtk "

```
| preDeriv postDeriv deriv preOperandFunctionValue postOperandFunctionValue |
context ← preOperand context.
activeDerivatives ← preOperand activeDerivatives bitOr: postOperand activeDerivatives.
preOperandFunctionValue ← preOperand functionValue.
postOperandFunctionValue ← postOperand functionValue.
activeDerivatives > 0
    ifTrue:
        [(preOperandFunctionValue isExpression and: [postOperand activeDerivatives > 0])
            ifTrue: [preOperandFunctionValue ← context addTemporaryAssignment:
preOperandFunctionValue].
        (postOperandFunctionValue isExpression and: [postOperand activeDerivatives > 0 or: [preOperand
activeDerivatives > 0]])
            ifTrue: [postOperandFunctionValue ← context addTemporaryAssignment:
postOperandFunctionValue]].
functionValue ← preOperandFunctionValue / postOperandFunctionValue.
gradientValues ← Array new: (preOperand size max: postOperand size).
postOperand activeDerivatives > 0
    ifTrue:
        [functionValue ← context addTemporaryAssignment: functionValue].
1 to: gradientValues size do:
    [: i |
    preDeriv ← preOperand derivativeActiveFor: i.
    postDeriv ← postOperand derivativeActiveFor: i.
    preDeriv
        ifTrue: [postDeriv
                    ifTrue: [deriv ← (preOperand derivativeAt: i) - (functionValue * (postOperand
derivativeAt: i)) / postOperandFunctionValue]
                    ifFalse: [deriv ← (preOperand derivativeAt: i) / postOperandFunctionValue]]
        ifFalse: [postDeriv
                    ifTrue: [deriv ← functionValue negated * (postOperand derivativeAt: i) /
postOperandFunctionValue]
                    ifFalse: [deriv ← nil]].
    gradientValues at: i put: deriv]
```

"* 22 Aug 90 11:33 am kurtk *"

preOperand: preOperand plusPostOperand: postOperand                           preOperand:plusPostOperand:
"Answer the sum of preOperand with postOperand. The result will contain a symbolic representation of the operation on the function values and all active partial derivatives."
"Arguments:
    preOperand - <CodeGenFAndGradF>
    postOperand - <CodeGenFAndGradF>"
"Author: 8 May 1989 graemeb; Revised: 6 Nov 89 sueb (move temporaryAssignments to context)"

```
| preDeriv postDeriv deriv |
context ← preOperand context.
activeDerivatives ← preOperand activeDerivatives bitOr: postOperand activeDerivatives.
functionValue ← preOperand functionValue + postOperand functionValue.
gradientValues ← Array new: (preOperand size max: postOperand size).
1 to: gradientValues size do:
```

```
[: i |
preDeriv ← preOperand derivativeActiveFor: i.
postDeriv ← postOperand derivativeActiveFor: i.
preDeriv
    ifTrue: [postDeriv
              ifTrue: [deriv ← (preOperand derivativeAt: i) + (postOperand derivativeAt: i)]
              ifFalse: [deriv ← preOperand derivativeAt: i]]
    ifFalse: [postDeriv
              ifTrue: [deriv ← postOperand derivativeAt: i]
              ifFalse: [deriv ← nil]].
gradientValues at: i put: deriv]
```

"* 3 Aug 90 12:57 pm kurtk *"

preOperand:protectedRaisedToPostOperand:
preOperand: preOperand protectedRaisedToPostOperand: postOperand
"Answer the exponentiation of preOperand with postOperand where it is known that preOperand > 0. The result will contain a symbolic representation of the operation on the function values and all active partial derivatives."
"Arguments:
preOperand - <CodeGenFAndGradF>
postOperand - <CodeGenFAndGradF>"
"Author: 7 Sep 90 graemeb"

```
| deriv preOperandFunctionValue postOperandFunctionValue factor1 factor2 |
context ← preOperand context.
activeDerivatives ← preOperand activeDerivatives bitOr: postOperand activeDerivatives.
preOperandFunctionValue ← preOperand functionValue.
postOperandFunctionValue ← postOperand functionValue.
gradientValues ← Array new: (preOperand size max: postOperand size).
activeDerivatives > 0
    ifTrue:
        [preOperandFunctionValue isExpression ifTrue: [preOperandFunctionValue ← context
addTemporaryAssignment: preOperandFunctionValue].
        (preOperand activeDerivatives > 0 and: [postOperandFunctionValue isExpression])
            ifTrue: [postOperandFunctionValue ← context addTemporaryAssignment:
postOperandFunctionValue].
        functionValue ← context addTemporaryAssignment: (preOperandFunctionValue protectedRaisedTo:
postOperandFunctionValue).
        factor1 ← postOperandFunctionValue * (functionValue / preOperandFunctionValue).
        preOperand numberOfActiveDerivatives > 1 ifTrue: [factor1 ← context addTemporaryAssignment:
factor1].
        postOperand activeDerivatives > 0
            ifTrue:
                ["postOperand has active derivatives"
                "post*pre↑(post-1)"
                factor2 ← preOperandFunctionValue ln * functionValue.
                postOperand numberOfActiveDerivatives > 1 ifTrue: [factor2 ← context
addTemporaryAssignment: factor2].
                1 to: gradientValues size do:
                    [: i |
                    (preOperand derivativeActiveFor: i)
                        ifTrue: [deriv ← factor1 * (preOperand derivativeAt: i)]
                        ifFalse: [deriv ← nil].
                    (postOperand derivativeActiveFor: i)
                        ifTrue: [deriv isNil
                                  ifTrue: [deriv ← factor2 * (postOperand derivativeAt: i)]
                                  ifFalse: [deriv ← deriv + factor2 * (postOperand derivativeAt: i)]].
                    gradientValues at: i put: deriv]]
            ifFalse: ["postOperand is a scalar"
                1 to: gradientValues size do: [: i | (preOperand derivativeActiveFor: i)
                    ifTrue:
                        [deriv ← factor1 * (preOperand derivativeAt: i).
                        gradientValues at: i put: deriv]]]]
    ifFalse: [functionValue ← preOperandFunctionValue protectedRaisedTo: postOperandFunctionValue]
```

"* 7 Sep 90 7:56 pm graemeb *"

preOperand:raisedToPostOperand:

preOperand: preOperand raisedToPostOperand: postOperand
  "*Answer the exponentiation of preOperand with postOperand. The result will contain a symbolic representation of the operation on the function values and all active partial derivatives.*"
  "*Arguments:*
  *preOperand - <CodeGenFAndGradF>*
  *postOperand - <CodeGenFAndGradF>*"
  "*Author: 8 May 1989 graemeb; Revised: 6 Nov 89 sueb (move temporaryAssignments to context) ; Revised: 9 Aug 90 kurtk re-enable temp assignments, massive rewrite, implement x↑y where both x & y have active derivatives.*"

| deriv preOperandFunctionValue postOperandFunctionValue factor1 factor2 |
  context ← preOperand context.
  activeDerivatives ← preOperand activeDerivatives bitOr: postOperand activeDerivatives.
  preOperandFunctionValue ← preOperand functionValue.
  postOperandFunctionValue ← postOperand functionValue.

gradientValues ← Array new: (preOperand size max: postOperand size).
  activeDerivatives > 0
    ifTrue:
      [preOperandFunctionValue isExpression ifTrue: [preOperandFunctionValue ← context addTemporaryAssignment: preOperandFunctionValue].
        . (preOperand activeDerivatives > 0 and: [postOperandFunctionValue isExpression])
          ifTrue: [postOperandFunctionValue ← context addTemporaryAssignment: postOperandFunctionValue].
        functionValue ← context addTemporaryAssignment: (preOperandFunctionValue raisedTo: postOperandFunctionValue).
        factor1 ← postOperandFunctionValue * (functionValue / preOperandFunctionValue).
        preOperand numberOfActiveDerivatives > 1 ifTrue: [factor1 ← context addTemporaryAssignment: factor1].
        postOperand activeDerivatives > 0
          ifTrue:
            ["*postOperand has active derivatives*"
            "*post*pre↑(post-1)*"
            factor2 ← preOperandFunctionValue ln * functionValue.
            postOperand numberOfActiveDerivatives > 1 ifTrue: [factor2 ← context addTemporaryAssignment: factor2].
            1 to: gradientValues size do:
              [: i |
              (preOperand derivativeActiveFor: i)
                ifTrue: [deriv ← factor1 * (preOperand derivativeAt: i)]
                ifFalse: [deriv ← nil].
              (postOperand derivativeActiveFor: i)
                ifTrue: [deriv isNil
                  ifTrue: [deriv ← factor2 * (postOperand derivativeAt: i)]
                  ifFalse: [deriv ← deriv + factor2 * (postOperand derivativeAt: i)]].
              gradientValues at: i put: deriv]]
          ifFalse: ["*postOperand is a scalar*"
            1 to: gradientValues size do: [:i | (preOperand derivativeActiveFor: i)
              ifTrue:
                [deriv ← factor1 * (preOperand derivativeAt: i).
                gradientValues at: i put: deriv]]]]
    ifFalse: [functionValue ← preOperandFunctionValue raisedTo: postOperandFunctionValue]

"* 10 Aug 90 9:57 am kurtk *"

preOperand:timesPostOperand:

preOperand: preOperand timesPostOperand: postOperand
  "*Answer the product of preOperand with postOperand. The result will contain a symbolic representation of the operation on the function values and all active partial derivatives.*"
  "*Arguments:*
    *preOperand - <CodeGenFAndGradF>*
    *postOperand - <CodeGenFAndGradF>*"
  "*Author: 5 May 1989 graemeb; Revised: 6 Dec 89 sueb (suppress creation of temporaryAssignments)*"

| preDeriv postDeriv deriv preOperandFunctionValue postOperandFunctionValue |
  context ← preOperand context.

activeDerivatives ← preOperand activeDerivatives bitOr: postOperand activeDerivatives.
preOperandFunctionValue ← preOperand functionValue.
postOperandFunctionValue ← postOperand functionValue.
(preOperandFunctionValue isExpression and: [postOperand activeDerivatives > 0])
    ifTrue: [preOperandFunctionValue ← context addTemporaryAssignment: preOperandFunctionValue].
(postOperandFunctionValue isExpression and: [preOperand activeDerivatives > 0])
    ifTrue: [postOperandFunctionValue ← context addTemporaryAssignment: postOperandFunctionValue].
functionValue ← preOperandFunctionValue * postOperandFunctionValue.
gradientValues ← Array new: (preOperand size max: postOperand size).
1 to: gradientValues size do:
    [: i |
    preDeriv ← preOperand derivativeActiveFor: i.
    postDeriv ← postOperand derivativeActiveFor: i.
    preDeriv
        ifTrue: [postDeriv
            ifTrue: [deriv ← preOperandFunctionValue * (postOperand derivativeAt: i) + ((preOperand derivativeAt: i)* postOperandFunctionValue)]
            ifFalse: [deriv ← (preOperand derivativeAt: i)  * postOperandFunctionValue]]
        ifFalse: [postDeriv
            ifTrue: [deriv ← preOperandFunctionValue * (postOperand derivativeAt: i)]
            ifFalse: [deriv ← nil]].
    gradientValues at: i put: deriv]

"* 31 Jul 90 2:05 pm kurtk *"

reciprocalOperand: operand                                          reciprocalOperand:
"Load the receiver with CodeGen nodes to represent 1/(operand)."
"Arguments: operand - <CodeGenFAndGradF>"
"Author: 8 May 1989 graemeb; Revised:  6 Nov 89 sueb (move temporaryAssignments to context) ; Revised: 31 Jul 90 kurtk (add temporary assignment)"

| deriv operandFunctionValue |
context ← operand context.
activeDerivatives ← operand activeDerivatives.
operandFunctionValue ← operand functionValue.
operandFunctionValue isExpression
    ifTrue: [operandFunctionValue ← context addTemporaryAssignment: operandFunctionValue].
functionValue ← operandFunctionValue reciprocal.
gradientValues ← Array new: operand size.
1 to: gradientValues size do:
    [: i |
    (operand derivativeActiveFor: i)
        ifTrue: [deriv ← (operand derivativeAt: i) negated /
            (operandFunctionValue * operandFunctionValue)]
        ifFalse: [deriv ← nil].
    gradientValues at: i put: deriv]

"* 31 Jul 90 6:03 pm kurtk *"

signumOperand: operand                                          signumOperand:
"Load the receiver with CodeGen nodes to represent signum(operand)."
"Arguments: operand - <CodeGenFAndGradF>"
"Author: 8 Dec 89 graemeb;  Revised: 17 Jan 90 sueb (removed temporary assignments) ; Revised: 24 Jan 90 sueb (removed unused temps)"

context ← operand context.
activeDerivatives ← 0.
gradientValues ← Array new: operand size.
functionValue ← operand functionValue signum.

"* 24 Jan 90 5:57 pm sueb *"

sinOperand: operand                                              sinOperand:
"Load the receiver with CodeGen nodes to represent sin(operand)."
"Arguments: operand - <CodeGenFAndGradF>"
"Author: 5 Mar 90 graemeb (suppress creation of
temporaryAssignments); Revised: 4 May 90 graemeb ;
Revised: 1 Aug 90 kurtk (unsuppress creation of
temporaryAssignments)"

| deriv operandTemp fPrime |
context ← operand context.
activeDerivatives ← operand activeDerivatives.
gradientValues ← Array new: operand size.
activeDerivatives > 0
    ifTrue:
        [operand functionValue isExpression
            ifTrue: [operandTemp ← context addTemporaryAssignment: operand functionValue]
            ifFalse: [operandTemp ← operand functionValue].
        functionValue ← operandTemp sin.
        activeDerivatives numBits > 1
            ifTrue: [fPrime ← context addTemporaryAssignment: operandTemp cos]
            ifFalse: [fPrime ← operandTemp cos].
        1 to: gradientValues size do:
            [: i |
            (operand derivativeActiveFor: i)
                ifTrue: [deriv ← fPrime * (operand derivativeAt: i)]
                ifFalse: [deriv ← nil].
            gradientValues at: i put: deriv]]
    ifFalse: [functionValue ← operand functionValue sin]

*"* 3 Aug 90 12:25 pm kurtk *"* smallSignalWithArgs: args                                                   smallSignalWithArgs:
    *"Answer the small-signal component (gradient) of self with respect to the argument. The argument is assumed to be an CodeGenArgumentFAndGradF. This method will fail if this is not true."*
    *"Arguments: args - <Array> of code-generation values"*
    *"Author: 8 May 1989 graemeb; Revised: 6 Nov 89 sueb (move temporaryAssignments to context)"*

| arg1 arg2 |
arg1 ← args at: 1.
arg2 ← args at: 2.
activeDerivatives ← 0.
context ← arg1 context.
functionValue ← arg1 derivativeAt: arg2 argumentNumber.
gradientValues ← Array new: 0.

spiceDepletionChargeWithArgs:inContext:
spiceDepletionChargeWithArgs: args inContext: aContext
    *"Answer the value of junction depletion charge for the given arguments using the spice formula."*
    *"Arguments: args - <Array> of code-generation values"*
    *"Author: 8 May 1989 graemeb ; Revised: 2 Mar 90 sueb (pass context); Revised: 7 Sep 90 graemeb, convert to protected raised to and push out temporary assignments for speed."*

| cj pb mj fc vqj oneMinusFc oneMinusMj oneMinusFcRaisedToMj qj0 qj1 qj2 deltaVj one vj two cpm |
vj ← args at: 1.
cj ← args at: 2.
pb ← args at: 3.
mj ← args at: 4.
fc ← args at: 5.

vqj ← (fc * pb) makeTemporaryAssignment.
one ← 1.0d0 asCodeGenFAndGradFWithContext: vj context.    *"Yuck."*
two ← 2.0d0 asCodeGenFAndGradFWithContext: vj context.
oneMinusMj ← (one - mj) makeTemporaryAssignment.
oneMinusFc ← one - fc.
oneMinusFcRaisedToMj ← oneMinusFc protectedRaisedTo: mj.
qj0 ← (cj * pb * (one - (oneMinusFc / oneMinusFcRaisedToMj)) / oneMinusMj) makeTemporaryAssignment.
qj1 ← (cj / oneMinusFcRaisedToMj) makeTemporaryAssignment.
qj2 ← (cj * mj / (oneMinusFc * oneMinusFcRaisedToMj * pb)) makeTemporaryAssignment.
cpm ← (cj * pb / oneMinusMj) makeTemporaryAssignment.

↑vj > vqj
    iftrue:
        [deltaVj ← vj - vqj.
        (deltaVj * ((deltaVj * (qj2 / two)) + qj1)) + qj0]
    iffalse:

```
    [(one - ((one - (vj / pb)) protectedRaisedTo: oneMinusMj)) * cpm]
        context: aContext
```

*"* 7 Sep 90 8:01 pm graemeb *"* spiceInvertWithArgs: args inContext: aContext                    spiceInvertWithArgs:inContext:
    *"Answer the reciprocal of self if self not the special value.  Answer zero if self is the special value."*
    *"Arguments: args - <Array> of code-generation values"*
    *"Author: 8 May 1989 graemeb ; Revised: 2 Mar 90 sueb (pass context)"*

| arg1 specialValue |
    arg1 ← args at: 1.
    specialValue ← args at: 2.

↑arg1 = specialValue
        iftrue: [0.0d0 asCodeGenFAndGradFWithContext: arg1 context]
        iffalse: [arg1 reciprocal]
        context: aContext

*"* 5 Mar 90 11:49 am sueb *"* spiceJunctionCurrentWithArgs:inContext:
spiceJunctionCurrentWithArgs: args inContext: aContext
    | nfvt is reverseBreakpointVtMultiplier lvj gmin factor lij lgj vj one |
    *"Arguments: args - <Array> of code-generation values"*
    *"Answer the value of junction current for the given arguments using the spice formula."*
    *" ; Revised: 2 Mar 90 sueb (pass context)"* vj ← args at: 1.
    nfvt ← args at: 2.
    is ← args at: 3.
    reverseBreakpointVtMultiplier ← args at: 4.
    lvj ← reverseBreakpointVtMultiplier * nfvt.
    gmin ← args at: 5.
    one ← 1.0d0 asCodeGenFAndGradFWithContext: vj context.

↑vj > lvj
        iftrue:
            [((vj / nfvt) exp - one) * is + (vj * gmin)]
        iffalse:
            [factor ← reverseBreakpointVtMultiplier exp.
            lij ← is * (factor - one) + (gmin * lvj).
            lgj ← is * factor / nfvt + gmin.
            (vj - lvj) * lgj + lij]
        context: aContext

*"* 5 Mar 90 11:49 am sueb *"* sqrtOperand: operand                                              sqrtOperand:
    *"Load the receiver with CodeGen nodes to represent sqrt(operand)."*
    *"Arguments: operand - <CodeGenFAndGradF>"*
    *"Author: 8 May 1989 graemeb; Revised: 6 Nov 89 sueb (move temporaryAssignments to context) ;
    Revised: 1 Aug 90 kurtk (add temporaryAssignments)"*

| deriv operandTemp |
    context ← operand context.
    activeDerivatives ← operand activeDerivatives.
    functionValue ← operand functionValue sqrt.
    gradientValues ← Array new: operand size.
    activeDerivatives > 0
        ifTrue:
            [operand functionValue isExpression
                ifTrue: [operandTemp ← context addTemporaryAssignment: operand functionValue]
                ifFalse: [operandTemp ← operand functionValue].
            functionValue ← context addTemporaryAssignment: operandTemp sqrt.
            1 to: gradientValues size do:
                [:i |
                (operand derivativeActiveFor: i)

```
                ifTrue: [deriv ← (self preferredLiteralNode new value: 0.5d0)
                                / functionValue * (operand derivativeAt: i)]
                ifFalse: [deriv ← nil].
            gradientValues at: i put: deriv]]
    ifFalse: [functionValue ← operand functionValue sqrt]
```

"* 1 Aug 90 12:11 pm kurtk *"

relational binary

< aCGFGF                                                                                             <
"*Answer a boolean value representing self < aCGFGF. The result will contain a symbolic representation of the operation on the function values.*"
"*Arguments:*
    *aCGFGF - <CodeGenFAndGradF>*"
"*Author: 8 May 1989 graemeb*"

↑self preferredBooleanClass new preOperand: self lTPostOperand: aCGFGF

<= aCGFGF                                                                                            <=
"*Answer a boolean value representing self <= aCGFGF. The result will contain a symbolic representation of the operation on the function values.*"
"*Arguments:*
    *aCGFGF - <CodeGenFAndGradF>*"
"*Author: 8 May 1989 graemeb*"

↑self preferredBooleanClass new preOperand: self lEPostOperand: aCGFGF

= aCGFGF                                                                                             =
"*Answer a boolean value representing self = aCGFGF. The result will contain a symbolic representation of the operation on the function values.*"
"*Arguments:*
    *aCGFGF - <CodeGenFAndGradF>*"
"*Author: 8 May 1989 gracmeb*"

↑self preferredBooleanClass new preOperand: self eQPostOperand: aCGFGF

> aCGFGF                                                                                             >
"*Answer a boolean value representing self > aCGFGF. The result will contain a symbolic representation of the operation on the function values.*"
"*Arguments:*
    *aCGFGF - <CodeGenFAndGradF>*"
"*Author: 8 May 1989 graemeb*"

↑self preferredBooleanClass new preOperand: self gTPostOperand: aCGFGF

>= aCGFGF                                                                                            >=
"*Answer a boolean value representing self >= aCGFGF. The result will contain a symbolic representation of the operation on the function values.*"
"*Arguments:*
    *aCGFGF - <CodeGenFAndGradF>*"
"*Author: 8 May 1989 graemeb*"

↑self preferredBooleanClass new preOperand: self gEPostOperand: aCGFGF

~= aCGFGF                                                                                            ~=
"*Answer a boolean value representing self ~= aCGFGF. The result will contain a symbolic representation of the operation on the function values.*"
"*Arguments:*
    *aCGFGF - <CodeGenFAndGradF>*"
"*Author: 8 May 1989 graemeb*"

↑self preferredBooleanClass new preOperand: self nEPostOperand: aCGFGF error handling valueOutOfRange: aVariableNodeWithRangeChecking                            .            valueOutOfRange:
"*Answer a code-generation node representing a 'variable out of range' condition.*"
"*Author: 8 May 1989 graemeb*"

↑functionValue valueOutOfRange: aVariableNodeWithRangeChecking initialize-release makeTemporaryAssignment                                                                                  makeTemporaryAssignment
   "Make a temporary assignment for the function value if there are no active derivatives. This requires that
there be NO REUSE of values since this object is changed to reflect the generated assignment."
   "Author: 8 Aug 90 graemeb"

activeDerivatives = 0 ifTrue: [functionValue ← context addTemporaryAssignment: functionValue].

"* 8 Aug 90 12:36 pm graemeb *"

setActiveDerivativesTo: derivatives                                                                       setActiveDerivativesTo:
   "Set the active derivatives to the given mask. Also, Rebuild the names of the new active derivatives."
   "Arguments:
        derivatives - <Integer> active-derivative mask."
   "Author: 4 May 1989 graemeb; Revised: 17 Nov 89 sueb (cache argumentNames in context)"

activeDerivatives ← derivatives.
   gradientValues ← Array new: context numberOfArguments.
   1 to: gradientValues size do:
        [: i | (self derivativeActiveFor: i)
             ifTrue: [gradientValues at: i put: (self preferredVariableNode new name: functionValue name , '←'
   , (context argumentNames at: i))]]

setExpression: value andContext: aContext                                                                 setExpression:andContext:
   "Set up a coge-generation object to represent a constant with the given value."
   "Arguments:
        value    - <e.g., a TspiceCodeGenBinaryNode>
        aContext - <ModelCodeGenContext>"
   "Author: 9 Nov 89 sueb"

context ← aContext.
   activeDerivatives ← 0.
   functionValue ← value.
   gradientValues ← Array new: 0 setName: name andContext: aContext                                                                        setName:andContext:
   "Set the name and context for the receiver. Set the active derivtives to zero to represent an argument-
independent value."
   "Arguments:
        name     - <String>  name of the variable represented by the receiver
        aContext - <ModelCodeGenContext>"
   "Author: 4 May 1989 graemeb; Revised: 6 Nov 89 sueb (move temporaryAssignments to context)"

context ← aContext.
   activeDerivatives ← 0.
   functionValue ← self preferredVariableNode new name: name.
   gradientValues ← Array new: 0 setSize:activeDerivatives:andName:andContext:
setSize: size activeDerivatives: derivatives andName: name andContext: aContext
   "Set the number of arguments (size), the active derivatives, name and context for the receiver. This will
represent an argument-dependent variable if 'activeDerivatives' is non-zero."
   "Arguments:
        size        - <Integer> number of model arguments
        derivatives - <Integer> a mask with one bit for each model argument (bit set → derivative wrt that
arg. is active)
        name        - <String>  name of the variable represented by the receiver
        aContext    - <ModelcodeGenContext>"
   "Author: 4 May 1989 graemeb; Revised: 17 Nov 89 sueb (cache argumentNames in context)"

context ← aContext.
   activeDerivatives ← derivatives.
   functionValue ← self preferredVariableNode new name: name.

gradientValues ← Array new: size.
1 to: size do:
    [:i | (self derivativeActiveFor: i)
        ifTrue: [gradientValues at: i put: (self preferredVariableNode new name: name , '←' , (context argumentNames at: i))]]

setValue: value andContext: aContext                                                 setValue:andContext:
"Set up a coge-generation object to represent a constant with the given value."
"Arguments:
    value        - <DoubleFloat>
    aContext    - <ModelCodeGenContext>"
"Author: 5 May 1989 graemeb; Revised: 6 Nov 89 sueb (move temporaryAssignments to context)"

context ← aContext.
activeDerivatives ← 0.
functionValue ← self preferredLiteralNode new value: value.
gradientValues ← Array new: 0 testing derivativeActiveFor: i                                                                                derivativeActiveFor:
"Answer true if the derivative of this variable with respect to model argument number 'i' is active, else answer false."
"Arguments:
    i - <Integer> model argument number"
"Author: 8 May 1989 graemeb"

↑((activeDerivatives bitShift: 1 - i)     bitAnd: 1) ~= 0 equivalentTo: aCodeGenNode                                                                  equivalentTo:
"Return true if aCodeGenNode represents the same function value and derivatives as the receiver."
"Author: 1 May 90 sueb"

| cgGradientValues size gradient |
(aCodeGenNode isCodeGenFAndGradF and:
    [(size ← gradientValues size) = aCodeGenNode size and:
        [functionValue equivalentTo: aCodeGenNode functionValue]])
    ifFalse: [↑false].
cgGradientValues ← aCodeGenNode gradientValues.
1 to: size do:
    [:i | (gradient ← gradientValues at: i) isNil
        ifTrue:
            [gradient = (cgGradientValues at: i)
                ifFalse: [↑false]]
        ifFalse:
            [(gradient equivalentTo: (cgGradientValues at: i))
                ifFalse: [↑false]]].
↑true "* 3 May 90 8:06 am sueb *"

isCodeGenFAndGradF                                                                           isCodeGenFAndGradF
"Return true since the receiver is a CodeGenFAndGradF (used during the renaming of temporary variables)."
"Author: 22 Nov 89 sueb"

↑true notSameAs: aCodeGenNode                                                                  notSameAs:
"Answer true if the receiver and aCodeGenNode are the same object (this method is needed since = has been overridded for this class."
"Author: 14 Nov 89 sueb"

↑super ~= aCodeGenNode okToMoveToArgumentIndependentBlock                            okToMoveToArgumentIndependentBlock
"Return true if the receiver represents a code statement that can be moved to the argument-independent function. (Exceptions include the derivative statements for transient functions.)"

"Author: 14 May 90 sueb"
self halt: 'This should not be called? gb.'.
↑functionValue okToMoveToArgumentIndependentBlock "* 23 Aug 90 5:44 pm graemeb *"

sameAs: aCodeGenNode                                                                                          sameAs:
"Answer true if the receiver and aCodeGenNode are the same object (this method is needed since = has been overridded for this class."
"Author: 14 Nov 89 sueb"

↑super = aCodeGenNode preferred preferredBooleanClass                                                                                         preferredBooleanClass
"Answer the class preferred for constructing a boolean code-generation value."
"Author: 8 May 1989 graemeb"

↑CodeGenBoolean preferredLiteralNode                                                                                          preferredLiteralNode
"Answer the class preferred for constructing a code-generation literal node."
"Author: 8 May 1989 graemeb"

↑TspiceCodeGenLiteralNode preferredUnaryNode                                                                                            preferredUnaryNode
"Answer the class preferred for constructing a code-generation unary node."
"Author: 8 May 1989 graemeb"

↑TspiceModelUnaryNode preferredVariableNode                                                                                         preferredVariableNode
"Answer the class preferred for constructing a code-generation variable node."
"Author: 8 May 1989 graemeb"

↑TspiceCodeGenVariableNode data flow analysis referencedVariables                                                                                           referencedVariables
"Return a Set of names of the variables referenced by the receiver"
"Author: 6 Nov 89 sueb"

↑functionValue referencedVariables renameReferencedVariable: oldName to: newName                                                                 renameReferencedVariable:to:
"Rename the variable 'oldName' to 'newName'."
"Author: 22 Nov 89 sueb"

functionValue isExpression
    ifTrue: [functionValue renameReferencedVariable: oldName to: newName]
    ifFalse:
        [(functionValue isLiteral not and: [functionValue name = oldName])
            ifTrue: [functionValue ← TspiceCodeGenVariableNode new name: newName]]

printing addVarDeclarationsFor: varName toContext: aContext                                                            addVarDeclarationsFor:toContext:
"Add declarations for the given variable and its active derivatives."
"Arguments:
    varName    - <String>
    aContext   - <ModelCodeGenContext>"
"Author: 8 May 1989 graemeb; Revised: 17 Nov 89 sueb (cache argumentNames in context); Revised: 16 Aug 90 graemeb"

aContext addVarDeclaration: varName.
1 to: gradientValues size do:
    [: i | (self derivativeActiveFor: i)
        ifTrue: [aContext addVarDeclaration: varName , '←' , (context argumentNames at: i)]]

"* 22 Aug 90 12:04 pm graemeb *"

printOn: aStream   printOn:
"Print in standard format the function value and active derivatives of this variable."
"Arguments:
    aStream - <writeable stream>"
"Author: 8 May 1989 graemeb"

functionValue printOn: aStream.
aStream cr.
gradientValues do:
    [: gradientValue |
    gradientValue printOn: aStream.
    aStream cr]

converting asCodeGenFAndGradFWithContext: aContext   asCodeGenFAndGradFWithContext:
"Answer an equivalent CodeGenFAndGradF."
"Arguments:
    aContext - <ModelCodeGenContext>"
"Author: 4 May 1989 graemeb"

↑self asCodeGenFAndGradFWithName: name andContext: aContext   asCodeGenFAndGradFWithName:andContext:
"Answer a code-generation object corresponding to self."
"Arguments:
    name      - <String>
    aContext  - <ModelCodeGenContext>"
"Author: 4 May 1989 graemeb"

↑self species new    setSize: gradientValues size
    activeDerivatives: activeDerivatives
    andName: name
    andContext: aContext.

"* 8 Aug 90 5:10 pm graemeb *"

arithmetic functions bessel2: newDelayArgument   bessel2:
"Generate the code to return the bessel2 of the receiver for the backend simulator."
"Author: 4 Apr 90 sueb"

↑self species new bessel2Operand: self delay: newDelayArgument

"* 5 Apr 90 11:23 am sueb *"

ddt   ddt
"Generate the code to return the ddt of the receiver for the backend simulator."
"Author: 4 Apr 90 sueb"

↑self species new ddtOperand: self

"* 5 Apr 90 9:10 am sueb *"

delay: newDelayArgument   delay:
"Generate the code to return the delay of the receiver for the backend simulator."
"Author: 4 Apr 90 sueb"

↑self species new delayOperand: self delay: newDelayArgument

"* 5 Apr 90 11:27 am sueb *"

integral                                                                                                                integral
"*Generate the code to return the integral of the receiver for the backend simulator.*"
"*Author: 4 Apr 90 sueb*"

↑self species new integralOperand: self

"* 5 Apr 90 11:29 am sueb *"

max: argArray                                                                                                           max:
"*Answer the maximum of argument 1 and argument 2. The result will contain a symbolic representation of the operation on the function values and all active partial derivatives. Note that self == argument 1.*"
"*Arguments:
    argArray - <Array> of CodeGenFAndGradF*"
"*Author: 5 May 1989 graemeb ; Revised: 5 Mar 90 sueb (pass context)*"

| aCGFGF |
aCGFGF ← argArray at: 2.
↑self species new     boolean: self > aCGFGF
    then: self
    else: aCGFGF
    context: aCGFGF context "* 5 Mar 90 11:47 am sueb *"

min: argArray                                                                                                           min:
"*Answer the minimum of argument 1 and argument 2. The result will contain a symbolic representation of the operation on the function values and all active partial derivatives. Note that self == argument 1.*"
"*Arguments:
    argArray - <Array> of CodeGenFAndGradF*"
"*Author: 5 May 1989 graemeb ; Revised: 5 Mar 90 sueb (pass context)*"

| aCGFGF |
aCGFGF ← argArray at: 2.
↑self species new     boolean: self < aCGFGF
    then: self
    else: aCGFGF
    context: aCGFGF context "* 5 Mar 90 11:47 am sueb *"

pcomplex: args                                                                                                          pcomplex:
"*Answer the Complex number which has the magnitude of arg1 and phase (in degrees) of arg2.*"
"*Arguments: args - <Array> of code-generation nodes*"
"*Author: 8 May 1989 graemeb*"

↑self species new pcomplexWithArgs: args sign: argArray                                                                                                          sign:
"*Answer the magnitude of argument 1 times sign of argument 2. The result will contain a symbolic representation of the operation on the function values and all active partial derivatives. Note that self == argument 1.*"
"*Arguments:
    argArray - <Array> of CodeGenFAndGradF*"
"*Author: 8 Dec 89 graemeb*"

| aCGFGF |
aCGFGF ← argArray at: 2.
↑self abs * aCGFGF signum smallSignal: args                                                                                                       smallSignal:
"*Answer the small-signal component (gradient) of self with respect to the argument. The argument is assumed to be an CodeGenArgumentFAndGradF. This method will fail if this is not true.*"
"*Arguments: args - <Array> of code-generation values*"
"*Author: 8 May 1989 graemeb*"

↑self species new smallSignalWithArgs: args spiceDepletionCharge: functionArgs                                                                                          spiceDepletionCharge:
    "*Answer the value of junction depletion charge for the given arguments using the spice formula.*"
    "*Arguments: args - <Array> of code-generation values*"
    "*Author: 8 May 1989 graemeb ; Revised: 2 Mar 90 sueb (pass context)*"

↑self species new spiceDepletionChargeWithArgs: functionArgs inContext: self context "* 5 Mar 90 11:48 am sueb *"

spiceInvert: args                                                                                                                              spiceInvert:
    "*Answer the reciprocal of self if self not the special value. Answer zero if self is the special value.*"
    "*Arguments: args - <Array> of code-generation values*"
    "*Author: 8 May 1989 graemeb ; Revised: 2 Mar 90 sueb (pass context)*"

↑self species new spiceInvertWithArgs: args inContext: context

"* 5 Mar 90 11:48 am sueb *"

spiceJunctionCurrent: args                                                                                                   spiceJunctionCurrent:
    "*Answer the value of junction current for the given arguments using the spice formula.*"
    "*Arguments: args - <Array> of code-generation values*"
    "*Author: 8 May 1989 graemeb ; Revised: 2 Mar 90 sueb (pass context)*"

↑self species new spiceJunctionCurrentWithArgs: args inContext: context

"* 5 Mar 90 11:48 am sueb *"

APPENDIX G

*From Tektronix Smalltalk-80 version TB2.2.2a of May 05, 1988, 18:14:03. on 2 October 1990 at 11:56:16 am
ADS version: ADS.2c3aTEK.007.LBa6.020*

_____ ArgumentFAndGradF * _____

AbstractFAndGradF subclass: #ArgumentFAndGradF                                                   *ArgumentFAndGradF*
    instanceVariableNames: 'argumentNumber imposedValue limited'
    classVariableNames: ''
    poolDictionaries: ''
    category: 'Vector-Algebra'
ArgumentFAndGradF comment:
'The class handles model arguments.
Author: 2 January 1989 graemeb Instance variables:

argumentNumber   <Integer>   indicates the position in other FAndGradFs where the partial derivative with respect to this argument will be found
imposedValue    <DoubleFloat>
limited           <Boolean>   flag is true if argument has just been limited' mathematical functions logarithmicDeltaCompressionWithParameters:
logarithmicDeltaCompressionWithParameters: array
    "*Limit the variation of the argument from call to call if the new argument is outside the given range.
Initialize the argument to the given value.*"
    "*Author: 16 Aug 89 graemeb; Modified: 9 Oct 89 graemeb*"

| delta referenceArgValue newValue x xAbs y | delta ← (array at: 1) value.

```
referenceArgValue ← fAndGradF value.
referenceArgValue = 1.0d30
    ifTrue:
        [newValue ← (array at: 2) value]
    ifFalse:
        [x ← (imposedValue - referenceArgValue) /delta.
        xAbs ← x abs.
        (xAbs > 1.0d0)
            ifTrue:
                [limited ← true.
                y ← (1.0d0 + xAbs ln) * x sign.
                newValue ← delta * y + referenceArgValue]
            ifFalse:
                [newValue ← imposedValue]].
↑fAndGradF value: newValue
``` spiceBreakdownJunctionLimitWithParameters: array                                    spiceBreakdownJunctionLimitWithParameters:

"*Limit the variation of the argument from call to call for junctions with breakdown. This is the limiting algorithm used in Berkeley Spice.*"

"*Author: 3 January 1989 graemeb; Modified: 7 Apr 1989 graemeb, test for arg. = 1d30 as key to initialize; Revised: 15 Aug 90 graemeb*"

```
| newValue vt vcrit offset referenceArgValue is state | vt ← array at: 1.
is ← array at: 2.
offset ← array at: 3.
vcrit ← vt * (vt / (2.0d0 sqrt * is)) ln.

referenceArgValue ← fAndGradF value.
referenceArgValue = 1.0d30
    ifTrue:
        [newValue ← vcrit.
        ↑fAndGradF value: newValue].
newValue ← self spiceJunctionLimit: imposedValue reference: referenceArgValue vt: vt vcrit: vcrit."Forward limiting."
limited
    ifTrue: [↑fAndGradF value: newValue].
offset isNegativeInfinity
    ifFalse:     "Reverse breakdown limiting."
        [newValue ← self spiceJunctionLimit: (imposedValue - offset) negated reference:
(referenceArgValue - offset) negated vt: vt vcrit: vcrit.
        limited
            ifTrue: [↑fAndGradF value: newValue negated + offset]].
↑fAndGradF value: imposedValue
```

"*\* 15 Aug 90 11:42 am graemeb \**"

spiceCSLimitWithParameters: maxDelta                                    spiceCSLimitWithParameters:

"*Limit the variation of the argument from call to call to a value of 'maxDelta'. This is the limiting algorithm used in Berkeley Spice for the controlled sources.*"

"*Author: 2 January 1989 graemeb; Modified: 7 Apr 1989 graemeb, test for arg. = 1d30 as key to initialize; Modified: 7 Sep 89 graemeb, bugfix*"

```
| referenceArgValue delta newValue |
referenceArgValue ← fAndGradF value.
referenceArgValue = 1.0d30
    ifTrue:
        [newValue ← 0.0d0.
        ↑fAndGradF value: newValue].
delta ← imposedValue - referenceArgValue.
delta abs < maxDelta
    ifTrue: [newValue ← imposedValue]
    ifFalse: [limited ← true.
        newValue ← referenceArgValue + (maxDelta * delta sign)].
↑fAndGradF value: newValue
``` spiceJunctionLimitWithParameters: array             spiceJunctionLimitWithParameters:
"Limit the variation of the argument from call to call for functions of the form 'is*(exp(arg/vt)-1)'. This is the limiting algorithm used in Berkeley Spice. Initialize the junction voltage to vcrit."
"Author: 2 January 1989 graemeb; Modified: 16 Aug 89 graemeb... add to comment"

| newValue vt vcrit referenceArgValue is |

" State is currently handled by the off-element loader.
state ← array at: 3.
state = 0.0d0
    ifTrue: [↑referenceValue value: 0.0d0].
"
vt ← array at: 1.
is ← array at: 2.
vcrit ← vt * (vt / (2.0d0 sqrt * is)) ln.
referenceArgValue ← fAndGradF value.
referenceArgValue = 1.0d30
    ifTrue:
        [newValue ← vcrit]
    ifFalse:
        [newValue ← self spiceJunctionLimit: imposedValue reference: referenceArgValue vt: vt vcrit: vcrit]."Forward limiting."
↑fAndGradF value: newValue spiceOffJunctionLimitWithParameters: array            spiceOffJunctionLimitWithParameters:
"Limit the variation of the argument from call to call for functions of the form 'is*(exp(arg/vt)-1)'. This is the limiting algorithm used in Berkeley Spice. Initialize the junction voltage to 0."
"Author: 14 Sep 89 graemeb"

| newValue vt vcrit referenceArgValue is |

" State is currently handled by the off-element loader.
state ← array at: 3.
state = 0.0d0
    ifTrue: [↑referenceValue value: 0.0d0].
"
vt ← array at: 1.
is ← array at: 2.
vcrit ← vt * (vt / (2.0d0 sqrt * is)) ln.
referenceArgValue ← fAndGradF value.
referenceArgValue = 1.0d30
    ifTrue:
        [newValue ← 0]
    ifFalse:
        [newValue ← self spiceJunctionLimit: imposedValue reference: referenceArgValue vt: vt vcrit: vcrit]."Forward limiting."
↑fAndGradF value: newValue updateReferenceArgWithUnlimitedValue            updateReferenceArgWithUnlimitedValue
"Store the imposed value into the AbstractFAndGradF as the reference value and set to 'unlimited'."
"Author: 2 January 1989 graemeb"

limited ← false.
↑fAndGradF value: imposedValue accessing argumentNumber            argumentNumber
"Answer the number of this argument as a SmallInteger."
"Author: 24 Feb 1989 graemeb"

↑argumentNumber deltaValue            deltaValue
"Answer the difference between the imposed value and the reference value of the AbstractFAndGradF."
"Author: 2 January 1989 graemeb"

↑imposedValue - fAndGradF value derivativeAt: index
"*answer the derative at the index, 1 if at my number, zero-otherwise*"
"*Author: 9 Aug 90 kurtk*"

index = argumentNumber ifTrue: [↑DoubleFloat one].
    ↑DoubleFloat zero

"* 9 Aug 90 12:26 pm kurtk *"

imposedValue
"*Answer the imposed value of the AbstractFAndGradF.*"
"*Author: 2 January 1989 graemeb*"

↑imposedValue limited
"*Answer whether the argument was limited.*"
"*Author: 2 January 1989 graemeb*"

↑limited putImposedValue: value
"*Store value into the AbstractFAndGradF as the imposed value and set to 'unlimited'.*"
"*Author: 2 January 1989 graemeb*"

imposedValue ← value.
    limited ← false putValue: value
"*Store value into the ArgumentFAndGradF as the imposed and reference value and set to 'unlimited'.*"
"*Author: 15 Jun 89 graemeb*"

fAndGradF value: value.
    imposedValue ← value.
    limited ← false private spiceJunctionLimit: imposed reference: reference vt: vt vcrit: vcrit
"*Limit the variation of the argument from call to call for functions of the form 'is\*(exp(arg/vt)-1)'. This is the limiting algorithm used in Berkeley Spice.*"
"*Author: 2 January 1989 graemeb*"

| delta twovt referenceArgValue | twovt ← vt * 2.0d0.
    imposed < vcrit | (imposed <= 0.0d0)
        ifTrue: [limited ← false. ↑imposed]
        ifFalse:
            [delta ← imposed - reference.
            delta abs <= twovt
                ifTrue: [limited ← false. ↑imposed]
                ifFalse:
                      [reference <= 0.0d0
                          ifTrue:
                              [limited ← true. ↑vt * (imposed / vt + 1.0d0) ln]
                          ifFalse:
                              [delta <= vt negated
                                  ifTrue:
                                      [limited ← true. ↑vcrit]
                                  ifFalse:
                                      [limited ← true. ↑reference + (vt * (delta / vt + 1.0d0) ln)]]]]

initialize-release newWithNumVars: numVars thisVarNum: num withValue: val             newWithNumVars:thisVarNum:withValue:
    "Answer an instance of self with f initialized to 'val' and fprime initialized to 1.0d0."
    "Author: 2 January 1989 graemeb"

fAndGradF ← self species newWithNumVars: numVars thisVarNum: num withValue: val.
    argumentNumber ← num converting asCodeGenFAndGradFWithName: name andContext: aContext          asCodeGenFAndGradFWithName:andContext:
    "Answer a code-generation object corresponding to self."
    "Arguments:
        name     -     <String>
        aContext   -     <ModelCodeGenContext>"
    "Author: 8 May 1989 graemeb"
    self halt: 'Should not be used. gb.'.
        ↑CodeGenArgumentFAndGradF new setSize: fAndGradF size
            derivativeNumber: argumentNumber
            andName: name
            andContext: aContext "* 24 Sep 90 10:52 am graemeb *"

testing isArgument                                                                                                         isArgument
    "Answer that this object is an argument."
    "Author: 28 Aug 90 graemeb"

↑true

"* 28 Aug 90 10:36 am graemeb *"

APPENDIX H

*From Tektronix Smalltalk-80 version TB2.2.2a of May 05, 1988, 18:14:03. on 12 September 1990 at 4:56:29 pm ADS version: ADS.2c3aTEK.007.LBa6.020*

———————————— CodeGenArgumentFAndGradF ————————————

CodeGenFAndGradF subclass: #CodeGenArgumentFAndGradF         *CodeGenArgumentFAndGradF*
    instanceVariableNames: 'argumentNumber'
    classVariableNames: ''
    poolDictionaries: ''
    category: 'Tspice-MDS-To-C'
CodeGenArgumentFAndGradF comment:
'This class is used to represent a model argument during the code-generation process.
Author: 4 May 1989 graemeb Instance variables:

argumentNumber     <SmallInteger>
' initialize-release setSize: size derivativeNumber: i andName: name andContext: aContext        setSize:derivativeNumber:andName:andContext:
"*Set up a code-generation object to represent a model argument.*"
"*Arguments:*
    *size -*    *<SmallInteger>*   *number of arguments (hence derivatives) in the model*
    *i*      -    *<SmallInteger>*   *argument (hence derivative) number of this argument*
    *name*   -    *<String>*       *name of argument*
    *aContext - <ModelCodeGenContext> context for code generation*"
"*Author: 4 May 1989 graemeb; Revised: 16 Nov 89 sueb (removed temporaryAssignments)*"

argumentNumber ← i.
    activeDerivatives ← 1 bitShift: i - 1.
    context ← aContext.
    functionValue ← self preferredVariableNode new name: name.
    gradientValues ← Array new: size.
    gradientValues at: i put: (self preferredLiteralNode new value: 1.0d0)

accessing argumentNumber                                                                                argumentNumber
        "*Answer the number of this argument as a SmallInteger.*"
        "*Author: 4 May 1989 graemeb*"

↑argumentNumber    ◄——— NOTE 3 convergencePossible                                                                convergencePossible
    "*Answer &convergencepossible as a code-generation variable node.*"
    "*Author: 14 Aug 90 graemeb*"

↑self preferredVariableNode new name: '←convergencePossible'   ◄——— NOTE 4

"* 23 Aug 90 9:51 am graemeb *"

functionArgValue                                                                       functionArgValue
    "*Answer the name of this argument as a code-generation variable node.*"
    "*Author: 4 May 1989 graemeb; Revised: 14 Aug 90 graemeb*"

↑self preferredVariableNode new name: functionValue name

"* 14 Aug 90 5:04 pm graemeb *"

imposedFunctionArgValue                                                   imposedFunctionArgValue
    "*Answer the name of this argument as a code-generation variable node.*"
    "*Author: 14 Aug 90 graemeb*"

↑self preferredVariableNode new name: functionValue name , '←←imposed'

"* 14 Aug 90 5:03 pm graemeb *"

converting asCodeGenFAndGradFWithContext: aContext                asCodeGenFAndGradFWithContext:
        "*Answer an equivalent CodeGenFAndGradF.*"
        "*Arguments:*
            *aContext - <ModelCodeGenContext>*"
        "*Author: 4 May 1989 graemeb*"

↑self species new     setSize: gradientValues size
            activeDerivatives: activeDerivatives
            andName: functionValue name
            andContext: context asCodeGenFAndGradFWithName:andContext:
asCodeGenFAndGradFWithName: name andContext: aContext "Answer a code-generation object corresponding to self."
"No need to create a new argument object since they are never assigned to."
"Arguments:
    name      -    <String>
    aContext  -    <ModelCodeGenContext>"
"Author: 4 May 1989 graemeb"

↑self arithmetic functions logarithmicDeltaCompressionWithParameters: args
    "Answer a code-generation node representing this function call and arguments. Note: limit functions answer a scalar assignment node rather than a CodeGenFAndGradF value." ← NOTE 5
    "Arguments:
        args-   <Array> of nodes."
    "Author: 8 Dec 89 graemeb; Revised: 15 Aug 90 graemeb"

| functionArgs f delta initialValue |
    context resetLocalAssignments.
    f ← args at: 1.
    delta ← args at: 2.
    initialValue ← args at: 3.
    functionArgs ← OrderedCollection new.
    functionArgs add: f functionArgValue;
                  add: f imposedFunctionArgValue;
                  add: self convergencePossible;
                  add: delta functionValue;
                  add: initialValue functionValue.
    functionArgs ← functionArgs asArray.
    ↑TspiceCodeGenAssignmentNode new name: functionValue name value: ((functionArgs at: 1)
logarithmicDeltaCompressionWithArgs: functionArgs)

"* 15 Aug 90 11:21 am graemeb *"

spiceBreakdownJunctionLimitWithParameters: args
    "Answer a code-generation node representing this function call and arguments. Note: limit functions answer a scalar assignment node rather than a CodeGenFAndGradF value." ← NOTE 5
    "Arguments:
        args-   <Array> of nodes."
    "Author: 4 May 1989 graemeb; Modified: 30 May 89 sueb; Revised: 15 Aug 90 graemeb"

| functionArgs vt is two vcrit f offset |
    context resetLocalAssignments.
    f ← args at: 1.
    vt ← args at: 2.
    is ← args at: 3.
    offset ← args at: 4.
    two ← 2.0d0 asCodeGenFAndGradFWithContext: context.
    vcrit ← context addTemporaryAssignment: (vt * (vt / (two sqrt * is)) ln) functionValue.
    functionArgs ← OrderedCollection new.
    functionArgs add: f imposedFunctionArgValue;
                  add: f functionArgValue;
                  add: self convergencePossible;
                  add: vcrit functionValue;
                  add: vt functionValue;
                  add: offset functionValue.
    functionArgs ← functionArgs asArray.
    ↑TspiceCodeGenAssignmentNode new name: functionValue name value: ((functionArgs at: 1)
spiceBreakdownJunctionLimitWithArgs: functionArgs)

"* 27 Aug 90 3:54 pm graemeb *"

spiceCSLimitWithParameters: args

"*Answer a code-generation node representing this function call and arguments. Note: limit functions answer a scalar assignment node rather than a CodeGenFAndGradF value.*"
"*Arguments:*
    *args-    <Array> of nodes.*"
"*Author: 4 May 1989 graemeb; Modified: 30 May 89 sueb; Revised: 15 Aug 90 graemeb*"

← NOTE 5

| functionArgs f delta |
context resetLocalAssignments.
f ← args at: 1.
delta ← args at: 2.
functionArgs ← OrderedCollection new.
functionArgs add: f functionArgValue;
            add: f imposedFunctionArgValue;
            add: self convergencePossible;
            add: delta functionValue.
functionArgs ← functionArgs asArray.
↑TspiceCodeGenAssignmentNode new name: functionValue name value: ((functionArgs at: 1) spiceCSLimitWithArgs: functionArgs)

"* 15 Aug 90 11:52 am graemeb *"

spiceJunctionLimitWithParameters: args                           spiceJunctionLimitWithParameters:
"*Answer a code-generation node representing this function call and arguments. Note: limit functions answer a scalar assignment node rather than a CodeGenFAndGradF value.*"
"*Arguments:*
    *args-    <Array> of nodes.*"
"*Author: 4 May 1989 graemeb; Modified: 30 May 89 graemeb; Revised: 15 Aug 90 graemeb *"

| functionArgs vt is vcrit two f |
context resetLocalAssignments.
f ← args at: 1.
vt ← args at: 2.
is ← args at: 3.
two ← 2.0d0 asCodeGenFAndGradFWithContext: context.
vcrit ← context addTemporaryAssignment: (vt * (vt / (two sqrt * is)) ln) functionValue.
functionArgs ← OrderedCollection new.
functionArgs add: f imposedFunctionArgValue;
            add: f functionArgValue;
            add: self convergencePossible;
            add: vcrit functionValue;
            add: vt functionValue.
functionArgs ← functionArgs asArray.
↑TspiceCodeGenAssignmentNode new name: functionValue name value: ((functionArgs at: 1) spiceJunctionLimitWithArgs: functionArgs)

"* 27 Aug 90 3:45 pm graemeb *"

spiceOffJunctionLimitWithParameters: args                        spiceOffJunctionLimitWithParameters:
"*Answer a code-generation node representing this function call and arguments. Note: limit functions answer a scalar assignment node rather than a CodeGenFAndGradF value.*"
"*Arguments:*
    *args-    <Array> of nodes.*"
"*Author: 8 Dec 89 graemeb; Revised: 15 Aug 90 graemeb*"

| functionArgs vt is two vcrit f |
context resetLocalAssignments.
f ← args at: 1.
vt ← args at: 2.
is ← args at: 3.
two ← 2.0d0 asCodeGenFAndGradFWithContext: context.
vcrit ← context addTemporaryAssignment: (vt * (vt / (two sqrt * is)) ln) functionValue.
functionArgs ← OrderedCollection new.
functionArgs add: f imposedFunctionArgValue;
            add: f functionArgValue;
            add: self convergencePossible;
            add: vcrit functionValue;
            add: vt functionValue.
functionArgs ← functionArgs asArray.

↑TspiceCodeGenAssignmentNode new name: functionValue name value: ((functionArgs at: 1)
spiceOffFunctionLimitWithArgs: functionArgs)

"* 27 Aug 90 3:46 pm graemeb *"

updateReferenceArgWithUnlimitedValue   updateReferenceArgWithUnlimitedValue
"Store the imposed value into the reference value."
"Author: 1 Jun 89 sueb; Revised: 16 Aug 90 graemeb"

context resetLocalAssignments.
↑TspiceCodeGenAssignmentNode new name: functionValue name value: self imposedFunctionArgValue "* 16 Aug 90 9:55 am graemeb *"

private logarithmicDeltaCompressionWithArgs: args   logarithmicDeltaCompressionWithArgs:
"Answer a code-generation node representing this function call and arguments. Note: limit functions
answer a scalar function node rather than a CodeGenFAndGradF value."
"Arguments:
    args-    <Array> of nodes."
"Author: 8 Dec 89 graemeb; Revised: 17 Jan 90 sueb (removed temporary assignments)"

| imposedValue functionArgs |
imposedValue ← args at: 1.
context ← imposedValue context.
activeDerivatives ← imposedValue activeDerivatives.
functionArgs ← Array new: args size.
1 to: args size do:
    [:i | functionArgs at: i put: (args at: i) functionValue].
functionValue ← imposedValue functionValue logarithmicDeltaCompressionWithArgs: functionArgs.
gradientValues ← imposedValue gradientValues species   species
"Answer the preferred class for reconstructing the receiver."
"Author: 4 May 1989 graemeb"

↑CodeGenFAndGradF spiceBreakdownJunctionLimitWithArgs: args   spiceBreakdownJunctionLimitWithArgs:
"Answer a code-generation node representing this function call and arguments. Note: limit functions
answer a scalar function node rather than a CodeGenFAndGradF value."
"Arguments:
    args-    <Array> of nodes."
"Author: 4 May 1989 graemeb; Revised: 16 Nov 89 sueb (removed temporaryAssignments)"

| imposedValue functionArgs |
imposedValue ← args at: 1.
context ← imposedValue context.
activeDerivatives ← imposedValue activeDerivatives.
functionArgs ← Array new: args size.
1 to: args size do:
    [:i | functionArgs at: i put: (args at: i) functionValue].
functionValue ← imposedValue functionValue spiceBreakdownJunctionLimitWithArgs: functionArgs.
gradientValues ← imposedValue gradientValues spiceCSLimitWithArgs: args   spiceCSLimitWithArgs:
"Answer a code-generation node representing this function call and arguments. Note: limit functions
answer a scalar function node rather than a CodeGenFAndGradF value."
"Arguments:
    args-    <Array> of nodes."
"Author: 4 May 1989 graemeb; Revised: 16 Nov 89 sueb (removed temporaryAssignments)"

| imposedValue functionArgs |
imposedValue ← args at: 1.
context ← imposedValue context.
activeDerivatives ← imposedValue activeDerivatives.
functionArgs ← Array new: args size.

1 to: args size do:
    [:i | functionArgs at: i put: (args at: i) functionValue].
functionValue ← imposedValue functionValue spiceCSLimitWithArgs: functionArgs.
gradientValues ← imposedValue gradientValues spiceJunctionLimitWithArgs: args                                spiceJunctionLimitWithArgs:
"Answer a code-generation node representing this function call and arguments. Note: limit functions answer a scalar function node rather than a CodeGenFAndGradF value."
"Arguments:
    args-    <Array> of nodes."
"Author: 4 May 1989 graemeb; Revised: 16 Nov 89 sueb (removed temporaryAssignments)"

| imposedValue functionArgs |
imposedValue ← args at: 1.
context ← imposedValue context.
activeDerivatives ← imposedValue activeDerivatives.
functionArgs ← Array new: args size.
1 to: args size do:
    [:i | functionArgs at: i put: (args at: i) functionValue].
functionValue ← imposedValue functionValue spiceJunctionLimitWithArgs: functionArgs.
gradientValues ← imposedValue gradientValues spiceOffJunctionLimitWithArgs: args                             spiceOffJunctionLimitWithArgs:
"Answer a code-generation node representing this function call and arguments. Note: limit functions answer a scalar function node rather than a CodeGenFAndGradF value."
"Arguments:
    args-    <Array> of nodes."
"Author: 8 Dec 89 graemeb; Revised: 17 Jan 90 sueb (removed temporary assignments)"

| imposedValue functionArgs |
imposedValue ← args at: 1.
context ← imposedValue context.
activeDerivatives ← imposedValue activeDerivatives.
functionArgs ← Array new: args size.
1 to: args size do:
    [:i | functionArgs at: i put: (args at: i) functionValue].
functionValue ← imposedValue functionValue spiceOffJunctionLimitWithArgs: functionArgs.
gradientValues ← imposedValue gradientValues

APPENDIX 1

*From Tektronix Smalltalk-80 version TB2.2.2a of May 05, 1988, 18:14:03. on 12 September 1990 at 5:22:33 pm ADS version: ADS.2c3aTEK.007.LBa6.020*

——————————————— MDSModelDefinition ———————————————

*MDSModelDefinition*

C code generation -- utilities generateDcCodeInContext: modelContext                           generateDcCodeInContext:
"Generate the C code for each of the stored blocks of compiled smalltalk model code."
"Author: 27 Nov 89 sueb; Revised: 2 Feb 90 sueb (moved to this class from 'SimulatorModelDefinition') ; Revised: 14 May 90 sueb "

| dcCode argDefs opCode aiCode dataFlowAnalyzer argumentNames updates oldAICode |
modelContext analysisMode: #dc.
modelContext setupZeroArgumentResultNamesForModel: self.
dcCode ← TspiceModelBlockNode new initialize.
argDefs ← self codeFor: #argumentDefinition.
argDefs notNil ifTrue: [dcCode addAll: argDefs].

dcCode addAll: (self codeFor: #argumentDependentEquations).
modelContext at: #argumentDependent putCode: (dcCode generateCodeInContext: modelContext). *"Needed here to determine the intermediate & result types."*
modelContext resetVarDeclarations.

opCode ← code at: #output ifAbsent: [].
opCode notNil ifTrue:
    [modelContext at: #output putCode: (opCode generateCodeInContext: modelContext)].
modelContext resetVarDeclarations.

aiCode ← code at: #argumentIndependentEquations ifAbsent: [].
oldAICode ← modelContext codeFor: #argumentIndependent.
aiCode notNil ifTrue:
    [modelContext at: #argumentIndependent putCode: (aiCode generateCodeInContext: modelContext).
    modelContext resetVarDeclarations].

dataFlowAnalyzer ← self class preferredDataFlowAnalyzerClass new context: modelContext.
dataFlowAnalyzer optimizeCode.

oldAICode isEmpty
    ifFalse: [modelContext at: #argumentIndependent putCode: oldAICode].
modelContext at: #dcMapOut putCode: (mapManager generateCodeInContext: modelContext).

dataFlowAnalyzer release.

argumentNames ← modelContext argumentNames.
dcCode ← modelContext codeFor: #argumentDependent.
updates ← OrderedCollection new: argumentNames size.
dcCode do:
    [:statement |
        (statement isAssignment and: [(argumentNames includes: statement variableName)])
            ifTrue:
                [updates add: statement]].
argDefs ← TspiceCodeGenBlockNode new initialize.

*From Tektronix Smalltalk-80 version TB2.2.2a of May 05, 1988, 18:14:03. on 12 September 1990 at 5:22:17 pm
ADS version: ADS.2c3aTEK.007.LBa6.020*

———————————————— MDSModelDefinition ————————————————

*MDSModelDefinition*

C code generation printArgumentIndependentCodeOn:inContext:
printArgumentIndependentCodeOn: aStream inContext: context
    *"Print out C code that will execute the receiver's 'argument independent code'."*
    *"Author: 27 Nov 89 sueb ; Revised: 25 Jan 90 sueb (removed unused temp); Revised: 16 Aug 90 graemeb"*

| temporaryVariables aiCode |
    aiCode ← context codeFor: #argumentIndependent.

(aiCode isNil or: [aiCode isEmpty])
        ifFalse: [temporaryVariables ← aiCode temporaryVariables asSortedCollection].

aStream cr; nextPutAll: '/* Run the argument independent code for one element */'.
    aStream cr.
    aStream nextPutAll: 'int'; cr;
            nextPutAll: 'AI←';
            nextPutAll: name;
            nextPutAll: '(←element, ←circuit)
    struct ';
            nextPutAll: name;
            nextPutAll: 'ElementInstance *←element;
    circuitData *←circuit;
    {

NOTE 7

```
        (aiCode isNil or: [aiCode isEmpty])
            ifFalse:
                [temporaryVariables do:
                    [: var |
                        (context containsPermanentVariable: var)
                            ifFalse:
                                [(((var at: 1) = $← and: [(var at: 2) = $I])
                                    ifTrue:
                                        [aStream crtab: 1; nextPutAll: 'int '; nextPutAll: var; nextPut: $;]
                                    ifFalse:
                                        [aStream crtab: 1; nextPutAll: 'double '; nextPutAll: var; nextPut: $;]]].
                aiCode printCodeOn: aStream level: 1.
                aStream cr].
        aStream crtab; nextPutAll: 'return(OKAY);
}
```

NOTE 8 points to the `ifFalse:` / `[temporaryVariables do:` block.
NOTE 9 points to the `ifFalse:` / `[aStream crtab: 1; nextPutAll: 'double '...` line.

"* 24 Aug 90 9:52 am graemeb *"

printBiasBypassingLoaderOn:inContext:
printBiasBypassingLoaderOn: aStream inContext: context
  "Print out C code for a bias bypassing loader ('load using solution vector -- with bypassing') that will execute the receiver's dc equations, then mapout results."

"Author: 2 Nov 89 sueb; Revised: 5 Feb 90 sueb (moved to this class from 'SimulatorModelDefinition') ; Revised: 14 Mar 90 sueb "

| moCode dcCode |
  context nonLinearResults isEmpty
      ifTrue: [↑self].
  moCode ← context codeFor: #dcMapOut.

aStream cr.
  aStream nextPutAll: '/* Bias bypassing loader -- "LoadUsingSolutionVector with bypassing" */'; cr.
  aStream nextPutAll: 'int'; cr;
            nextPutAll: 'BB←';
            nextPutAll: name;
            nextPutAll: '(←loader, ←circuit, ←convergencePossible)  '
  int *←convergencePossible;'.

dcCode ← context codeFor: #dcArgumentDependent.
  (dcCode isEmpty and: [moCode isEmpty])
      ifTrue:
          [self printEmptyFunctionOn: aStream]
      ifFalse:
          [self printDeclarationsOn: aStream inContext: context.

aStream tab.
  (context nonLinearArguments isEmpty)
      ifFalse:
          [aStream nextPutAll: 'double *←solutionVector;'; cr.
          self printMapInDeclarationsOn: aStream level: 1 inContext: context.
          self printLinearizationCheckDeclarationsOn: aStream level: 1 inContext: context].
  aStream tab; nextPutAll: 'double *←rhs;'.

(dcCode isEmpty)
      ifFalse:
          [aStream crtab; nextPutAll: 'double ←sum;
  double ←absoluteTolerance;
  double ←relativeTolerance;
  double ←vnTolerance;'].

self hasState
          ifTrue:
              [aStream crtab; nextPutAll: 'double ←scaleValue;

←scaleValue = max(1.0e-6, ←stepperVariable);'].

aStream crtab.

```
                (context nonLinearArguments isEmpty)
                        ifFalse:
                                [aStream nextPutAll: '←solutionVector = ←circuit→solutionVector;';        crtab].
                        aStream nextPutAll: '←rhs = ←circuit→solution.rhs;'.

(dcCode isEmpty)
                        ifFalse:
                                [aStream crtab; nextPutAll: '←absoluteTolerance = *←circuit→absoluteTolerance;
←relativeTolerance = *←circuit→relativeTolerance;
←vnTolerance = *←circuit→vnTolerance;'].

aStream cr; crtab;   nextPutAll: '
        ←element = (struct ';
                nextPutAll: name;
                nextPutAll: 'ElementInstance *) ←loader→elements;

for (←i = 0; ←i < ←loader→num←Elements; ←i++) { aStream crtab: 2; nextPutAll: '←element→bypass = TRUE;';cr.

self printMapInsOn: aStream level: 2 inContext: context.

self printExtrapolationOfLinearResultsOn: aStream inContext: context level: 2.

self printBypassCheckOn: aStream inContext: context level: 2.

aStream crtab: 2; nextPutAll: 'if (!←element→bypass) {'.
                self printArgumentUpdatesOn: aStream inContext: context level: 3.
                self printDcFunctionCallOn: aStream inContext: context level: 3.

self printLinearizationCheckOn: aStream level: 3 inContext: context.

aStream crtab: 2; nextPutAll: '}'; tab; nextPutAll: '/* end if (!←element→bypass) */';      cr.

aStream crtab:2; nextPutAll: '/* Run the mapout code */'.
                self hasState
                        ifTrue:
                                [self printOffElementMapOutsOn: aStream level: 2 inContext: context]
                        ifFalse:
                                [moCode printCodeOn: aStream level: 2].

aStream nextPutAll: '
        ←element = ←element→next;
        }       /* end for loop over elements */
}
']

"* 24 Aug 90 1:56 pm graemeb *"
``` printBiasInitializingLoaderOn:inContext:
printBiasInitializingLoaderOn: aStream inContext: context
"Print out C code for a bias initializing loader ('load using initial arguments') that will execute the receiver's argument independent and dc equations, then mapout results."
"Author: 2 Nov 89 sueb; Revised: 5 Feb 90 sueb (moved to this class from 'SimulatorModelDefinition') ; Revised: 14 Mar 90 sueb "

```
| moCode |
moCode ← context codeFor: #dcMapOut.

aStream cr.
aStream nextPutAll: '/* Bias initializing loader -- "LoadUsingInitialArguments" */'; cr.
aStream nextPutAll: 'int'; cr;
        nextPutAll: 'BI←';
        nextPutAll: name;
        nextPutAll: '(←loader, ←circuit)'.
```

```
        ((context codeFor: #dcArgumentDependent) isEmpty and: [moCode isEmpty])
            ifTrue:
                [self printEmptyFunctionOn: aStream]
            ifFalse:
                [self printDeclarationsOn: aStream inContext: context.
                aStream tab; nextPutAll: 'double *←rhs;'; cr.
                self hasState
                    ifTrue:
                        [aStream tab;    nextPutAll: 'double ←scaleValue;

←scaleValue = max(1.0e-6, ←stepperVariable);'].

aStream crtab;   nextPutAll: '←rhs = ←circuit→solution.rhs;

←element = (struct ';
                    nextPutAll: name;
                    nextPutAll: 'ElementInstance *) ←loader→elements;
for (←i = 0; ←i < ←loader→num←Elements; ←i++) { aStream crtab:2; nextPutAll: '/* Run the mapout code */'.
                self hasState
                    ifTrue:
                        [self printOffElementMapOutsOn: aStream level: 2 inContext: context]
                    ifFalse:
                        [moCode printCodeOn: aStream level: 2].

aStream nextPutAll: '
←element = ←element→next;
        }   /* end for loop over elements */
}
']

"* 24 Aug 90 1:58 pm graemeb *"
``` printBiasNonBypassingLoaderOn:inContext:
printBiasNonBypassingLoaderOn: aStream inContext: context
    "Print out C code for a bias bypassing loader ('load using solution vector -- without bypassing') that will execute the receiver's dc equations, then mapout results."
    "Author: 2 Nov 89 sueb; Revised: 5 Feb 90 sueb (moved to this class from 'SimulatorModelDefinition') ; Revised: 14 Mar 90 sueb "

```
    | dcCode moCode |
    moCode ← context codeFor: #dcMapOut.
    dcCode ← context codeFor: #dcArgumentDependent.

aStream cr.
    aStream nextPutAll: '/* Bias non-bypassing loader -- "LoadUsingSolutionVector" */'; cr.
    aStream nextPutAll: 'int'; cr;
            nextPutAll: 'BN←';
            nextPutAll: name;
            nextPutAll: '(←loader, ←circuit, ←convergencePossible)
int *←convergencePossible;'.

(dcCode isEmpty and: [moCode isEmpty])
        ifTrue:
            [self printEmptyFunctionOn: aStream]
        ifFalse:
            [self printDeclarationsOn: aStream inContext: context.

aStream tab.
    (context nonLinearArguments isEmpty)
        ifFalse:
            [aStream nextPutAll: 'double *←solutionVector;'; cr.
            self printMapInDeclarationsOn: aStream level: 1 inContext: context.
            self printLinearizationCheckDeclarationsOn: aStream level: 1 inContext: context].
    aStream tab; nextPutAll: 'double *←rhs;'.
```

```
      dcCode isEmpty
          ifFalse:
              [aStream crtab;  nextPutAll: 'double ←sum;
  double ←absoluteTolerance;
  double ←relativeTolerance;'].

self hasState
      ifTrue:
          [aStream crtab;  nextPutAll: 'double ←scaleValue;

←scaleValue = max(1.0e-6, ←stepperVariable);'].

aStream crtab.
  (context nonLinearArguments isEmpty)
      ifFalse:
          [aStream nextPutAll: '←solutionVector = ←circuit→solutionVector;';        crtab].
          aStream nextPutAll: '←rhs = ←circuit→solution.rhs;'.

dcCode isEmpty
              ifFalse:
                  [aStream crtab;  nextPutAll: '←absoluteTolerance = *←circuit→absoluteTolerance;
  ←relativeTolerance = *←circuit→relativeTolerance;'].

aStream cr;  crtab;   nextPutAll: '
  ←element = (struct ';
              nextPutAll: name;
              nextPutAll: 'ElementInstance *) ←loader→elements;

for (←i = 0;  ←i < ←loader→num←Elements;  ←i++) {

←element→bypass = FALSE;

self printMapInsOn: aStream level: 2 inContext: context.

self printConditionalExtrapolationOfLinearResultsOn: aStream inContext: context level: 2.

self printArgumentUpdatesOn: aStream inContext: context level: 2.
          self printDcFunctionCallOn: aStream inContext: context level: 2.
          self printLinearizationCheckOn: aStream level: 2 inContext: context.

aStream crtab:2;  nextPutAll: '/* Run the mapout code */'.
          self hasState
              ifTrue:
                  [self printOffElementMapOutsOn: aStream level: 2 inContext: context]
              ifFalse:
                  [moCode printCodeOn: aStream level: 2].

aStream nextPutAll: '
  ←element = ←element→next;
  }   /* end for loop over elements */
  }
  ']
```

"* 24 Aug 90 2:02 pm graemeb *"

printBiasOutputLoaderOn:inContext:

printBiasOutputLoaderOn: aStream inContext: context
    "Print out C code for a bias output loader ('load using solution vector -- without mapouts') that will
execute the receiver's model equations and output code before outputs are printed to the ansr file."
    "Author: 2 Nov 89 sueb; Revised: 5 Feb 90 sueb (moved to this class from 'SimulatorModelDefinition') ;
Revised: 22 Mar 90 sueb (updated to use Alaine's new output macro) ; Revised: 17 Apr 90 sueb (run dc code
only if element was bypassed) ; Revised: 13 Jun 90 sueb (don't need to send analysis section as argument)"

| initialOpCode dcOpCode tranOpCode temporaryVariables |
    temporaryVariables ← Set new.
    initialOpCode ← context codeFor: #initialOutput.
    initialOpCode isEmpty
        ifFalse:

[temporaryVariables addAll: initialOpCode temporaryVariables].
dcOpCode ← context codeFor: #dcOutput.
dcOpCode isEmpty
    ifFalse:
        [temporaryVariables addAll: dcOpCode temporaryVariables].

tranOpCode ← context codeFor: #transientOutput.
tranOpCode isEmpty
    ifFalse:
        [temporaryVariables addAll: tranOpCode temporaryVariables].
temporaryVariables ← temporaryVariables asSortedCollection.

aStream cr.
aStream nextPutAll: '/* Bias output loader -- "*Run code to set values before printing outputs*" */'; cr.
aStream nextPutAll: 'int'; cr;
        nextPutAll: 'BO←';
        nextPutAll: name;
        nextPutAll: '(←fd, ←circuit, ←analysisType, ←fileType, ←keepType, ←el, ←outputs, ←workArrayPtr)
FILE *←fd; /* input -- file descriptor of ansr file */
circuitData *←circuit;
int ←analysisType;
int ←fileType;
int ←keepType;
circuitPrimitive *←el;
outputIndexNames *←outputs;
double *←workArrayPtr;
{
    int ←i;

(context argumentNames isEmpty)
    ifFalse:
        [aStream    nextPutAll:
    'double *←solutionVector = ←circuit→solutionVector;'; cr].

self printTemporaryDeclarations: temporaryVariables on: aStream inContext: context.
aStream crtab;  .nextPutAll: 'struct ';
        nextPutAll: name;
        nextPutAll: 'ElementInstance *←element = (struct ';
        nextPutAll: name;
        nextPutAll: 'ElementInstance *) ←el;
double *←outputLocation;
int *←outputIndices;
int ←numOutputs = ←outputs→size;
int ←numToWrite = ←fileType == ANSRPFILE ? ←numOutputs + 1 : ←numOutputs;

/* Loop through all element instances. */
while (←element != NULL) { self printFullMapInsOn: aStream level: 2.

aStream nextPutAll:

switch (←analysisType) {
        case TRANSIENT←ANALYSIS:'.
        "*Don't need to do the next step unless we add bypassing to transient.*

(context codeFor: #transient) isEmpty
            ifFalse:
                [aStream crtab: 3;   nextPutAll: '/* *If element was bypassed, run transient code* */'.
                aStream crtab: 3;   nextPutAll: 'if (←element→bypass == TRUE)'.
                self printTransientFunctionCallOn: aStream inContext: context level: 4]."

aStream crtab: 3; nextPutAll: '/* Run the output code */'.
        tranOpCode printCodeOnWithoutLimiting: aStream level: 3 inContext: context.

```
            aStream nextPutAll:

break;

aStream nextPutAll:

case DC←ANALYSIS:'.
            (context codeFor: #dcArgumentDependent) isEmpty
                ifFalse:
                    [aStream crtab: 3;    nextPutAll: '/* If element was bypassed, run dc code */'.
                    aStream crtab: 3; nextPutAll: 'if (←element→bypass == TRUE)'.
                    self printDcFunctionCallOn: aStream inContext: context level: 4].

aStream crtab: 3; nextPutAll: '/* Run the output code */'.
            dcOpCode printCodeOnWithoutLimiting: aStream level: 3 inContext: context.
            aStream nextPutAll:

break;

aStream nextPutAll:

default:'.
            (context codeFor: #dcArgumentDependent) isEmpty
                ifFalse:
                    [aStream crtab: 3;    nextPutAll: '/* If element was bypassed, update arguments and run DC code
*/'.
                    aStream crtab: 3; nextPutAll: 'if (←element→bypass == TRUE)'.
                    self printDcFunctionCallOn: aStream inContext: context level: 4].

aStream crtab: 3; nextPutAll: '/* Run the output code */'.
            initialOpCode printCodeOnWithoutLimiting: aStream level: 3 inContext: context.
            aStream nextPutAll:

break;
            } context addOutputMapTo: aStream.

aStream nextPutAll:
            WRITE←BINARY←DOUBLE←ARRAY←TO←FILE(←fd, ←workArrayPtr, ←numToWrite, "Error
writing to output file");
            if (←keepType == ELEMENT←LIST)
                ←element = ←element→next;
            else
                ←element = NULL;
        } /* end for loop over elements */ return (OKAY);
}

"* 7 Sep 90 6:35 pm graemeb *"

printBiasPredictedSolutionVectorLoaderOn:inContext:
printBiasPredictedSolutionVectorLoaderOn: aStream inContext: context
    "Print out C code for a bias loader ('load using predicted solution vector -- without convergence checking')
that will execute the receiver's dc equations, then mapout results."

"Author: 2 Nov 89 sueb; Revised: 5 Feb 90 sueb (moved to this class from 'SimulatorModelDefinition') ;
Revised: 14 Mar 90 sueb "

| moCode |
    moCode ← context codeFor: #dcMapOut.

aStream cr.
```

```
        aStream nextPutAll: '/* Bias non-bypassing loader -- "LoadUsingPredictedSolutionVector" */'; cr.
        aStream nextPutAll: 'int'; cr;
                nextPutAll: 'BP←';
                nextPutAll: name;
                nextPutAll: '(←loader, ←circuit, ←convergencePossible)
int *←convergencePossible;'.

((context codeFor: #dcArgumentDependent) isEmpty and: [moCode isEmpty])
            ifTrue:
                [self printEmptyFunctionOn: aStream]
            ifFalse:
                [self printDeclarationsOn: aStream inContext: context.

aStream tab.
                aStream nextPutAll: 'double *←rhs;'; cr.

(context nonLinearArguments isEmpty)
                    ifFalse:
                        [aStream tab;    nextPutAll: 'double *←solutionVector;';   cr.
                        self printMapInDeclarationsOn: aStream level: 1 inContext: context].

self hasState
                    ifTrue:
                        [aStream tab;    nextPutAll: 'double ←scaleValue;
←scaleValue = max(1.0e-6, ←stepperVariable);'].

(context nonLinearArguments isEmpty)
                    ifFalse:
                        [aStream crtab;    nextPutAll: '←solutionVector = ←circuit→solutionVector;'].

aStream crtab;    nextPutAll: '←rhs = ←circuit→solution.rhs;

←element = (struct ';
                    nextPutAll: name;
                    nextPutAll: 'ElementInstance *) ←loader→elements;
for (←i = 0; ←i < ←loader→num←Elements; ←i++) { self printMapInsOn: aStream level: 2 inContext: context.
                self printArgumentUpdatesOn: aStream inContext: context level: 2.
                self printDcFunctionCallOn: aStream inContext: context level: 2.

aStream crtab:2; nextPutAll: '/* Run the mapout code */'.
                self hasState
                    ifTrue:
                        [self printOffElementMapOutsOn: aStream level: 2 inContext: context]
                    ifFalse:
                        [moCode printCodeOn: aStream level: 2].

aStream nextPutAll: '
←element = ←element→next;
}    /* end for loop over elements */
}
']

"* 24 Aug 90 2:05 pm graemeb *"
``` printCInitializationFunctionOn:inContext:
printCInitializationFunctionOn: aStream inContext: context
  "Generate a C-code function to initialize this model in the backend simulator."
  "Author: 26 May 89 sueb; Revised: 27 Nov 89 sueb ; Revised: 24 Jan 90 sueb (allocates all space for doubles at once) ; Revised: 6 Mar 90 sueb (add flag for source stepping, remove flag for compiled models) ; Revised: 2 May 90 sueb (print out counts for special function instances, add tran functions, dc output function) ; Revised: 30 May 90 sueb ; Revised: 13 Jun 90 sueb (link to arrays for parameter names, ranges, model outputs); Revised: 4 Sep 90 graemeb, pass context to outputs printer."

| argSize resultSize stateIndex tempSize intermediateSize numberOfArgs numberOfResults numberOfTemps numberOfOutputs bufferSize paramNames |
　　numberOfArgs ← self argumentNames size.
　　numberOfResults ← self resultNames size.
　　numberOfTemps ← self temporaryNames size.
　　numberOfOutputs ← variables maximumNumberOfOutputs.
　　argSize ← numberOfArgs printString.
　　resultSize ← numberOfResults printString.
　　intermediateSize ← (self intermediateNames size + (context intermediateVariables size)) printString.
　　tempSize ← numberOfTemps printString.
　　paramNames ← variables parameterNames.
　　stateIndex ← ((paramNames indexOf: 'STATE' ifAbsent: [paramNames indexOf: 'state']) - 1) printString.

self printOutputArraysOn: aStream inContext: context.
　　self printParameterDefaultsFor: paramNames on: aStream.
　　self printParameterNames: paramNames on: aStream.
　　CRangeContext new writeRangesForModel: self onStream: aStream.

aStream cr.
　　aStream nextPutAll:
'Init←', name, ' (←mod)
modelDefinition *←mod;
{'; cr.

numberOfTemps > 0
　　　　ifTrue:
　　　　　　[aStream crtab; nextPutAll: 'register int ←i;'; cr].

aStream crtab; nextPutAll: 'double *←doubleBuffer;';cr.
　　aStream nextPutAll:

'(void) strcpy (←mod→name, "', name, '");
←mod→num←Arguments = ', argSize, ';
←mod→num←Results = ', resultSize, ';
←mod→num←Intermediates = ', intermediateSize, ';
←mod→num←Temporaries = ', tempSize, ';
←mod→num←Pads = ', self padNames size printString, ';
←mod→num←Parameters = ', paramNames size printString, ';';cr.

paramNames isEmpty
　　　　ifTrue:
　　　　　　[aStream crtab; nextPutAll: '←mod→parameterDefaults = NULL;'.
　　　　　　aStream crtab; nextPutAll: '←mod→parameterNames = NULL;']
　　　　ifFalse:
　　　　　　[aStream crtab; nextPutAll: '←mod→parameterDefaults = parameterDefaults;'.
　　　　　　aStream crtab; nextPutAll: '←mod→parameterNames = parameterNames;'].

aStream crtab; nextPutAll: '←mod→parameterRanges = ', BackendCodeManager
nameForArrayOfAllParameterRanges ,';
　　　　←mod→outputMap = analysisOutputs;';　cr.

bufferSize ← (numberOfArgs * numberOfTemps) + (2 * numberOfArgs) + (2 * numberOfResults) + numberOfOutputs.
　　bufferSize = 0
　　　　ifFalse:
　　　　　　[aStream crtab; nextPutAll: '←doubleBuffer = CALLOC (', bufferSize printString, ', double);'.

numberOfTemps > 0
　　　　　　ifTrue:
　　　　　　　　[aStream nextPutAll: '
←mod→tempWorkspace = CALLOC (', tempSize, ', fandfprime);
for (←i=0; ←i<', tempSize, '; ←i++) {
　　←mod→tempWorkspace[←i].fval = 0.0;
　　←mod→tempWorkspace[←i].partialIndex = 0;
　　←mod→tempWorkspace[←i].vectorSize = ←mod→num←Arguments;'.

numberOfArgs > 0
　　　　　　　　　ifTrue:

```
            [aStream crtab; tab; nextPutAll: '←mod→tempWorkspace[←i].fprime =
←doubleBuffer;
        ←doubleBuffer += ', argSize, ';'].

aStream crtab; nextPutAll: '}
'].
        numberOfArgs > 0
            ifTrue:
                [aStream nextPutAll: '
←mod→deltaArgumentsWorkspace = ←doubleBuffer;
←doubleBuffer += ', argSize, ';
←mod→imposedArgumentsWorkspace = ←doubleBuffer;
←doubleBuffer += ', argSize, ';'].

numberOfResults > 0
            ifTrue:
                [aStream nextPutAll: '
←mod→linearResultsWorkspace = ←doubleBuffer;
←doubleBuffer += ', resultSize, ';
←mod→scaledResultsWorkspace = ←doubleBuffer;
←doubleBuffer += ', resultSize, ';'].

numberOfOutputs > 0
            ifTrue:
                [aStream nextPutAll: '
←mod→outputsWorkspace = ←doubleBuffer;']].

•   self printFunctionInstanceCountsOn: aStream inContext: context.

self printLinksToFunctionsOn: aStream inContext: context.

"If there are any zero-argument results, tell the simulator to do source stepping."
    context hasNonzeroZeroArgumentResults
        ifTrue: [aStream cr; crtab; nextPutAll: '←mod→sourceStepped = TRUE;']
        ifFalse: [aStream cr; crtab; nextPutAll: '←mod→sourceStepped = FALSE;'].

aStream nextPutAll: '
←mod→stateIndex = ', stateIndex, ';
}
;

"* 4 Sep 90 7:05 pm graemeb *"

printDcOutputLoaderOn: aStream inContext: context            printDcOutputLoaderOn:inContext:
    "Print out C code for a dc output loader ('load using solution vector – without mapouts') that will execute
    the receiver's model equations and output code before outputs are printed to the ansr file."

"Author: 2 May 90 sueb ; Revised:  14 May 90 sueb; Revised:  13 Jun 90 sueb (don't need to send analysis
    section as argument)"

| opCode temporaryVariables |
    opCode ← context codeFor: #initialOutput.
    temporaryVariables ← SortedCollection new.
    opCode isEmpty
        ifFalse:
            [temporaryVariables addAll: opCode temporaryVariables].

aStream cr.
    aStream nextPutAll: '/* Dc output loader -- "Run code to set values before printing outputs" */'; cr.
    aStream nextPutAll: 'int'; cr;
            nextPutAll: 'DO←';
            nextPutAll: name;
            nextPutAll: '(←loader, ←circuit, ←fdAnsr)
FILE *←fdAnsr; /* input -- file descriptor of ansr file */
', (context primitiveModel outputNamesFor: #Dc) isEmpty
        ifTrue:
            [self printEmptyFunctionOn: aStream]
        ifFalse:
```

[self printDeclarations: temporaryVariables on: aStream inContext: context.

(context argumentNames isEmpty)
    ifFalse:
        [aStream tab;    nextPutAll: 'double *←solutionVector;

←solutionVector = ←circuit→solutionVector;'; cr].
    aStream crtab;    nextPutAll: '
←element = (struct ';
        nextPutAll: name;
        nextPutAll: 'ElementInstance *) ←loader→elements;

for (←i = 0; ←i < ←loader→num←Elements; ←i++) { self printFullMapInsOn: aStream level: 2.

(context codeFor: #dcArgumentDependent) isEmpty
    ifFalse:
        [aStream crtab: 2;    nextPutAll: '/* If element was bypassed, run dc code */'.
        aStream crtab: 2; nextPutAll: 'if (←element→bypass == TRUE)'.
        self printDcFunctionCallOn: aStream inContext: context level: 3].

aStream crtab: 2; nextPutAll: '/* Run the output code */'.
opCode printCodeOnWithoutLimiting: aStream level: 2 inContext: context.
aStream cr.

"        aStream crtab:2; nextPutAll: 'WRITE←ELEMENT←OUTPUTS
(←loader→outputMap[←circuit→outputSection],
                    ←element→elementNumber);'.
"       aStream nextPutAll: '
    ←element = ←element→next;
}   /* end for loop over elements */ return (OKAY);'.

aStream nextPutAll: '
}
']

"* 24 Aug 90 2:06 pm graemeb *"

printResetArgumentsOn: aStream inContext: context                    printResetArgumentsOn:inContext:
    "Print out C code to reset the reference values for limited arguments from a solution vector passed in as an argument. This will be called when a sequencer moves its swept variable back to a previously-converged value."
    "Author: 12 Mar 90 sueb; Revised: 14 Aug 90 graemeb, reset limited args only."

| arguments mapIns |
    arguments ← context limitedArgumentNames intersection: context nonLinearArguments.
    mapIns ← mapManager mapInsDictionary.
    aStream cr.
    aStream nextPutAll: '/* Reset reference values for limited arguments using the designated solution vector */'; cr.
    aStream nextPutAll: 'int'; cr;
            nextPutAll: 'RA←';
            nextPutAll: name;
            nextPutAll: '(←loader, ←solutionVector)
elementLoader *←loader;
double *←solutionVector;
{ arguments isEmpty
        ifFalse:
            [aStream tab; nextPutAll: 'register int ←i;
struct ';
        .       nextPutAll: name;

nextPutAll: 'ElementInstance *←element;

```
←element = (struct ';
        nextPutAll: name;
        nextPutAll: 'ElementInstance *) ←loader→elements;
for (←i = 0; ←i < ←loader→num←Elements; ←i++) {
```

1 to: arguments size do:
        [:i |
        (mapIns at: (arguments at: i)) printCCodeForDirectMapinOn: aStream
                              argumentName: (arguments at: i)
                                argumentIndex: i
                                level: 2].
        aStream crtab; nextPutAll: '
    ←element = ←element→next;
} /* end for loop over elements */
'].

aStream crtab; nextPutAll: 'return(OKAY);
}

"* 24 Aug 90 2:09 pm graemeb *"

printSpice3                                                                                                                                                       printSpice3
    "Print out an MDS model in spice3 format."

self halt: 'The spice3 model generation is not complete!'.

"* 2 Feb 90 8:57 am sueb *"

printTekSpice2                                                                                                                                                    printTekSpice2
    "Print out a set of loaders for an MDS model in (new) tekspice2 format."
    "Arguments:
        model - <SimulatorModel>"
    "Author: 2 Nov 89 sueb ; Revised: 17 Jan 90 ballard (use ADSFilename) ; Revised: 2 Feb 90 sueb (moved to this class, no longer needs MDSModel) ; Revised: 14 Mar 90 sueb (add resetArguments function) ; Revised: 27 Mar 90 sueb (add Processor yields and 'unwind' code for quit button box) ; Revised: 1 May 90 sueb (generate transient loaders first)"

| aStream subcircuitInstance modelContext functionsFileName |

Transcript show: self name, ' '.
    subcircuitInstance ← SubCircuitInstance new.
    modelContext ← ModelCodeGenContext new inPrimitiveInstance: subcircuitInstance setupNulVariables model: self.
    modelContext setUpVariablesForModel: self inContext: TspiceSimulatorContext new.
    modelContext resetLocalAssignments.
    functionsFileName ← ADSFilename named: name extension: 'c'.
    [aStream ← functionsFileName newReadWriteStreamSavingOld.
    aStream nextPutAll: self class fileHeader.
    aStream nextPutAll: '#include "parserDefs.h"'; cr.
    aStream nextPutAll: '#include "cPrimitives.h"'; cr.
    aStream nextPutAll: '#include "', name, '.h"'; cr.

Processor yield.
    self generateTransientCodeInContext: modelContext.
    Processor yield.
    self generateDcCodeInContext: modelContext.
    modelContext performMiscellaneousProcessing.
    Processor yield.
    self printMacroNamesUsing: modelContext.
    Processor yield.
    self printTransientLoadersOn: aStream inContext: modelContext.
    Processor yield.
    self printBiasLoadersOn: aStream inContext: modelContext.
    Processor yield.

```
        self printNewFunctionsOn: aStream inContext: modelContext.
        Processor yield.
        self printCInitializationFunctionOn: aStream inContext: modelContext.
        aStream close] valueOnUnwindDo: [aStream isNil ifFalse: [aStream close].
                                          functionsFileName remove.
                                          modelContext isNil ifFalse: [modelContext release]].
```

"   *Processor yield.*
    *[self printMacroNamesUsing: modelContext] valueNowOrOnUnwindDo: [modelContext isNil ifFalse:*
*[modelContext release]]."*

"* 31 Aug 90 7:19 pm graemeb *"

printTopologyCheckLoaderOn:inContext:
printTopologyCheckLoaderOn: aStream inContext: context
    "Print out C code for a topology check loader ('load using signs') that will execute the receiver's argument
independent and dc equations, then mapout the signum of the results into the matrix."
    "Author: 25 Jan 90 sueb ; Revised: 27 Feb 90 sueb (remove declaration of rhs) ; Revised: 16 May 90
sueb "

```
    | moCode |
    self hasState
        ifTrue: [moCode ← mapManager generateCodeForMapOutsInContext: context]
        ifFalse: [moCode ← context codeFor: #dcMapOut].

aStream cr.
    aStream nextPutAll: '/* Bias topology check loader -- "LoadUsingSigns" */'; cr.
    aStream nextPutAll: 'int'; cr;
                nextPutAll: 'LS←';
                nextPutAll: name;
                nextPutAll: '(←loader, ←circuit, ←convergencePossible)
    int *←convergencePossible;'.

((context codeFor: #dcArgumentDependent) isEmpty and: [moCode isEmpty])
        ifTrue:
            [↑self printEmptyFunctionOn: aStream].

self printDeclarationsOn: aStream inContext: context.
    self printMapInDeclarationsOn: aStream level: 1 inContext: context.
    aStream crtab;    nextPutAll: '

←element = (struct ';
                nextPutAll: name;
                nextPutAll: 'ElementInstance *) ←loader→elements;
    for (←i = 0; ←i < ←loader→num←Elements; ←i++) {

"    self printAIFunctionCallOn: aStream inContext: context level: 2.
"    self printInitializeArgumentValuesOn: aStream inContext: context.
    self printArgumentUpdatesOn: aStream inContext: context level: 2.
    self printDcFunctionCallOn: aStream inContext: context level: 2.

aStream crtab:2; nextPutAll: '/* Run the mapout code */'.
    moCode printSignumCodeOn: aStream level: 2.

aStream cr; nextPutAll: '
        ←element = ←element→next;
    }    /* end for loop over elements */
}
,
```

"* 27 Aug 90 11:08 am graemeb *"

printTransientInitializingLoaderOn:inContext:
printTransientInitializingLoaderOn: aStream inContext: context "Print out C code for a transient loader ('load using predicted solution vector -- without convergence checking') that will execute the receiver's dc equations, then mapout results."
"Author: 2 May 90 sueb ; Revised: 14 May 90 sueb"

```
aStream cr.
aStream nextPutAll: '/* Transient initializing loader -- "TransientLoaderToInitializeOperators" */'; cr.
aStream nextPutAll: 'int'; cr;
        nextPutAll: 'TI←';
        nextPutAll: name;
        nextPutAll: '(←loader, ←circuit, ←convergencePossible)
int *←convergencePossible;'.

((context numberOfBesselInstances = 0) and:
    [(context numberOfDdtInstances = 0) and:
        [(context numberOfDelayInstances = 0) and:
            [(context numberOfIntegralInstances = 0)]]])
ifTrue:
    [aStream nextPutAll: '
elementLoader *←loader;
circuitData *←circuit;

{
    /* No instances of transient operators need to be initialized */
}
']
        ifFalse:
            [self printDeclarationsOn: aStream inContext: context.

aStream tab.
        aStream nextPutAll: 'double *←rhs;'; cr.

(context nonLinearArguments isEmpty)
            ifFalse:
                [aStream tab; nextPutAll: 'double *←solutionVector;'; cr.
                self printMapInDeclarationsOn: aStream level: 1 inContext: context].

(context nonLinearArguments isEmpty)
            ifFalse:
                [aStream crtab; nextPutAll: '←solutionVector = ←circuit→solutionVector;'].

aStream crtab; nextPutAll: '←rhs = ←circuit→solution.rhs;

←element = (struct ';
        nextPutAll: name;
        nextPutAll: 'ElementInstance *) ←loader→elements;
for (←i = 0; ←i < ←loader→num←Elements; ←i++) { self printMapInsOn: aStream level: 2 inContext: context.
        self printArgumentUpdatesOn: aStream inContext: context level: 2.
        self printTransientFunctionCallOn: aStream inContext: context level: 2.

aStream nextPutAll: '
    ←element = ←element→next;
}   /* end for loop over elements */
}
']
```

"* 24 Aug 90 2:11 pm graemeb *"

printTransientNonBypassingLoaderOn:inContext:
printTransientNonBypassingLoaderOn: aStream inContext: context
"Print out C code for a transient bypassing loader ('load using solution vector -- without bypassing') that will execute the receiver's transient equations, then mapout results."
"Author: 5 Apr 90 sueb; ; Revised: 17 Apr 90 sueb ; Revised: 23 Apr 90 sueb ; Revised: 14 May 90 sueb"

| dcCode moCode |
moCode ← context codeFor: #transientMapOut.

aStream cr.
aStream nextPutAll: '/* Transient non-bypassing loader -- "LoadUsingSolutionVector" */'; cr.
aStream nextPutAll: 'int'; cr;
        nextPutAll: 'TN←';
        nextPutAll: name;
        nextPutAll: '(←loader, ←circuit, ←convergencePossible)
int *←convergencePossible;'.

((context codeFor: #transientArgumentDependent) isEmpty and: [moCode isEmpty])
    ifTrue:
        [self printEmptyFunctionOn: aStream]
    ifFalse:
        [self printDeclarationsOn: aStream inContext: context.

aStream tab.
(context nonLinearArguments isEmpty)
    ifFalse:
        [aStream nextPutAll: 'double *←solutionVector;'; cr.
        self printMapInDeclarationsOn: aStream level: 1 inContext: context.
        self printLinearizationCheckDeclarationsOn: aStream level: 1 inContext: context].
aStream tab; nextPutAll: 'double *←rhs;'.

dcCode ← context codeFor: #dcArgumentDependent.
(context nonLinearResults isEmpty)
    ifFalse:
        [aStream crtab; nextPutAll: 'double ←sum;
double ←absoluteTolerance;
double ←relativeTolerance;'].

aStream crtab.
(context nonLinearArguments isEmpty)
    ifFalse:
        [aStream nextPutAll: '←solutionVector = ←circuit→solutionVector;';    crtab].
        aStream nextPutAll: '←rhs = ←circuit→solution.rhs;'.

(context nonLinearResults isEmpty)
        ifFalse:
            [aStream crtab; nextPutAll: '←absoluteTolerance = *←circuit→absoluteTolerance;
←relativeTolerance = *←circuit→relativeTolerance;'].

aStream cr; crtab;   nextPutAll: '
←element = (struct ';
        nextPutAll: name;
        nextPutAll: 'ElementInstance *) ←loader→elements;

for (←i = 0; ←i < ←loader→num←Elements; ←i++) {

←element→bypass = FALSE;

self printMapInsOn: aStream level: 2 inContext: context.

self printConditionalExtrapolationOfLinearResultsOn: aStream inContext: context level: 2.

self printArgumentUpdatesOn: aStream inContext: context level: 2.
        self printTransientFunctionCallOn: aStream inContext: context level: 2.
        self printLinearizationCheckOn: aStream level: 2 inContext: context.

aStream crtab:2; nextPutAll: '/* Run the mapout code */'.
        moCode printCodeOn: aStream level: 2.
        aStream nextPutAll: '
←element = ←element→next;
} /* end for loop over elements */
}
']

"* 24 Aug 90 3:13 pm graemeb *"

printTransientOutputLoaderOn:inContext:
printTransientOutputLoaderOn: aStream inContext: context
"Print out C code for a transient output loader ('load using solution vector -- without mapouts') that will execute the receiver's model equations and output code before outputs are printed to the ansr file."
"Author: 5 Apr 90 sueb; ; Revised: 17 Apr 90 sueb ; Revised: 2 May 90 sueb ; Revised: 14 May 90 sueb; Revised: 13 Jun 90 sueb (don't need to send analysis section as argument)"

```
| opCode temporaryVariables |
opCode ← context codeFor: #transientOutput.
temporaryVariables ← SortedCollection new.
opCode isEmpty
    ifFalse:
        [temporaryVariables addAll: opCode temporaryVariables].

aStream cr.
aStream nextPutAll: '/* Transient output loader -- "Run code to set values before printing outputs" */'; cr.
aStream nextPutAll: 'int'; cr;
        nextPutAll: 'TO←';
        nextPutAll: name;
        nextPutAll: '(←loader, ←circuit, ←fdAnsr)
FILE *←fdAnsr; /* input -- file descriptor of ansr file */
'.

(context primitiveModel outputNamesFor: #Transient) isEmpty
    ifTrue:
        [self printEmptyFunctionOn: aStream]
    ifFalse:
        [self printDeclarations: temporaryVariables on: aStream inContext: context.

(context argumentNames isEmpty)
            ifFalse:
                [aStream tab;    nextPutAll: 'double *←solutionVector;

←solutionVector = ←circuit→solutionVector;'; cr].

aStream crtab;  nextPutAll: '
    ←element = (struct ';
        nextPutAll: name;
        nextPutAll: 'ElementInstance *) ←loader→elements;

for (←i = 0; ←i < ←loader→num←Elements; ←i++) {
'.

self printFullMapInsOn: aStream level: 2.

"Don't need to do the next step unless we add bypassing to transient.

(context codeFor: #transient) isEmpty
            ifFalse:
                [aStream crtab: 2;   nextPutAll: '/* If element was bypassed, run transient code */'.
                aStream crtab: 2;   nextPutAll: 'if (←element→bypass == TRUE)'.
                self printTransientFunctionCallOn: aStream inContext: context level: 3]."

aStream crtab: 2; nextPutAll: '/* Run the output code */'.
        opCode printCodeOnWithoutLimiting: aStream level: 2 inContext: context.
        aStream cr.

"       aStream crtab:2; nextPutAll: 'WRITE←ELEMENT←OUTPUTS
(←loader→outputMap[←circuit→outputSection],
                    ←element→elementNumber);'.
"       aStream nextPutAll: '
    ←element = ←element→next;
}   /* end for loop over elements */
'.

return (OKAY);'.
``` aStream nextPutAll: '
}
']

"* 24 Aug 90 2:12 pm graemeb *"

printTransientPredictedSolutionVectorLoaderOn:inContext:
printTransientPredictedSolutionVectorLoaderOn: aStream inContext: context
    "Print out C code for a transient loader ('load using predicted solution vector -- without convergence
checking') that will execute the receiver's transient equations, then mapout results."
    "Author: 5 Apr 90 sueb ; Revised: 17 Apr 90 sueb ; Revised: 23 Apr 90 sueb ; Revised: 14 May 90 sueb
"

| moCode |
    moCode ← context codeFor: #transientMapOut.

aStream cr.
    aStream nextPutAll: '/* Transient non-bypassing loader -- "TransientLoadUsingPredictedSolutionVector" */';
cr.
    aStream nextPutAll: 'int'; cr;
                nextPutAll: 'TP←';
                nextPutAll: name;
                nextPutAll: '(←loader, ←circuit, ←convergencePossible)
int *←convergencePossible;'.

((context codeFor: #transientArgumentDependent) isEmpty and: [moCode isEmpty])
        ifTrue:
            [self printEmptyFunctionOn: aStream]
        ifFalse:
            [self printDeclarationsOn: aStream inContext: context.

aStream tab.
            aStream nextPutAll: 'double *←rhs;'; cr.

(context nonLinearArguments isEmpty)
                ifFalse:
                    [aStream tab;   nextPutAll: 'double *←solutionVector;';   cr.
                    self printMapInDeclarationsOn: aStream level: 1 inContext: context].

*       (context nonLinearArguments isEmpty)
                ifFalse:
                    [aStream crtab;   nextPutAll: '←solutionVector = ←circuit→solutionVector;'].

aStream crtab;   nextPutAll: '

←element = (struct ';
                nextPutAll: name;
                nextPutAll: 'ElementInstance *) ←loader→elements;
    ←rhs = ←circuit→solution.rhs;

for (←i = 0; ←i < ←loader→num←Elements; ←i++) { self printMapInsOn: aStream level: 2 inContext: context.
            self printArgumentUpdatesOn: aStream inContext: context level: 2.
            self printTransientFunctionCallOn: aStream inContext: context level: 2.

aStream crtab:2; nextPutAll: '/* Run the mapout code */'.
            moCode printCodeOn: aStream level: 2.

aStream nextPutAll: '
        ←element = ←element→next;
    }   /* end for loop over elements */
}
']

"* 24 Aug 90 2:13 pm graemeb *"

testPrintRanges                                                                    testPrintRanges
   "FOR TESTING ONLY!!!"
   "Author: 6 Jun 90 sueb"

| aStream functionsFileName modelContext subcircuitInstance |
   Transcript show: self name, ' '.
   subcircuitInstance ← SubCircuitInstance new.
   modelContext ← ModelCodeGenContext new inPrimitiveInstance: subcircuitInstance setupNulVariables
model: self.
   modelContext setUpVariablesForModel: self inContext: TspiceSimulatorContext new.
   functionsFileName ← ADSFilename named: name extension: 'c'.
   aStream ← functionsFileName newReadWriteStreamSavingOld.
   aStream nextPutAll: self class fileHeader.
   aStream nextPutAll: '#include "cPrimitives.h"'; cr.
   aStream nextPutAll: '#include "', name, '.h"'; cr.

self printOutputArraysOn: aStream.

self printCInitializationFunctionOn: aStream inContext: modelContext.

aStream close

"* 8 Jun 90 2:47 pm sueb *"

updates do:
      [:statement |
         dcCode removeStatement: statement.
         argDefs addStatement: statement].
   modelContext at: #dcArgumentDefinitions putCode: argDefs.

modelContext at: #argumentDefinitions putCode: argDefs.
   modelContext moveCodeAt: #argumentDefinitions to: #dcArgumentDefinitions.
   modelContext moveCodeAt: #argumentDependent to: #dcArgumentDependent.
   modelContext moveCodeAt: #output to: #initialOutput.

"* 22 Aug 90 1:47 pm graemeb *"

generateTransientCodeInContext: modelContext                        generateTransientCodeInContext:
   "Generate the C code for each of the stored blocks of compiled smalltalk model code for transient analysis."
   "Author: 17 Aug 90 graemeb"

| trCode argDefs opCode aiCode dataFlowAnalyzer argumentNames updates oldAICode |
   modelContext analysisMode: #transient.
   modelContext setupZeroArgumentResultNamesForModel: self.
   trCode ← TspiceModelBlockNode new initialize.
   argDefs ← self codeFor: #argumentDefinition.
   argDefs notNil ifTrue: [trCode addAll: argDefs].
   trCode addAll: (self codeFor: #argumentDependentEquations).
   modelContext at: #argumentDependent putCode: (trCode generateCodeInContext: modelContext). "Needed
here to determine the intermediate & result types."
   modelContext moveResultsToTransient.
   modelContext resetVarDeclarations.

opCode ← code at: #output ifAbsent: [].
   opCode notNil ifTrue:
      [modelContext at: #output putCode: (opCode generateCodeInContext: modelContext)].
      modelContext resetVarDeclarations.

aiCode ← code at: #argumentIndependentEquations ifAbsent: [].
   oldAICode ← modelContext codeFor: #argumentIndependent.
   aiCode notNil ifTrue:
      [modelContext at: #argumentIndependent putCode: (aiCode generateCodeInContext: modelContext).
       modelContext resetVarDeclarations].

dataFlowAnalyzer ← self class preferredDataFlowAnalyzerClass new context: modelContext.
   dataFlowAnalyzer optimizeCode.

modelContext at: #transientMapOut putCode: (mapManager generateCodeForMapOutsInContext: modelContext).

`dataFlowAnalyzer release.

argumentNames ← modelContext argumentNames.
trCode ← modelContext codeFor: #argumentDependent.
updates ← OrderedCollection new: argumentNames size.
trCode do:
    [: statement |
        (statement isAssignment and: [(argumentNames includes: statement variableName)])
            ifTrue:
                [updates add: statement]].
argDefs ← TspiceCodeGenBlockNode new initialize.
updates do:
    [: statement |
        trCode removeStatement: statement.
        argDefs addStatement: statement].
modelContext at: #argumentDefinitions putCode: argDefs.
modelContext moveCodeAt: #argumentDefinitions to: #transientArgumentDefinitions.
modelContext moveCodeAt: #argumentDependent to: #transientArgumentDependent.
modelContext moveCodeAt: #output to: #transientOutput.

"* 6 Sep 90 10:38 pm graemeb *"

limitedArgumentNames
"*Answer an array of strings representing the arguments which have limiting.*"
"*Author: 14 Aug 90 graemeb*"

| argumentNames limitedArgumentNames argDefCode i |
argumentNames ← self argumentNames.
limitedArgumentNames ← OrderedCollection new.
argDefCode ← self codeFor: #argumentDefinition.
1 to: argumentNames size do:
    [: i |
    (argDefCode statements at: i) name ~= 'updateWithoutLimiting'
        ifTrue: [limitedArgumentNames add: (argumentNames at: i)]].
↑limitedArgumentNames asArray "* 14 Aug 90 3:32 pm graemeb *"

printAIFunctionCallOn: aStream inContext: context level: level
"*Print out C code to call the DC function for this model.*"
"*Author: 3 Jan 90 sueb*"

| aiCode |
aiCode ← context codeFor: #argumentIndependent.
(aiCode isNil or: [aiCode isEmpty])
    ifFalse:
        [aStream crtab: level; nextPutAll: '/* Run the argument independent code */'.
        aStream crtab: level; nextPutAll: 'AI←', name, '(←element, ←circuit);'.
        aStream cr]

printArgumentUpdatesOn: aStream inContext: context level: level
"*Print out C code to update the reference arguments for this model.*"
"*Author: 3 Jan 90 sueb; Revised: 16 Aug 90 graemeb *"

| argDefCode |
argDefCode ← context argumentDefinitionCode.
argDefCode isEmpty
    ifFalse:
        [aStream crtab: level; nextPutAll: '/* Update arguments */'.

argDefCode printCodeOn: aStream level: level.
aStream cr]

"* *17 Aug 90 3:15 pm graemeb* *"

printBiasLoadersOn: aStream inContext: modelContext        printBiasLoadersOn:inContext:
   "*Print out a set of bias loaders for an MDS model in tekspice2 format.*"
   "*Author: 2 Nov 89 sueb ; Revised: 17 Jan 90 ballard (use ADSFilename) ; Revised: 2 Feb 90 sueb (moved to this class, no longer needs MDSModel) ; Revised: 14 Mar 90 sueb (add resetArguments function) ; Revised: 27 Mar 90 sueb (add Processor yields and 'unwind' code for quit button box) ; Revised: 3 Apr 90 sueb (broke out bias loaders from original 'printTekSpice2' method) ; Revised: 1 May 90 sueb (generate argument-independent block from transient code)*"

modelContext analysisMode: #dc.
   (modelContext codeFor: #dcArgumentDependent) isEmpty
      ifTrue:
         [aStream cr; nextPutAll: '/* No dc code for this model */'; cr]
      ifFalse:
         [self printDcCodeOn: aStream inContext: modelContext].
   Processor yield.
   self printTopologyCheckLoaderOn: aStream inContext: modelContext.
   Processor yield.
   self printBiasInitializingLoaderOn: aStream inContext: modelContext.
   Processor yield.
   self printBiasPredictedSolutionVectorLoaderOn: aStream inContext: modelContext.
   Processor yield.
   self printBiasNonBypassingLoaderOn: aStream inContext: modelContext.
   Processor yield.
   self printBiasBypassingLoaderOn: aStream inContext: modelContext.
   Processor yield.
   self printBiasOutputLoaderOn: aStream inContext: modelContext.
   Processor yield.
   self printDcOutputLoaderOn: aStream inContext: modelContext.
   Processor yield.
   self saveMacroNamesUsing: modelContext "* *17 Aug 90 2:17 pm graemeb* *"

printBypassCheckOn:inContext:level:
printBypassCheckOn: aStream inContext: context level: level
   "*Print out the C code for checking to see if the dcCode can by bypassed.*"
   "*Author: 2 Nov 89 sueb*"

| argumentNames resultNames index | resultNames ← context nonLinearResults.
   resultNames isEmpty
      ifTrue: [↑self].

argumentNames ← context nonLinearArguments.

aStream crtab: level; nextPutAll: '/* determine if the dc code can be bypassed */'.

index ← level.

argumentNames do:
      [: argName |
         aStream crtab: index; nextPutAll: 'if (←element→bypass) {'.
         index ← index + 1.
         aStream crtab: (index); nextPutAll: '←element→bypass = fabs(', argName, '←←delta) <= ←relativeTolerance *'.
         aStream crtab: (index + 2);
             nextPutAll: 'MAX(fabs(', argName, '←←delta), fabs(', argName, '←←imposed)) + ←vnTolerance;'].

argumentNames do:
      [: argName |
         index ← index - 1.

```
        aStream crtab: index; nextPutAll: '}'].
aStream cr.

resultNames do:
        [:resName |
            aStream crtab: index; nextPutAll: 'if (←element→bypass) {'.
            index ← index + 1.
            aStream crtab: index; nextPutAll: '←element→bypass = fabs(', resName, '←←linear - ', resName,
') <= '.
            aStream crtab: (level + 2); nextPutAll: '(←relativeTolerance * MAX(fabs(', resName, '←←linear),
fabs(', resName, ')) + ←absoluteTolerance);'].

resultNames do:
        [:resName |
            index ← index - 1.
            aStream crtab: index; nextPutAll: '}'].
    aStream cr "* 16 Aug 90 11:16 am graemeb *"

printConditionalExtrapolationOfLinearResultsOn:inContext:level:
printConditionalExtrapolationOfLinearResultsOn: aStream inContext: context level: level
    "Print out the C code to calculate delta argument values (for 'nonlinear' arguments) and update linear
branch values conditional upon convergencepossible only if there any nonlinear results."
    "Author: 16 Aug 90 graemeb"

context nonLinearResults isEmpty
        ifFalse:
            [aStream crtab: level; nextPutAll: 'if (*←convergencePossible) {';  cr.
            self printExtrapolationOfLinearResultsOn: aStream inContext: context level: level+1.
            aStream crtab: level; nextPutAll: '}';  cr]

"* 16 Aug 90 12:23 pm graemeb *"

printDcCodeOn: aStream inContext: context                           printDcCodeOn:inContext:
    "Print out C code that will execute the receiver's 'dc code'."
    "Author: 27 Nov 89 sueb ; Revised: 25 Jan 90 sueb (removed unused temp)"

| temporaryVariables dcCode |
    dcCode ← context codeFor: #dcArgumentDependent.
    dcCode isEmpty
        ifFalse: [temporaryVariables ← dcCode temporaryVariables asSortedCollection].

aStream cr; nextPutAll: '/* Run the dc code for one element */'.
    aStream cr.
    aStream nextPutAll: 'int'; cr;
            nextPutAll: 'DC←';
            nextPutAll: name;
            nextPutAll: '(←element, ←circuit)
struct ';
            nextPutAll: name;
            nextPutAll: 'ElementInstance *←element;
circuitData *←circuit;
{
    dcCode isEmpty
        ifTrue:
            [aStream crtab: 1;   nextPutAll: 'return(OKAY);']
        ifFalse:
            [temporaryVariables do:
                [: var |
                    (context containsPermanentVariable: var)
                        ifFalse:
                            [(((var at: 1) = $←   and: [(var at: 2) = $I])
                                ifTrue:
                                    [aStream crtab: 1; nextPutAll: 'int '; nextPutAll: var; nextPut: $;]
                                ifFalse:
                                    [aStream crtab: 1; nextPutAll: 'double '; nextPutAll: var; nextPut: $;]]].
``` dcCode printCodeOn: aStream level: 1.
		aStream cr].
	aStream nextPutAll: '
}

"* 17 Aug 90 12:24 pm graemeb *"

printDcFunctionCallOn: aStream inContext: context level: level    printDcFunctionCallOn:inContext:level:
	"Print out C code to call the DC function for this model."
	"Author: 3 Jan 90 sueb"

| dcCode |
	dcCode ← context codeFor: #dcArgumentDependent.
	(dcCode isNil or: [dcCode isEmpty])
		ifTrue:
			[aStream crtab: level; nextPutAll: '/* (no dc code for this model) */'; cr]
		ifFalse:
			[aStream crtab: level; nextPutAll: '/* Run the DC code */'.
			aStream crtab: level; nextPutAll: 'DC←', name, '(←element, ←circuit);'.
			aStream cr]

"* 17 Aug 90 12:25 pm graemeb *"

printDeclarations: temporaryVariables on: aStream inContext: context     printDeclarations:on:inContext:
	"Print the variable declarations needed for all loaders, beginning with the loader and circuit (always passed
as arguments to the loader function) and including any temporaries (double floats) stored in
'temporaryVariables'."
	"Author: 2 Nov 89 sueb; Revised: 5 Feb 90 sueb (moved to this class from 'SimulatorModelDefinition');
Revised: 15 Aug 90 graemeb"

| variableType |
	aStream nextPutAll: '
elementLoader *←loader;
circuitData *←circuit;

{ register int ←i;'.

self printTemporaryDeclarations: temporaryVariables on: aStream inContext: context.
	aStream nextPutAll: '
struct ';
	nextPutAll: name;
	nextPutAll: 'ElementInstance *←element;

"* 5 Sep 90 7:12 pm graemeb *"

printDeclarationsOn: aStream inContext: context          printDeclarationsOn:inContext:
	"Print the variable declarations needed for all loaders, beginning with the loader and circuit (always passed
as arguments to the loader function) and including any temporaries (double floats) stored in
'temporaryVariables'."
	"Author: 2 Nov 89 sueb; Revised: 5 Feb 90 sueb (moved to this class from 'SimulatorModelDefinition')"

aStream nextPutAll: '
elementLoader *←loader;
circuitData *←circuit;

{ register int ←i;
	struct ';
			nextPutAll: name;
			nextPutAll: 'ElementInstance *←element;

"* 1 Aug 90 12:51 pm graemeb *"

printEmptyFunctionOn: aStream
"Print a null function (e.g., the receiver has no dc code)."
"Author: 2 Nov 89 sueb; Revised: 5 Feb 90 sueb (moved to this class from 'SimulatorModelDefinition')"

aStream nextPutAll: '
elementLoader *←loader;
circuitData *←circuit;

{
    /* No dc code, and no values need to be mapped out to the solution */
}
'

"* 21 Feb 90 1:58 pm sueb *"

printExtrapolationOfLinearResultsOn:inContext:level:
printExtrapolationOfLinearResultsOn: aStream inContext: context level: level
"Print out the C code to calculate delta argument values (for 'nonlinear' arguments) and update linear branch values."
"Author: 2 Nov 89 sueb ; Revised: 25 Jan 90 sueb (removed unused temps)"

| results argumentsSize result argumentNames resultNames argName resName nonLinearArgumentNames |
context nonLinearResults isEmpty ifTrue: [↑self].
results ← context results.
argumentNames ← variables argumentNames.
resultNames ← mapManager resultNames.
nonLinearArgumentNames ← context nonLinearArguments.
argumentsSize ← argumentNames size.

aStream crtab: level; nextPutAll: '/* calculate delta argument values */'.
nonLinearArgumentNames do:
    [:arg |
    aStream crtab: level; nextPutAll: arg, '←←delta = ', arg, '←←imposed - ', arg, ';'].
aStream cr.

aStream crtab: level; nextPutAll: '/* update linear results */'.
1 to: results size do:
    [:i |
    resName ← resultNames at: i.
    (context isNonLinearResult: resName)
        ifTrue:
            [result ← results at: i.
            result numberOfActiveDerivatives == 0
                ifTrue:
                    [aStream crtab: level; nextPutAll: resName, '←←linear = ', resName, ';']
                ifFalse:
                    [result numberOfActiveDerivatives == 1
                        ifTrue:
                            [resName ← resultNames at: i.
                            1 to: argumentsSize do:
                                [:j |
                                (result derivativeActiveFor: j)
                                    ifTrue:
                                        [argName ← argumentNames at: j.
                                        aStream crtab: level; nextPutAll: '←sum = ',
resName, '←', argName, ' * ', argName, '←←delta;']]]
                        ifFalse:
                            [aStream crtab: level; nextPutAll: '←sum = 0.0;'.
                            resName ← resultNames at: i.
                            1 to: argumentsSize do:
                                [:j |
                                (result derivativeActiveFor: j)
                                    ifTrue:
                                        [argName ← argumentNames at: j.
                                        aStream crtab: level; nextPutAll: '←sum += ', resName, '←', argName, ' * ', argName, '←←delta;']]].
aStream crtab: level; nextPutAll: resName, '←←linear = ', resName, ' + ←sum;']]].
aStream cr "* 6 Sep 90 7:58 pm graemeb *"

printFullMapInsOn: aStream level: level    printFullMapInsOn:level:
"Print out the C code to map argument values from the solution vector."
"Author: 25 Oct 89 sueb; Revised: 5 Feb 90 sueb (moved to this class from 'SimulatorModelDefinition')"

| arguments mapIns |
arguments ← variables argumentNames.
mapIns ← mapManager mapInsDictionary.
1 to: arguments size do:
　　[: i |
　　(mapIns at: (arguments at: i)) printCCodeForDirectMapinOn: aStream
　　　　　　　　　　　　argumentName: (arguments at: i)
　　　　　　　　　　　· argumentIndex: i level: level]

"* 21 Feb 90 1:58 pm sueb *"

printFunctionInstanceCountsOn:inContext:
printFunctionInstanceCountsOn: aStream inContext: context
"Print the code to store the model's count of the number of instances of each type of special function used in the model code."
"Author: 9 Apr 90 sueb ; Revised: 23 Apr 90 sueb "

aStream crtab; nextPutAll: '←mod→functionInstances [BESSEL2←INDEX] = ', context numberOfBesselInstances printString, ';'.
aStream crtab; nextPutAll: '←mod→functionInstances [DDT←INDEX] = ', context numberOfDdtInstances printString, ';'.
aStream crtab; nextPutAll: '←mod→functionInstances [DELAY←INDEX] = ', context numberOfDelayInstances printString, ';'.
aStream crtab; nextPutAll: '←mod→functionInstances [INTEGRAL←INDEX] = ', context numberOfIntegralInstances printString, ';'

"* 26 Apr 90 5:20 pm sueb *"

printInitializeArgumentValuesOn:inContext:
printInitializeArgumentValuesOn: aStream inContext: context
"Print out the code used to set arguments to their initial values, for the first execution of the dc code."
"Author: 2 Nov 89 sueb; Revised: 5 Feb 90 sueb (moved to this class from 'SimulatorModelDefinition'); Revised: 15 Aug 90 graemeb."

| limitedArgumentNames |
limitedArgumentNames ← context limitedArgumentNames.
aStream nextPutAll: '
/*
　* Set initial values for nonlinear arguments.　　＼
　* Initialize reference values for limited arguments with initial (flag) values.
　* The limiting function will test for this and set the real initial value.
　* Set unlimited arguments to zero.
　*/ context nonLinearArguments do:
　　[:argName |
　　　(limitedArgumentNames includes: argName)
　　　　ifTrue: [aStream crtab: 2; nextPutAll: argName, ' = POS←INFINITY;'].
　　　aStream crtab: 2; nextPutAll: argName, '←←imposed = 0.0;'].
aStream cr.

"* 23 Aug 90 11:07 am graemeb *"

printLinearizationCheckDeclarationsOn:level:inContext:

printLinearizationCheckDeclarationsOn: aStream level: level inContext: context
"Print declarations for temporaries used by the linearization checks."
"Author: 15 Aug 90 graemeb"

```
| nonLinearResults |
nonLinearResults ← context nonLinearResults.
nonLinearResults isEmpty
    ifTrue: [↑self].
context nonLinearArguments do:
    [: arg |
    aStream crtab: level;
            nextPutAll: 'double ';
            nextPutAll: arg;
            nextPutAll: '←←delta;'].
nonLinearResults do:
    [: res |
    aStream crtab: level;
            nextPutAll: 'double ';
            nextPutAll: res;
            nextPutAll: '←←linear;'].
aStream cr
```

"* 16 Aug 90 11:15 am graemeb *"

printLinearizationCheckOn:level:inContext:
printLinearizationCheckOn: aStream level: level inContext: context
"Print out the check to see if a linear solution has been reached."
"Author: 2 Nov 89 sueb; Revised: 5 Feb 90 sueb (moved to this class from 'SimulatorModelDefinition')"

```
| resultNames index | resultNames ← context nonLinearResults.
resultNames isEmpty
    ifTrue: [↑self].

aStream crtab: level; nextPutAll: '/* perform linearization check */'.

index ← level.
resultNames do:
    [: resName |
    aStream crtab: index; nextPutAll: 'if (*←convergencePossible) {'.
    index ← index + 1.
    aStream crtab: (index); nextPutAll: '*←convergencePossible = (fabs(', resName, ' - ', resName,
'←←linear) <='.
    aStream crtab: (index + 2); nextPutAll: 'fabs(', (context convergenceReferenceFor: resName), ') *
←relativeTolerance + ←absoluteTolerance);'].

resultNames do:
    [: resName |
    index ← index - 1.
    aStream crtab: index; nextPutAll: '}'].
aStream cr
```

"* 31 Aug 90 8:56 pm graemeb *"

printLinksToFunctionsOn:inContext:
printLinksToFunctionsOn: aStream inContext: context
"Write the code to link the model functions to the loader functions already written on aStream."
"Author: 30 May 90 sueb; Revised: 16 Aug 90 graemeb"

```
| bbLoader |
bbLoader ← context nonLinearResults isEmpty
    ifTrue: ['BN←']
    ifFalse: ['BB←'].

aStream nextPutAll: '
```

```
←mod→arg←Indep = AI←', name, ';
←mod→reset←Arguments = RA←', name, ';
←mod→tran←Initialize = TI←', name, ';
←mod→tran←PredictedSoln = TP←', name, ';
←mod→tran←NonBypass = TN←', name, ';
←mod→tran←Output = TO←', name, ';
←mod→bias←Initialize = BI←', name, ';
←mod→bias←PredictedSoln = BP←', name, ';
←mod→signumLoad = LS←', name, ';
←mod→bias←NonBypass = BN←', name, ';
←mod→bias←Bypass = ', bbLoader, name, ';
←mod→bias←Output = BO←', name, ';
←mod→dc←Output = DO←', name, ';

←mod→allocateElementInstance = Allocate←', name, ';
←mod→setupMappings = Mappings←', name, ';
←mod→printElementInstances = PrintElementInstances←', name, ';
←mod→printElementInstance = PrintElementInstance←', name, ';
←mod→saveZeroArgumentResults = SaveZeroArgumentResults←', name, ';'
```

"* 31 Aug 90 11:01 pm graemeb *"

printMapInDeclarationsOn: aStream level: level inContext: context    printMapInDeclarationsOn:level:inContext:
"Print declarations for temporaries used by the mapins."
"Author: 15 Aug 90 graemeb"

```
context nonLinearArguments do:
    [: arg |
    aStream crtab: level;
                nextPutAll: 'double ';
                nextPutAll: arg;
                nextPutAll: '←←imposed;'].
aStream cr
```

"* 16 Aug 90 9:43 am graemeb *"

printMapInsOn: aStream level: level inContext: context    printMapInsOn:level:inContext:
"Print out the C code to map argument values from the solution vector."
"Author: 25 Oct 89 sueb; Revised: 5 Feb 90 sueb (moved to this class from 'SimulatorModelDefinition');
Revised: 15 Aug 90 graemeb"

```
| nonLinearArguments mapIns limitedArgumentNames argument |
nonLinearArguments ← context nonLinearArguments.
mapIns ← mapManager mapInsDictionary.
1 to: nonLinearArguments size do:
    [: i |
    argument ← nonLinearArguments at: i.
    (mapIns at: argument) printCCodeOn: aStream
                            argumentName: (nonLinearArguments at: i)
                            argumentIndex: i level: level].
aStream cr
```

"* 16 Aug 90 9:40 am graemeb *"

printNewFunctionsOn: aStream inContext: modelContext    printNewFunctionsOn:inContext:
"Print out a set of new functions for an MDS model in tekspice2 format."
"Author: 24 Aug 90 graemeb"

aStream cr; nextPutAll:

'circuitPrimitive *
Allocate←', name, ' (paramPtrs, templatePadArray)
double **paramPtrs;
struct node **templatePadArray;
{
    struct ', name, 'ElementInstance *←element;

```
    struct node **templatePad;    /* walks down pads array in template
                                   * structure */
    double **param;                /* walks down paramPtrs structure */

←element = MALLOC (struct ', name, 'ElementInstance);
    ASSERT (←element != NULL);
    ←element→next = NULL;
    /*
     * copy the solution vector offset for each pad on the element
     * template into the element instance''s pad variables
     */
    templatePad = templatePadArray;
    param = paramPtrs;

self padNames do: [:pad | aStream tab; nextPutAll: (ModelCodeGenContext offsetNameFor: pad);
nextPutAll: ' = (*templatePad++)→number;'; cr].
    self parameterNames do: [:par | aStream tab; nextPutAll: '&', par, ' = *param++;'; cr].

aStream cr; nextPutAll:
'    return ((circuitPrimitive *) ←element);
} int
Mappings←', name, ' (←loader, ←circuit)
elementLoader *←loader;
circuitData *←circuit;

{
    struct ', name, 'ElementInstance *←element = (struct ', name, 'ElementInstance *) ←loader→elements;
    int ←equationCounter = ←circuit→num←Equations;
    char *←matrix = ←circuit→solution.matrix; /* used by the ALLOCATE macros */ modelContext addTransientOperatorCounterDeclarationsTo: aStream.
    aStream nextPutAll: '/* Loop through all element instances. */
    while (←element != NULL) {

(modelContext presetVariables keys intersection: modelContext permanentVariableNames keys)
        do: [:var |
            aStream nextPutAll: '&', var, ' = LookupAddress("', var, '",←circuit);'; cr].
    self printAlFunctionCallOn: aStream inContext: modelContext level: 2.
    mapManager addMappingsOn: aStream inContext: modelContext.
    modelContext addTransientOperatorCounterUpdatesTo: aStream.
    modelContext addMatrixAllocationTo: aStream.
    modelContext addInitializationForSourcesTo: aStream.

aStream nextPutAll: '    ←element = ←element→next;
    }   /* End of loop through all element instances. */
    ←circuit→num←Equations = ←equationCounter;

modelContext addTransientOperatorCounterStoresTo: aStream.
    aStream nextPutAll: '
} int
PrintElementInstances←', name, ' ()
{
} int
PrintElementInstance←', name, ' ()
{
}

';  cr.
    aStream cr; nextPutAll:

'int
SaveZeroArgumentResults←', name, ' (←loader)
``` elementLoader *←loader;

```
    modelContext hasNonzeroZeroArgumentResults
        ifFalse:
            [aStream    nextPutAll: '{
}']
        ifTrue:
            [aStream cr; nextPutAll: '
{
struct ', name, 'ElementInstance *←element = (struct ', name, 'ElementInstance *) ←loader→elements;

/* Loop through all element instances. */
while (←element != NULL) { modelContext addReInitializationForSourcesTo: aStream.
    aStream nextPutAll: '    ←element = ←element→next;
    }   /* End of loop through all element instances. */ aStream nextPutAll: '
}
']
```

"* 1 Sep 90 1:47 am graemeb *"

printOffElementMapOutsOn: aStream level: level inContext: context    printOffElementMapOutsOn:level:inContext:
"Print out C code for mapOuts that will scale results if the element is off."
"Author: 14 Mar 90 sueb"

```
| onMoCode offMoCode |
onMoCode ← mapManager generateCodeForMapOutsInContext: context.
offMoCode ← context codeFor: #dcMapOut.

aStream crtab: level; nextPutAll: '/* Scale results if element is off */'.
aStream crtab: level; nextPutAll: 'if (STATE == OFF) {'.
offMoCode printCodeOn: aStream level: level + 1.
aStream crtab: level; nextPutAll: '}'.
aStream crtab: level; nextPutAll: 'else {'.
onMoCode printCodeOn: aStream level: level + 1.
aStream crtab: level; nextPutAll: '}'
```

"* 17 Aug 90 1:56 pm graemeb *"

printOutputArraysOn: aStream    printOutputArraysOn:
"Print out the arrays containing data needed for the output maps stored in the model and used by the loader."
"Author: 13 Jun 90 sueb"

```
| arrayReferences outputNames outputData allOutputs analysisData analysisMap index size analysisName
arrayRefsForEachAnalysis outputNamesForEachAnalysis opNames |
    arrayReferences ← OrderedCollection newForAddLast.
    outputNames ← OrderedCollection newForAddLast.
    outputData ← self allOutputs.
    arrayRefsForEachAnalysis ← outputData value.
    outputNamesForEachAnalysis ← outputData key. self halt.
    allOutputs ← OrderedCollection newForAddLast.

BackendCodeManager analysisNameMap do:
        [: analysis |
            analysisMap ← arrayRefsForEachAnalysis at: analysis.
            analysisData ← OrderedCollection newForAddLast: 4.
            analysisData add: analysis asString.
            analysisData add: analysisMap size.
            (index ← arrayReferences indexOfSubCollection: analysisMap startingAt: 1) = 0
                ifTrue:
                    [index ←arrayReferences size + 1.
```

```
                analysisMap do: [:arrayRef | arrayReferences add: arrayRef]].
        analysisData add: index.

opNames ← outputNamesForEachAnalysis at: analysis.
        (index ← outputNames indexOfSubCollection: opNames startingAt: 1) = 0
            ifTrue:
                [index ←outputNames size + 1.
                opNames do: [:opName | outputNames add: opName]].
        analysisData add: index.
        allOutputs add: analysisData].

arrayReferences isEmpty
    ifFalse:
        [aStream cr; nextPutAll: 'static arrayReference locations [] = {'.
        arrayReferences do:
            [:arrayRef | aStream crtab;    nextPutAll: (arrayRef array - 1) printString, ', ', (arrayRef
index - 1) printString]
            andBetweenDo:
                [aStream nextPutAll: ', '].
        aStream cr; nextPutAll: '};'; cr].

outputNames isEmpty
    ifFalse:
        [aStream cr; nextPutAll: 'static char *outputNames [] = {'.
        outputNames do:
            [:opName | aStream crtab;    nextPut: $"; nextPutAll: opName; nextPut: $"]
            andBetweenDo:
                [aStream nextPutAll: ', '].
        aStream cr; nextPutAll: '};'; cr].

aStream cr; nextPutAll: 'static outputMapType analysisOutputs [] = {'.
allOutputs do:
    [:collection |
        analysisName ← collection at: 1.
        size ← collection at: 2.
        aStream crtab;   nextPutAll: size printString, ', '.
        size = 0
            ifTrue: [aStream nextPutAll: 'NULL, NULL']
            ifFalse:
                [aStream nextPutAll: '&locations[', ((collection at: 3) - 1) printString, '], '.
                aStream nextPutAll: '&outputNames[', ((collection at: 4) - 1) printString, ']']]
    andBetweenDo:
        [aStream nextPutAll: ', '; tab; nextPutAll: '/* ', analysisName, ' */'].
aStream tab; nextPutAll: '/* ', analysisName, ' */'.
aStream cr; nextPutAll: '};'; cr.

"* 4 Sep 90 6:12 pm graemeb *"
``` printOutputArraysOn: aStream inContext: context                    printOutputArraysOn:inContext:
"Print out the arrays containing data needed for the output maps stored in the model and used by the
loader."
"Author: 13 Jun 90 sueb; Revised: 4 Sep 90 graemeb, add context parameter and convert to output index."

| outputNames outputData allOutputs analysisData analysisMap index size analysisName
outputNamesForEachAnalysis opNames |
    outputNames ← OrderedCollection newForAddLast.
    outputData ← self allOutputs.
    outputNamesForEachAnalysis ← outputData key.
    allOutputs ← OrderedCollection newForAddLast.

BackendCodeManager analysisNameMap do:
        [:analysis |
            opNames ← outputNamesForEachAnalysis at: analysis.
            analysisData ← OrderedCollection newForAddLast: 4.
            analysisData add: analysis asString.
            analysisData add: opNames size.
            (index ← outputNames indexOfSubCollection: opNames startingAt: 1) = 0
                ifTrue:

```
                [index ←outputNames size + 1.
                    opNames do: [: opName | outputNames add: opName]].
            analysisData add: index.
            allOutputs add: analysisData].

outputNames isEmpty
        ifFalse:
            [aStream cr; nextPutAll: 'static int locations [] = {'.
            outputNames do:
                    [: opName | aStream crtab;   nextPutAll: (context indexForOutput: opName) printString]
                andBetweenDo:
                    [aStream nextPutAll: ', '].
            aStream cr;  nextPutAll: '};'; cr].

outputNames isEmpty
        ifFalse:
            [aStream cr; nextPutAll: 'static char *outputNames [] = {'.
            outputNames do:
                    [: opName | aStream crtab;   nextPut: $"; nextPutAll: opName; nextPut: $"]
                andBetweenDo:
                    [aStream nextPutAll: ', '].
            aStream cr;  nextPutAll: '};'; cr].

aStream cr;  nextPutAll: 'static outputIndexNames analysisOutputs [] = {'.
    allOutputs do:
        [: collection |
            analysisName ← collection at: 1.
            size ← collection at: 2.
            aStream crtab;   nextPutAll: size printString, ', '.
            size = 0
                ifTrue: [aStream nextPutAll: 'NULL, NULL']
                ifFalse:
                    [aStream nextPutAll: '&locations[', ((collection at: 3) - 1) printString, '], '.
                    aStream nextPutAll: '&outputNames[', ((collection at: 3) - 1) printString, ']']]
        andBetweenDo:
            [aStream nextPutAll: ', '; tab; nextPutAll: '/* ', analysisName, ' */'].
    aStream tab; nextPutAll: '/* ', analysisName, ' */'.
    aStream cr;  nextPutAll: '};'; cr.

"* 6 Sep 90 4:53 pm graemeb *"

printParameterDefaultsFor: paramNames on: aStream                               printParameterDefaultsFor:on:
    "Generate a C-code function to initialize the parameters for this model for the backend simulator."
    "Author: 26 May 89 sueb; Revised: 27 Nov 89 sueb (add comments with parameter names); Revised: 5
Feb 90 sueb (moved to this class from 'SimulatorModelDefinition'); Revised: 4 May 90 graemeb ; Revised: 13
Jun 90 sueb (renamed, changed name of array to be consistent with other arrays used in the model file)"

| pSize inputParameters |
    inputParameters ← variables parameterValues.
    inputParameters isEmpty
        ifTrue: [↑self].

pSize ← inputParameters size.
    aStream cr.
    aStream nextPutAll:
'static
double parameterDefaults [] = {'; crtab.
    1 to: pSize - 1 do:
        [: i |
            aStream crtab.
            aStream nextPutAll: (inputParameters at: i) asSimulatorString;
                nextPut: $,;
                tab;
                nextPutAll: '/* ', (paramNames at: i), ' */'].
    pSize > 0
        ifTrue:
            [aStream   crtab;
                nextPutAll: (inputParameters at: pSize) asSimulatorString;
```

```
                    tab;
                    nextPutAll: '/* ', (paramNames at: pSize), ' */'].
        aStream nextPutAll: '
];
```

*"* 13 Jun 90 9:17 am sueb *"* printParameterNames: parameterNames on: aStream                                    printParameterNames:on:
"*Print out the declaration for the static array of parameter names in the C model code.*"
"*Author: 11 Jun 90 sueb*"

```
parameterNames isEmpty
    ifFalse:
        [aStream cr; nextPutAll: 'static char *parameterNames [] = {'.
        parameterNames do:
                [:pName | aStream crtab; nextPutAll: '"', pName, '"']
            andBetweenDo:
                [aStream nextPutAll: ', '].
        aStream cr; nextPutAll: '};'; cr].
```

*"* 11 Jun 90 3:46 pm sueb *"* printTemporaryDeclarations:on:inContext:
printTemporaryDeclarations: temporaryVariables on: aStream inContext: context
"*Print the temporary variable declarations needed.*"
"*Author: 4 Sep 90 graemeb*"

```
| variableType |
temporaryVariables do:
    [: var |
    (context containsPermanentVariable: var)
        ifFalse:
            [((var at: 1)  = $←
            and: [(var at: 2) = $I])
                ifTrue: [variableType ← 'int ']
                ifFalse: [variableType ← 'double '].
            aStream crtab: 1; nextPutAll: variableType; nextPutAll: var; nextPut: $;]].
aStream crtab.
```

*"* 4 Sep 90 11:39 pm graemeb *"* printTransientCodeOn: aStream inContext: context                                   printTransientCodeOn:inContext:
"*Print out C code that will execute the receiver's 'transient code'.*"
"*Author: 4 Apr 90 sueb; Revised: 15 Aug 90 graemeb*"

```
| temporaryVariables tranCode |
tranCode ← context codeFor: #transientArgumentDependent.

tranCode isEmpty
    ifFalse: [temporaryVariables ← tranCode temporaryVariables asSortedCollection].

aStream cr; nextPutAll: '/* Run the transient code for one element */'.
aStream cr.
aStream nextPutAll: 'int'; cr;
        nextPutAll: 'TR←';
        nextPutAll: name;
        nextPutAll: '(←element, ←circuit)
struct ';
        nextPutAll: name;
        nextPutAll: 'ElementInstance *←element;
circuitData *←circuit;
{
,
```

```
    tranCode isEmpty
        ifTrue:
            • [aStream crtab: 1;    nextPutAll: 'return(OKAY);']
        ifFalse:
            [temporaryVariables do:
                [: var |
                    (context containsPermanentVariable: var)
                        ifFalse:
                            [(((var at: 1) = $←   and: [(var at: 2) = $I])
                                ifTrue:
                                    [aStream crtab: 1; nextPutAll: 'int '; nextPutAll: var; nextPut: $;]
                                ifFalse:
                                    [aStream crtab: 1; nextPutAll: 'double '; nextPutAll: var; nextPut: $;]]].

context addTransientOperatorTableDeclarationsTo: aStream.

tranCode printCodeOn: aStream level: 1.
            aStream cr].
    aStream nextPutAll: '
}
'
```

"* 30 Aug 90 5:16 pm graemeb *"

printTransientFunctionCallOn:inContext:level:
printTransientFunctionCallOn: aStream inContext: context level: level
"Print out C code to call the TR function for this model."
"Author: 5 Apr 90 sueb; Revised: 17 Aug 90 graemeb"

```
| trCode |
trCode ← context codeFor: #transientArgumentDependent.
(trCode isNil or: [trCode isEmpty])
    ifTrue:
        [aStream crtab: level; nextPutAll: '/* (no transient code for this model) */';   cr]
    ifFalse:
        [aStream crtab: level; nextPutAll: '/* Run the transient code */'.
         aStream crtab: level; nextPutAll: 'TR←', name, '(←element, ←circuit);'.
         aStream cr]
```

"* 17 Aug 90 11:55 am graemeb *"

printTransientLoadersOn:inContext:
printTransientLoadersOn: aStream inContext: modelContext
"Print out a set of transient loaders for an MDS model in tekspice2 format."
"Author: 3 Apr 90 sueb ; Revised: 1 May 90 sueb (generate argument-independent block from transient code)"

```
Processor yield.
modelContext analysisMode: #transient.

self printArgumentIndependentCodeOn: aStream inContext: modelContext.
Processor yield.
self printResetArgumentsOn: aStream inContext: modelContext.
(modelContext codeFor: #transientArgumentDependent) isEmpty
    ifTrue:
        • [aStream cr; nextPutAll: '/* No transient code for this model */';cr]
    ifFalse:
        [self printTransientCodeOn: aStream inContext: modelContext].

Processor yield.
self printTransientInitializingLoaderOn: aStream inContext: modelContext.
Processor yield.
self printTransientPredictedSolutionVectorLoaderOn: aStream inContext: modelContext.
Processor yield.
self printTransientNonBypassingLoaderOn: aStream inContext: modelContext.
Processor yield.
```

. self printTransientOutputLoaderOn: aStream inContext: modelContext.
Processor yield.
self saveMacroNamesUsing: modelContext "* 17 Aug 90 2:15 pm graemeb *"

APPENDIX J

*From Tektronix Smalltalk-80 version TB2.2.2a of May 05, 1988, 18:14:03. on 2 October 1990 at 1:51:03 pm*
*ADS version: ADS.2c3aTEK.007.LBa6.020*

──────────────── AssignmentNodeWithRangeChecking ──────────────── code for backend simulator                                         *AssignmentNodeWithRangeChecking* generateCodeInContext: aContext                                              generateCodeInContext:
"Generate and answer code for this node. The code can print itself out in forms for incorporation in simulators."
"Arguments:
    aContext - <ModelCodeGenContext>"
"Author: 8 Dec 89 graemeb ; Revised: 24 Jan 90 sueb (use TspiceCodeGenAssignmentNodeWithRange)"

| node var condition action |
node ← TspiceCodeGenAssignmentNodeWithRange new.
node assignmentStatement: (super generateCodeInContext: aContext).
var ← self variable execute: aContext.
condition ← range generateCodeForWithinRange: var inContext: aContext.
action ← TspiceCodeGenBlockNode new initialize addStatement: (TspiceCodeGenFunctionNode new function: #ValueOutOfRange argumentNodes: (Array with: var functionValue)).
node range: (TspiceCodeGenConditionalNode new boolean: condition not then: action else: nil).
↑node "* 24 Jan 90 9:42 am sueb *"

──────────────── MappingManagerRel ──────────────── model code                                                                        *MappingManagerRel* generateCodeInContext: aContext                                              generateCodeInContext:
"Answer a TspiceCodeGenBlockNode representing the code for the output mapping operation."
"Arguments:
    aContext - <ModelCodeGenContext>"
"Author: 12 Mar 90 sueb"

(aContext hasNonzeroZeroArgumentResults or: [aContext primitiveModel hasState not])
    ifTrue: [↑self generateCodeWithSourceSteppingInContext: aContext]
    ifFalse: [↑self generateCodeForOffElementInContext: aContext]

"* 10 Aug 90 2:01 pm graemeb *"

──────────────── SpecialTspiceModelFunctionNode ──────────────── executing                                                                         *SpecialTspiceModelFunctionNode* generateCodeInContext: aContext                                              generateCodeInContext:
"Generate code for the special function instance. ***Note: don't execute arguments here. Leave this to the function instance."

"Arguments:
    aContext - <ModelCodeGenContext>"
"Author: 11 May 1989 graemeb"

↑(aContext functionInstanceAt: index) generateCodeWithArguments: arguments inContext: aContext ——————————————— TspiceConditionalNode ———————————————

*TspiceConditionalNode* code for backend simulator generateCodeInContext: aContext                                                                                 generateCodeInContext:
    "*Generate code for the conditional node ('if () then {}' or 'if () then {} else {}' statement). The active derivatives at the conclusion of this statement are the 'or' of those from the 'then' and 'else' blocks. Note that zero assignments to derivatives are generated for each derivative active at the end of one block but not the other.*"
    "*Author: 3 May 1989 graemeb; Revised: 21 Sep 90 graemeb, disable temp generation for 'if condition'.*"

| condition then else thenNode initialDerivatives newValue elseNode finalDerivatives assignedVariableArrayReferences arrayReference |
        "*Generate the 'condition' code.*"
        aContext clearTemporaryGeneration.
        condition ← boolean generateCodeInContext: aContext.
        aContext setTemporaryGeneration.

"*Save the initial active derivatives of vars assigned to in the 'if' statement.*"
        assignedVariableArrayReferences ← thenValue assignedVariableArrayReferences.
        elseValue notNil
            ifTrue: [assignedVariableArrayReferences addAll: elseValue assignedVariableArrayReferences].
        then ← Dictionary new.
        assignedVariableArrayReferences do:
            [: arrayReferenceArg |
                then at: arrayReferenceArg put: ((aContext valueFromArrayReference: arrayReferenceArg) asCodeGenFAndGradFWithContext: aContext) activeDerivatives].

else ← then deepCopy.

"*Generate the 'then' code.*"
        thenNode ← thenValue generateCodeInContext: aContext.

"*Save the new active derivatives of vars assigned to in 'then' block. Reset the active derivatives in the context to their initial values.*"
        then associationsDo: [: association |
            arrayReference ← association key.
            initialDerivatives ← association value.
            newValue ← ((aContext valueFromArrayReference: arrayReference) asCodeGenFAndGradFWithContext: aContext).
            association value: newValue activeDerivatives.
            aContext storeValue: (newValue setActiveDerivativesTo: initialDerivatives) inArrayReference: arrayReference].

"*Generate the 'else' code.*"
        "*Save the new active derivatives of vars assigned to in 'else' block.*"
        "*Reset the active derivatives in the context to their initial values.*"
        elseValue notNil
            ifTrue: [elseNode ← elseValue generateCodeInContext: aContext.
                else associationsDo: [: association |
                    arrayReference ← association key.
                    initialDerivatives ← association value.
                    newValue ← ((aContext valueFromArrayReference: arrayReference) asCodeGenFAndGradFWithContext: aContext).
                    association value: newValue activeDerivatives.
                    aContext storeValue: (newValue setActiveDerivativesTo: initialDerivatives) inArrayReference: arrayReference].
            ]
            ifFalse: [elseNode ← TspiceCodeGenBlockNode new initialize "*Generate an 'else' block in case needed for derivative initialization.*"].

*"Generate derivative initialization assignments where needed."*
self initializeDerivativesIn: elseNode usingDerivatives: then and: else andContext: aContext.
self initializeDerivativesIn: thenNode usingDerivatives: else and: then andContext: aContext.

*"Finally, install the active-derivative masks into the assigned variables in the context."*
then associationsDo: [: association |
    arrayReference ← association key.
    finalDerivatives ← (else at: arrayReference) bitOr: association value.
    newValue ← aContext valueFromArrayReference: arrayReference.
    aContext storeValue: (newValue setActiveDerivativesTo: finalDerivatives) inArrayReference:
arrayReference*"Reset the active derivatives in context."*].
elseNode isEmpty ifTrue: [elseNode ← nil].

*"Answer the generated conditional node."*
↑TspiceCodeGenConditionalNode new boolean: condition then: thenNode else: elseNode

*"* 21 Sep 90 12:15 pm graemeb *"*

---

———————————— TspiceModelAssignmentNode ————————————

*TspiceModelAssignmentNode*
code for backend simulator generateCodeInContext: aContext    *generateCodeInContext:*
    *"Generate and answer code for this node. The code can print itself out in forms for incorporation in simulators."*
    *"Arguments:*
        *aContext - <ModelCodeGenContext>"*
    *"Author: 11 May 1989 graemeb"*

| cGValue |
aContext resetLocalAssignments.

cGValue ← value generateCodeInContext: aContext.
cGValue addVarDeclarationsFor: variable name toContext: aContext.
↑variable codeGenStore: cGValue in: aContext

---

———————————— TspiceModelBinaryNode ————————————

*TspiceModelBinaryNode*
code for backend simulator generateCodeInContext: aContext    *generateCodeInContext:*
    *"Generate and answer code for this node. The code can print itself out in forms for incorporation in simulators."*
    *"Arguments:*
        *aContext - <ModelCodeGenContext>"*
    *"Author: 11 May 1989 graemeb"*

↑(preValue generateCodeInContext: aContext)
    perform: key with: (postValue generateCodeInContext: aContext)

---

———————————— TspiceModelBlockNode ————————————

*TspiceModelBlockNode*
code for backend simulator generateCodeInContext: aContext    *generateCodeInContext:*
    *"Generate and answer code for this node. The code can print itself out in forms for incorporation in simulators."*
    *"Arguments:*
        *aContext - <ModelCodeGenContext>"*
    *"Author: 11 May 1989 graemeb; Revised: 24 Oct 89 sueb ('temporary assignment' statements are not separate statements)"*

```
| codeGenNode codeGenStatement |
codeGenNode ← TspiceCodeGenBlockNode new initialize.
statements do:
    [: statement |
        codeGenStatement ← statement generateCodeInContext: aContext.
        codeGenStatement notNil "Update without limiting maps to nil."
            ifTrue: [
                codeGenStatement isAssignment
                    ifTrue: [aContext addTemporaryAssignmentStatementsTo: codeGenNode].
                codeGenStatement addStatementTo: codeGenNode inContext: aContext]].
codeGenNode temporaryVariables: aContext varDeclarations copy.
↑codeGenNode "* 26 Feb 90 2:27 pm sueb *"
```

---
_____ TspiceModelFunctionNode _____

*TspiceModelFunctionNode* code for backend simulator generateCodeInContext: aContext                                    generateCodeInContext:
   *"Generate and answer code for this node. The code can print itself out in forms for incorporation in simulators."*
   *"Arguments:*
       *aContext - <ModelCodeGenContext>"*
   *"Author: 11 May 1989 graemeb; Modified: 30 May 89 sueb"*

```
| argVals firstArg |
argVals ← Array new: arguments size.
1 to: arguments size do:
    [: i | argVals at: i put: ((arguments at: i)   generateCodeInContext: aContext)].
firstArg ← argVals at: 1.
arguments size = 1
    ifTrue: [↑firstArg perform: key].
↑firstArg perform: key with: argVals
```

---
_____ TspiceModelLiteralNode _____

*TspiceModelLiteralNode* code for backend simulator generateCodeInContext: aContext                                    generateCodeInContext:
   *"Generate and answer code for this node. The code can print itself out in forms for incorporation in simulators."*
   *"Arguments:*
       *aContext - <ModelCodeGenContext>"*
   *"Author: 11 May 1989 graemeb"*

↑key asCodeGenFAndGradFWithContext: aContext

---
_____ TspiceModelUnaryNode _____

*TspiceModelUnaryNode* code for backend simulator generateCodeInContext: aContext                                    generateCodeInContext:
   *"Generate and answer code for this node. The code can print itself out in forms for incorporation in simulators."*
   *"Arguments:*
       *aContext - <ModelCodeGenContext>"*
   *"Author: 11 May 1989 graemeb"*

```
key == #changeSign
    ifTrue: [↑(value generateCodeInContext: aContext) negated].
```

```
key == #reciprocal
    ifTrue: [↑(value generateCodeInContext: aContext) reciprocal].
key == #!
    ifTrue: [↑(value generateCodeInContext: aContext) logicalNot].

key == #exp
    ifTrue: [↑(value generateCodeInContext: aContext) exp].
↑value generateCodeInContext: aContext
```

---

TspiceModelVariableNode

*TspiceModelVariableNode* code for backend simulator generateCodeInContext: aContext                                                 generateCodeInContext:
  *"Generate and answer code for this node. The code can print itself out in forms for incorporation in simulators."*
  *"Arguments:*
        *aContext - <ModelCodeGenContext>"*
  *"Author: 11 May 1989 graemeb; Revised: 24 Sep 90 graemeb, remove conversion upon access."*

↑self execute: aContext

*"* 24 Sep 90 11:52 am graemeb *"*

---

TspiceWhileNode

*TspiceWhileNode* code for backend simulator generateCodeInContext: aContext                                                 generateCodeInContext:
  *"Generate and answer code for this node. The code can print itself out in forms for incorporation in simulators."*
  *"Arguments:*
        *aContext - <ModelCodeGenContext>"*
  *"Author: 11 May 1989 graemeb"*

| condition initial main preInits model zero initialDerivatives newValue derivativesNeedingInitialization name arrayReference |

*"Generate the 'condition' code."*
condition ← boolean generateCodeInContext: aContext.

initial ← Dictionary new.

*"Save the initial active derivatives of vars assigned to in 'main' block."*
statements assignedVariableArrayReferences do:
    [: arrayReferenceArg |
        initial at: arrayReferenceArg put: ((aContext valueFromArrayReference: arrayReferenceArg)
 asCodeGenFAndGradFWithContext: aContext) activeDerivatives].

*"Generate the 'main' code for the first time to activate derivatives and discard the code."*
statements generateCodeInContext: aContext.
main ← statements generateCodeInContext: aContext.

*"Save the new active derivatives of vars assigned to in 'main' block. Reset the active derivatives in the context to their initial values."*
    preInits ← TspiceCodeGenCompoundNode new initialize.
    model ← aContext primitiveModel.
    zero ← 0.0d0 asCodeGenFAndGradFWithContext: aContext.
    initial associationsDo: [: association |
        arrayReference ← association key.
        initialDerivatives ← association value.
        newValue ← ((aContext valueFromArrayReference: arrayReference)
 asCodeGenFAndGradFWithContext: aContext).
        association value: newValue activeDerivatives.

*"Pre initialization."*
    derivativesNeedingInitialization ← newValue activeDerivatives bitAnd: initialDerivatives bitInvert.
    name ← model nameFromArrayReference: arrayReference.
    1 to: newValue size do:
        [:i | ((derivativesNeedingInitialization bitShift: 1 - i)    bitAnd: 1)  ~= 0
            ifTrue: [preInits addStatement: (TspiceCodeGenAssignmentNode new name: name , '←' ,
(model argumentNames at: i) value: zero)]].

*"Post initialization."*
    derivativesNeedingInitialization ← initialDerivatives bitAnd: newValue activeDerivatives bitInvert.
    name ← model nameFromArrayReference: arrayReference.
    1 to: newValue size do:
        [:i | ((derivativesNeedingInitialization bitShift: 1 - i)    bitAnd: 1)  ~= 0
            ifTrue: [main addStatement: (TspiceCodeGenAssignmentNode new name: name , '←' ,
(model argumentNames at: i) value: zero)]].

aContext storeValue: (newValue setActiveDerivativesTo: initialDerivatives) inArrayReference: arrayReference].

↑TspiceCodeGenWhileNode new initialAssignments: preInits condition: condition statements: main "* 29 Nov 89 3:43 pm ballard *"

APPENDIX K

*From Tektronix Smalltalk-80 version TB2.2.2a of May 05, 1988, 18:14:03. on 4 October 1990 at 5:01:25 pm*
*ADS version: ADS.2c3aTEK.007.LBa6.020*

_____ TspiceModelVariableNode _____

*TspiceModelVariableNode* code for backend simulator codeGenStore: aValue in: aContext                                           codeGenStore:in:
        *"Store aValue in the receiver's array location."*
        *"Arguments:*
            *aValue   - <CodeGenFAndGradF>*
            *aContext  - <ModelCodeGenContext>"*
        *"Author: 11 May 1989 graemeb"* aContext    storeValue: (aValue asCodeGenFAndGradFWithName: name andContext: aContext)
            inArray: arrayReference array
            atIndex: arrayReference index.
        ↑TspiceCodeGenAssignmentNode new name: name value: aValue

APPENDIX L

*From Tektronix Smalltalk-80 version TB2.2.2a of May 05, 1988, 18:14:03. on 4 October 1990 at 5:04:48 pm*
*ADS version: ADS.2c3aTEK.007.LBa6.020*

_____ TspiceCodeGenAssignmentNode _____

*TspiceCodeGenAssignmentNode* accessing addStatementTo: codeGenNode inContext: context  addStatementTo:inContext:
"Add assignment statements representing the receiver and each of its active derivatives to the code block 'codeGenNode'."
"Author: 17 Nov 89 sueb"

| gradientName gradientValue fAndGradFValue |
fAndGradFValue ← value.
value ← value functionValue.
codeGenNode addStatement: self.

NOTE 12
```
1 to: fAndGradFValue size do:
    [: i | (fAndGradFValue derivativeActiveFor: i)
        ifTrue:
            [gradientName ← name, '←', (fAndGradFValue context argumentNames at: i).
            gradientValue ← fAndGradFValue derivativeAt: i.
            codeGenNode addStatement: (TspiceCodeGenAssignmentNode new name: gradientName value: gradientValue)]]
```

"* 7 Aug 90 12:31 pm graemeb *"

APPENDIX M

*From Tektronix Smalltalk-80 version TB2.2.2a of May 05, 1988, 18:14:03. on 2 October 1990 at 5:31:41 pm*
*ADS version: ADS.2c3aTEK.007.LBa6.020*

──────────────── TspiceCodeGenValueNode ────────────────

TspiceCodeGenNode subclass: #TspiceCodeGenValueNode    *TspiceCodeGenValueNode*
   instanceVariableNames: "
   classVariableNames: "
   poolDictionaries: "
   category: 'Tspice-MDS-To-C'
TspiceCodeGenValueNode comment:
'This class is an abstract super class for all code-generation nodes that return a value.
Author: 9 May 1989 graemeb' testing gt: aCodeGenNode    gt:
    "Answer false since no ordering is yet defined for expressions."
    "Author: 17 May 1989 graemeb"

↑false isExpression    isExpression
    "Answer true since all nodes except literals and variables represent expressions."
    "Author: 9 May 1989 graemeb"

↑true isLiteral    isLiteral
    "Answer false since no nodes are literals except the literal node."
    "Author: 10 May 1989 graemeb"

↑false isOne    isOne
    "Answer false since no nodes can be constant one except the literal node."
    "Author: 10 May 1989 graemeb"

↑false isOnePointFive    isOnePointFive
    "Answer false since no nodes can be constant one except the literal node."

"*Author: 21 Sep 90 graemeb*"

↑false

"* 21 Sep 90 11:48 am graemeb *"

isTwo                                                                                                           isTwo
    "*Answer false since no nodes can be constant one except the literal node.*"
    "*Author: 21 Sep 90 graemeb*"

↑false

"* 21 Sep 90 11:48 am graemeb *"

isZero                                                                                                          isZero
    "*Answer false since no nodes can be constant zero except the literal node.*"
    "*Author: 10 May 1989 graemeb*"

↑false controlling iftrue: trueValue iffalse: falseValue                                                                       iftrue:iffalse:
        "*Answer a code-generation value node with value of an inline 'if then else' statement.*"
        "*Arguments:
            trueValue    -    <code-generation value node>
            falseValue   -    <code-generation value node>*"
        "*Author: 4 May 1989 graemeb*"

↑self preferredInlineConditionalNode new boolean: self
            then: trueValue
            else: falseValue logical unary not                                                                                                         not
        "*Answer a new code-generation node to represent the result of this operation. Perform local optimization where possible.*"
        "*Author: 10 May 1989 graemeb*"

↑self preferredUnaryNode new operator: #! node: self logical binary

& aCGN                                                                                                      &
        "*Answer a new code-generation node to represent the result of this operation. Perform local optimization where possible.*"
        "*Arguments:
            aCGN - <code-generation node>*"
        "*Author: 10 May 1989 graemeb*"

↑self preferredBinaryNode new preNode: self operator: #& postNode: aCGN

| aCGN                                                                                                      |
        "*Answer a new code-generation node to represent the result of this operation. Perform local optimization where possible.*"
        "*Arguments:
            aCGN - <code-generation node>*"
        "*Author: 10 May 1989 graemeb*"

↑self preferredBinaryNode new preNode: self operator: #| postNode: aCGN arithmetic binary

* aCGN
        "*Answer a new code-generation node to represent the result of this*"

operation. Perform local optimization where possible."
"Arguments: aCGN - <code-generation node>"
"Author: 13 Aug 90 kurtk, uses product node"

| newNode |
aCGN isZero ifTrue: [↑aCGN].
newNode ← TspiceCodeGenProductNode new term: self operator: #*.
↑newNode addTerm: aCGN operator: #*

"* 5 Sep 90 12:25 pm kurtk *"

+ aCGN
"Answer a new code-generation node to represent the result of this
operation. Perform local optimization where possible."
"Arguments: aCGN - <code-generation node>"
"Author: 13 Aug 90 kurtk, uses summation node"

| newNode |
aCGN isZero ifTrue: [↑self].
newNode ← TspiceCodeGenSummationNode new term: self operator: #+.
↑newNode addTerm: aCGN operator: #+

"* 5 Sep 90 10:37 am kurtk *"

- aCGN
"Answer a new code-generation node to represent the result of this
operation. Perform local optimization where possible."
"Arguments: aCGN - <code-generation node>"
"Author: 13 Aug 90 kurtk, uses summation node; Revised: 19 Sep 90 graemeb, may not return node created here if merge done."

| newNode |
aCGN isZero ifTrue: [↑self].
newNode ← TspiceCodeGenSummationNode new term: self operator: #+.
↑newNode addTerm: aCGN operator: #-

"* 19 Sep 90 5:40 pm graemeb *"

/ aCGN
"Answer a new code-generation node to represent the result of this operation. Perform local optimization where possible."
"Arguments:
    aCGN - <code-generation node>"
"Author: 17 Aug 90 kurtk"

| new |
aCGN isZero
    ifTrue: [self userError: 'Division by zero'].
aCGN isOne
    ifTrue: [↑self].
new ← TspiceCodeGenProductNode new term: self operator: #*.
↑new addTerm: aCGN operator: #/

"* 5 Sep 90 8:42 am kurtk *"

protectedRaisedTo: aCGN
"Answer a new code-generation node to represent the result of this operation where it is known that self > 0. Perform local optimization where possible."
"Arguments:
    aCGN - <code-generation node>"
"Author: 7 Sep 90 graemeb"

aCGN isOne
    ifTrue: [↑self].
aCGN isZero ifTrue: [↑TspiceCodeGenLiteralNode one].
    ↑(aCGN * self ln) exp "* 7 Sep 90 7:47 pm graemeb *"

protectedRaisedTo: aCGN usingContext: context                    protectedRaisedTo:usingContext:
    "Answer a new code-generation node to represent the result of this operation where it is known that self >
0. Perform local optimization where possible."
    "Arguments:
        aCGN - <code-generation node>
        context - <ModelCodeGenContext>"
    "Author: 7 Sep 90 graemeb"

| result |
    (result ← self raisedToSpecialCases: aCGN usingContext: context) notNil ifTrue: [↑result].
    ↑(aCGN * self ln) exp "* 21 Sep 90 3:34 pm graemeb *"

raisedTo: aCGN                                                                          raisedTo:
    "Answer a new code-generation node to represent the result of this operation. Perform local optimization
where possible."
    "Arguments:
        aCGN - <code-generation node>"
    "Author: 10 May 1989 graemeb; Revised: 23 Oct 89 sueb"

aCGN isOne
        ifTrue: [↑self].
    aCGN isZero
        ifTrue: [↑TspiceCodeGenLiteralNode one].
    ↑self preferredBinaryNode new    preNode: self
        operator: '↑' asSymbol
        postNode: aCGN raisedTo: aCGN usingContext: context                                   raisedTo:usingContext:
    "Answer a new code-generation node to represent the result of this operation. Perform local optimization
where possible."
    "Arguments:
        aCGN - <code-generation node>
        context - <ModelCodeGenContext>"
    "Author: 10 May 1989 graemeb; Revised: 23 Oct 89 sueb; Revised: 21 Sep 90 graemeb, added context
to allow temp generation."

| preOperandFunctionValue |
    aCGN isOne
        ifTrue: [↑self].
    aCGN isZero
        ifTrue: [↑TspiceCodeGenLiteralNode one].
    aCGN isTwo
        ifTrue: [preOperandFunctionValue ← context addTemporaryAssignment: self.
            ↑preOperandFunctionValue * preOperandFunctionValue].
    aCGN isOnePointFive
        ifTrue: [preOperandFunctionValue ← context addTemporaryAssignment: self.
            ↑preOperandFunctionValue * preOperandFunctionValue sqrt].
    ↑self preferredBinaryNode new    preNode: self
        operator: '↑' asSymbol
        postNode: aCGN "* 21 Sep 90 12:22 pm graemeb *"

raisedToSpecialCases: aCGN usingContext: context              raisedToSpecialCases:usingContext:
    "Answer a new code-generation node to represent the result of this operation if it is a special case, else
answer nil."
    "Arguments:
        aCGN - <code-generation node>
        context - <ModelCodeGenContext>"
    "Author: 21 Sep 90 graemeb"

```
| preOperandFunctionValue |
aCGN isOne
    ifTrue: [↑self].
aCGN isZero
    ifTrue: [↑TspiceCodeGenLiteralNode one].
aCGN isTwo
    ifTrue: [preOperandFunctionValue ← context addTemporaryAssignment: self.
            ↑preOperandFunctionValue * preOperandFunctionValue].
aCGN isOnePointFive
    ifTrue: [preOperandFunctionValue ← context addTemporaryAssignment: self.
            ↑preOperandFunctionValue * preOperandFunctionValue sqrt].
↑nil "* 21 Sep 90 12:31 pm graemeb *"
``` preferred preferredAssignmentNode          preferredAssignmentNode
   "*Answer the class of the node preferred for constructing an assignment statement.*"
   "*Author: 10 May 1989 graemeb*"

↑TspiceCodeGenAssignmentNode preferredBinaryNode          preferredBinaryNode
   "*Answer the class of the node preferred for constructing a binary expression.*"
   "*Author: 10 May 1989 graemeb*"

↑TspiceCodeGenBinaryNode preferredFunctionNode          preferredFunctionNode
   "*Answer the class of the node preferred for constructing a function expression.*"
   "*Author: 10 May 1989 graemeb*"

↑TspiceCodeGenFunctionNode preferredInlineConditionalNode          preferredInlineConditionalNode
   "*Answer the class of the node preferred for constructing an in-line 'if then else' expression.*"
   "*Author: 10 May 1989 graemeb*"

↑TspiceCodeGenInlineConditionalNode preferredLiteralNode          preferredLiteralNode
   "*Answer the class of the node preferred for constructing a literal constant.*"
   "*Author: 10 May 1989 graemeb*"

↑TspiceCodeGenLiteralNode preferredTempAssignmentNode          preferredTempAssignmentNode
   "*Answer the class of the node preferred for constructing an assignment statement for a generated temporary.*"
   "*Author: 10 May 1989 graemeb*"

↑TspiceCodeGenAssignmentNode preferredUnaryNode          preferredUnaryNode
   "*Answer the class of the node preferred for constructing a unary expression.*"
   "*Author: 10 May 1989 graemeb*"

↑TspiceCodeGenUnaryNode preferredVariableNode          preferredVariableNode
   "*Answer the class of the node preferred for constructing a variable.*"
   "*Author: 10 May 1989 graemeb*"

↑TspiceCodeGenVariableNode arithmetic unary negated                                                                                                        negated
"Answer a new code-generation node to represent the result of this operation. Perform local optimization where possible."
"Author: 10 May 1989 graemeb; Revised: 23 Oct 89 sueb"

↑self preferredUnaryNode new operator: #- node: self reciprocal                                                                                                    reciprocal
"Answer a new code-generation node to represent the result of this operation. Perform local optimization where possible."
"Author: 10 May 1989 graemeb; Revised: 23 Oct 89 sueb ; Revised: 22 Aug 90 kurtk"

↑↑TspiceCodeGenProductNode new term: self operator: #/

"* 22 Aug 90 11:36 am kurtk *"

arithmetic functions abs                                                                                                                    abs
"Answer a new code-generation node to represent the result of this operation. Perform local optimization where possible."
"Author: 10 May 1989 graemeb; Revised: 23 Oct 89 sueb"

↑self preferredFunctionNode new function: #abs argumentNodes: (Array with: self)

atan                                                                                                                  atan
"Answer a new code-generation node to represent the result of this operation. Perform local optimization where possible."
"Author: 10 May 1989 graemeb; Modified: 30 May 89 sueb; Revised: 23 Oct 89 sueb".

↑self preferredFunctionNode new function: #atan
                        argumentNodes:
                            (Array with: self)

"* 17 Aug 90 11:12 am erniem *"

bessel2Derivative: instanceIndex                                                    bessel2Derivative:
"Answer a new code-generation node to represent one of the derivatives of this operation. Perform local optimization where possible."
"Arguments:
    args - <Array> of code-generation nodes"
"Author: 4 Apr 90 sueb ; Revised: 30 Apr 90 sueb "

↑self preferredFunctionNode new function: #spiceBessel2Derivative argumentNodes: (Array with: self with: instanceIndex)

"* 30 Apr 90 9:01 am sueb *"

bessel2ForInstance: instanceIndex delay: newDelayArgument          bessel2ForInstance:delay:
"Answer a new code-generation node to represent the result of this operation. Perform local optimization where possible."
"Arguments:
    args - <Array> of code-generation nodes"
"Author: 4 Apr 90 sueb"

↑self preferredFunctionNode new function: #spiceBessel2 argumentNodes: (Array with: self with: instanceIndex with: newDelayArgument)

"* 24 Aug 90 10:00 am graemeb *"

cos                                                                                                                    cos
"Answer a new code-generation node to represent the result of this operation. Perform local optimization where possible."
"Author: 5 Mar 90 graemeb"

↑self preferredFunctionNode new function: #cos argumentNodes: (Array with: self)

"* 5 Mar 90 12:17 pm erniem *"

ddtDerivative                                                                                                                   ddtDerivative
"Answer a new code-generation node to represent one of the derivatives of this operation. Perform local optimization where possible."
"Arguments:
    args - <Array> of code-generation nodes"
"Author: 4 Apr 90 sueb"

↑self preferredFunctionNode new function: #ddtDerivative argumentNodes: (Array with: self)

"* 5 Apr 90 11:04 am sueb *"

ddtDerivativeOffset: offset                                                                   ddtDerivativeOffset:
"Answer a new code-generation node to represent one of the derivatives of this operation. Perform local optimization where possible."

↑self preferredFunctionNode new function: #ddtDerivative argumentNodes: (Array with: self with: offset)

"* 21 Aug 90 3:51 pm graemeb *"

ddtForInstance: instanceIndex                                                             ddtForInstance:
"Answer a new code-generation node to represent the result of this operation. Perform local optimization where possible."
"Arguments:
    args - <Array> of code-generation nodes"
"Author: 4 Apr 90 sueb"

↑self preferredFunctionNode new function: #ddt argumentNodes: (Array with: self with: instanceIndex)

"* 20 Aug 90 2:23 pm graemeb *"

ddtForInstance: instanceIndex offset: offset                                             ddtForInstance:offset:
"Answer a new code-generation node to represent the result of this operation. Perform local optimization where possible."

↑self preferredFunctionNode new function: #ddt argumentNodes: (Array with: self with: instanceIndex with: offset)

"* 21 Aug 90 3:52 pm graemeb *"

delayDerivative: instanceIndex                                                           delayDerivative:
"Answer a new code-generation node to represent one of the derivatives of this operation. Perform local optimization where possible."
"Arguments:
    args - <Array> of code-generation nodes"
"Author: 4 Apr 90 sueb ; Revised: 30 Apr 90 sueb "

↑self preferredFunctionNode new function: #delayDerivative argumentNodes: (Array with: self with: instanceIndex)

"* 30 Apr 90 9:01 am sueb *"

delayForInstance: instanceIndex delay: newDelayArgument                   delayForInstance:delay:
"Answer a new code-generation node to represent the result of this operation. Perform local optimization where possible."
"Arguments:
    args - <Array> of code-generation nodes"
"Author: 4 Apr 90 sueb"

↑self preferredFunctionNode new function: #delay argumentNodes: (Array with: self with: instanceIndex with: newDelayArgument)

"* 24 Aug 90 9:59 am graemeb *"

exp                                                                                                                                                                       exp
"Answer a new code-generation node to represent the result of this operation. Perform local optimization where possible."
"Author: 10 May 1989 graemeb; Revised: 23 Oct 89 sueb"

↑self preferredFunctionNode new function: #exp argumentNodes: (Array with: self)

integralDerivative                                                                                integralDerivative
"*Answer a new code-generation node to represent one of the derivatives of this operation. Perform local optimization where possible.*"
"*Arguments:
    args - <Array> of code-generation nodes*"
"*Author: 4 Apr 90 sueb*"

↑self preferredFunctionNode new function: #integralDerivative argumentNodes: (Array with: self)

"* 5 Apr 90 11:30 am sueb *"

integralDerivativeOffset: offset                                          integralDerivativeOffset:
"*Answer a new code-generation node to represent one of the derivatives of this operation. Perform local optimization where possible.*"

↑self preferredFunctionNode new function: #integralDerivative argumentNodes: (Array with: self with: offset)

"* 21 Aug 90 3:53 pm graemeb *"

integralForInstance: instanceIndex                                          integralForInstance:

"*Answer a new code-generation node to represent the result of this operation. Perform local optimization where possible.*"
"*Arguments:
    args - <Array> of code-generation nodes*"
"*Author: 4 Apr 90 sueb*"

↑self preferredFunctionNode new function: #integral argumentNodes: (Array with: self with: instanceIndex)

"* 5 Apr 90 11:30 am sueb *"

integralForInstance: instanceIndex offset: offset                            integralForInstance:offset:
"*Answer a new code-generation node to represent the result of this operation. Perform local optimization where possible.*"

↑self preferredFunctionNode new function: #integral argumentNodes: (Array with: self with: instanceIndex with: offset)

"* 21 Aug 90 3:53 pm graemeb *"

ln                                                                                                         ln
"*Answer a new code-generation node to represent the result of this operation. Perform local optimization where possible.*"
"*Author: 10 May 1989 graemeb; Modified: 30 May 89 sueb; Revised: 23 Oct 89 sueb*"

↑self preferredFunctionNode new function: #log
                            argumentNodes:
                                (Array with: self)

logarithmicDeltaCompressionWithArgs: args                        logarithmicDeltaCompressionWithArgs:
"*Answer a new code-generation node to represent the result of this operation. Perform local optimization where possible.*"
"*Arguments:
    args - <Array> of code-generation nodes*"
"*Author: 8 Dec 89 graemeb; Revised: 15 Aug 90 graemeb*"

↑self preferredFunctionNode new function: #logarithmicDeltaCompression argumentNodes: args "* 15 Aug 90 11:24 am graemeb *"

max: aCGN                                                                                max:
"*Answer a new code-generation node to represent the result of this operation. Perform local optimization where possible.*"
"*Arguments:
    aCGN - <code-generation node>*"

"Author: 10 May 1989 graemeb; Modified: 26 May 89 sueb; Revised: 23 Oct 89 sueb"

↑self preferredFunctionNode new function: #max argumentNodes: (Array with: self with: aCGN)

min: aCGN  min:
"Answer a new code-generation node to represent the result of this operation. Perform local optimization where possible."
"Arguments:
    aCGN - <code-generation node>"
"Author: 10 May 1989 graemeb; Modified: 26 May 89 sueb; Revised: 23 Oct 89 sueb"

↑self preferredFunctionNode new function: #min argumentNodes: (Array with: self with: aCGN)

mod: aCGN  mod:
"Answer a new code-generation node to represent the result of this operation. Perform local optimization where possible."
"Arguments:
    aCGN - <code-generation node>"
"Author: 8 Dec 89 graemeb"

↑self preferredFunctionNode new function: #fmod argumentNodes: (Array with: self with: aCGN)

sign  sign
"Answer a new code-generation node to represent the result of this operation. Perform local optimization where possible."
"Author: 10 May 1989 graemeb; Revised: 23 Oct 89 sueb"

↑self preferredFunctionNode new function: #sign argumentNodes: (Array with: self)

signum  signum
"Answer a new code-generation node to represent the result of this operation. Perform local optimization where possible."
"Author: 8 Dec 89 graemeb"

↑self preferredFunctionNode new function: #signum argumentNodes: (Array with: self)

sin  sin
"Answer a new code-generation node to represent the result of this operation. Perform local optimization where possible."
"Author: 5 Mar 90 graemeb"

↑self preferredFunctionNode new function: #sin argumentNodes: (Array with: self)

"* 5 Mar 90 12:17 pm erniem *"

spiceBreakdownJunctionLimitWithArgs: args  spiceBreakdownJunctionLimitWithArgs:
"Answer a new code-generation node to represent the result of this operation. Perform local optimization where possible."
"Arguments:
    args - <Array> of code-generation nodes"
"Author: 10 May 1989 graemeb"

↑self preferredFunctionNode new function: #SpiceBreakdownJunctionLimit argumentNodes: args "* 24 Aug 90 3:19 pm graemeb *"

spiceCSLimitWithArgs: args  spiceCSLimitWithArgs:
"Answer a new code-generation node to represent the result of this operation. Perform local optimization where possible."
"Arguments:
    args - <Array> of code-generation nodes"
"Author: 10 May 1989 graemeb"

↑self preferredFunctionNode new function: #SpiceCSLimit argumentNodes: args

"* 24 Aug 90 3:20 pm graemeb *"

spiceJunctionLimitWithArgs: args  spiceJunctionLimitWithArgs:

"Answer a new code-generation node to represent the result of this operation. Perform local optimization where possible."
"Arguments:
    args - <Array> of code-generation nodes"
"Author: 10 May 1989 graemeb"

↑self preferredFunctionNode new function: #SpiceJunctionLimit argumentNodes: args "* 24 Aug 90 3:20 pm graemeb *"

spiceOffJunctionLimitWithArgs: args                                    spiceOffJunctionLimitWithArgs:
"Answer a new code-generation node to represent the result of this operation. Perform local optimization where possible."
"Arguments:
    args - <Array> of code-generation nodes"
"Author: 8 Dec 89 graemeb"

↑self preferredFunctionNode new function: #SpiceOffJunctionLimit argumentNodes: args "* 24 Aug 90 3:20 pm graemeb *"

sqrt                                                                                        sqrt
"Answer a new code-generation node to represent the result of this operation. Perform local optimization where possible."
"Author: 10 May 1989 graemeb; Revised: 23 Oct 89 sueb"

↑self preferredFunctionNode new function: #sqrt argumentNodes: (Array with: self)

storeBessel2ParameterForInstance: instanceIndex                        storeBessel2ParameterForInstance:
↑self preferredFunctionNode new function: #storeBessel2Parameter argumentNodes: (Array with: self with: instanceIndex)

"* 20 Aug 90 4:25 pm graemeb *"

storeDelayParameterForInstance: instanceIndex                          storeDelayParameterForInstance:
↑self preferredFunctionNode new function: #storeDelayParameter argumentNodes: (Array with: self with: instanceIndex)

"* 20 Aug 90 4:21 pm graemeb *"

relational binary

< aCGN                                                                                                <
"Answer a new code-generation node to represent the result of this operation. Perform local optimization where possible."
"Arguments:
    aCGN - <code-generation node>"
"Author: 10 May 1989 graemeb"

↑self preferredBinaryNode new preNode: self operator: #< postNode: aCGN

<= aCGN                                                                                               <=
"Answer a new code-generation node to represent the result of this operation. Perform local optimization where possible."
"Arguments:
    aCGN - <code-generation node>"
"Author: 10 May 1989 graemeb"

↑self preferredBinaryNode new preNode: self operator: #<= postNode: aCGN

= aCGN                                                                                                =
"Answer a new code-generation node to represent the result of this operation. Perform local optimization where possible."
"Arguments:
    aCGN - <code-generation node>"
"Author: 10 May 1989 graemeb"

↑self preferredBinaryNode new preNode: self operator: #= postNode: aCGN

\> aCGN                                                                                                               \>
    "Answer a new code-generation node to represent the result of this operation. Perform local optimization where possible."
    "Arguments:
        aCGN - \<code-generation node\>"
    "Author: 10 May 1989 graemeb"

↑self preferredBinaryNode new preNode: self operator: #\> postNode: aCGN

\>= aCGN                                                                                                              \>=
    "Answer a new code-generation node to represent the result of this operation. Perform local optimization where possible."
    "Arguments:
        aCGN - \<code-generation node\>"
    "Author: 10 May 1989 graemeb"

↑self preferredBinaryNode new preNode: self operator: #\>= postNode: aCGN

~= aCGN                                                                                                               ~=
    "Answer a new code-generation node to represent the result of this operation. Perform local optimization where possible."
    "Arguments:
        aCGN - \<code-generation node\>"
    "Author: 10 May 1989 graemeb ; Revised: 15 Jun 90 sueb "

↑self preferredBinaryNode new preNode: self operator: #~= postNode: aCGN

"* 15 Jun 90 3:09 pm sueb *"

error handling valueOutOfRange: aVariableNodeWithRangeChecking                                                       valueOutOfRange:
    "Answer a node representing the action to take for a value out of range."
    "Arguments:
        aVariableNodeWithRangeChecking - \<VariableNodeWithRangeChecking\>"
    "Author: 10 May 1989 graemeb"

| node |
    node ← TspiceCodeGenBlockNode new initialize.
    node addStatement: (self preferredFunctionNode new function: #ValueOutOfRange argumentNodes: (Array with: (self preferredVariableNode new name: aVariableNodeWithRangeChecking name))).
    ↑node printing printCTemporaryAssignmentsOn:nestLevel:
printCTemporaryAssignmentsOn: aStream nestLevel: level
    "Patch to allow value nodes to be used as arithmetic values. Remove when temporary assignments are moved to the context."
    "Author: 8 May 1989 graemeb"

printTemporaryAssignmentsOn: aStream                                                               printTemporaryAssignmentsOn:
    "Patch to allow value nodes to be used as arithmetic values. Remove when temporary assignments are moved to the context."
    "Author: 8 May 1989 graemeb"

accessing functionValue                                                                                                 functionValue
    "Answer the function value of this variable as a code-generation value node."
    "Author: 5 May 1989 graemeb"

↑self size                                                                                                                size
    "Answer the number of active derivatives for this value. This is always zero since value nodes represent scalar values only."
    "Author: 8 May 1989 graemeb"

↑0

APPENDIX N

```
dmna.mds        Mon Oct  5 14:20:45 1990         1 modelDefinition  dmna {

/*
 * Modified nodal analysis diode model.
 */ defaultParameterValues {

AREA=1.0 , (0.0, infinity) : biasSensitivity :
  /*Scaling factor.*/

CJO=0.0 , [0.0, 0.001]
  /*Zero-bias junction capacitance.*/

EG=1.11 , [0.1, 2.0] : biasSensitivity :
  /*Energy gap potential.*/

FC=0.5 , (0.0, 1.0)
  /*Forward-bias junction capacitance.*/

IS=1e-14 , (0.0, 0.001] : biasSensitivity :
  /*Saturation current.*/

M=0.5 , (0.0, 0.9]
  /*Depletion capacitance grading coefficient.*/

N=1.0 , (0.0, 5.0] : biasSensitivity :
  /*Emission coefficient.*/

PB=1.0 , (0.0, infinity)
  /*Built-in junction potential.*/

PT=3.0 , (0.0, 5.0] : biasSensitivity :
  /*Saturation current temperature exponent.*/

RS=0.0 , [0.0, infinity) : biasSensitivity :
  /*Series ohmic resistance.*/

STATE=1 , (0,1)

TT=0.0 , [0.0, 0.001]
  /*Transit time.*/

} argumentIndependentEquations { gs=AREA*spiceInvert(RS,0)

t=temp+273.15
  to=tnom+273.15
  ratio=t/to
  vt=k*t/q
  nvt=N*vt

/*transform model parameter values to temperature adjusted values*/ is=IS*AREA*exp(EG*(ratio-1)/nvt)*ratio^(PT/N)   : tempAdjust :
  eg=1.16-0.000702*(t*t/(t+1108))
  vref=3*vt*log(ratio)-eg+1.1150877*ratio
  pb=PB*ratio-vref    : tempAdjust :
  cjo=CJO*AREA*(1+M*(0.0004*(t-to)+(1-pb/PB)))    : tempAdjust :

} topologicalDescription {
  pad   anode   units=volts
  pad   cathode units=volts
  node  iAnode  units=volts     : collapseTo(anode, RS) :
  branch junction iAnode cathode units=amps
  branch resistor anode iAnode  units=amps
} argumentDefinition { vj=across(iAnode,cathode)
  vs=across(anode,iAnode)
} argumentDependentEquations { id=is*(exp(vj/nvt)-1)

if (vj > FC*pb)
  { cd=(cjo/((1-FC)^M))*(1+M*(vj-FC*pb)/(pb-FC*pb)) }
  else
  { cd=cjo/((1-vj/pb)^M) }
  cd=cd+TT*(id+is)/nvt throughValueFor(junction)=id+cd*ddt(vj)

throughValueFor(resistor)=gs*vs
} output {

ID=id  : bias,initialAc :
  VD=vj+vs : bias,initialAc :
```

```
dmna.mds        Mon Oct  5 14:20:45 1990              2

REQ=1/gradient(id,vj) : bias,initialAc :
   CAP=cd : bias,initialAC :
 } dt.mds          Mon Oct  1 14:41:23 1990              1
```

APPENDIX O

```
modelDefinition dt {

/*
 * Tableau method diode model.
 */ defaultParameterValues {

AREA=1.0 ,(0.0, infinity) : biasSensitivity :
  /*Scaling factor.*/

CJO=0.0 ,[0.0, 0.001]
  /*Zero-bias junction capacitance.*/

EG=1.11 ,[0.1, 2.0] : biasSensitivity :
  /*Energy gap potential.*/

FC=0.5 ,(0.0, 1.0)
  /*Forward-bias junction capacitance.*/

IS=1e-14 ,(0.0, 0.001] : biasSensitivity :
  /*Saturation current.*/

M=0.5 ,(0.0, 0.9]
  /*Depletion capacitance grading coefficient.*/

N=1.0 ,(0.0, 5.0] : biasSensitivity :
  /*Emission coefficient.*/

PB=1.0 ,(0.0, infinity)
  /*Built-in junction potential.*/

PT=3.0 ,(0.0, 5.0] : biasSensitivity :
  /*Saturation current temperature exponent.*/

RS=1.0 ,(0.0, infinity) : biasSensitivity :
  /*Series ohmic resistance.*/

TT=0.0 ,[0.0, 0.001]
  /*Transit time.*/
} argumentIndependentEquations { gs=AREA/RS t=temp+273.15
  to=tnom+273.15
  ratio=t/to
  vt=k*t/q
  nvt=N*vt

/*transform model parameter values to temperature adjusted values*/ is=IS*AREA*exp(EG*(ratio-1)/nvt)*ratio^(PT/N) : tempAdjust :
  eg=1.16-0.000702*(t*t/(t+1108))
  vref=3*vt*log(ratio)-eg+1.1150877*ratio
  pb=PB*ratio-vref  : tempAdjust :
  cjo=CJO*AREA*(1+M*(0.0004*(t-to)+(1-pb/PB)))  : tempAdjust :

} topologicalDescription {
  pad  anode    units=volts
  pad  cathode  units=volts
  node iAnode   units=volts
  branch junction iAnode cathode units=amps
  branch resistor anode iAnode units=amps
  unknown jcurrent units=amps
  unknown rcurrent units=amps
  unknown jcapacitance units=coulombs
} argumentDefinition { vj=across(iAnode,cathode)
  vs=across(anode,iAnode)
  ijunction=value(jcurrent)
  iresistor=value(rcurrent)
  cjunction=value(jcapacitance)
} argumentDependentEquations { id=is*(exp(vj/nvt)-1)

if (vj > FC*pb)
  { cd=(cjo/((1-FC)^M))*(1+M*(vj-FC*pb)/(pb-FC*pb)) }
  else
``` dt.mds          Mon Oct 1    .4:41:23 1990           2

```
    { cd=cjo/((1-vj/pb)^M) }
    cd=cd+TT*(id+is)/nvt throughValueFor(junction)=ijunction
    constraintFor(jcurrent)=ijunction-id-cd*ddt(vj)
    throughValueFor(resistor)=iresistor
    constraintFor(rcurrent)=iresistor-gs*vs
    constraintFor(jcapacitance)=cjunction-cd
    }
output  {

VD=vj+vs   : bias,initialAc :
    REQ=1/gradient(id,vj)   : bias,initialAc :
    }

}
``` dmt.mds          Mon Oct 15    .31:12 1990           1                    APPENDIX P

```
modelDefinition  dmt  {

/*
 *  Diode model for the modified tableau method.
 */ defaultParameterValues {

AREA=1.0 ,(0.0, infinity) : biasSensitivity :
    /*Scaling factor.*/

CJO=0.0 ,[0.0, 0.001]
    /*Zero-bias junction capacitance.*/

EG=1.11 ,[0.1, 2.0] : biasSensitivity :
    /*Energy gap potential.*/

FC=0.5 ,(0.0, 1.0)
    /*Forward-bias junction capacitance.*/

IS=1e-14 ,(0.0, 0.001] : biasSensitivity :
    /*Saturation current.*/

M=0.5 ,(0.0, 0.9]
    /*Depletion capacitance grading coefficient.*/

N=1.0 ,(0.0, 5.0] : biasSensitivity :
    /*Emission coefficient.*/

PB=1.0 ,(0.0, infinity)
    /*Built-in junction potential.*/

PT=3.0 ,(0.0, 5.0] : biasSensitivity :
    /*Saturation current temperature exponent.*/

RS=1.0 ,(0.0, infinity) : biasSensitivity :
    /*Series ohmic resistance.*/

TT=0.0 ,[0.0, 0.001]
    /*Transit time.*/

} argumentIndependentEquations  { gs=AREA/RS t=temp+273.15
    to=tnom+273.15
    ratio=t/to
    vt=k*t/q
    nvt=N*vt /*transform model parameter values to temperature adjusted values*/ is=IS*AREA*exp(EG*(ratio-1)/nvt)*ratio^(PT/N)   : tempAdjust :
    eg=1.16-0.000702*(t*t/(t+1108))
    vref=3*vt*log(ratio)-eg+1.1150877*ratio
    pb=PB*ratio-vref   : tempAdjust :
    cjo=CJO*AREA*(1+M*(0.0004*(t-to)+(1-pb/PB)))    : tempAdjust :

} topologicalDescription {
    pad   anode     units=volts
    pad   cathode   units=volts
    node  iAnode    units=volts
    branch junction iAnode cathode units=amps
    branch resistor anode iAnode units=amps
    unknown jcurrent units=amps
    unknown rcurrent units=amps
} argumentDefinition { vj=across(iAnode,cathode)
```

```
    vs=across(anode,iAnode)
    ijunction=value(jcurrent)
    iresistor=value(rcurrent)
} argumentDependentEquations { id=is*(exp(vj/nvt)-1)

if (vj > FC*pb)
    { cd=(cjo/((1-FC)^M))*(1+M*(vj-FC*pb)/(pb-FC*pb)) }
    else
    { cd=cjo/((1-vj/pb)^M) }
    cd=cd+TT*(id+is)/nvt
    throughValueFor(junction)=ijunction
    constraintFor(jcurrent)=ijunction-id-cd*ddt(vj)
    throughValueFor(resistor)=iresistor
    constraintFor(rcurrent)=iresistor-gs*vs
} output {

VD=vj+vs : bias,initialAc :
    REQ=1/gradient(id,vj) : bias,initialAc :
    CAP=cd  : bias,initialAC :
}

}
``` dmt2.mds        Mon Oct _5 14:19:37 1990        1        APPENDIX Q

```
modelDefinition dmt2 {

/*
 * Diode model for the modified tableau method.
 */ defaultParameterValues {

AREA=1.0 ,(0.0, infinity) : biasSensitivity :
    /*Scaling factor.*/

CJO=0.0 ,[0.0, 0.001]
    /*Zero-bias junction capacitance.*/

EG=1.11 ,[0.1, 2.0] : biasSensitivity :
    /*Energy gap potential.*/

FC=0.5 ,(0.0, 1.0)
    /*Forward-bias junction capacitance.*/

IS=1e-14 ,(0.0, 0.001] : biasSensitivity :
    /*Saturation current.*/

M=0.5 ,(0.0, 0.9]
    /*Depletion capacitance grading coefficient.*/

N=1.0 ,(0.0, 5.0] : biasSensitivity :
    /*Emission coefficient.*/

PB=1.0 ,(0.0, infinity)
    /*Built-in junction potential.*/

PT=3.0 ,(0.0, 5.0] : biasSensitivity :
    /*Saturation current temperature exponent.*/

RS=0.0 ,[0.0, infinity) : biasSensitivity :
    /*Series ohmic resistance.*/

TT=0.0 ,[0.0, 0.001]
    /*Transit time.*/

} argumentIndependentEquations { gs=AREA/RS t=temp+273.15
    to=tnom+273.15
    ratio=t/to
    vt=k*t/q
    nvt=N*vt /*transform model parameter values to temperature adjusted values*/ is=IS*AREA*exp(EG*(ratio-1)/nvt)*ratio^(PT/N)  : tempAdjust :
    eg=1.16-0.000702*(t*t/(t+1108))
    vref=3*vt*log(ratio)-eg+1.1150877*ratio
    pb=PB*ratio-vref : tempAdjust :
    cjo=CJO*AREA*(1+M*(0.0004*(t-to)+(1-pb/PB)))  : tempAdjust :

} topologicalDescription {
    pad anode units=volts
    pad cathode units=volts
```

```
dmt2.mds          Mon Oct  5 14:19:37 1990          2 branch junction anode cathode units=amps
  unknown jcurrent units=amps
} argumentDefinition { vj=across(anode,cathode)
  ijunction=value(jcurrent)
} argumentDependentEquations { vjeff=vj-ijunction*RS
  id=is*(exp(vjeff/nvt)-1)

if (vjeff > FC*pb)
  { cd=(cjo/((1-FC)^M))*(1+M*(vjeff-FC*pb)/(pb-FC*pb)) }
  else
  { cd=cjo/((1-vjeff/pb)^M) }
  cd=cd+TT*(id+is)/nvt throughValueFor(junction)=ijunction
  constraintFor(jcurrent)=ijunction-id-cd*ddt(vjeff)
} output {

VD=vj    : bias,initialAc :
  REQ=1/gradient(id,vj)  : bias,initialAc :
  CAP=cd   : bias,initialAC :
}

} amp.mds          Fri Oct  5 14:46:54 1990          1 modelDefinition amp { defaultParameterValues {
A = 1, (-infinity, infinity)
TA = 0, [0, infinity)
} topologicalDescription {
pad vcp units=volts
pad vcm units=volts
pad vop units=volts
pad vom units=volts
branch source vop vom units=amps
unknown i units=amps
} argumentDefinition {
vin = across(vcp, vcm)
vout = across(vop, vom)
iout = value(i)
} argumentDependentEquations {
constraintFor(i) = vout + ddt(TA * vout) - A * vin
throughValueFor(source) = iout
}

} motor.mds          Fri Oct  5 14:39:55 1990          1 modelDefinition motor { defaultParameterValues {
KE = 1, (0, infinity)
KG = 1, [0, infinity)
TML = 0, [0, infinity)
} topologicalDescription {
pad vcp units=volts
pad vcm units=volts
pad vop units=volts
pad vom units=volts
branch output vop vom units=amps
unknown w units=rpm
unknown i units=amps
} argumentDefinition {
vin = across(vcp, vcm)
vout = across(vop, vom)
wmotor = value(w)
iout = value(i)
} argumentDependentEquations {
throughValueFor(output)=iout
constraintFor(w) = KE * (wmotor + ddt(TML * wmotor)) - vin
constraintFor(i) = vout - KG * wmotor
}

}
```

APPENDIX R

APPENDIX S

*From Tektronix Smalltalk-80 version TB2.2.2a of May 05, 1988, 18:14:03. on 17 October 1990 at 3:48:26 pm*
*ADS version: ADS.2c3aTEK.007.LBa6.020*

——————————— TspiceCodeGenBlockNode ———————————

TspiceCodeGenNode subclass: #TspiceCodeGenBlockNode          *TspiceCodeGenBlockNode*
    instanceVariableNames: 'statements temporaryVariables'
    classVariableNames: ''
    poolDictionaries: ''
    category: 'Tspice-MDS-To-C'
TspiceCodeGenBlockNode comment:
'This class represents a compound statement (block).
Author: 8 May 1989 graemeb; Revised: 17 Nov 89 sueb Instance variables:

statements           <OrderedCollection> of code-generation nodes
temporaryVariables      <Set> of names of temporary variables (variables created during the generation of C code for this block of code)
' building addFirst: statement                                                         addFirst:
    "*Add a statement to the beginning of the block (this is used when code is moved from one block to another during code optimization).*"
    "*Author: 14 Nov 89 sueb*"

statements addFirst: statement addLast: statement                                                       addLast:
    "*Add a statement to the end of the block (this is used when code is moved from one block to another during code optimization).*"
    "*Author: 21 Nov 89 sueb*"

statements addLast: statement addStatement: statement                                          addStatement:
    "*Add a statement to the block.*"
    "*Arguments:*
        *statement - <OrderedCollection> of code-generation nodes*"
    "*Author: 9 May 1989 graemeb*"

statements addLast: statement addTemporaryAssignmentForValue:inContext:
addTemporaryAssignmentForValue: valueNode inContext: context
    "*Generate a temporary assignment statement with a double-float value of valueNode and add it to the block. Create and answer a variable node for the created variable.*"
    "*Arguments:*
        *valueNode    - <TspiceCodeGenValueNode subclass>*
        *context       - <ModelCodeGenContext>*"
    "*Author: 15 Aug 89 graemeb; Revised: 20 Dec 89 sueb (capitalize temporary variables) ; Revised: 4 Apr 90 sueb* "

| temporaryAssignment temporaryVariableName |
    temporaryVariableName ← context nextTemporary.
    temporaryAssignment ← valueNode preferredTempAssignmentNode new name: temporaryVariableName value: valueNode.
    statements addLast: temporaryAssignment.

↑valueNode preferredVariableNode new name: temporaryVariableName

"* 4 Apr 90 5:27 pm sueb *"

move:to:dataFlowAnalysis:
move: statement to: newBlock dataFlowAnalysis: aDataFlowAnalyzer
"*Data flow analysis has shown that the statement can be moved to the block indicated by the symbol 'newBlock.' If the statement is an assignment statement, go ahead and remove it from the receiver's collection of statements. If the statement is nested inside a conditional, check to see if all the conditional's nested statements can be moved (this is true if none of their assigned values are used before 'newBlock.' If the conditional can be moved, remove it from the receiver's statements."*
"Author: 13 Nov 89 sueb"

(statements includes: statement)
        ifTrue:
            [statements remove: statement.
            ↑statement]
        ifFalse:
            [statements do:
                [: stmt | stmt isAssignment
                    ifFalse:
                        [(stmt okToMove: statement to: newBlock dataFlowAnalysis: aDataFlowAnalyzer)
                        ifTrue:
                            [statements remove: stmt.
                            ↑stmt]]]].
↑nil "* 22 May 90 9:50 am sueb *"

moveToArgumentIndependentCode:dataFlowAnalysis:
moveToArgumentIndependentCode: statement dataFlowAnalysis: aDataFlowAnalyzer
"*Data flow analysis has shown that the statement can be moved to the argument independent code block. If the statement is an assignment statement, go ahead and remove it from the receiver's collection of statements. If the statement is nested inside a conditional, check to see if all the conditional's nested statements can be moved (this is true if none of the statements are argument dependent, and the condition is not argument dependent. If the conditional can be moved, remove it from the receiver's statements."*
"Author: 13 Nov 89 sueb"

(statements includes: statement)
        ifTrue:
            [statements remove: statement.
            ↑statement]
        ifFalse:
            [statements do:
                [: stmt | stmt isAssignment
                    ifFalse:
                        [(stmt isArgumentIndependent: statement dataFlowAnalysis: aDataFlowAnalyzer)
                        ifTrue:
                            [statements remove: stmt.
                            ↑stmt]]]].
↑nil removeStatement: statement                                                         removeStatement:
"*Data flow analysis has shown that the variable assigned to in 'statement' is not referenced anywhere. Statement will be an assignment statement, either one of the receiver's statements, or nested inside a conditional statement. In the latter case, removing the statement may leave the conditional with no nested statements (empty block); when this happens, remove the conditional.*"
"Author: 17 Nov 89 sueb"

statements remove: statement
        ifAbsent:
            [statements do:
                [: stmt | stmt isAssignment
                    ifFalse:
                        [(stmt removeNestedStatement: statement)
                          ifTrue:

```
                    [stmt emptyBlock
                            ifTrue: [statements remove: stmt].
                    ↑true]]].
            ↑false].
    ↑true
```

.reuseTemporaryAssignmentForValue:inContext:
reuseTemporaryAssignmentForValue: valueNode inContext: context
   "*Generate a temporary assignment statement with a double-float value of valueNode and add it to the block.
Reuse the current temporary variable. Create and answer a variable node for the reused variable.*"
   "*Arguments:*
       *valueNode   - <TspiceCodeGenValueNode subclass>*
       *context     - <ModelCodeGenContext>*"
   "*Author: 15 Aug 89 graemeb; Revised: 20 Dec 89 sueb (capitalize temporary variables)*"

| assignmentNumber temporaryAssignment temporaryVariableName |
   assignmentNumber ← context numberOfLocalAssignments.
   temporaryVariableName ← '←D' , assignmentNumber printString.
   context addVarDeclaration: temporaryVariableName.
   temporaryAssignment ← valueNode preferredTempAssignmentNode new name: temporaryVariableName
value: valueNode.
   statements addLast: temporaryAssignment.
   ↑valueNode preferredVariableNode new name: temporaryVariableName initialize-release initialize                                                                                          initialize
   "*Initialize a new block node.*"
   "*Author: 9 May 1989 graemeb*"

statements ← OrderedCollection new printing printCodeOn: aStream level: anInteger                                              printCodeOn:level:
      "*Block-node printout in C format. This block represents a collection of statements.*"
      "*Arguments:*
          *aStream - <writeable stream>*"
      "*Author: 24 Oct 89 sueb*"

statements do:
          [:each | each printCOn: aStream nestLevel: anInteger]

printCodeOnWithoutLimiting:level:inContext:
   printCodeOnWithoutLimiting: aStream level: anInteger inContext: context
      "*Block-node printout in C format. This block represents a collection of statements.*"
      "*Arguments:*
          *aStream - <writeable stream>*"
      "*Author: 24 Oct 89 sueb*"

| argumentNames |
      aStream crtab: anInteger; nextPutAll: '/* no limiting or assignments to arguments are done here */';cr.
      argumentNames ← context argumentNames.
      statements do:
          [:each |
              (each isAssignment and: [(argumentNames includes: each variableName)])
                  ifFalse:
                      [each printCOn: aStream nestLevel: anInteger]]

printCOn:inContext:withHeader:
   printCOn: aStream inContext: context withHeader: headerString
      "*Top-level block-node printout in C format. This block represents the complete executable code of a
routine.*"
      "*Arguments:*
          *aStream    - <writeable stream>* context     - <ModelCodeGenContext>
headerString - <String> string to placed between the variable declarations and executable code"
"Author: 9 May 1989 graemeb; Revised: 20 Dec 89 sueb (capitalize temporary variables)"

| declaration |
aStream nextPut: ${.
context varDeclarations asSortedCollection do:
    [: var |
    ((var at: 1) = $←
     and: [(var at: 2) = $I])
        ifTrue: [declaration ← 'int ']
        ifFalse: [declaration ← 'double '].
    aStream crtab: 1; nextPutAll: declaration; nextPutAll: var; nextPut: $;].
aStream cr.
aStream nextPutAll: headerString.
statements do:
    [: each | each printCOn: aStream nestLevel: 1].
aStream crtab: 1; nextPutAll: 'return(OKAY);'.
aStream cr; nextPut: $} printCOn: aStream nestLevel: level                                                        printCOn:nestLevel:
"Block-node printout in C format. This block represents a collection of statements."
"Arguments:
    aStream - <writeable stream>
    level    - <Integer> the nesting level"
"Author: 9 May 1989 graemeb"

aStream nextPut: ${.
statements do:
    [: each | each printCOn: aStream nestLevel: level+1].
aStream crtab: level; nextPut: $} printOn: aStream                                                                           printOn:
"Block-node printout. This block represents a collection of statements."
"Arguments:
    aStream - <writeable stream>"
"Author: 9 May 1989 graemeb"

aStream nextPut: ${; cr.
statements do:
    [: each | each printOn: aStream. aStream cr].
aStream nextPut: $} printSignumCodeOn: aStream level: anInteger                                                printSignumCodeOn:level:
"Print the matrix mapOuts for the topology checker. Assumes that the receiver holds only mapOut code
(the statements are actually 'TspiceCodeGenFunctionNodes'). Prints only the mapOuts to the matrix, after
taking the signum of the values."
"Arguments:
    aStream - <writeable stream>"
"Author: 25 Jan 90 sueb ; Revised: 10 Apr 90 sueb (if the argument to signum is a literal, compute its sign
here) ; Revised: 18 May 90 sueb "

| functionName arguments arg2 |
aStream crtab: anInteger; nextPutAll: '/* mapOut the sign of the results to the matrix */'; cr.
statements do:
    [: each |
    functionName ← each function.
    arguments ← each arguments.
    (#('←ADDNN' '←ADDCN' '←ADDNC' '←ADDCC') includes: functionName)
        ifTrue:
            [aStream crtab: anInteger; nextPutAll: functionName, '('.
            (arguments at: 1) printCOn: aStream.
            aStream nextPutAll: ', '.
            (arg2 ← arguments at: 2) isLiteral
                ifTrue:
                    [arg2 sign printCOn: aStream]
                ifFalse:
                    [aStream nextPutAll: '←SIGNUM('.
                    (arguments at: 2) printCOn: aStream.

aStream nextPutAll: ' )'].
aStream nextPutAll: ');']]

"* 19 Jun 90 9:36 am sueb *"

data flow analysis referencedVariables
*"Return a collection of all the variables referenced by the receiver's statements."*
*"Author: 24 Jan 90 sueb"*

| variables |
variables ← Set new.
statements do:
   [: stmt |
      variables addAll: stmt referencedVariables].
↑variables asOrderedCollection "* 24 Jan 90 9:49 am sueb *"

enumerating do: aBlock
*"Enumerate all statements"*
*"Author: 6 Nov 89 sueb"* statements do: aBlock topLevelAssignmentsDo: aBlock
*"Enumerate all top-level assignments"*
*"Author: 17 May 1989 graemeb"* statements do:
   [: statement | statement isAssignment
      ifTrue: [aBlock value: statement]]

testing contains: statement
*"Return true if statement is one of the receiver's statements, or is nested inside one of the receiver's statements."*
*"Author: 13 Nov 89 sueb"* statements do:
   [: stmt | stmt = statement
      ifTrue: [↑true]
      ifFalse:
         [(stmt isAssignment not and: [stmt contains: statement])
            ifTrue: [↑true]]].
↑false isEmpty
*"Answer true if the are no statements in this block."*
*"Author: 9 May 1989 graemeb"*

↑statements isEmpty okToMove: statement to: newBlock dataFlowAnalysis: aDataFlowAnalyzer
*"Return true if the receiver contains 'statement' as a nested statement, AND all its nested statements are used only in 'newblock' (this second check is ensuring that none of the variables defined in the statements are used anywhere in the code BEFORE newblock.)"*
*"Author: 13 Nov 89 sueb"* statements do:
   [: stmt | stmt isAssignment
      ifTrue:

```
            [(aDataFlowAnalyzer definition: stmt onlyUsedIn: newBlock)
                ifFalse: [↑false]]
            ifFalse:
                [(stmt okToMove: statement to: newBlock dataFlowAnalysis: aDataFlowAnalyzer)
                    ifFalse: [↑false]]].
    ↑true
``` okToMoveTo: newBlock dataFlowAnalysis: aDataFlowAnalyzer      okToMoveTo:dataFlowAnalysis:

"*Return true if all of the receiver's nested statements are used only in 'newblock' (this second check is ensuring that none of the variables defined in the statements are used anywhere in the code BEFORE newblock.)*"
"*Author: 13 Nov 89 sueb*"

```
    statements do:
        [: stmt | stmt isAssignment
            ifTrue:
                [(aDataFlowAnalyzer definition: stmt onlyUsedIn: newBlock orInCodeBlock: self)
                    ifFalse: [↑false]]
            ifFalse:
                [(stmt okToMoveTo: newBlock dataFlowAnalysis: aDataFlowAnalyzer)
                    ifFalse: [↑false]]].
    ↑true
``` okToMoveToArgumentIndependentBlock      okToMoveToArgumentIndependentBlock

"*Return true if the receiver represents a code statement that can be moved to the argument-independent function. (Exceptions include the derivative statements for transient functions.)*"
"*Author: 14 May 90 sueb*"

```
"   statements do:
        [: node | node okToMoveToArgumentIndependentBlock
            ifFalse:
                [↑false]].
    ↑true"
``` self shouldNotImplement

"* 23 Aug 90 5:18 pm graemeb *"

accessing renameFunctionsUsing: dictionary      renameFunctionsUsing:
"*Rename functions using given name map.*"
"*Arguments:*
   *dictionary - <Dictionary> of new-function symbols keyed by old-function symbols.*"
"*Author: 17 Oct 90 graemeb*"

```
    statements do:
        [: statement | statement renameFunctionsUsing: dictionary]
```

"* 17 Oct 90 10:00 am graemeb *"

statements      statements
"*Return the receiver's collection of statements.*"
"*Author: 17 Nov 89 sueb*"

↑statements temporaryVariables      temporaryVariables
"*Return the Set of temporary variables that need to be declared for this block of code.*"
"*Author: 23 Oct 89 sueb; Revised: 24 Aug 90 graemeb, collection may be added to so save.*"

```
    temporaryVariables isNil
        ifTrue: [↑temporaryVariables ← Set new].
    ↑temporaryVariables
```

"* 24 Aug 90 9:51 am graemeb *"

temporaryVariables: set
    "Store the Set of temporary variables that need to be declared for this block of code."
    "Author: 23 Oct 89 sueb"

temporaryVariables ← set temporaryVariables:

_copying copy                                                                                                                    copy
    "Return a copy of the receiver. NOTE: the new block's collection of statements will contain the SAME
    statements (a 'shallowCopy' of the receiver's statements collection), so any operations performed on the
    statements themselves will affect both the receiver and its copy."
    "Author: 2 May 90 sueb"

| newBlock |
    newBlock ← self species new initialize.
    newBlock statements addAll: statements.
    newBlock temporaryVariables: temporaryVariables copy.
    ↑newBlock "* 2 May 90 3:59 pm sueb *"

APPENDIX T modifiers          Tue Oct  3 14:16:36 1990          1

The Model Description Language has been structured to facillitate the
    complete mathematical description of a model. This description is free of
    algorithmic details which are features of approximate solution methods
    which may be employed to solve systems formed using a given model
    definition. The model definition may augmented by an individual knowledgable
    in practical simulation to incorporate such algorithmic information.
    Further, special simulation outputs may be flagged or the generation of
    code for simulation methods of a particular type may be signalled through
    the use of "line modifiers" in a model definition. Line modifiers permit
    the tailoring of a model definition for a particular simulator.

A model definition for a diode is given below. This definition contains
    no line modifiers and hence provides scant information as to its algorithmic
    treatment. Following the first definition is one for the same device which
    has been augmented with line modifiers. All line modifiers appear between
    colons ":".

modelDefinition  diode  ( defaultParameterValues  (

AREA=1.0 , (0.0, infinity)

CJO=0.0 , [0.0, 0.001]

EG=1.11 , [0.1, 2.0]

FC=0.5 , [0.0, 1.0)

IS=1e-14 , (0.0, 0.001]

M=0.5 , [0.0, 0.9]

N=1.0 , (0.0, 5.0]

PB=1.0 , (0.0, infinity)

PT=3.0 , (0.0, 5.0]

RS=0.0 , (0.0, infinity)

TT=0.0 , [0.0, 0.001]

} argumentIndependentEquations  ( gs=AREA/RS t=temp+273.15
  to=tnom+273.15
  ratio=t/to
  vt=k*t/q
  nvt=N*vt is=IS*AREA*exp(EG*(ratio-1)/nvt)*ratio^(PT/N)
  eg=1.16-0.000702*(t*t/(t+1108))
  vref=3*vt*log(ratio)-eg+1.1150877*ratio
  pb=PB*ratio-vref
  cjo=CJO*AREA*(1+M*(0.0004*(t-to)+(1-pb/PB)))

modifiers          Tue   : 23 14:16:36 1990          2
}
topologicalDescription {
  pad  anode  units=volts
  pad  cathode  units=volts
  node  iAnode  units=volts
  branch junction iAnode cathode units=amps
  branch resistor anode iAnode units=amps
}
} output {

ID=id
  VD=vj+vs
  REQ=1/gradient(id,vj)
  CAP=cd
}

}

The modified definition for the diode follows.

modelDefinition diode { defaultParameterValues {

AREA=1.0 ,(0.0, infinity) : biasSensitivity :

CJO=0.0 ,[0.0, 0.001]

EG=1.11 ,[0.1, 2.0] : biasSensitivity :

FC=0.5 ,(0.0, 1.0)

IS=1e-14 ,(0.0, 0.001] : biasSensitivity :

M=0.5 ,(0.0, 0.9]

N=1.0 ,(0.0, 5.0] : biasSensitivity :

PB=1.0 ,(0.0, infinity)

PT=3.0 ,(0.0, 5.0] : biasSensitivity :

RS=0.0 ,[0.0, infinity) : biasSensitivity :

TT=0.0 ,[0.0, 0.001]

} argumentIndependentEquations { if ( RS > 0.0 )
  { gs=AREA/RS }
  else
  { gs=0.0 } t=temp+273.15
  to=tnom+273.15
  ratio=t/to
  vt=k*t/q
  nvt=N*vt is=IS*AREA*exp(EG*(ratio-1)/nvt)*ratio^(PT/N)   : tempAdjust :
  eg=1.16-0.000702*(t*t/(t+1108))
  vref=3*vt*log(ratio)-eg+1.1150877*ratio
  pb=PB*ratio-vref    : tempAdjust :
  cjo=CJO*AREA*(1+M*(0.0004*(t-to)+(1-pb/PB)))   : tempAdjust :

} topologicalDescription {
  pad  anode  units=volts
  pad  cathode  units=volts
  node  iAnode  units=volts     : collapseTo(anode, RS) :
  branch junction iAnode cathode units=amps
  branch resistor anode iAnode units=amps
} argumentDefinition { vj=across(iAnode,cathode) : spiceJunctionLimit(nvt, is) :
  vs=across(anode,iAnode)
} argumentDependentEquations { id=is*(exp(vj/nvt)-1)

if (vj > FC*pb)
  { cd=(cjo/((1-FC)^M))*(1+M*(vj-FC*pb)/(pb-FC*pb)) }
  else
  { cd=cjo/((1-vj/pb)^M) }
  cd=cd+TT*(id+is)/nvt throughValueFor(junction)=id+cd*ddt(vj)
  throughValueFor(resistor)=gs*vs
}

```
modifiers          Tue __t 23 14:16:36 1990          3 output {
  ID=id  : bias,initialAc :
  VD=vj+vs  : bias,initialAc :
  REQ=1/gradient(id,vj)  : bias,initialAc :
  CAP=cd  : bias,initialAC :
  }

}
```

The line modifiers which appear in the above example are:

: biasSensitivity : - is used within the defaultParameterValues
     block to denote that for the parameter defined on the same line,
     code to facillitate a bias sensitivity analysis is to be generated.

: tempAdjust : - is used to denote that an output value is to be reported
     for the quantity defined on this line.

: collapseTo(annode, RS) : - is employed within the topologicalDescription
     block to parametrically eliminate an unnecessary node whenever RS has
     a value of zero.

: spiceJunctionLimit(nvt, is) : - signals that the Berkeley Spice junction
     voltage limiting method is to be applied to the argument defined on this
     line.

: bias, initialAc : - indicates that the quantities defined on this line
     will be output for bias and initialAc type analyses.

It is seen that line modifiers apply only to the course of simulation
and output generation. The line modifiers may be parametrized and use
values calculated during the evaluation of model equations or input model
parameter values. It is the incorporation of line modifiers that guide
code generation for tailoring a model definition to solution methods.
Annotation by line modifiers does not change the fundamental nature of
the mathematical definition.

Line modifiers are created for the target simulator and are used to
guide the generation of simulator code. The modifiers appearing above
correspond to an analog simulator which we have developed at Tektronix.

APPENDIX U (PRIOR ART)

Automated Design and Engineering for Electronics™ West

PROCEEDINGS OF THE TECHNICAL SESSIONS

Automated Design and
Engineering for Electronics—West

March 31—April 2, 1987
Anaheim Convention Center
Anaheim, California

A SIMULATOR FOR DESIGNING MIXED TECHNOLOGY SYSTEMS by

Doug Johnson
Analogy Inc.
Beaverton, Oregon

OVERVIEW

This paper examines the benefits of simulation in the design and analysis of a mixed technology system. In this particular case a speed controller for a DC Motor will be used as it incorporates the use of analog, digital, and mechanical elements. To date it has not been feasible to simulate such a complete and mixed discipline system together as a unit. The simulator used in the analysis is SABER from Analogy Inc., a newly released product that provides the capability necessary to perform this design.

SPECIFICATIONS

To begin the design, the specifications for the motor control circuitry must first be understood. The motor needs to drive an optical lap which is a flat cast iron disk 8" in diameter and 5/8" thick. The motor must be able to turn the lap bi-directionally at a user selectable speed from 0 - 750 rpm. The controller must be able to control the motor to within 2% of the selected speed and drive a worst case frictional load of 220 oz. in. The motor to be used should be small and thin (pancake motor) and not require a separate tachometer.

MOTOR BEHAVIORAL LEVEL

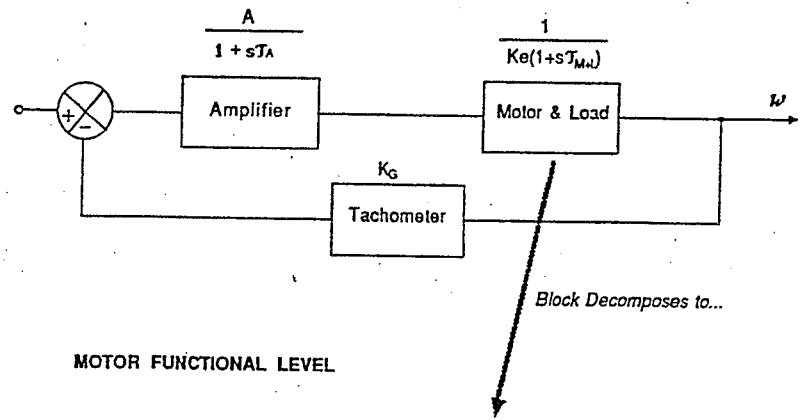

MOTOR FUNCTIONAL LEVEL

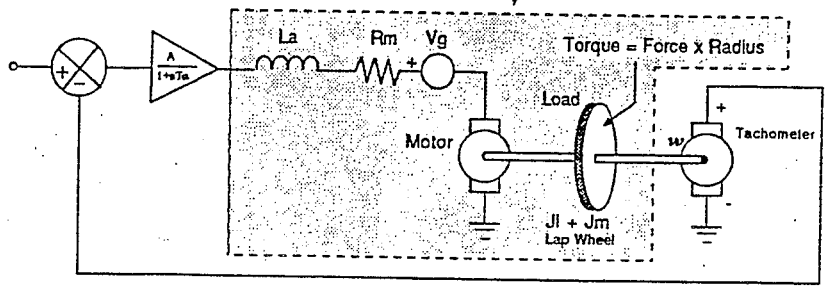

Figure 1

Speed Controller

Behavioral Level Classical Control System

A SIMULATOR FOR DESIGNING MIXED TECHNOLOGY SYSTEMS
by Doug Johnson

BEHAVIORAL LEVEL

To start the design it is desirable to be able to model and simulate the drive circuitry and load condition at a behavioral or conceptual level. This will provide immediate feedback on whether the design is feasible, before actually implementing any of the concepts into a particular circuit or technology. The motor controller, motor, and loads can then be broken into behavioral blocks as shown in Figure 1.

Each block can be modeled as a transfer function that simply relates the output as a function of the input. The transfer function for the motor speed control is w, the shaft speed divided by the input stimulus voltage (vin). Other blocks within the speed control are; the amplifier (A), the motor, and the feedback voltage created by the tach (Kg). Using the transfer functions shown in Figure 1 the models for simulation would be very simply described as shown in Figure 2 for the case of the amplifier, and Figure 3 for the motor. By designing in a top down fashion concepts can be verified before designs are fixed; major design flaws and conceptional errors can be uncovered early saving tremendous amounts of time and money. It should also be obvious that the possibility now exists to experiment with new concepts that may lead to major savings or technical breakthroughs with little risk in project delay and expense. This can only be realized by simulating and analyzing a design starting from the top down with concepts and ideas studied before implementation begins.

As demonstrated from the behavioral models in Figures 2 & 3 simple first order transfer equations are often all that is necessary for behavioral level simulation.

```
element template amp vcp vcm vop vom = a, ta electrical        vcp, vcm, vop, vom number            a, ta {
var      i  i
val      v  vin, avin, vout, vouta values  {
         vin = v(vcp) - (vcm)
         avin = a * vin
         vout = v(vop) - v(vom)
         vouta= ta * vout
        } equations {
         i(vcp) += 0
         i(vcm) += 0
         i(vop) += i
         i(vom) -= i
         i:     vout + d_by_dt(vouta) = avin
```

FIGURE 2
BEHAVIORAL TEMPLATE OF AMPLIFIER

```
element template motor vcp vcm shaft = ke, tml electrical        vcp,vcm
rotational        shaft
number            ke, tml {
var      t  t
val      w  wke, wketml
val      v  vin values  {
         wke     = ke * w(shaft)
         wketml  = wke * tml
         vin     = v(vcp) - v(vcm)
        } equations{
         i(vcp) += 0
         i(vcm) += 0
         t(shaft) += t
         t:   wke + d_by_dt(wketml) = vin
        }
```

FIGURE 3
BEHAVIORAL MODEL OF MOTOR

Taking the behavioral level models for each block in Figure 1 and simulating the system at this level the specifications necessary for the next lower level of simulation can be determined. By simulating the system and using analysis to derive critical parameters the final circuit and parts selection can be easily made and a high quality design will result.

In simulating the motor and drive circuitry the mechanical time constant of the motor and load (Tm+l) is determined. This is important in specifying the time constant for the amplifier section. In practice Tm+l could be measured in either the time or frequency domain. In the time domain, a step function voltage would be applied to the terminals of the motor and its connected load. The exponential increase would be plotted as the motor accelerates toward its steady state speed. 63% of this speed is defined as the motor mechanical time constant. Measuring the mechanical time constant in the frequency domain is a little more complex, but doable.

To insure stability now that the value of Tm+l is known, the amplifier time constant should be designed to be at least an order of magnitude larger. The parameters for Ta and Tm+l can be defined analytically and in conjunction with simulation to find the open loop gain, phase margin, damping of the closed loop to a step response, and other dynamic properties needed to define the systems performance.

Figure 4:
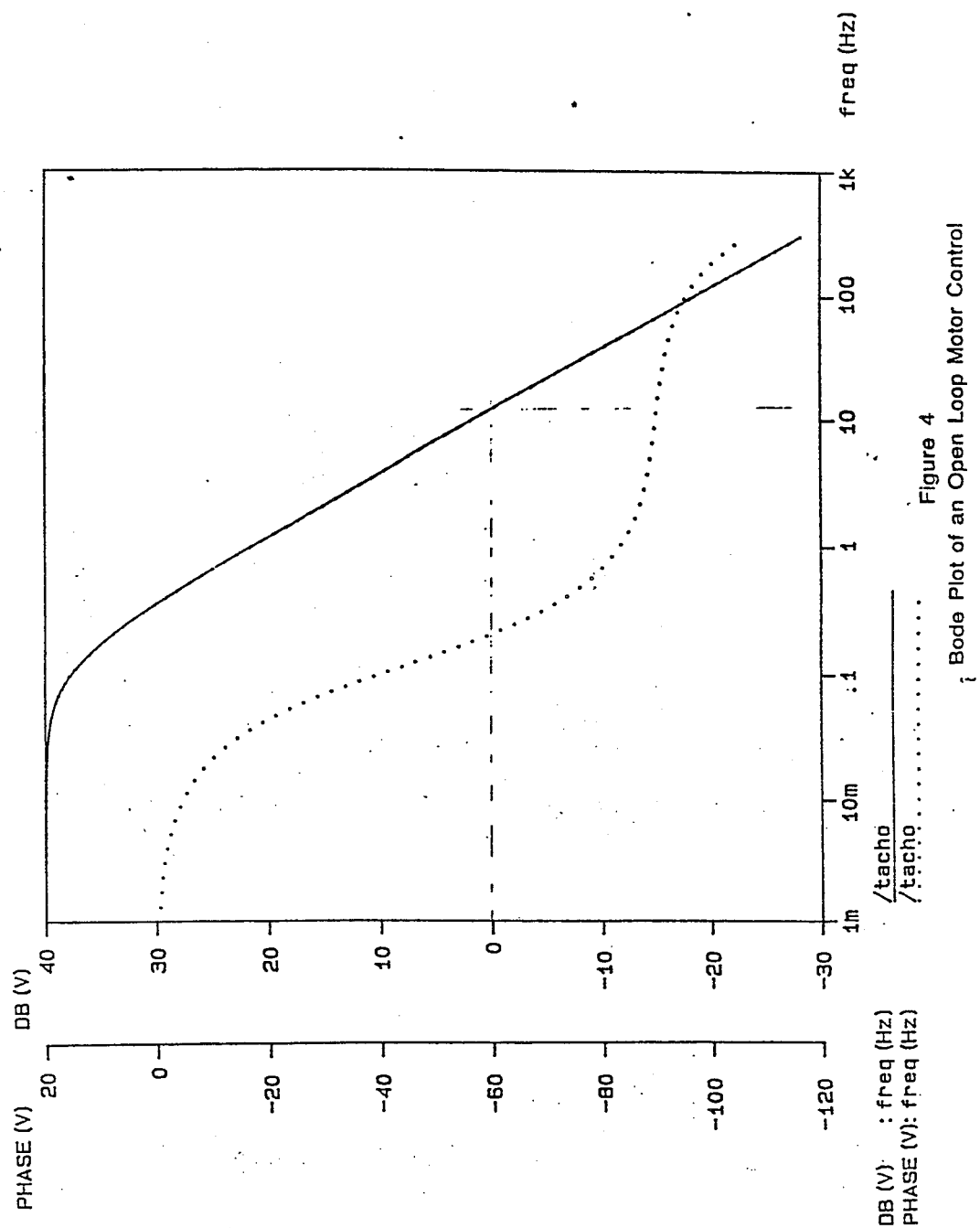

A key factor in the design of a motor driver is whether or not a compensator might be needed. Without simulation, the circuit would have to be built or analyzed in great detail to determine this. With simulation we can study the frequency characteristics of the open loop system as shown in Figure 4. If the output phase is greater than 135 degrees while the gain is greater than 0 db, we will need to add a compensator. From the graph it can be seen that this is not the case. There is more than adequate phase margin and the system will be stable when the loop is closed.

Figure 5:
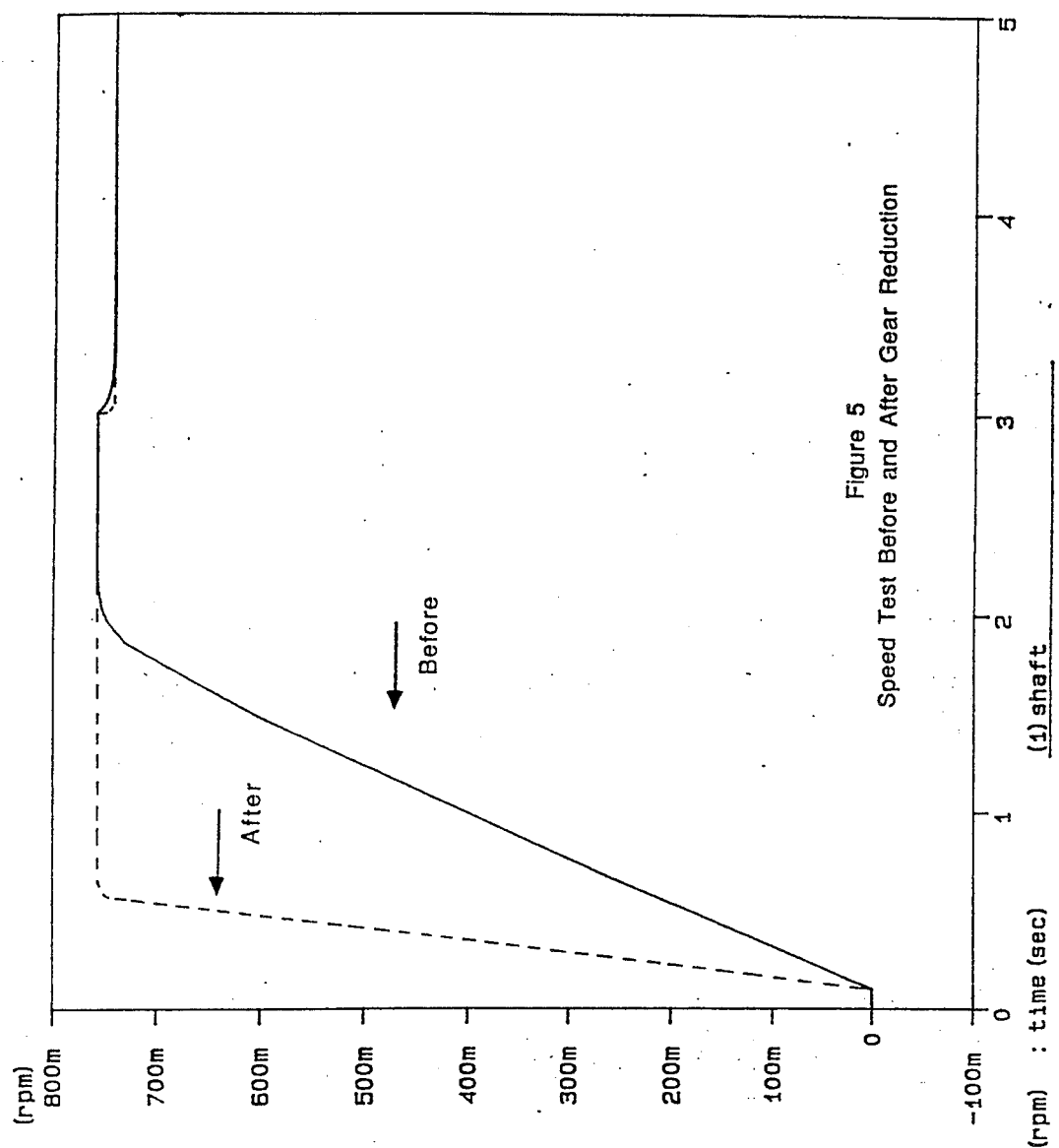

Simulation can verify whether the intended design will ever meet the performance specifications. Using a time domain analysis, the output speed under load is graphed while the input control voltage is varied over time. In Figure 5 we see that, the specification for a speed of 750 rpm is achieved. Similarly, speed regulation can be checked by applying a load 2.5 sec after the motor is started. This gives the motor time to get up to speed. The load of 16 oz.in. is applied and as the results show, the speed is maintained within 2%. Unfortunately, the amplifier driving the motor must be capable of delivering 500 volts at substantial amperage to achieve our performance specification.

This is unrealistic. By adding more detail to the model using the simulators modeling language, conditions such as voltage limits can be added using conditional statements:

"If Vmotor > VMAX then Vmotor = VMAX"

This statement will clamp the output to a specified value. Additionally limiting resistors are added between the AMP output and motor to limit the current to a realistic level. However, with these constraints it is obvious that the amplifier will not generate enough power to accelerate the motor as quickly. Therefore a gear reduction system must be added between the motor and load to provide the scaled leverage required to achieve the same specifications. A gear reduction of 4 to 1 is added and the tests in Figure 5 are repeated. This time the speed control passes the tests as is shown by the dotted lines in Figure 5.

Through these simulation runs, without specifically designing either the electronics or the motor, the design concept has been proven out. Implementing the design now becomes procedural and has little risk in failure due to an invalid concept. Using the capabilities of modeling and simulation again in the actual design, the circuit can be broken down into more detail one functional block at a time. Then verifying at each step that the detailed results still play with the rest of the system modeled at a higher level. Projects can thus be controlled very precisely in specification and performance leaving little to chance throughout the design cycle.

Once broken down to a lower level where the design is actually being implemented, the modeling language and simulator often need to accommodate many types of circuitry and technology. In Saber, these can be easily modeled and included within simulation of the Analog system.
To study the procedure and details of this implementation, the PWM will be focused on during the remainder of this paper.

THE PULSE WIDTH MODULATOR

In describing the PWM either as a behavioral or functional model there is a problem in that PWM's are non-linear in operation and cannot be analyzed for stability directly using classical techniques such as Bode plots or root locus methods. For this analysis then, the PWM will be replaced with a linearized equivalent circuit as in Figure 1. In determining the linear equivalant several assumptions will have to be made about the Bode Plot of an Open Loop Motor Control Speed Test Before and After Gear Reduction

PULSE WIDTH MODULATOR SUBSYSTEM
(FUNCTIONAL LEVEL)

PWM. The first assumption is that to avoid system interaction, the operating frequency of the PWM will be fixed and several orders of magnitude higher than the dominant poles of the system.

Next, it is assumed that the transfer function of duty cycle-out divided by voltage-in is linear throughout the motor controller operating range and that the gain of the PWM will be equivalent to the gain of the linear block of the behavioral model of Figure 1.

This linearization and substitution is required in order to use Bode and root locus methods. Again by simulating the circuit before it is actually implemented it can be determined if the system is unstable. If the system is not stable the simulator will allow experimentation with compensators to determine the necessary compensation to achieve stable operation. Once an adequate phase margin has been ensured using the linearized equivalent, we can move on to the transient analysis of the true non-linear PWM using the closed loop motor controller and applying a suite of tests to verify system performance.

Figure 6:
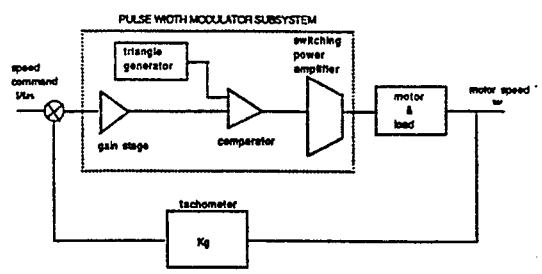
Figure 6:
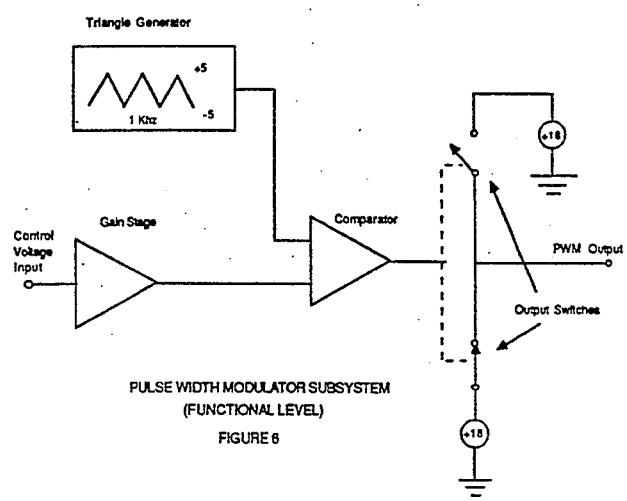
Figure 7:
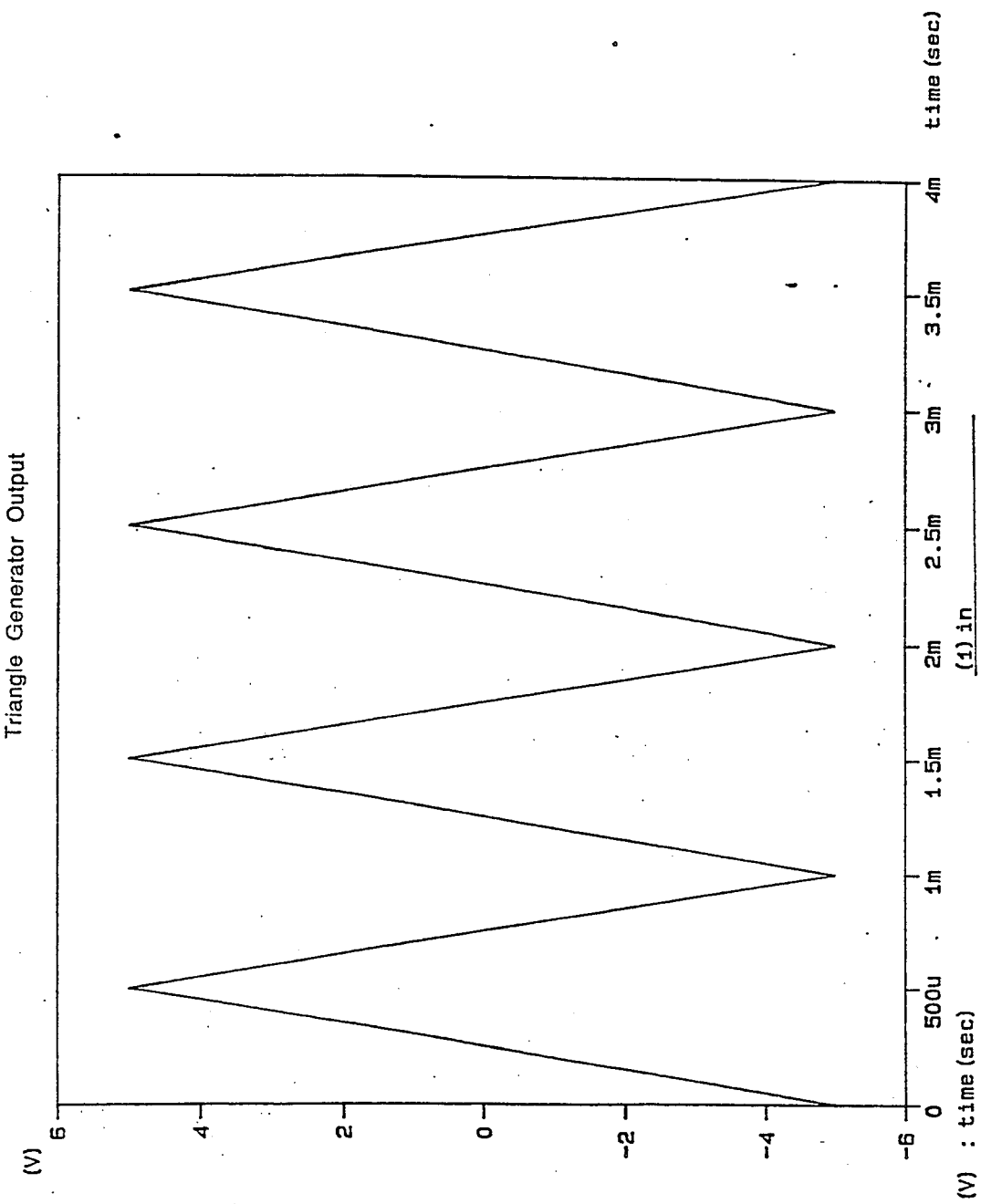

Figure 6 is a functional block diagram of the PWM used to drive the motor. The requirements for the PWM in terms of gain and frequency were determined at the higher behavioral level through the design and experimentation with different parameters. These parameters will now be used in the design of this more detailed level model. Again, this functional model contains switching elements it is nonlinear and therefore can only be analyzed in transient or time domain.

The PWM contains a triangle generator operating at 1.0 kHz, a voltage comparator and a boost amplifier to drive the motor. The triangle generator produces a triangle wave of +/- 10V at about 1 kHz. A high gain voltage comparator compares the input DC error signal with the triangle wave to produce a square wave whose duty cycle is linear and proportional to the DC input voltage.

The Triangle generator is modeled at the behavioral level as a piece-wise linear triangle with a amplitude of 10 volts about zero and a frequency of 1 Khz.

The comparator is a voltage controlled voltage source whose output voltage is slew rate limited and the output switching amplifier is modeled as voltage controlled switches with a small dead-band about the zero cross. This is accomplished by the model of the output transistors as shown in Figure 6.

By modeling the transistors this way the boost amplifier output currents, motor drive voltages and boost amplifier switching times required for proper system performance before designing the actual circuit. Parameters determined at this stage of the design will then be used to select the output transistors and circuit topology necessary to meet the same performance as was previously determined at the linear behavioral level.

A more detailed functional level description of the pulse-width modulator is possible, consisting of the macromodels for the actual op-amps used in the circuit. Many of the models that are industry supplied components are available along with the simulator as a standard parts library and are directly used during the lower level component simulations for providing final verification that the system as a whole still meets specifications.

PRIMITIVE LEVEL VERIFICATION

The major blocks of the motor controller have now been described and tested at the behavioral level, functional level, and further refined until they are now either at the primitive level or are at a level of description which allows their full characterization. For instance, in the control circuitry, only the control logic for the divide by 10 and sample/hold has not been fully detailed at the component level. These have been described at the functional level which is consistent with the information found in the data books. The entire system as designed can be simulated in a verification phase to ensure that with the specific parts included in the system will perform to specifications. If this final simulation proves out, the schematic can be sent to manufacturing for prototypes with a very high degree of confidence that the circuit will perform to expectations on the first go-around.

The results of the primitive level simulation for this design are shown in figure 8. and verify that the design still meets the specifications for motor drive RPM and stability.

What has been shown is that through the use of a systems simulator such as Saber. It is possible now for analog engineers to verify and develop new and improved concepts in systems design and interaction. While also gaining assistance, in the actual implementation of these concepts into circuitry through the use of a highly cost effective software tool. The ability to gain conceptual through circuit level design assistance including technologies that are non electrical in nature such as mechanical, chemical, and optical can provide enormous payback in design quality and in production savings to many companies in many different market areas.

Triangle Generator Output

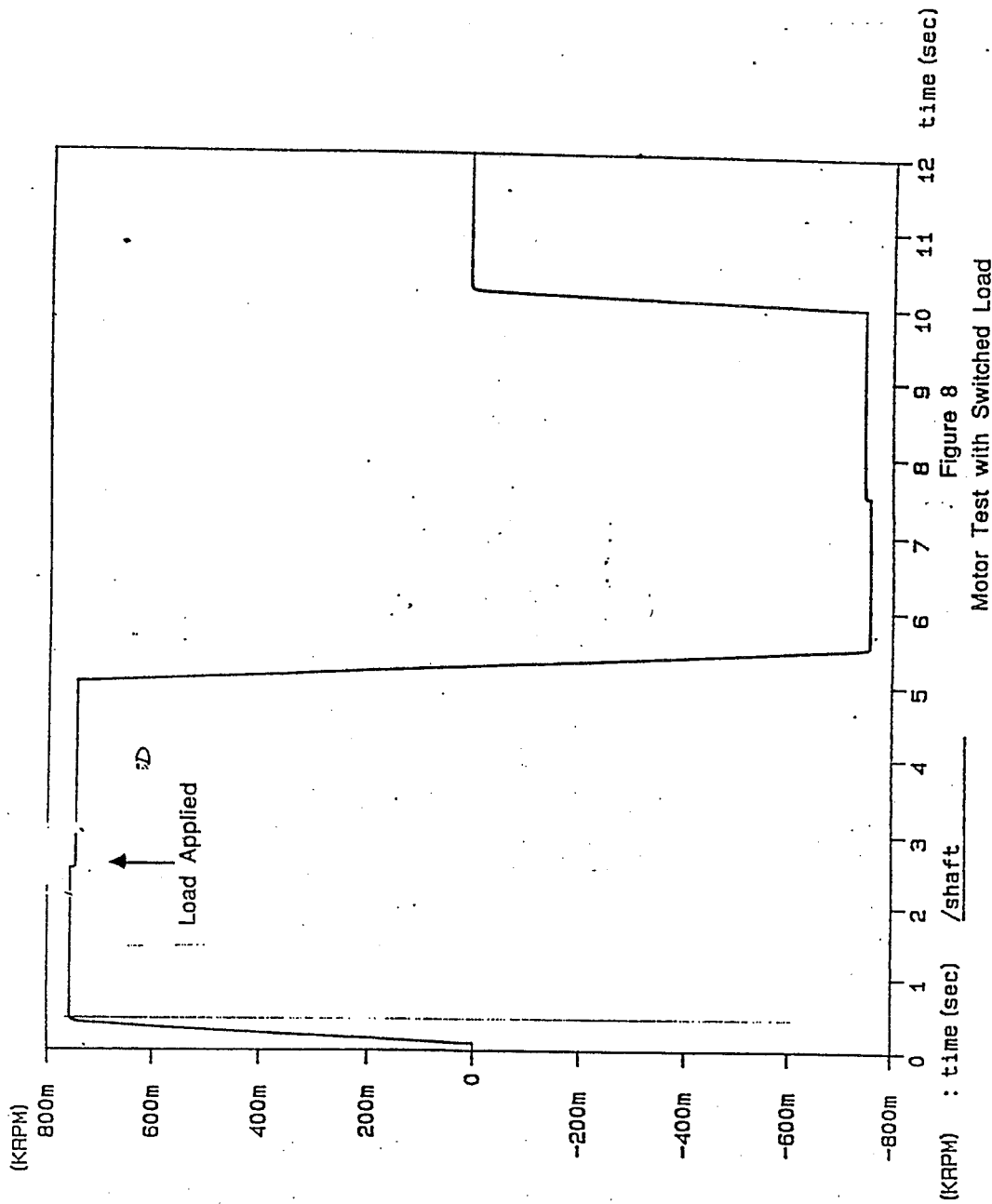

Figure 8 Motor Test with Switched Load

We claim:

1. A method for incorporating a description of an analog component model into a circuit simulator in a computer programming language used by a simulator program residing in a computer, the method comprising the steps of:

entering a high-level description of the component model;

compiling the high-level description using the computer to produce model behavior code parse trees and model structure data;

translating using the computer the parse trees to produce scalar-code parse trees; and converting using the computer the scalar-code parse trees and model structure data into code in the computer programming language used by the simulator program.

2. A method according to claim 1 further comprising, before the translating step, the step of:

debugging the model behavior code parse trees and model structure data.

3. A method according to claim 1 further comprising, before the translating step, the step of:

analyzing the data-flow of the model behavior code parse trees to produce verified parse trees and error messages for those variables referenced but not defined.

4. A method according to claim 3 further comprising, before the translating step but after the analyzing step, the step of:

debugging the verified parse trees and model structure data.

5. A method according to claim 1 further comprising, before the converting step, the step of:

checking argument dependence of the scalar-code parse trees to produce repartitioned scalar-code parse trees.

6. A method according to claim 1 wherein the entering step comprises the steps of:
naming the model;
declaring parameters;
describing a topology of the model;
declaring arguments; and
specifying argument-dependent equations.

7. A method according to claim 6 wherein the entering step further comprises the step of:
specifying argument-independent equations.

8. A method according to claim 1 wherein the converting step comprises the steps of:
filling in templates of information required by the simulator program with information from the scalar code parse trees; and
producing code according to the filled-in templates.

9. A method according to claim 8 wherein the producing step comprises the step of:
passing messages to objects representing nodes in a parse tree asking the objects to generate code representing themselves.

10. A method for describing a model of an analog device for a simulator program and for using the model of an analog device in conjunction with the simulator program to perform a simulation, the method being performed within a computer and comprising the steps of:
naming the model using a language and syntax recognizable by the computer;
declaring parameters for the model using the language and syntax recognizable by the computer;
describing a topology of the model using the language and syntax recognizable by the computer;
declaring arguments for the model using the language and syntax recognizable by the computer;
specifying argument-dependent equations for the model using the language and syntax recognizable by the computer; and
employing the model in conjunction with the simulator program using the computer to perform a simulation of a physical phenomenon.

11. A method according to claim 10 further comprising the step of:
specifying argument-independent equations.

12. A method according to claim 11 wherein the step of specifying argument-independent equations immediately precedes the step of describing a topology of the model and all of the steps are performed in the order indicated.

13. A method according to claim 10 wherein the step of declaring parameters comprises the steps of:
declaring default values; and
declaring legal sets of values.

14. A method according to claim 10 wherein the step of describing a topological model comprises the steps of:
naming nodes, pads, and branches;
connecting branches between nodes and pads; and
specifying units for each node, pad, and branch.

15. A method according to claim 14 wherein the describing step further comprises the steps of:
naming unknowns; and
specifying units for each unknown.

16. A method according to claim 10 wherein the step of declaring arguments comprises the steps of:
declaring across arguments;
specifying the nodes or pads the across arguments refer to;
declaring value arguments; and
associating the value argument with an unknown.

17. A method according to claim 16 wherein the specifying steps further comprises the step of:
further specifying a polarity.

18. A method according to claim 10 wherein the step of specifying argument-dependent equations comprises the steps of:
writing expressions for a through value for branches; and
writing expressions for constraints on unknowns.

19. A method for creating objects representing variables and their associated vector of derivatives with respect to arguments, which are able to respond to arithmetic operators by calculating the derivatives as well as the value of the variable, and for using the objects so created in conjunction with a simulator program to perform simulations of a physical phenomenon, the method comprising the steps of:
identifying an arithmetic operation;
determining how the arithmetic operation is affected by differentiation to produce a derivative with respect to the plurality of arguments;
writing code in a computer using a language and syntax recognizable by the computer to create a computer language object comprising:
a header containing the value of the variable; and
a vector associated with the header, the vector containing the determined derivative with respect to the argument; and
employing the objects in conjunction with the simulator program using the computer to perform a simulation of a physical phenomenon.

20. A method according to claim 19 wherein the object created by the writing step further comprises associated methods to produce a numerical result.

21. A method according to claim 19 wherein the object created by the writing step further comprises associated methods to produce code in a second language for producing a numerical result when executed.

22. A method according to claim 21 further comprising the additional step of:
linking the code produced in the second language into the code of an analog simulator program written in the second language.

23. A method according to claim 21 further comprising the step of:
optimizing the code in the second language before execution.

24. A method according to claim 23 further comprising the additional step of:
linking the code produced in the second language into the code of an analog simulator program written in the second language after optimization and before execution.

* * * * *